United States Patent
Molaire

(10) Patent No.: US 10,240,084 B2
(45) Date of Patent: Mar. 26, 2019

(54) NON-CRYSTALLIZABLE PI-CONJUGATED MOLECULAR GLASS MIXTURES, CHARGE TRANSPORTING MOLECULAR GLASS MIXTURES, LUMINESCENT MOLECULAR GLASS MIXTURES, OR COMBINATIONS THEREOF FOR ORGANIC LIGHT EMITTING DIODES AND OTHER ORGANIC ELECTRONICS AND PHOTONICS APPLICATIONS

(71) Applicant: MOLECULAR GLASSES, INC., Rochester, NY (US)

(72) Inventor: Michel Frantz Molaire, Rochester, NY (US)

(73) Assignee: Molecular Glasses, Inc., Rochester, NY (US)

( * ) Notice: Subject to any disclaimer, the term of this patent is extended or adjusted under 35 U.S.C. 154(b) by 96 days.

(21) Appl. No.: 14/664,899

(22) Filed: Mar. 22, 2015

(65) Prior Publication Data

US 2015/0275076 A1 Oct. 1, 2015

Related U.S. Application Data

(60) Provisional application No. 61/970,348, filed on Mar. 25, 2014, provisional application No. 62/116,352, filed on Feb. 13, 2015.

(51) Int. Cl.
| | | |
|---|---|---|
| *H01L 51/00* | (2006.01) | |
| *C09K 11/00* | (2006.01) | |
| *C09K 11/06* | (2006.01) | |
| *H01L 51/50* | (2006.01) | |

(52) U.S. Cl.
CPC ............ *C09K 11/06* (2013.01); *H01L 51/006* (2013.01); *H01L 51/0052* (2013.01); *H01L 51/0053* (2013.01); *H01L 51/0054* (2013.01); *H01L 51/0058* (2013.01); *H01L 51/0067* (2013.01); *H01L 51/0068* (2013.01); *H01L 51/0072* (2013.01); *H01L 51/0085* (2013.01); *C09K 2211/1059* (2013.01); *C09K 2211/1081* (2013.01); *H01L 51/5012* (2013.01); *H01L 51/5016* (2013.01); *H01L 51/5056* (2013.01); *H01L 51/5072* (2013.01); *H01L 2251/556* (2013.01); *Y02E 10/549* (2013.01)

(58) Field of Classification Search
CPC ......... C09K 11/00; C09K 11/06; H01L 27/00; H01L 27/14; H01L 27/142; H01L 51/005; H01L 51/006; H01L 51/0062; H01L 51/0071; H01L 51/0072
See application file for complete search history.

(56) References Cited

U.S. PATENT DOCUMENTS

| | | | | | |
|---|---|---|---|---|---|
| 4,499,165 | A | * | 2/1985 | Molaire | ............... C07F 15/045 346/135.1 |
| 4,626,361 | A | * | 12/1986 | Molaire | ............... C07F 15/045 252/1 |
| 5,176,977 | A | * | 1/1993 | Molaire | ............... C07C 69/017 430/109.4 |
| 7,629,097 | B2 | | 12/2009 | Molaire | |
| 7,776,500 | B2 | | 8/2010 | Molaire | |
| 2007/0292796 | A1 | * | 12/2007 | Molaire | ............... G03G 5/142 430/64 |
| 2007/0292799 | A1 | * | 12/2007 | Molaire | ............ G03G 9/09307 430/110.2 |
| 2011/0129951 | A1 | * | 6/2011 | Kondo | ............... H01L 51/0017 438/26 |
| 2011/0279020 | A1 | * | 11/2011 | Inoue | ................. C07D 209/82 313/504 |
| 2014/0048745 | A1 | | 2/2014 | Anemian et al. | |
| 2015/0069303 | A1 | * | 3/2015 | Eckes | ................. C08G 61/12 252/500 |

FOREIGN PATENT DOCUMENTS

| | | |
|---|---|---|
| JP | 2013235950 A | 11/2013 |
| WO | 2015095859 A1 | 6/2015 |
| WO | WO 2015117100 A1 * 8/2015 ......... H01L 51/5012 |

OTHER PUBLICATIONS

Cho et al., "Diversification of Carbazoles by LiCl-mediated Catalytic CuI Reaction", Bull. Korean Chem. Soc, vol. 32, No. 7, pp. 2461-2464, 2011.
Evans et al., "Triplet Energy Back Transfer in Conjugated Polymers with Pendant Phosphorescent Iridium Complexes", J. Am. Chem. Soc., 128, pp. 6647-6656, 2006.
Gagnon et al., "Triarylamines Designed to Form Molecular Glasses. Derivates of Tris(p-terphenyl-4-yl)amine with Multiple Contiguous Phenyl Substitutes", American Chemical Society, Organic Letters, vol. 12, No. 3, pp. 404-407, 2010.
Kulkarni et al., "Electron Transport Materials for Oganic Light-Emitting Diodes", Chem Mater, 16, pp. 4556-4573, 2004.
Molaire et al., "Organic Monomeric Glasses: A Novel Class of Materials", Journal of Polymer Science: Part A: Polymer Chemistry, vol. 27, pp. 2569-2592, 1989.

(Continued)

*Primary Examiner* — Haidung D Nguyen
(74) *Attorney, Agent, or Firm* — Dinsmore & Shohl LLP

(57) ABSTRACT

The present invention provides charge transporting molecular glass mixtures, luminescent molecular glass mixtures, or combinations thereof comprising at least two nonpolymeric compounds each independently corresponding to the structure $(R^1Y^1)_p[(Z^1Y^2)_mR^2Y^3]_nZ^2Y^4R^3$ wherein m is zero or one; n is zero up to an integer at which said compound starts to become a polymer; p is an integer of from one to eight; each $R^1$ and $R^3$ is independently a monovalent aliphatic or cycloaliphatic hydrocarbon group having 1 to 20 carbon atoms, an aromatic group or a multicyclic aromatic nucleus; $R^2$, $Z^1$, and $Z^2$ each independently represent multivalent aliphatic or cycloaliphatic hydrocarbon groups having 1 to 20 carbon atoms or an aromatic group; and $Y^1$, $Y^2$, $Y^3$ and $Y^4$ each independently represent a triple bond, a double bond, or a single bond link.

29 Claims, 5 Drawing Sheets

(56) References Cited

OTHER PUBLICATIONS

Paik et al., "White Light-Emitting Diodes from Novel Silicon-Based Copolymers Containing Both Electron-Transport Oxadiazole and Hole-Transport Carbazole Moieties in the Main Chain", Macromolecules, 35, pp. 6782-6791, 2002.
Polikarpov et al., "Achieving High Efficiency in Organic Light-Emitting Devices", Sigma-Aldrich, Material Matters, vol. 2, Article 3, pp. 1-6, accessed Nov. 28, 2011.
Shirota et al., "Charge Carrier Transporting Molecular Materials and Their Applications in Devices", Chem. Rev. 107, pp. 953-1010 2007.
Zhu et al., "Blue fluorescent emitters: design tactics and applications in organic light-emitting diodes", Chem Soc Rev 42, pp. 4963-4966, 2013.
Search Report pertaining to International Application No. PCT/US2015/021913 dated Oct. 14, 2015.
European Search Report pertaining to 15768803.7 dated Oct. 5, 2017.

\* cited by examiner

NON-CRYSTALLIZABLE PI-CONJUGATED MOLECULAR GLASS MIXTURES, CHARGE TRANSPORTING MOLECULAR GLASS MIXTURES, LUMINESCENT MOLECULAR GLASS MIXTURES, OR COMBINATIONS THEREOF FOR ORGANIC LIGHT EMITTING DIODES AND OTHER ORGANIC ELECTRONICS AND PHOTONICS APPLICATIONS

CROSS-REFERENCE TO RELATED PATENT APPLICATIONS

Priority for this patent application is based upon provisional patent applications 61/970,348 filed on Mar. 25, 2014 and 62/116,352 filed on Feb. 13, 2015. The disclosure of these United States patent applications are hereby incorporated by reference into this specification.

BACKGROUND OF THE INVENTION

Recently there has been increased interest into molecular glasses that can be coated into amorphous films for applications such as photoresist or molecular optoelectronic devices, including light-emitting diodes, field-effect transistors, and solar cells, as well as in advanced materials for xerography, two-photo absorption, luminescent devices, and photorefraction. One technique that is used in the art is a reverse of the principles of crystal engineering to devise molecules that resist crystallization. Examples of this technique are described in the publications by Eric Gagnon et al: "*Triarylamines Designed to Form Molecular Glasses. Derivatives of Tris (p-terphenyl-4-yl) amine with multiple Contiguous Phenyl Substituents.*" Organic Letters 201, Vol. 12, No. 3, p 404-407.

These molecular glasses produced via reverse crystallization engineering are defined as "amorphous materials in the state of thermodynamic non-equilibrium, and hence, they tend to undergo structural relaxation, exhibiting well-defined glass temperature (Tg's). However they also tend to crystallize on heating above their Tg's, frequently exhibiting polymorphism" (Hari Singh Nalwa, Advanced Functional Molecules and Polymers, Volume 3, CRC Press, 2001—Technology & Engineering; Yashuhiko Shirota and Hiroshi Kageyama, Chem. Rev. 2007, 107, 953-1010). With time, equilibrium will lead to crystallization of these non-equilibrium molecular glasses. Therefore crystallization is still a problem to be solved. When these non-equilibrium molecular glasses crystallize, the performance of a device comprising the non-equilibrium molecular glasses is degraded, limiting device longevity. An additional problem with current small molecule organic light emitting diode (OLED) materials is their solubility; either solubility is limited or requires non-green solvents.

A further issue with molecular glass usage involves fluorescent emitters, particularly blue fluorescent emitters aggregation quenching. To suppress fluorescent quenching, blue fluorescent dyes have been doped in a host matrix. The blending system may intrinsically suffer from the limitation of efficiency and stability, aggregation of dopants and potential phase separation (M. Zhu and C Yang, Chem. Soc. Rev., 2013, 42, 4963). Another method used for blue fluorescent organic light emitting diodes (OLEDs) is nondoped blue fluorescent emitters. Still charge injection and transportation remain a problem.

Molaire in U.S. Pat. No. 4,499,165 disclosed nonpolymeric amorphous mixtures of compounds which are useful as a binder in optical recording layers. These mixtures were further used in nonpolymeric amorphous composition and developing processes (U.S. Pat. No. 5,176,977). Monomeric glass mixtures incorporating tetracarbonylbisimide groups were disclosed in U.S. Pat. No. 7,776,500. In U.S. Pat. No. 7,629,097 these mixtures found use in encapsulated toner compositions incorporating organic monomeric glasses. The entire disclosure of each of these United States patents is hereby incorporated by reference into this specification. In U.S. patent application Ser. Nos. 14/467,143 and 14/578,482 by Molaire, charge transporting molecular glass mixtures, bipolar charge-transporting molecular glass mixtures, electroluminescent (bipolar) molecular glass mixtures, and crosslinkable molecular glass mixtures are disclosed. In the molecular glass mixtures of those disclosures the mixture comprises at least two different components joining one multivalent organic nucleus with at least two organic nuclei wherein at least one of the multivalent organic nucleus and the organic nuclei is multicyclic, the linking group being an ester, urethane, amide or imide group.

Most luminescent organic molecules are pi-conjugated compounds, i.e., materials in which single and double or single and triple bonds alternate throughout the molecule or polymer backbone. For fine line photoresist applications, it is important to minimize linking groups that contribute to light absorption above 250 nm.

There is a need for non-crystallizable molecular glasses that are fully pi-conjugated. There is a need for non-crystallizable molecular glasses for resist applications. There is a need for charge-transporting molecular glasses, luminescent molecular glasses, and combinations thereof that are truly non-crystallizable. There is further need for charge-transporting molecular glasses, luminescent molecular glasses, and combinations thereof with controllable thermal properties, independent of the structure of the charge transport moiety. There are specific needs for charge-transporting molecular glasses, luminescent molecular glasses, and combinations thereof that are relatively inexpensive to manufacture. There is a need to develop host matrix that will prevent phase separation of the guest emitter materials. There is also a need to develop luminescent emitters that will not aggregate in the first place. There is a need for charge-transporting molecular glasses, luminescent molecular glasses, and combinations thereof that are truly non-crystallizable. There is further need for charge-transporting molecular glasses, luminescent molecular glasses, and combinations thereof with large entropy of mixing to allow for complete compatibility of guest emitter materials. There is a further need for charge-transporting molecular glasses, luminescent molecular glasses, and combinations thereof where the polarity of transport can be easily modulated. There is still need for charge-transporting molecular glasses, luminescent molecular glasses, and the like that are bipolar and truly non-crystallizable.

The present invention provides solutions for the above problems.

It is an object of this invention to provide non-crystallizable molecular glasses that are fully pi-conjugated. It is an object of this invention to provide non-crystallizable molecular glasses for resist applications. It is and object of this invention to provide charge-transporting molecular glass mixtures, luminescent molecular glass mixtures, and combinations thereof with the many of the advantages illustrated herein. It is also an object of this invention to provide charge-transporting molecular glass mixtures, luminescent molecular glass mixtures, and combinations thereof that can be purified by simple and economic techniques. In another object of this invention there are provided charge-transporting molecular glass mixtures, luminescent molecular glass mixtures, and combinations thereof that can be easily dissolved in simple organic solvents. It is yet another object of this invention to provide charge-transporting molecular glass mixtures, luminescent molecular glass mixtures, and combinations thereof volatile and stable enough for vacuum deposition coatings. It is another object of this invention to provide charge-transporting molecular glass mixtures, luminescent molecular glass mixtures, and combinations thereof with uniform vapor pressure for vacuum deposition coatings without components fractionation. It is yet a further object of this invention to provide charge-transporting molecular glass mixtures, luminescent molecular glass mixtures, and combinations thereof with both sufficient electron-transporting and hole-transporting properties to support monolayer or simple device configuration.

SUMMARY OF THE INVENTION

Various embodiments of the present invention provide for charge-transporting molecular glass mixtures, luminescent molecular glass mixtures, and combinations thereof with thermal properties that can be controlled independent of the structure of the core charge-transporting group, the luminescent group, or a combination thereof. The various embodiments used to describe the principles of the present invention are by way of illustration only and should not be construed in any way to limit the scope of the invention. Those skilled in the art will understand that the principles of the present invention may be implemented in any suitably arranged device.

The charge-transporting molecular glass mixtures, the luminescent molecular glass mixtures, and combinations thereof of this invention can be used particularly in light-emitting diodes, organic photovoltaic cells, field-effect transistors, organic light emitting transistors, organic light emitting chemical cells, electrophotography, and many other applications of the like.

Each of the charge-transporting molecular glass mixture, the luminescent molecular glass mixture, and combinations thereof of this invention are defined as a mixture of compatible organic monomeric molecules with an infinitely low crystallization rate under the most favorable conditions. These mixtures can be formed in a one-part reaction of a multifunctional nucleus with a mixture of substituents. The "non-crystallizability" of the mixture is controlled by the structural dissymmetry of the nucleus, the substituents, or a combination thereof, and the number of components making up the mixture. In cases, where the nucleus is highly symmetric and rigid, the components with similar (non-distinct) substituents might crystallize out under the right conditions. Thus it is advantageous when possible to avoid those components, by designing an asymmetric glass mixture, wherein all the components of the mixture have distinct substituents. Without being bound to theory, we predict that the asymmetric mixtures are more likely to be fully non-crystallizable.

Increasing the number of components of the glass mixture, by adding more substituents, is another way to enhance the non-crystallizability of glass mixtures having highly symmetric and rigid nuclei.

Finally a glass mixture with partial component crystallization can be stabilized by mixing it with a non-crystallizable glass mixture in the right proportion. The mixed non-crystallizable glass mixture can be charge-transporting, luminescent, or even an inert non-crystallizable glass mixture.

Examples of highly symmetric and rigid nuclei include:

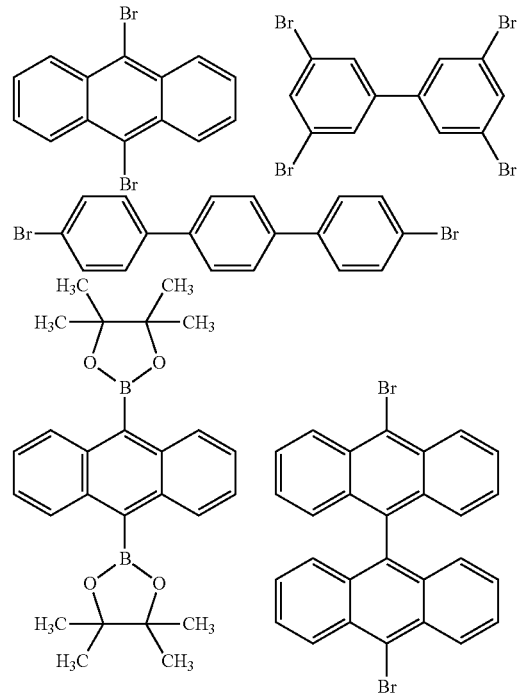

The charge-transporting molecular glass mixtures, luminescent molecular glass mixtures, and combinations thereof like amorphous polymers, have good film-forming properties.

However, unlike polymers, they display extremely low melt-viscosities, large positive entropy-of-mixing values, relatively high vapor pressure, and can be ground easily into extremely small particles. These properties make them ideal for certain applications where compatibility, defect-free film forming, melt-flow, vapor deposition coating, and small particle size are important.

Charge-transporting molecular glass mixtures, luminescent molecular glass mixtures, and combinations thereof of the invention when properly designed are truly non-crystallizable. Their thermal and other physical properties are tunable independent of the charge transport or luminescent moiety.

BRIEF DESCRIPTION OF THE SEVERAL
VIEWS OF THE DRAWINGS

The invention will be described in more details by reference to the drawings, of which FIG. 1 is a high pressure liquid chromatography (HPLC) identification of molecular glass mixture example 1;

FIG. 2 is a high pressure liquid chromatography (HPLC) identification of molecular glass mixture example 2;

FIG. 3. Is a compatibility curve (plot of calculated Tg Vs composition) of molecular glass mixture of example 1 and coumarin 6;

FIG. 4. Is a compatibility curve (plot of calculated Tg Vs composition) of molecular glass mixture of example 2 and coumarin 6;

DETAILED DESCRIPTION OF THE INVENTION

Figure 1:
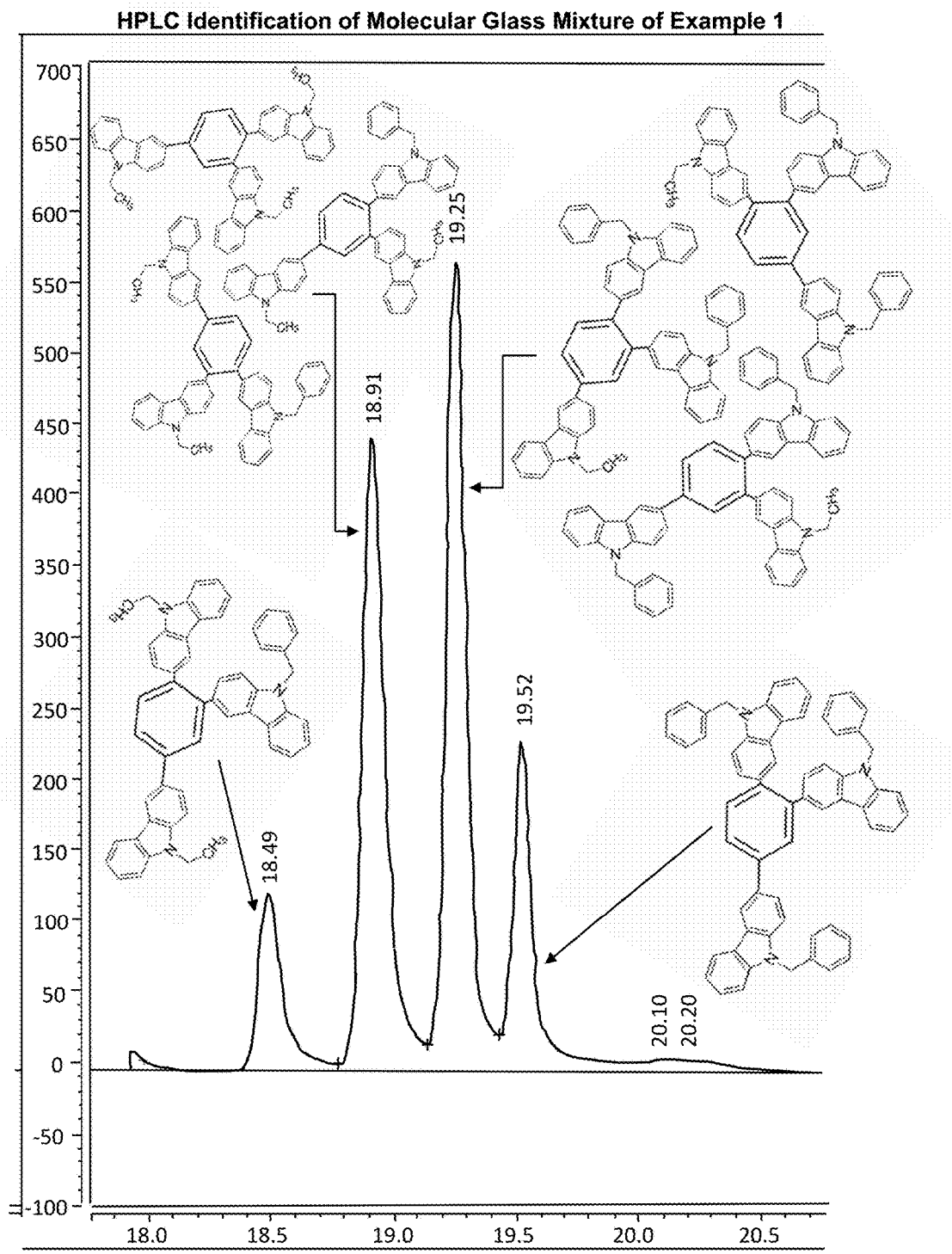

Various embodiments of the present invention provide for charge-transporting molecular glass mixtures, luminescent molecular glass mixtures, and combinations thereof. The various embodiments used to describe the principles of the present invention are by way of illustration only and should not be construed in any way to limit the scope of the invention. Those skilled in the art will understand that the principles of the present invention may be implemented in any suitably arranged device.

Definitions of Terms Used in this Application

Throughout this document, the following terms will have the following meanings.

The term "amorphous" means that the mixture is non-crystalline. That is, the mixture has no molecular lattice structure.

A "non-equilibrium molecular glass" is a glass forming material that is crystallizable under certain conditions, for example above the glass transition temperature, or in contact with certain solvents.

A "non-crystallizable molecular glass" will never crystallize under any circumstances and is always amorphous.

An "asymmetric glass mixture" is a glass mixture where all the components are asymmetric, i.e. have all distinct substituents.

A "isomeric glass mixture" is a glass mixture where all the components have the same molecular weight.

A "multicyclic aromatic nucleus" is a nucleus comprising at least two cyclic groups one of which is aromatic, including aromatic heterocyclic ring groups. The cyclic group may be substituted with substituents such as aliphatic hydrocarbons, including cycloaliphatic hydrocarbons, other aromatic ring groups such as aryl, and heterocyclic ring groups such as substituted or fused thiazole, oxazole, imide, pyrazole, triazole, oxadiazole, pyridine, pyrimidine, pyrazine, triazine, tetrazine and quinoline groups. The substituents are fused or non-fused and mono or polycyclic. Examples of multicyclic aromatic nuclei include 9,9-bis(4-hydroxy-3,5-dichlorophenyl)fluorene, 4,4'-hexahydro-4,7-methanoindan-5-ylidenebis(2,6-dichlorophenol); 9,9-bis(4-hydroxy-3,5-dibromophenyl(fluorene, 4,4'-hexahydro-4,7-methanoindan-5-ylidenebis(2,6-dibromophenol); 3',3",5',5"-tetrabromophenolphthalein, 9,9-bis(4-aminophenyl) fluorene, phenylindandiols; 1,1'-spirobiindandiols, 1,1'-spirobiindandiamines, 2,2'-spirobichromans; 7,7-dimethyl-7H-dibenzo[c,h]xanthenediol; xanthylium salt diols; 9,9-dimethylxanthene-3,6-bis(oxyacetic acids); 4,4'(3-phenyl-1-indanylidene)diphenol and other bisphenols; 3',3"-dibromo-5',5"-dinitro-2',2"-oxaphenolphthalein; 9-phenyl-3-oxo-2,6,7-trihydroxyxanthene; and the like.

"Aliphatic hydrocarbon group" refers to monovalent or divalent, alkanes, alkenes, alkadienes and alkynes having from 1 to 20 carbon atoms. The groups are straight or branched chain and include carbohydrate, carboxylic acid, alcohol, ether aldehyde and ketone functions.

"Cycloaliphatic" refers to cyclic aliphatic hydrocarbon groups. The groups may be substituted with halogen, alkoxy, amide, nitro, esters and aromatic groups.

Exemplary aliphatic groups include methyl, ethyl, propyl, isopropyl, butyl, hexyl, 2-ethylhexyl, methoxyethyl, ethoxycarbonylpropyl, 3-oxobutyl, 3-thiapentyl, furfuryl, 2-thiazolylmethyl, cyclohexylmethyl, benzyl, phenethyl, phenoxyethyl, vinyl (—CH═CH$_2$), 2-methylvinyl, allyl, allylidene, butadienyl, butenylidene, propargyl, and the like.

"Aromatic" and "aromatic heterocyclic" group refers to organic groups which undergo the same type of substitution reaction as benzene. In benzene, substitution reactions are preferred over addition reactions. Such groups preferably have from 6 to about 40 nuclear atoms and are mono- and polycyclic.

Exemplary aromatic groups include quinolinyl, pyrimidinyl, pyridyl, phenyl, tolyl, xylyl, naphthyl, anthryl, triptycenyl, p-chlorophenyl, p-nitrophenyl, p-bromophenyl, 2,4-dichlorophenyl, 2-chlorophenyl, 3,5-dinitrophenyl, p-(tetrabromophthalimido)phenyl, p-(tetrachlorophthalimido)phenyl, p-tetraphenylphthalimido)phenyl, p-naphthalimidophenyl, p-(4-nitrophthalimido)phenyl, p-phthalimidophenyl, 1-hydroxy-2-naphthyl, 3,5-dibromo-4-(4-bromobenzoyloxy)phenyl, 3,5-dibromo-4-(3,5-dinitrobenzoyloxy)phenyl, 3,5-dibromo-4-(1-naphthoyloxy)phenyl, thiazolyl, oxazolyl, imidazolyl, pyrazolyl, triazolyl, oxadiazolyl, pyrazinyl, etc and their corresponding multivalent and fused ring configurations.

"Green solvents" are non-toxic and benign to environment. A good guide of green solvents can be found in "Green chemistry tools to influence a medicinal chemistry and research chemistry based organization by K. Alfonsi, et al, Green Chem., 2008,10, 31-36, DOI: 10.1039/b711717e. A list of "preferred", "usable", and undesirable solvents are shown in Table 1. The preferred solvents are considered "greener". The undesirable solvents are to be avoided.

TABLE 1

| Preferred | Usable | Unudesirable |
|---|---|---|
| Water | cyclohexane | pentane |
| acetone | methylcyclohexane | hexane |
| ethanol | toluene | di-isopropyl ether |
| 2-propanol | heptane | diethyl ether |
| 1-propanol | acetonitrile | dichloromethane |
| ethyl acetate | 2-methyltetrahydrofuran | dichloroethane |
| isopropyl acetate | tetrahydrofuran | dimethyl formamide |
| methanol | xylenes | N-methylpyrrolidone |
| 1-butanol | dimethylsulfoxide | pyridine |
| t-butanol | acetic acis | dimetyl acetamide |
| | ethylene glycol | diaxane |
| | | dimetoxyethane |
| | | benzene |
| | | carbon tetrachloride |

An "electronic device" is any device that uses electrons in its function, input or output. A "photonic device" is any device that uses photons in its function, input or output.

The present invention provides molecular glass mixtures comprising at least two nonpolymeric compounds each independently corresponding to the structure

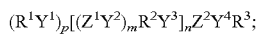

wherein m is zero or one, n is zero up to an integer at which said compound starts to become a polymer and p is an integer of from one to eight; $R^1$ and $R^3$ each independently represents a monovalent aliphatic or cycloaliphatic hydrocarbon group having 1 to 20 carbon atoms or an aromatic group or a multicyclic aromatic nucleus; $R^2$, $Z^1$ and $Z^2$ each independently represent multivalent aliphatic or cycloaliphatic hydrocarbon groups having 1 to 20 carbon atoms or an aromatic group; $Y^1$, $Y^2$, $Y^3$ and $Y^4$ each independently represent a triple bond, a double bond, or a single bond link; provided that at least one of $R^1$, $Z^1$, $R^2$, $Z^2$ and $R^3$ is a multicyclic aromatic nucleus, and the glass-transition temperature is above 25 degrees Celsius (° C.).

The molecular glass mixtures of the invention are truly non-crystallizable.

The present invention provides charge-transporting molecular glass mixtures, luminescent molecular glass mixtures, and combinations thereof comprising at least two nonpolymeric compounds each independently corresponding to the structure of Formula (I), given as

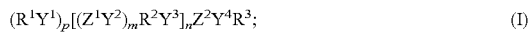

$$(R^1Y^1)_p[(Z^1Y^2)_mR^2Y^3]_nZ^2Y^4R^3; \quad (I)$$

wherein m is zero or one, n is zero up to an integer at which said compound starts to become a polymer and p is an integer of from one to eight.

In one embodiment of the invention, each $R^1$ and $R^3$ is independently a monovalent aliphatic or cycloaliphatic hydrocarbon group having 1 to 20 carbon atoms, an aromatic group or a multicyclic aromatic nucleus; $R^2$, $Z^1$, and $Z^2$ each independently represent multivalent aliphatic or cycloaliphatic hydrocarbon groups having 1 to 20 carbon atoms or an aromatic group where at least one of each $R^2$, $Z^1$ and $Z^2$ is independently a charge transporting moiety, a luminescent moiety, or a combination thereof. $Y^1$, $Y^2$, $Y^3$ and $Y^4$ each independently represent a triple bond, a double bond, or a single bond link; provided that the glass transition temperature (Tg) of the molecular glass mixture is above 20° C.

In a second embodiment of the invention each $R^1$ and $R^3$ is independently a monovalent aliphatic or cycloaliphatic hydrocarbon group having 1 to 20 carbon atoms, an aromatic group or a multicyclic aromatic nucleus where at least one of each $R^1$ and $R^3$ is independently a monovalent charge-transporting moiety, a luminescent moiety, or a combination thereof; $R^2$, $Z^1$, and $Z^2$ each independently represent multivalent aliphatic or cycloaliphatic hydrocarbon groups having 1 to 20 carbon atoms or an aromatic group; and $Y^1$, $Y^2$, $Y^3$ and $Y^4$ each independently represent a triple bond, a double bond, or a single bond link.

In a third embodiment of the invention each $R^1$ and $R^3$ is independently a monovalent aliphatic or cycloaliphatic hydrocarbon group having 1 to 20 carbon atoms, an aromatic group or a multicyclic aromatic nucleus where at least one of each $R^1$ and $R^3$ is independently a monovalent charge-transporting moiety, a luminescent moiety, or a combination thereof; $R^2$, $Z^1$, and $Z^2$ each independently represent multivalent aliphatic or cycloaliphatic hydrocarbon groups having 1 to 20 carbon atoms or an aromatic group where at least one of each $R^2$, $Z^1$ and $Z^2$ is independently a charge-transporting moiety, a luminescent moiety, or a combination thereof; and $Y^1$, $Y^2$, $Y^3$ and $Y^4$ each independently represent a triple bond, a double bond, or a single bond link.

In a fourth embodiment of the invention, each $R^1$ and $R^3$ is independently a monovalent aliphatic or cycloaliphatic hydrocarbon group having 1 to 20 carbon atoms, an aromatic group or a multicyclic aromatic nucleus where at least one of $R^1$ and $R^3$ is independently a monovalent hole-transporting moiety, a luminescent moiety, or a combination thereof; $R^2$, $Z^1$, and $Z^2$ each independently represent multivalent aliphatic or cycloaliphatic hydrocarbon groups having 1 to 20 carbon atoms or an aromatic group where at least one of each $R^2$, $Z^1$ and $Z^2$ is independently a multivalent electron-transporting moiety, a luminescent moiety, or a combination thereof; and $Y^1$, $Y^2$, $Y^3$ and $Y^4$ each independently represent a triple bond, a double bond, or a single bond link.

In a fifth embodiment of the invention, each $R^1$ and $R^3$ is independently a monovalent aliphatic or cycloaliphatic hydrocarbon group having 1 to 20 carbon atoms, an aromatic group or a multicyclic aromatic nucleus where at least one of each $R^1$ and $R^3$ is independently a monovalent electron-transporting moiety, a luminescent moiety, or a combination thereof; $R^2$, $Z^1$, and $Z^2$ each independently represent multivalent aliphatic or cycloaliphatic hydrocarbon groups having 1 to 20 carbon atoms or an aromatic group, where at least one of each $R^2$, $Z^1$ and $Z^2$ is independently a multivalent hole-transporting moiety, a luminescent moiety, or a combination thereof; and $Y^1$, $Y^2$, $Y^3$ and $Y^4$ each independently represent a triple bond, a double bond, or a single bond link.

In a sixth embodiment of the invention, each $R^1$ and $R^3$ is independently a monovalent aliphatic or cycloaliphatic hydrocarbon group having 1 to 20 carbon atoms, an aromatic group or a multicyclic aromatic nucleus where at least one of each $R^1$ and $R^3$ is independently a monovalent electron-transporting moiety, a luminescent moiety, or a combination thereof; and at least one of each $R^1$ and $R^3$ is independently a monovalent hole-transporting moiety, a luminescent moiety, or a combination thereof; $R^2$, $Z^1$, and $Z^2$ each independently represent multivalent aliphatic or cycloaliphatic hydrocarbon groups having 1 to 20 carbon atoms or an aromatic group, where at least one of each $R^2$, $Z^1$ and $Z^2$ is independently a multivalent hole-transporting moiety, a luminescent moiety, or a combination thereof; and $Y^1$, $Y^2$, $Y^3$ and $Y^4$ each independently represent a triple bond, a double bond, or a single bond link.

In a seventh embodiment of the invention each $R^1$ and $R^3$ is independently a monovalent aliphatic or cycloaliphatic hydrocarbon group having 1 to 20 carbon atoms, an aromatic group or a multicyclic aromatic nucleus where at least one of each $R^1$ and $R^3$ is independently a monovalent electron-transporting moiety, a luminescent moiety, or a combination thereof; and at least one of each $R^1$ and $R^3$ is independently a monovalent hole-transporting moiety, a luminescent moiety, or a combination thereof; $R^2$, $Z^1$, and $Z^2$ each independently represent multivalent aliphatic or cycloaliphatic hydrocarbon groups having 1 to 20 carbon atoms or an aromatic group, where at least one of each $R^2$, $Z^1$ and $Z^2$ is independently a multivalent electron-transporting moiety, a luminescent moiety or a combination thereof; and $Y^1$, $Y^2$, $Y^3$ and $Y^4$ each independently represent a triple bond, a double bond, or a single bond link.

In an eighth embodiment of the invention each $R^1$ and $R^3$ is independently a monovalent aliphatic or cycloaliphatic hydrocarbon group having 1 to 20 carbon atoms, an aromatic group or a multicyclic aromatic nucleus where at least one of each $R^1$ and $R^3$ is independently a monovalent hole-transporting moiety, a luminescent moiety, or a combination thereof; and at least one of each $R^1$ and $R^3$ is independently a monovalent electron-transporting moiety, a luminescent moiety, or a combination thereof; $R^2$, $Z^1$, and $Z^2$ each independently represent multivalent aliphatic or cycloaliphatic hydrocarbon groups having 1 to 20 carbon atoms or an aromatic group where none of $R^2$, $Z^1$, and $Z^2$ is a charge-transporting moiety, a luminescent moiety, or a combination thereof; and $Y^1$, $Y^2$, $Y^3$ and $Y^4$ each independently represent a triple bond, a double bond, or a single bond link.

In a ninth embodiment of the invention, all the components of the mixture are isomeric, that is all components of the mixture have the same molecular weight. Thus the molecular glass mixtures of this embodiment have uniform vapor pressure and can be coated by vacuum deposition without components fractionation.

Charge-transporting molecular glass mixtures, luminescent molecular glass mixtures, and combinations thereof of the invention when properly designed are truly non-crystallizable. Their thermal and other physical properties are tunable independent of the charge transport or luminescent moiety.

The molecular glass mixtures of this invention are prepared according to various cross-coupling reactions known in the art, in particular cross-coupling reactions that have been proven suitable for producing conjugated polymers. An important object of this invention is to provide a method of providing amorphous, truly non-crystallizable molecular glass materials that can be easily purified by simple and economic processes. Truly amorphous materials by definition cannot be recrystallized. Thus because of that it is very difficult, or perhaps potentially costly to purify amorphous molecular glass materials containing high level of impurities and other compositions.

Accordingly, this invention only uses reactions that
1.) are quantitative, that is the reaction is near 100% complete;
2.) with either no byproducts;
3.) or with byproducts that can be easily solubilized in water or other solvents, can be extracted efficiently or can be easily solubilized in water or other solvents and extracted efficiently.

Cross-coupling reactions capable of producing polymers tend to be those that are quantitative. Specific examples of those cross-coupling reactions include the following reactions: the "Heck Reaction," the "Suzuki Reaction," the "Stille Coupling Reaction," the "Sonogashira-Hagihara Coupling Reaction," and the "Knoevenagel Reaction."

1. The "Heck Reaction", a palladium-catalyzed C—C coupling between aryl halides or vinyl halides and activated alkenes in the presence of a base (Heck R. F. J Am Chem Soc, 90:5518, 1968).

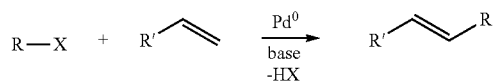

where R=alkenyl, aryl, allyl, alkynyl, benzyl; X=halide, triflate; and R'=alkyl, alkenyl, aryl, CO$_2$R, OR, SiR$_3$ 2. The "Suzuki Reaction", the palladium (0) complex catalyzed reaction of an aryl- or vinyl-boronic acid with an aryl- or vinyl-halide in the presence of a base (Tanigaki N., Masuda H., and Kaeriyama K. Polymer, 38:1221, 1997; Remers M., Schulze M., and Wegner G. Macromol Rapid Commun, 17:239,1996.)

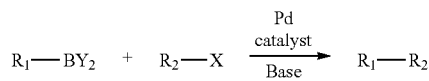

The halide or the boronate can be aryl or vinyl. R1=alkyl, alkenyl, alkynyl, aryl; Y=alkyl, OH, O-alkyl; R2=alkenyl, aryl, alkyl; x+, Cl, Br, I, OTf; Base=Sodium carbonate, Sodium hydroxide, M(O-alkyl), Potassium phosphate tribasic.

The "Stille Coupling Reaction", a palladium-catalyzed coupling between an organostannane and halides or pseudohlaides to form C—C bond with few limitations on the R-groups. (Stille J. K. Angew Chem Int Ed, 25:508, 1986)

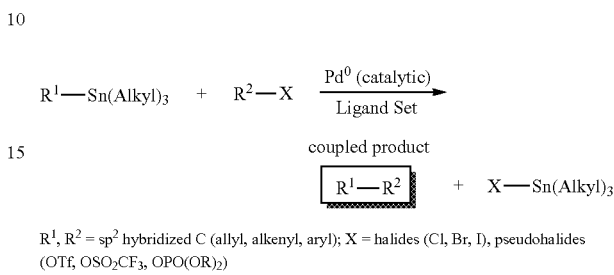

R$^1$, R$^2$ = sp$^2$ hybridized C (allyl, alkenyl, aryl); X = halides (Cl, Br, I), pseudohalides (OTf, OSO$_2$CF$_3$, OPO(OR)$_2$)

Organostannanes are not oxygen or moisture sensitive; however they are toxic and possess low polarity, and are poorly soluble in water.

3. The "Sonogashira-Hagihara Coupling Reaction", is the coupling of terminal alkynes with aromatic bromides or iodides performed in the presence of palladium catalyst a copper (I) co-catalyst and an amine base (Sonogashira K., Tohda Y., and Hagihara N. Tetrahedron Lett, 16:4467,1975).

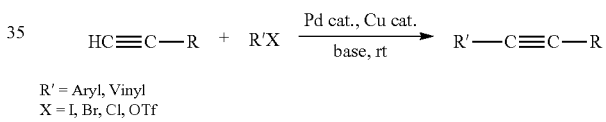

R' = Aryl, Vinyl
X = I, Br, Cl, OTf

4. The "Knoevenagel Reaction" is a base-catalyzed condensation of a dialdehyde and an arene possessing two relatively acidic sites (benzylic protons) (Laue T. and Plagens A. Named Organic Reactions, 2nd Ed. John Wiley and Sons, 1999.; Horhold H. H. and Helbig M. Macromol Chem Macromol Symp, 12:229, 1987)

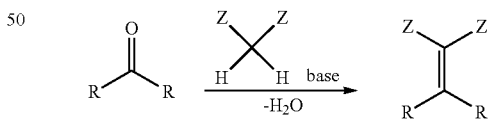

In this reaction the carbonyl group is an aldehyde or a ketone. The catalyst is usually a weakly basic amine. The active hydrogen component has the form Z—CH$_2$—Z or Z—CHR—Z for instance diethyl malonate, Meldrum's acid, ethyl acetoacetate or malonic acid. Z—CHR$_1$R$_2$ for instance nitromethane.

5. N-arylation of carbazoles and iminodiaryl compounds, such as the LiCl-mediated Catalytic CuI reaction reported in Bull. Korean Chem. Soc. 2011, Vol. 32, No. 7 2461, hereby incorporated by reference into this specification. A scheme of this reaction is shown below:

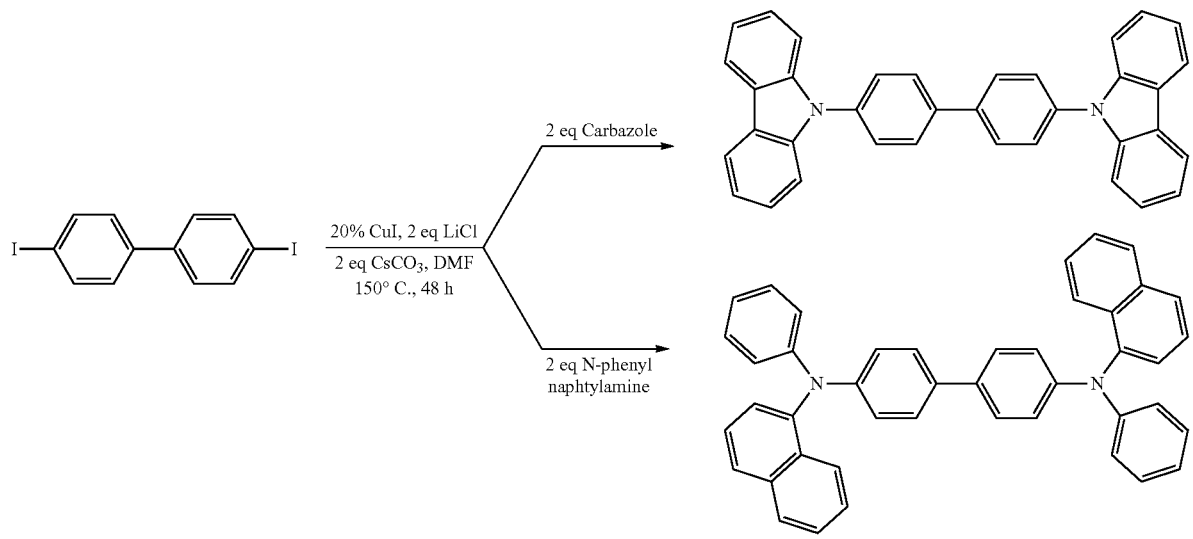

A preferred cross-coupling reaction is the "Suzuki". It has the following advantages:

1. the reaction occurs at mild reaction conditions (i.e low temperature, atmospheric pressure);
2. the reaction may use widely available common boronic acids;
3. inorganic by-products are easily removed from reaction mixture;
4. the reaction is steroselective;
5. the reaction is less toxic than other competitive methods; and
6. the reaction will take place in the presence of other functional groups, i.e group protecting is not always necessary;
7. the reaction makes use of relatively cheap reagents, the reaction is easy to prepare, and the reaction is "green."

Many palladium catalysts and precursors have been developed for the Suzuki reaction and are commercially available from vendors like Aldrich. Specific catalysts examples include:

air stable catalysts such as:
palladium(II) acetylacetonate

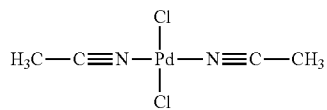

bis(acetonitrile)dichloropalladium(II),

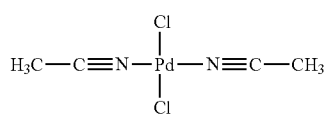

Palladium(II) trifluoroacetate

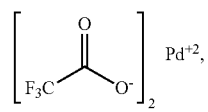

tris(dibenzylideneacetone)dipalladium(0)

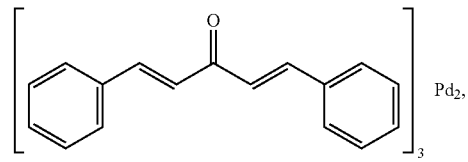

trichlorobis(tricyclohexylphosphine)palladium(II),

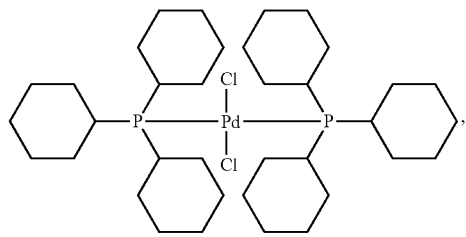

Bis(di-tert-butyl(4-dimethylaminophenyl)phosphine)dichloropalladium(II)

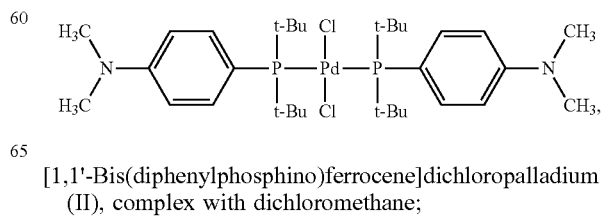

[1,1'-Bis(diphenylphosphino)ferrocene]dichloropalladium (II), complex with dichloromethane;

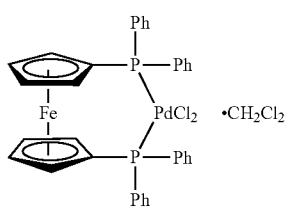

and air or moisture sensitive catalysts:
Bis(triphenylphosphine)palladium(II) dichloride

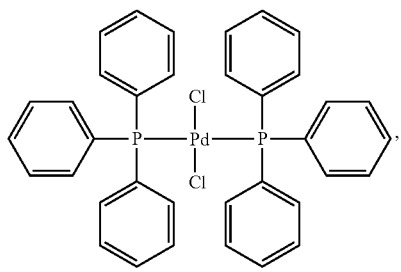

Tetrakis(triphenylphosphine)palladium(0)

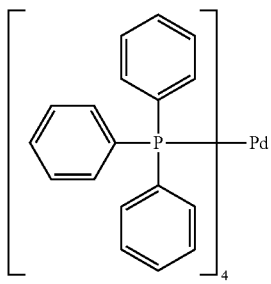

Bis(dibenzylideneacetone)palladium(0)

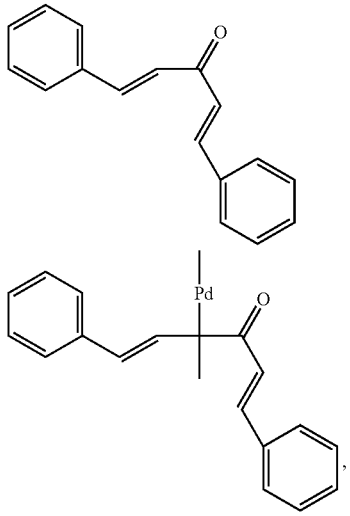

Dichlorobis(tri-o-tolylphosphine)palladium(II)

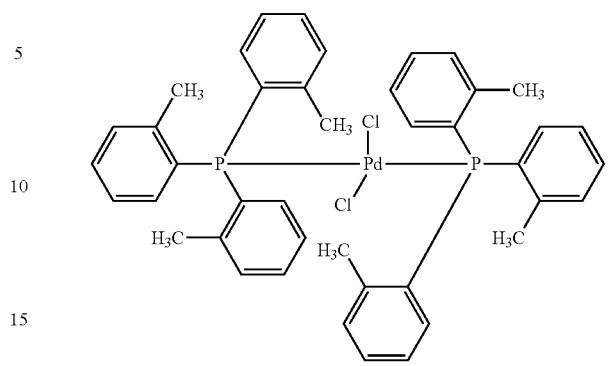

The molecular glass mixture made by the Suzuki reaction comprises at least two nonpolymeric, thermoplastic compounds, each thermoplastic compound independently conforming to the structure:

$$(R^1Y^1)_p[(Z^1Y^2)_m R^2Y^3]_n Z^2 4 R^3$$

wherein m is zero or one; n is the number of recurring units in the compound, and is zero up to, but not including, an integer at which said compound starts to become a polymer; p is an integer of from one to eight; each $R^1$ and $R^3$ is independently a monovalent aliphatic or cycloaliphatic hydrocarbon group having 1 to 20 carbon atoms, an aromatic group or a multicyclic aromatic nucleus; $R^2$, $Z^1$ and $Z^2$ each independently represent multivalent aliphatic or cycloaliphatic hydrocarbon groups having 1 to 20 carbon atoms or an aromatic group; $Y^1$, $Y^2$, $Y^3$ and $Y^4$ each independently represent a triple bond, a double bond, or a single bond link.

The multivalent aromatic nucleus starting material of this invention can be a multi-halide or a multi-boronates.

Specific examples of acceptable multi-halides include:

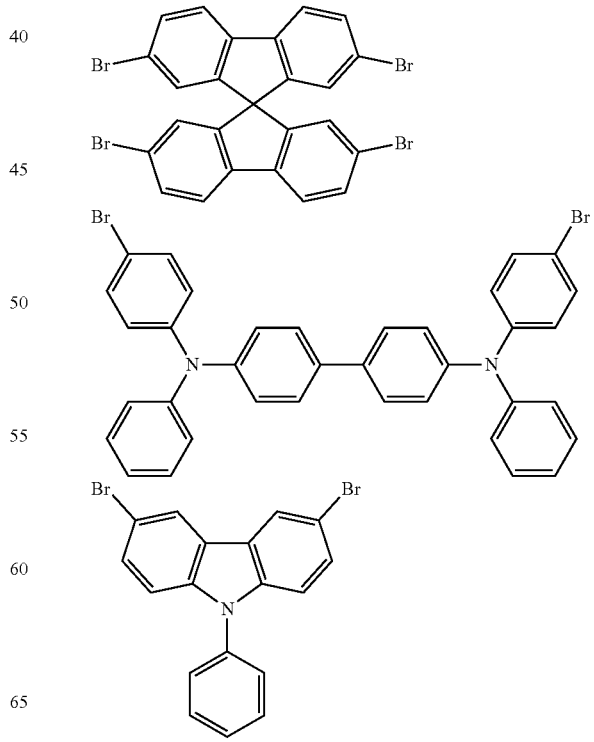

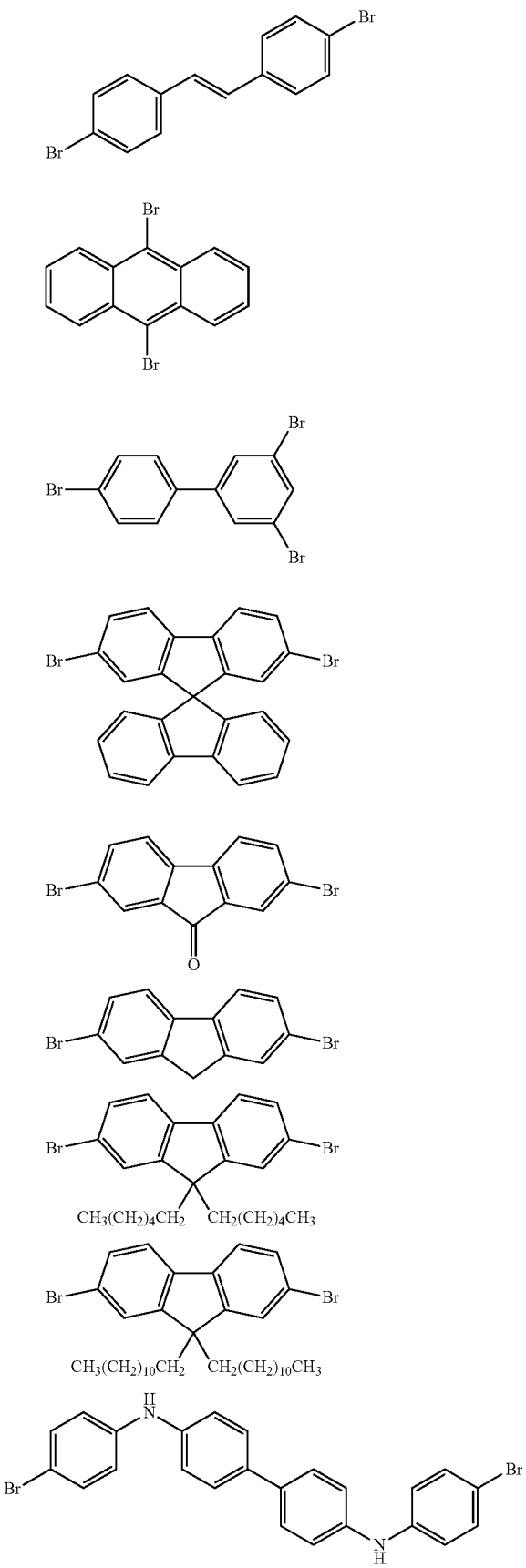
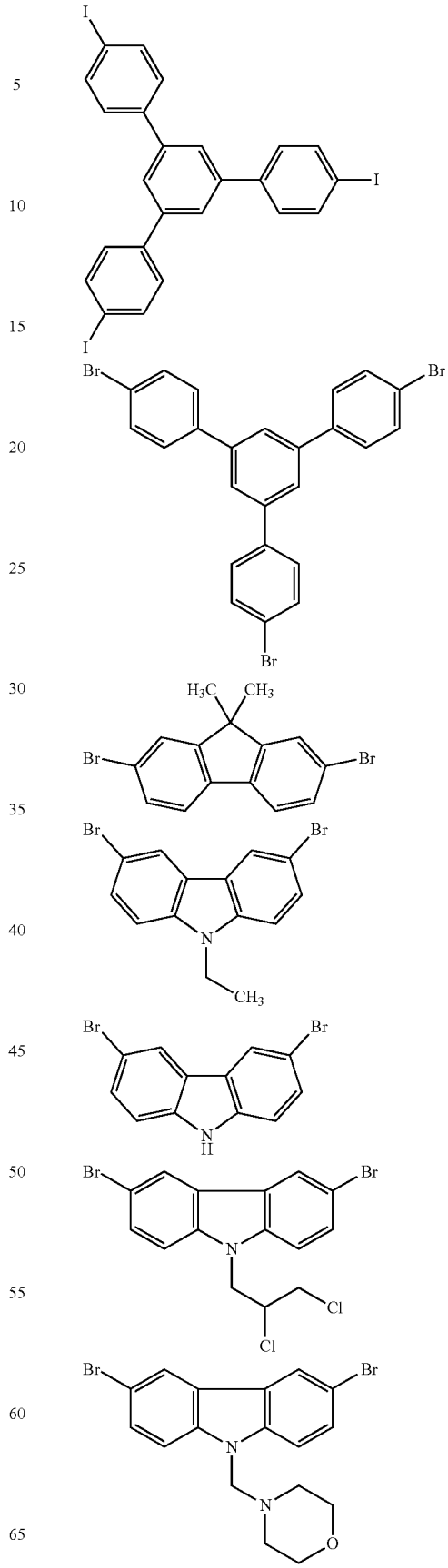

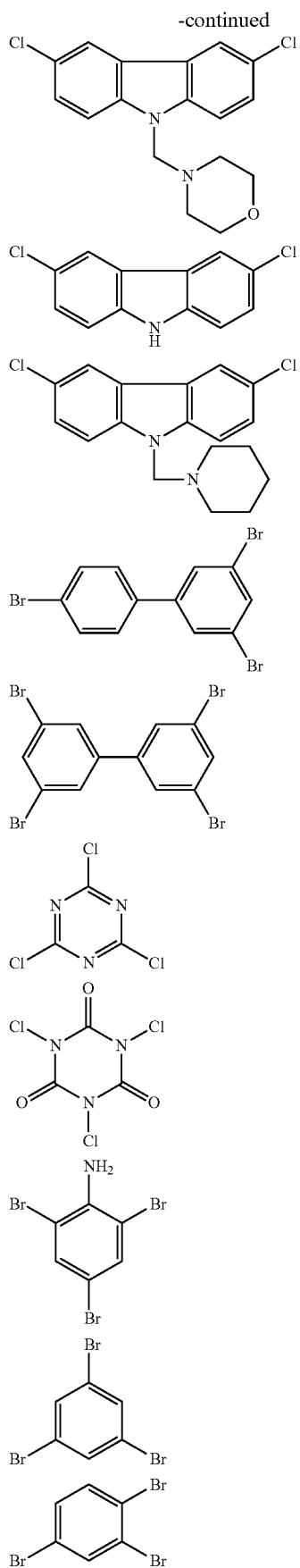
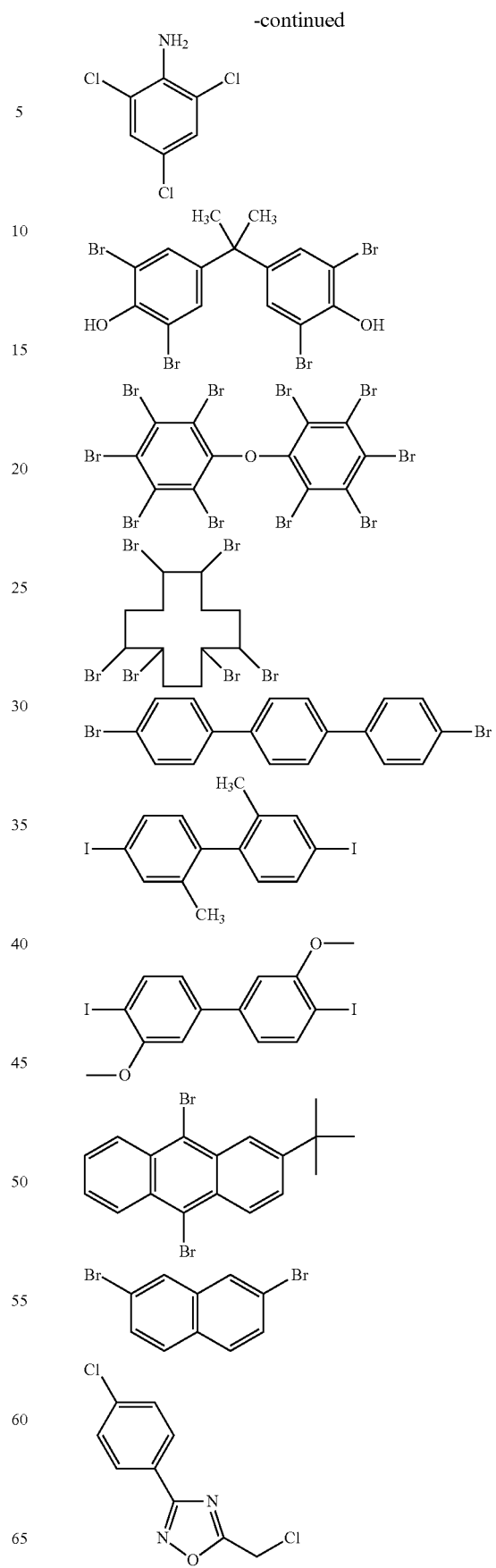

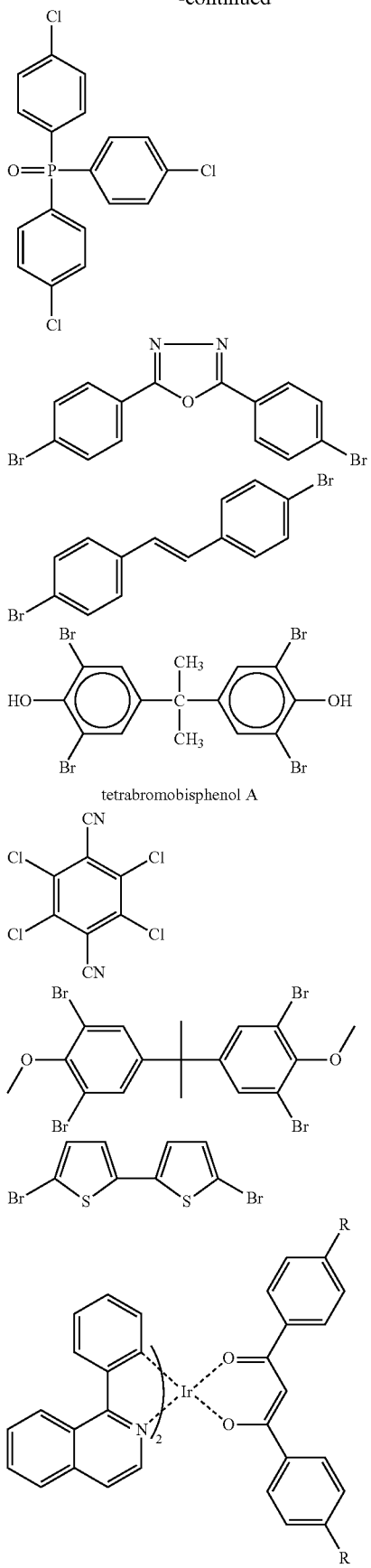
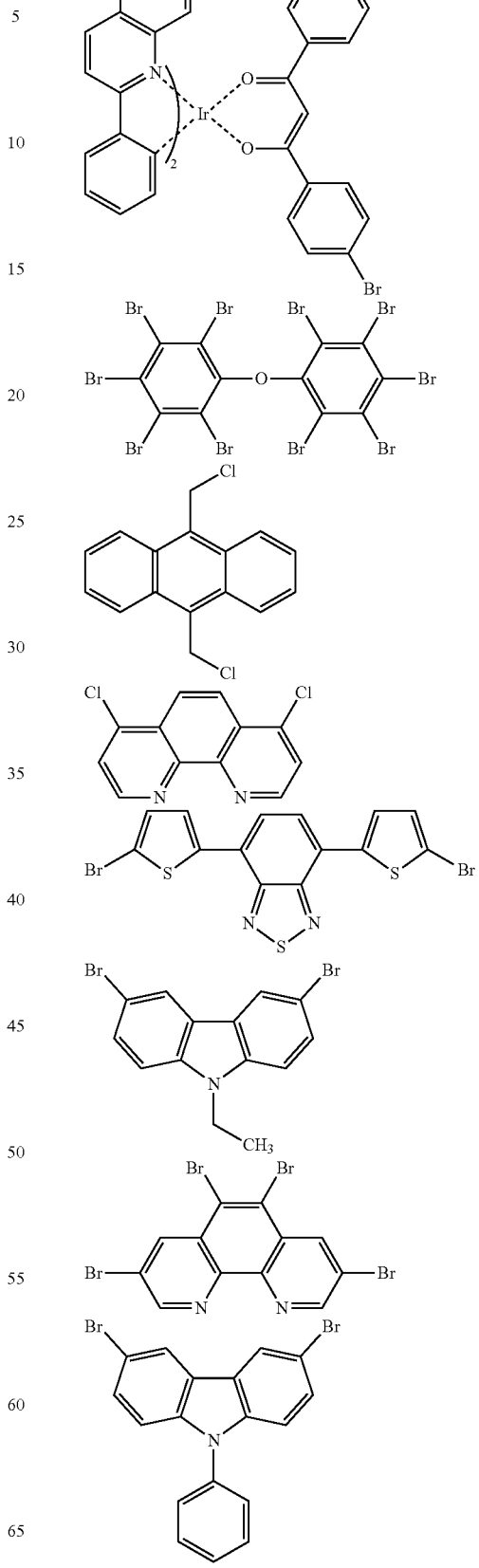

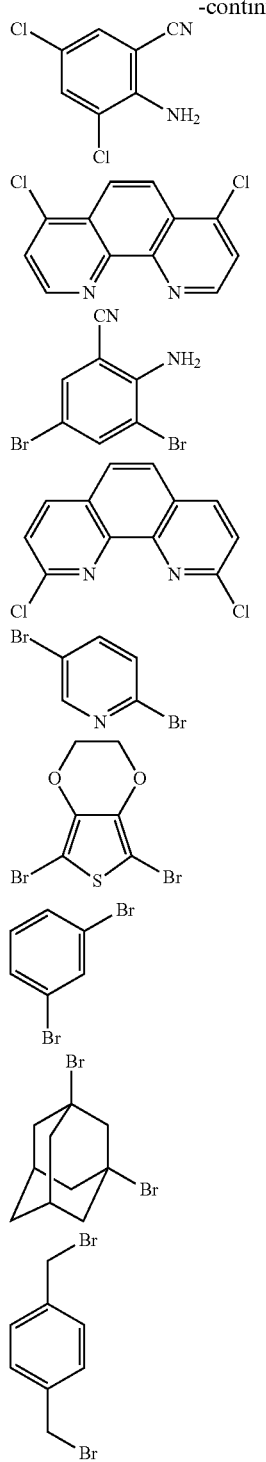
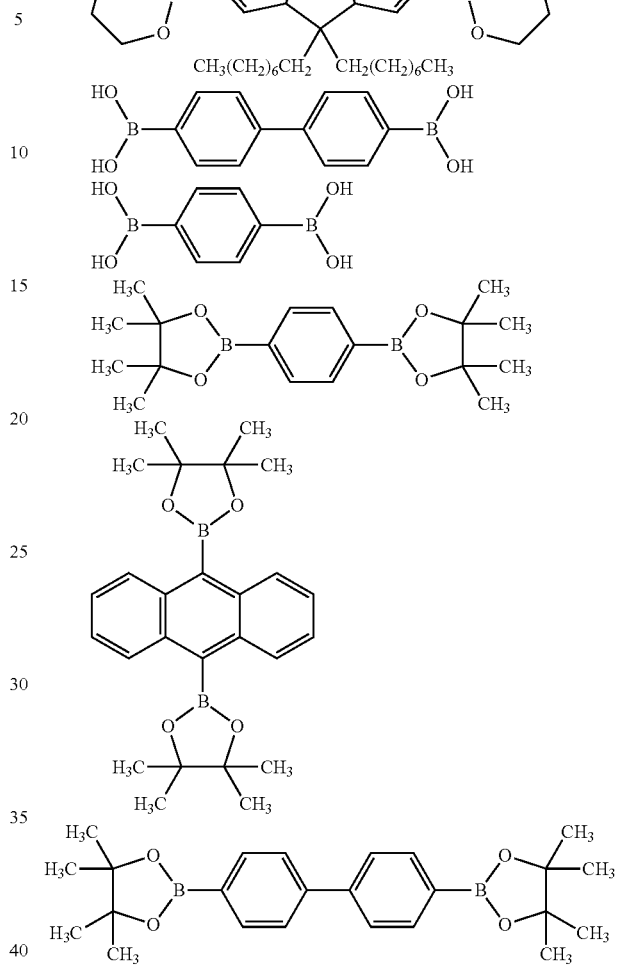
Specific examples of multiboronates include:
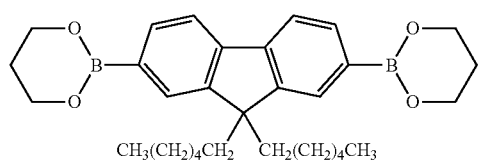
The dihalogenated iridium complexes reported in J. AM. CHEM. SOC. 2006, 128, 6647-6656:
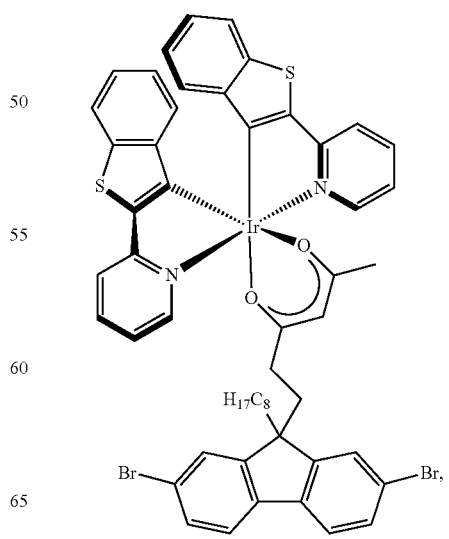

-continued
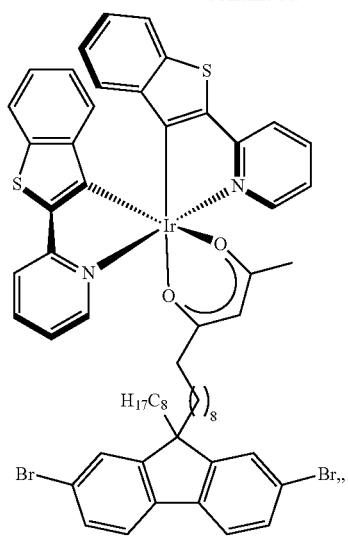
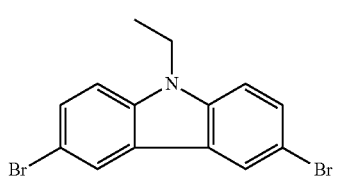
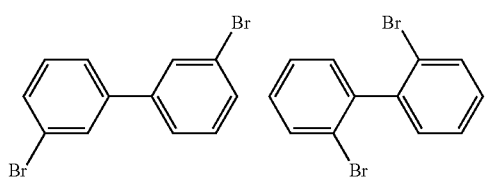
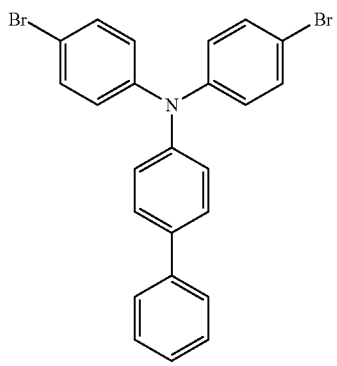
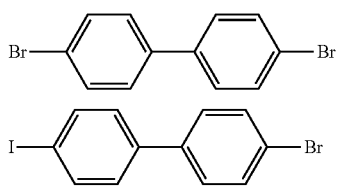
Examples of acceptable monovalent halides include:
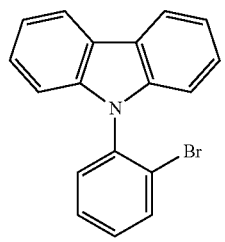
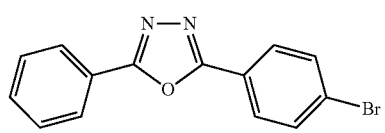
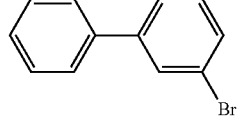
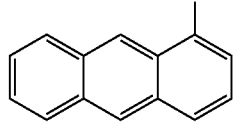
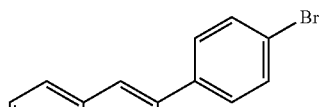
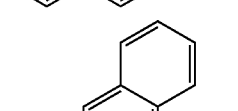
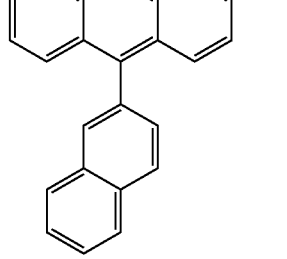
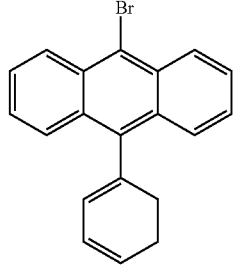

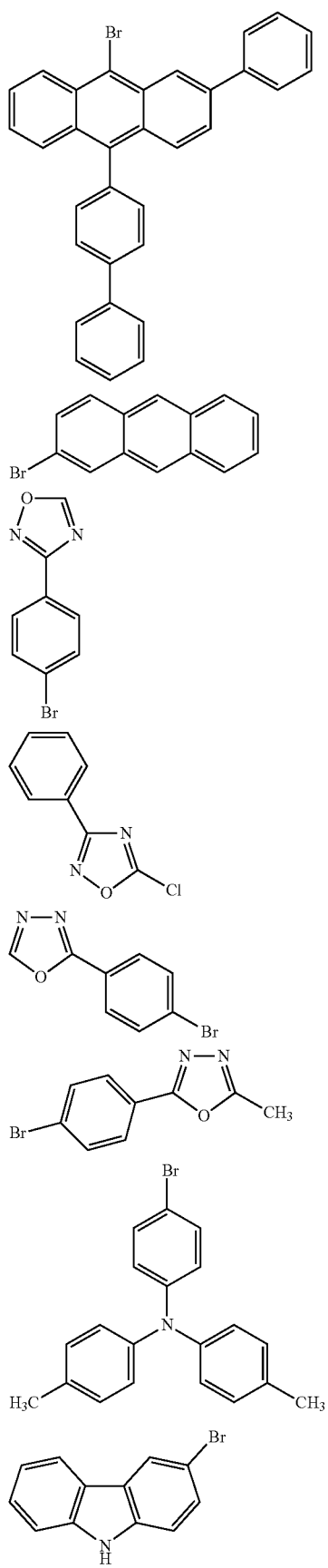
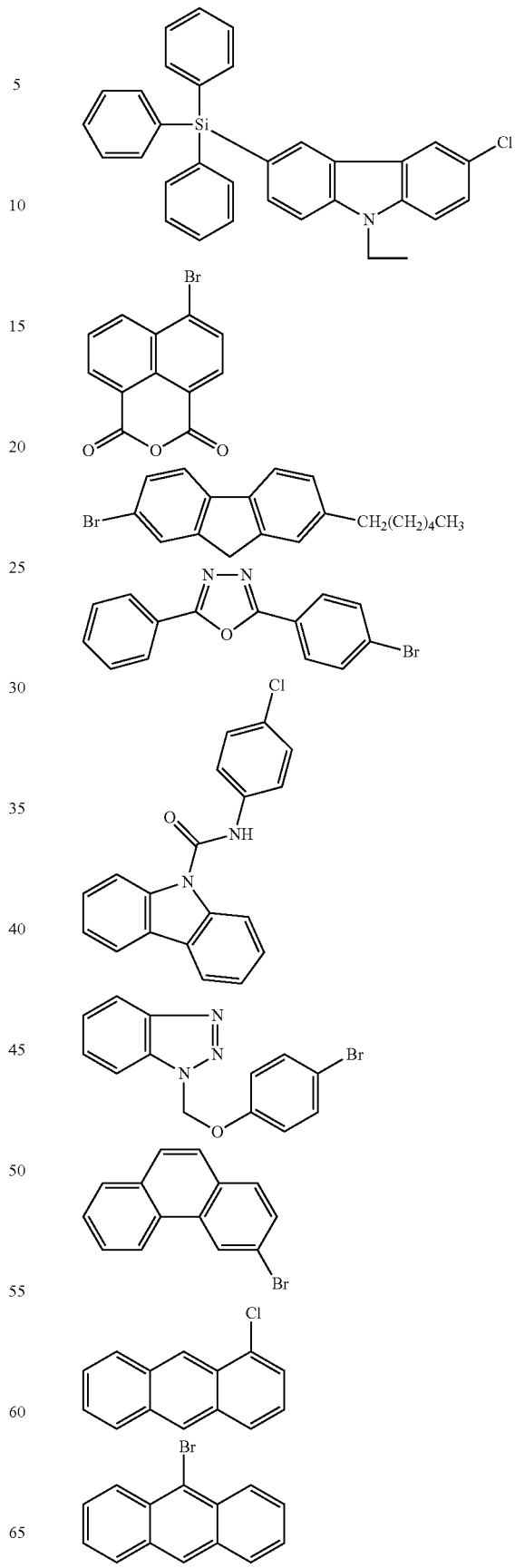

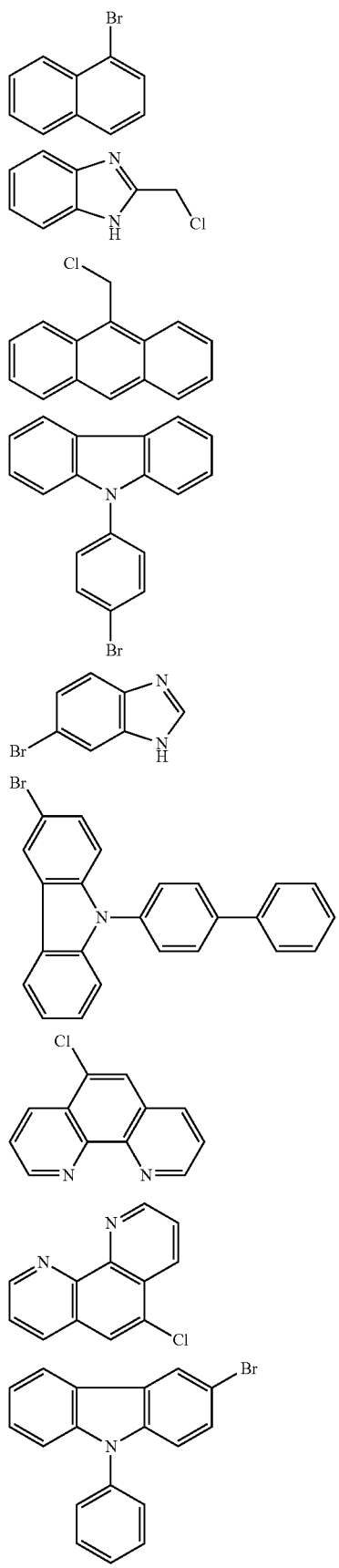
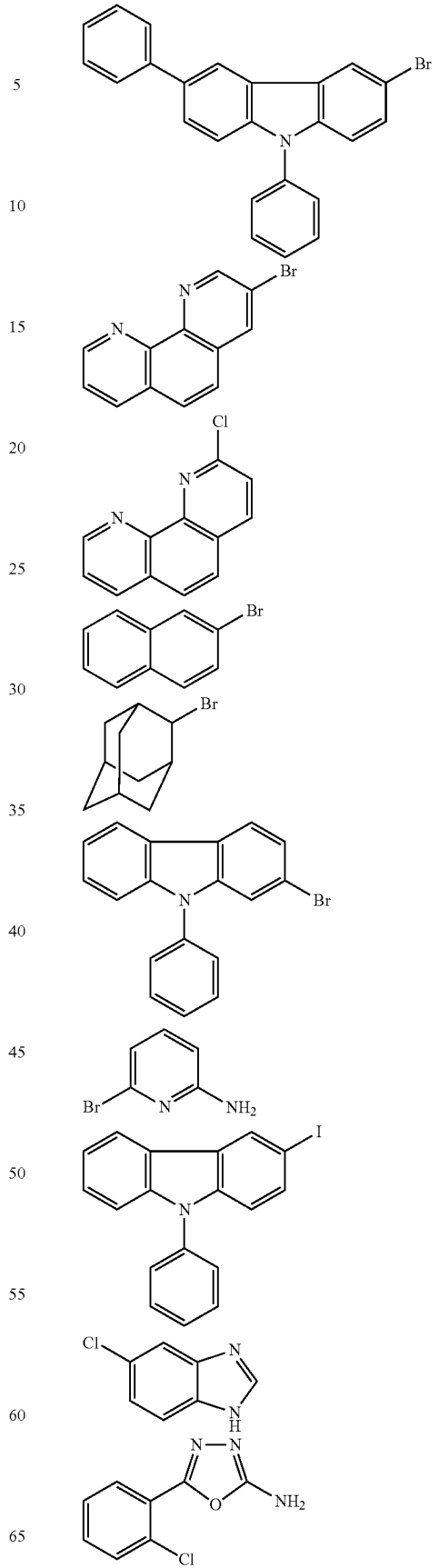

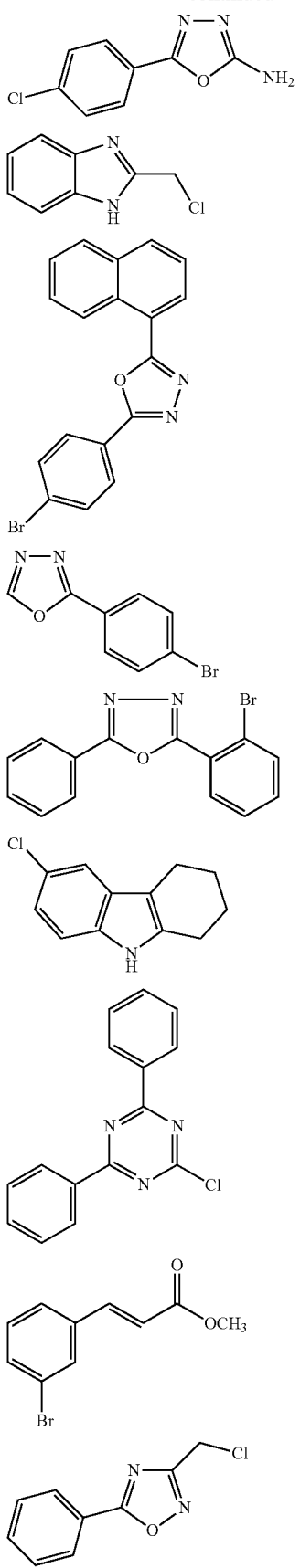
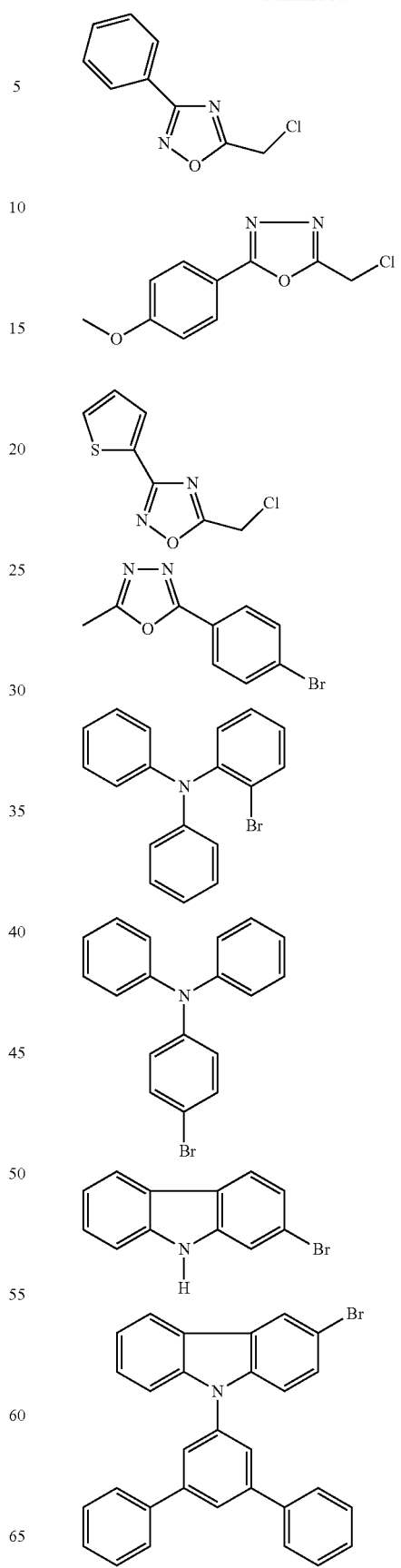

-continued
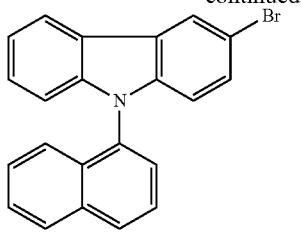
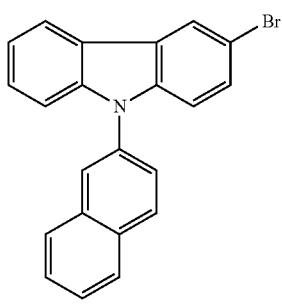
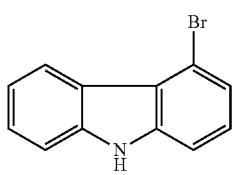
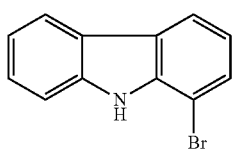
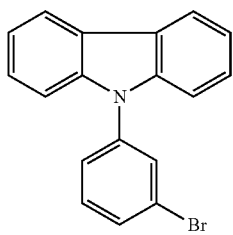
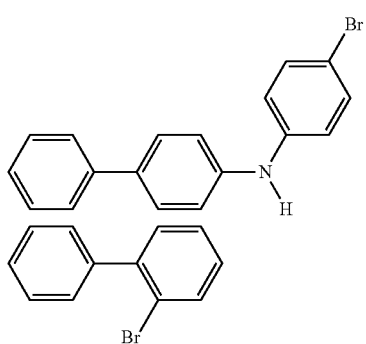
-continued
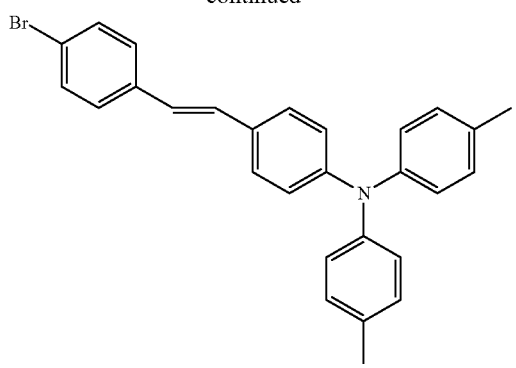
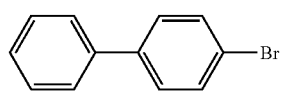
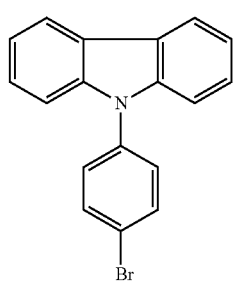
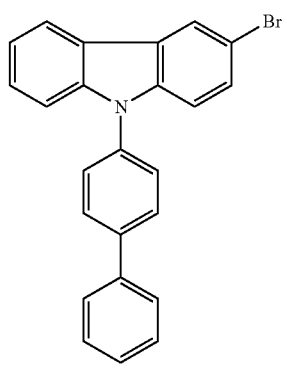
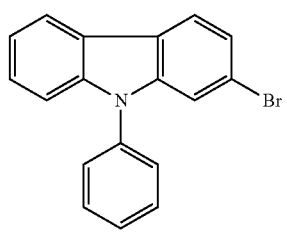

33
-continued
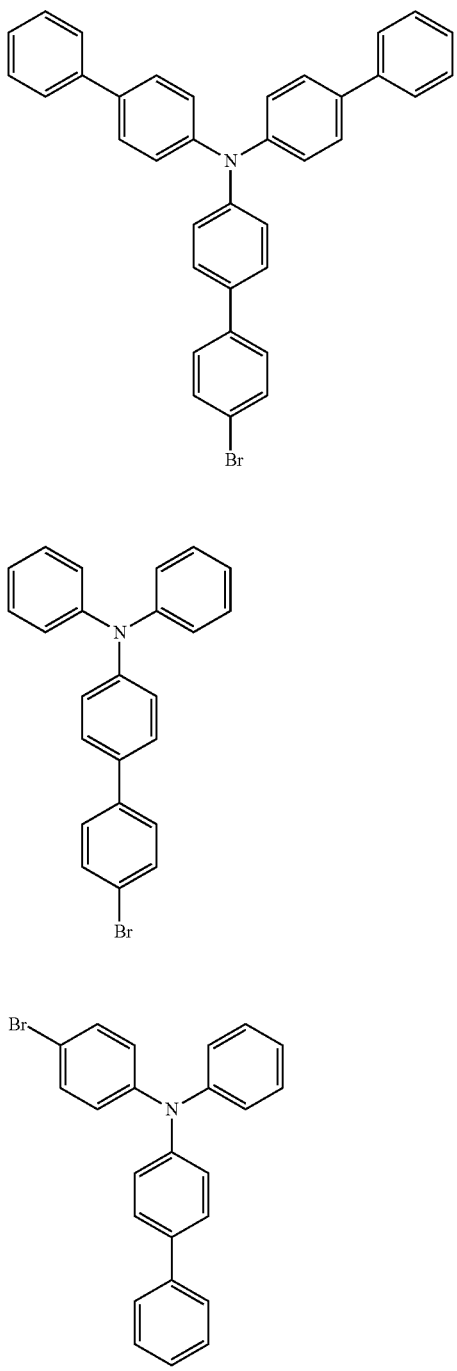
Example for specific monovalent boronic acids include:
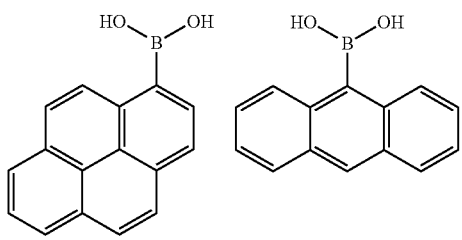
34
-continued
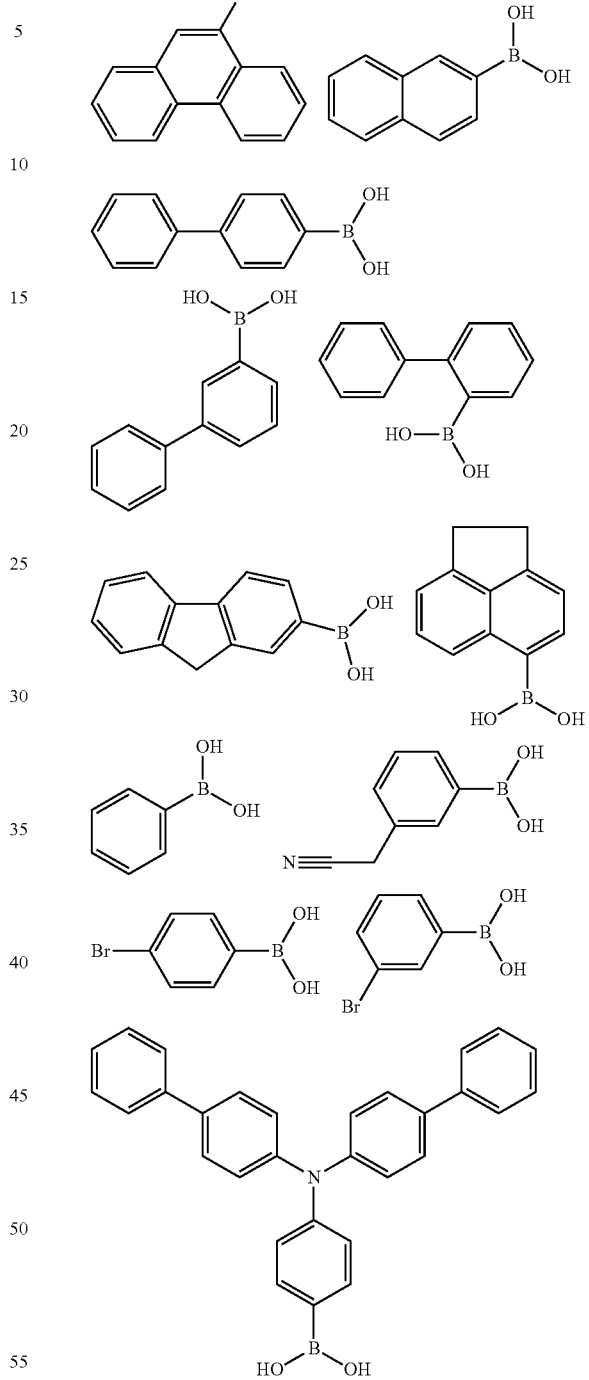
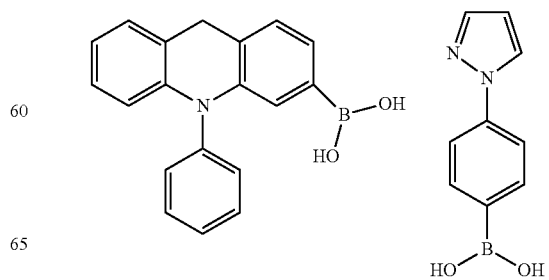

-continued

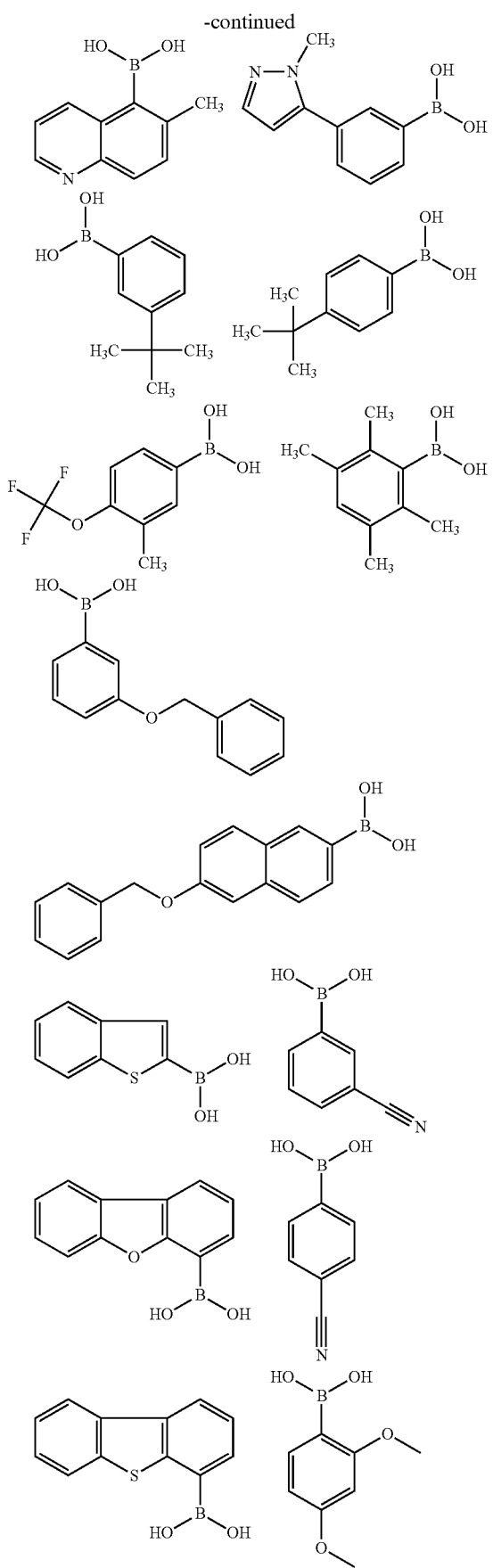

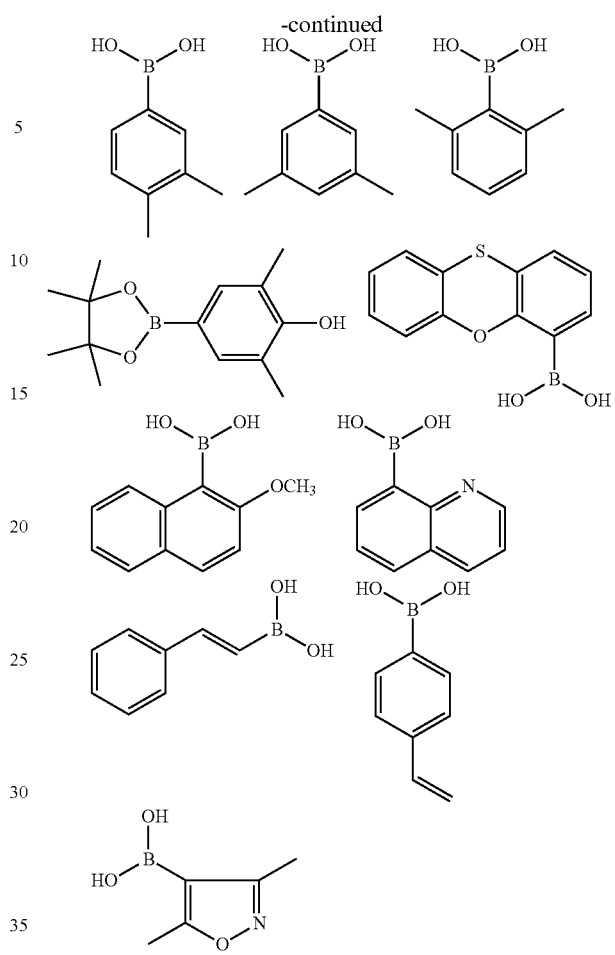

Another preferred coupling reaction is the Heck reaction. The advantages of the Heck reaction include:
1. the reaction can be assisted by microwave energy;
2. the reaction is phosphine-free using phosphine-free Pd(OAc)$_2$—Guanidine catalyst;
3. the reaction is compatible with a wide range of chemical functionalities;
4. regioselectivity can be controlled by the reaction conditions, by the substituents on the arylene component, by living groups and by the choice of olefinic component; and
5. the reaction has very few side reactions.

Many of the catalysts used for the Suzuki reaction are used for the Heck reaction, including those listed in the description of the Suzuki reaction provided above.

Specific examples of multi-olefin include:

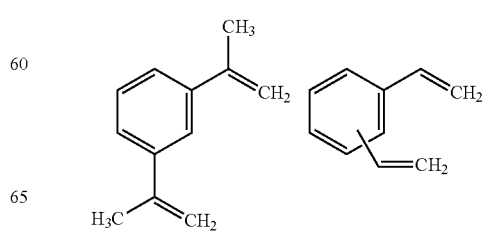

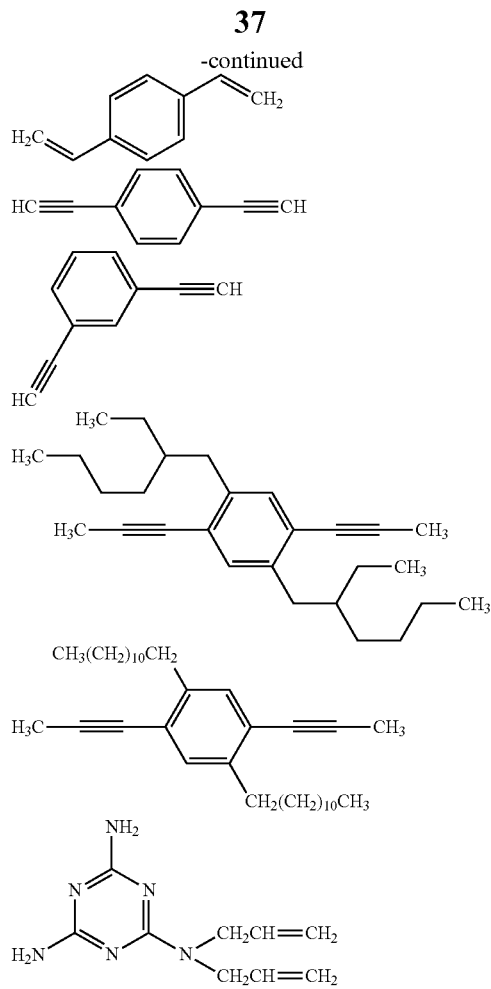
the distyrylhexylmetyylsilane reported in *macromolecules*, Vol 35, No 18, 2002 by Lee et al,
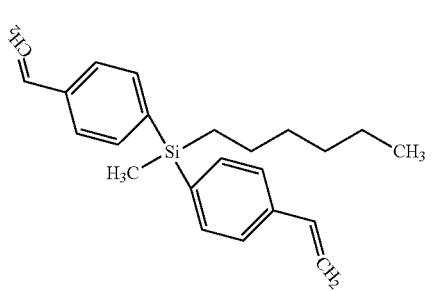 [SMILES: C=Cc1ccc([Si](C)(CCCCCC)c2ccc(C=C)cc2)cc1]
Specific examples of monovalent olefins include:
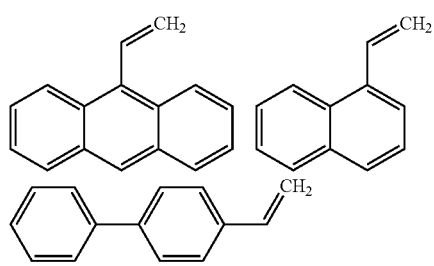
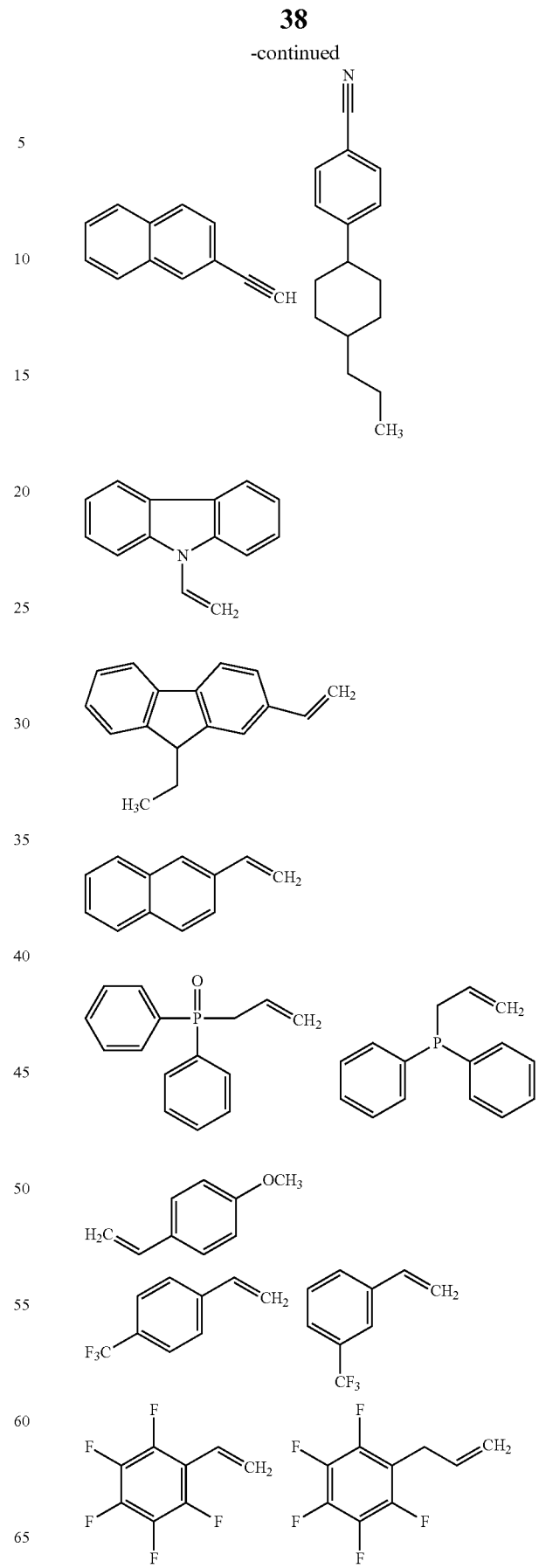

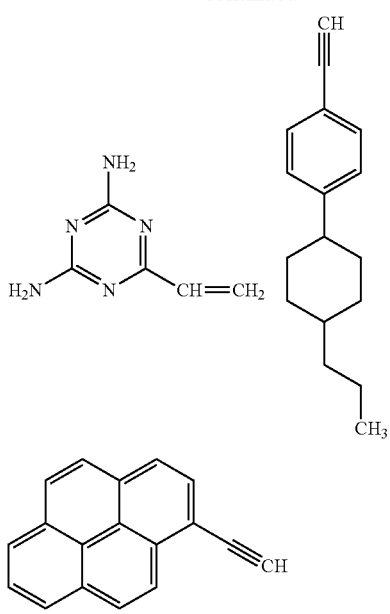

Another useful reaction of the invention is the N-arylation of carbazoles and iminoaryls. Examples of H-carbazoles and iminodiarylenes include:

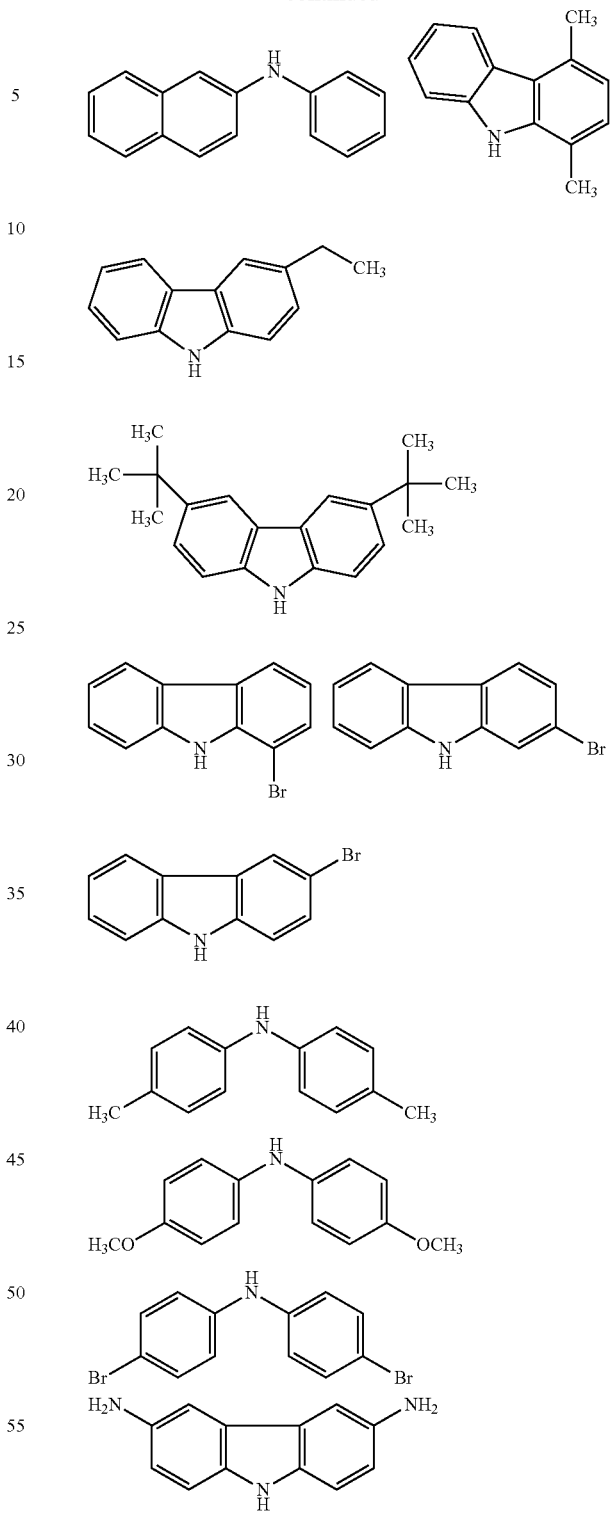

In one variation of the invention, dihalide and monohalide intermediates are prepared by reacting mono-anhydrides or di-anhydrides with halide-substituted mono-amino hole-transporting or electron-transporting moieties, or halide substituted mono-anhydrides with diamino hole-transporting or electron-transporting moieties, in the presence of an acid acceptor such as pyridine, picoline, or quinolone.

Examples of mono-anhydrides and di-anhydrides include:
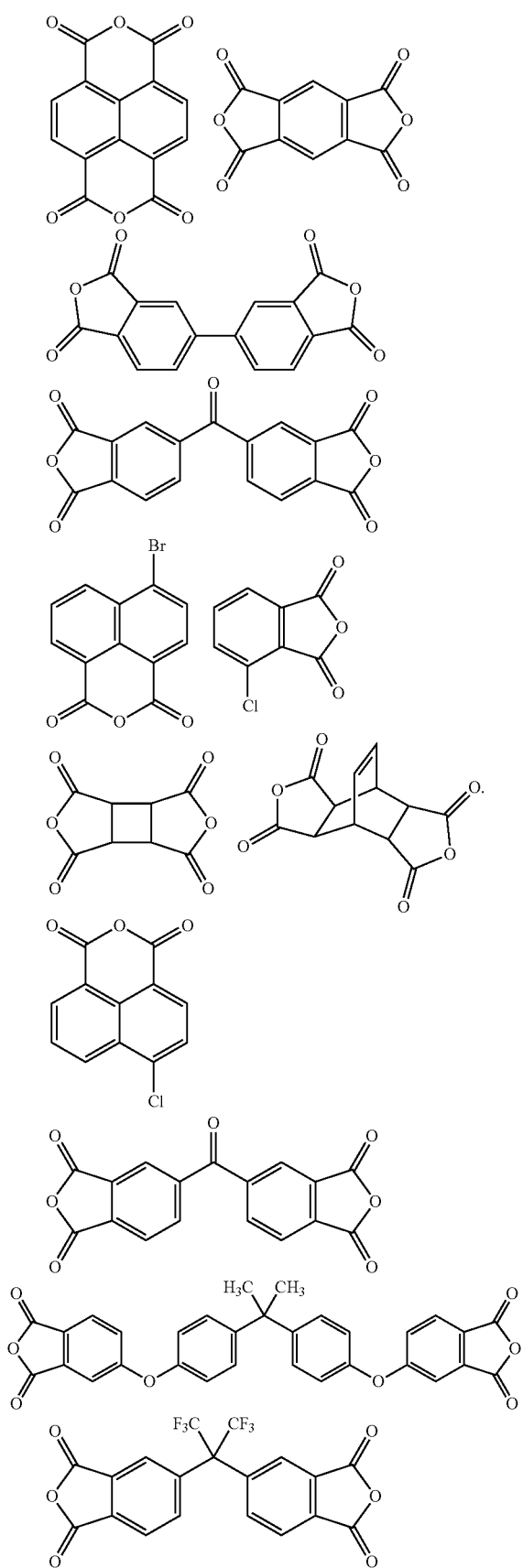
Examples of halide-substituted mono-amino hole or electron-transporting, or fluorescence moieties include:
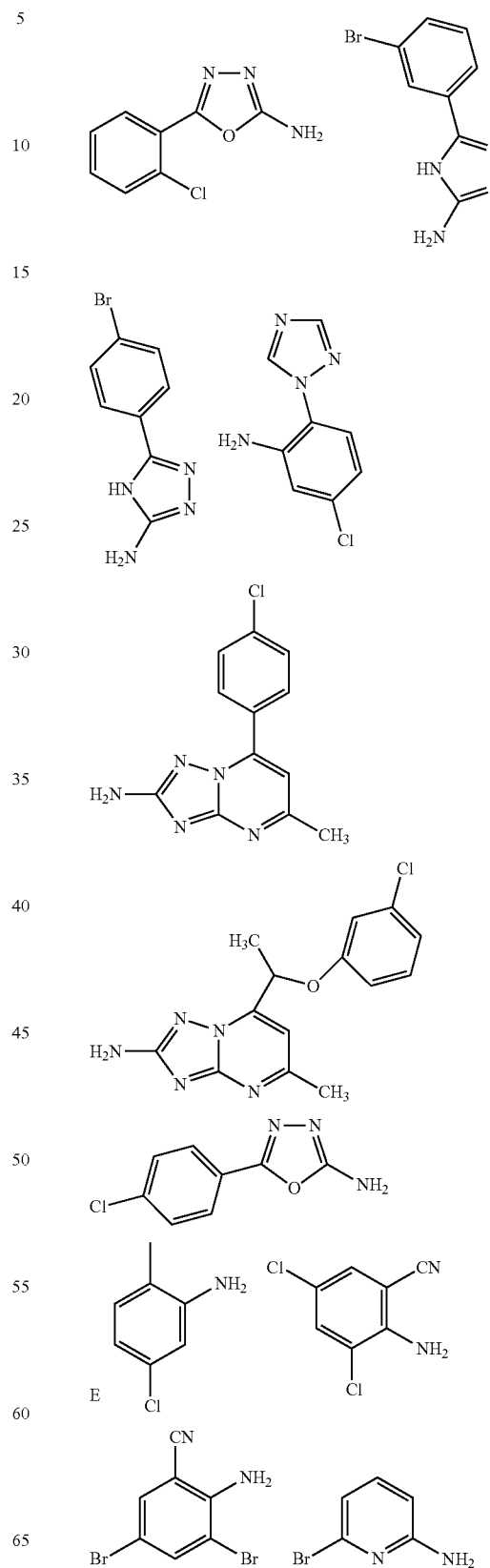

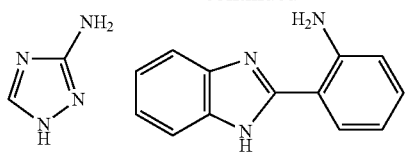
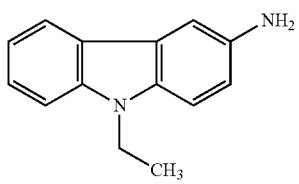
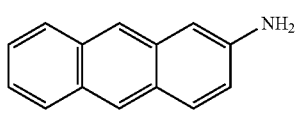
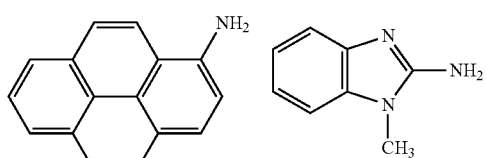
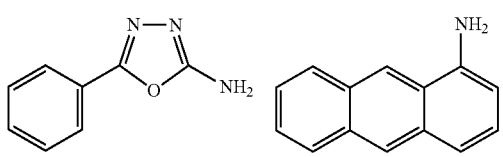
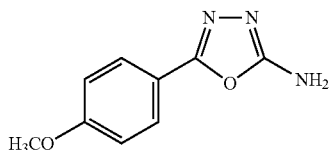
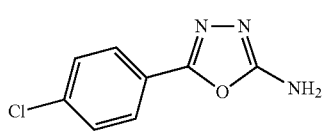
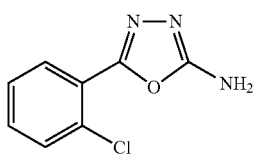
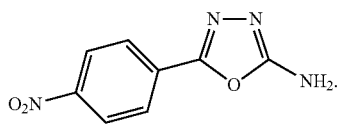
Examples of diamino hole or electron transport or fluorescence moieties include:
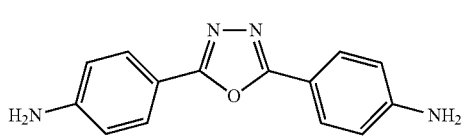
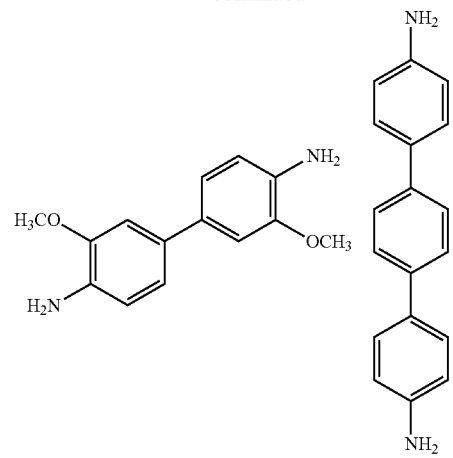
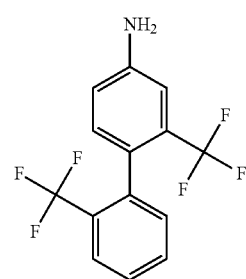
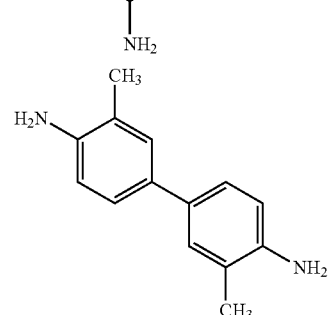
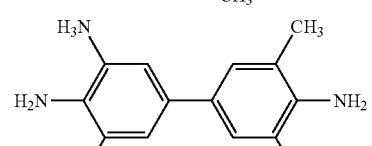
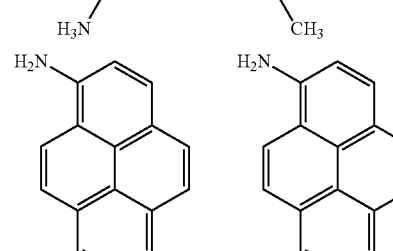
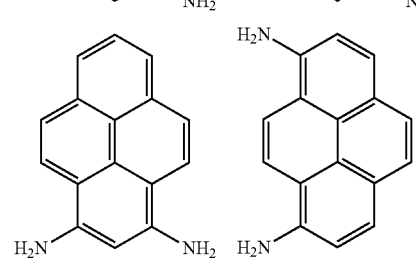

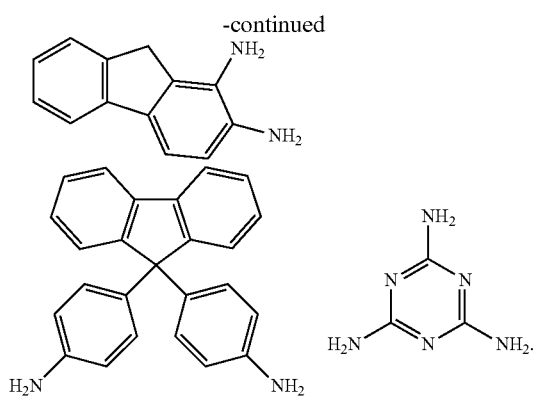
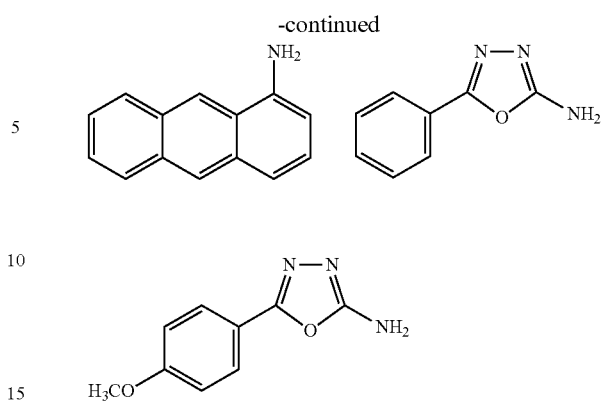
Examples of mono-amino hole or electron transport moieties include:
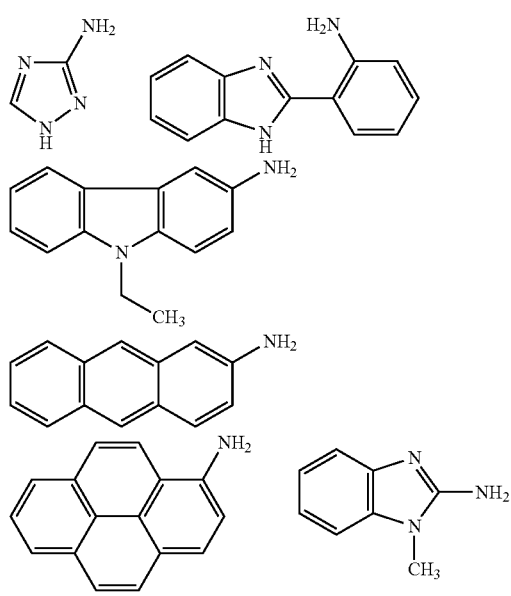
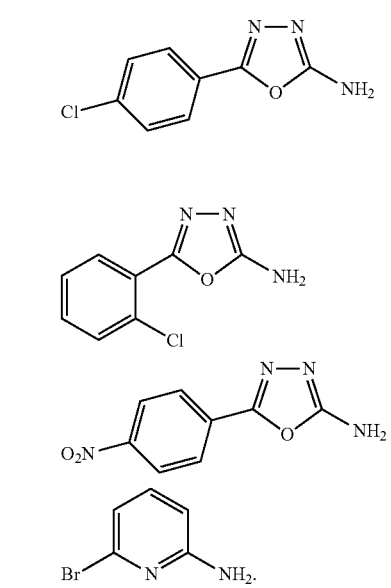
Examples of intermediates prepared from the above materials include:
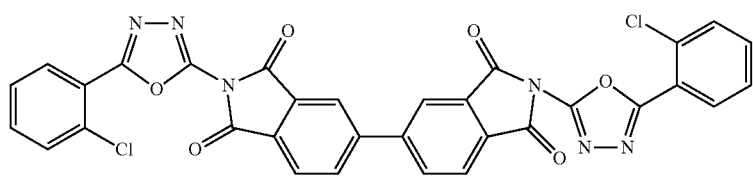
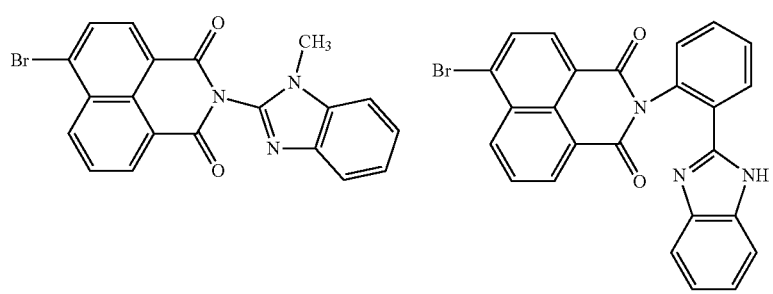

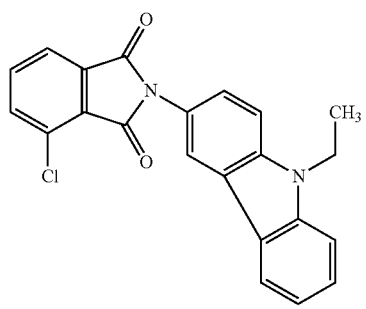
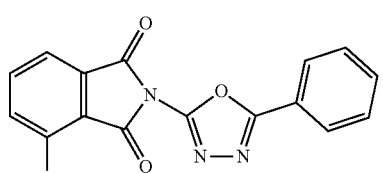
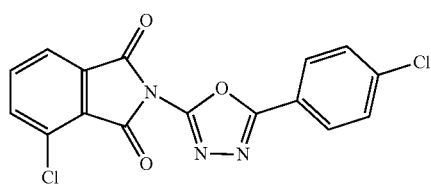
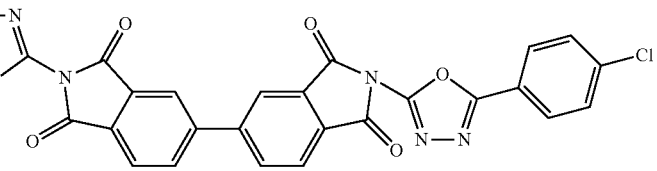
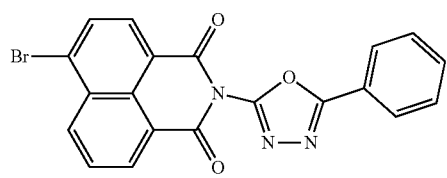
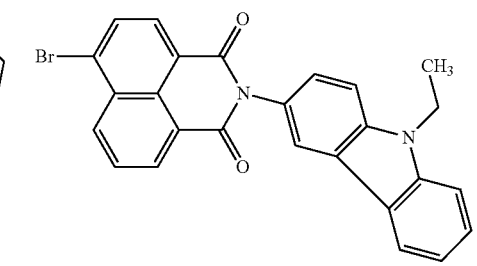
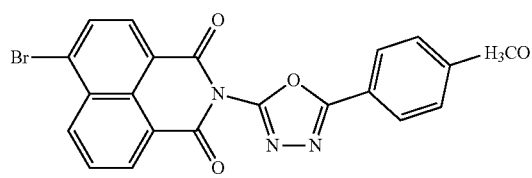
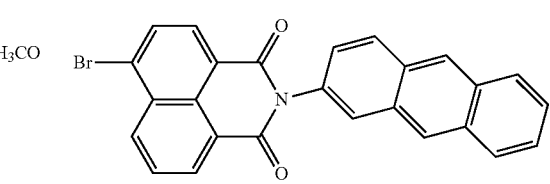
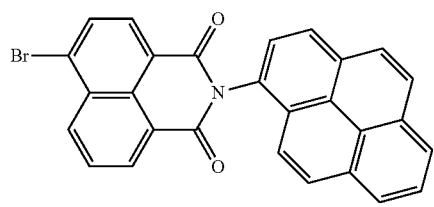
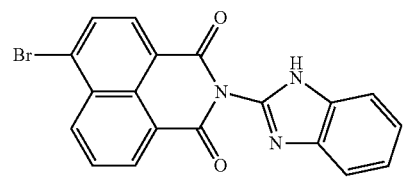
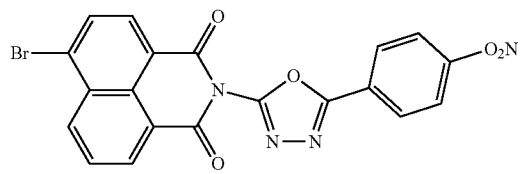
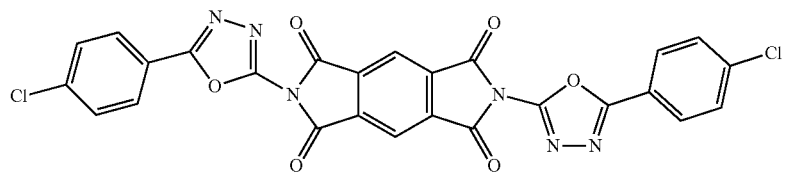

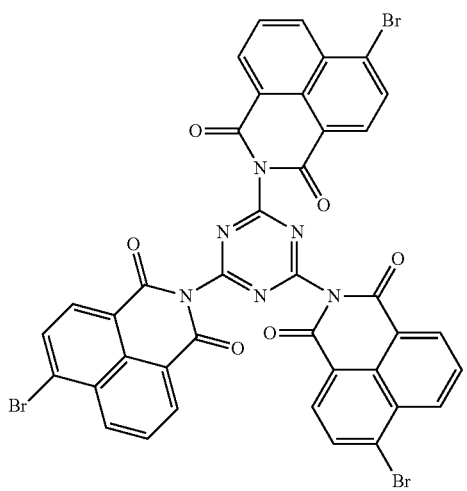
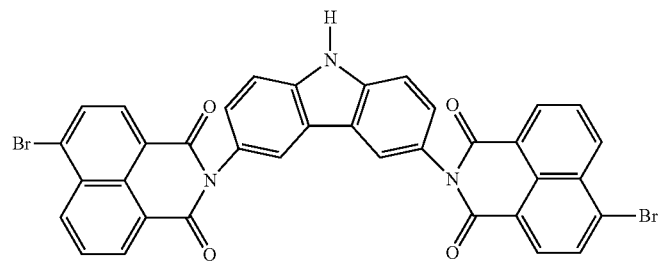

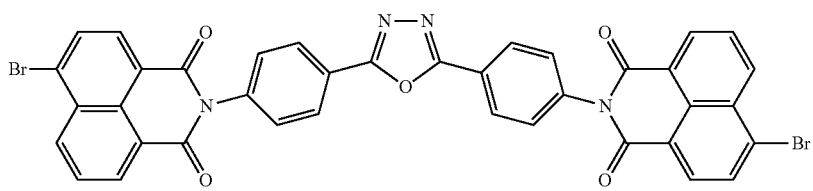

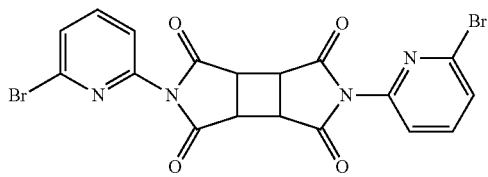

In the first preferred embodiment of the present invention, charge-transporting molecular glass mixtures, luminescent molecular glass mixtures, or combinations thereof comprise at least two nonpolymeric, thermoplastic compounds, each thermoplastic compound independently conforming to the structure of Formula (I)

$((R^1Y^1)_p[(Z^1Y^2)_mR^2Y^3]_nZ^2{}^4R^3)$:

wherein m is zero or one;

n is the number of recurring units in the compound, and is zero up to, but not including, an integer at which said compound starts to become a polymer;

p is an integer of from one to eight;

each $R^1$ and $R^3$ is independently a monovalent aliphatic or cycloaliphatic hydrocarbon group having 1 to 20 carbon atoms, an aromatic group or a multicyclic aromatic nucleus; and $R^2$, $Z^1$ and $Z^2$ each independently represent multivalent aliphatic or cycloaliphatic hydrocarbon groups having 1 to 20 carbon atoms or an aromatic group where at least one of each $R^2$, $Z^1$ and $Z^2$ is independently a multivalent charge transporting moiety, a multivalent luminescent moiety, or a combination thereof; and $Y^1$, $Y^2$, $Y^3$ and $Y^4$ each independently represent a triple bond, a double bond, or a single bond link;

provided that at least one of $R^1$, $Z^1$, $R^2$, $R^3$ and $Z^2$ of Formula (I) is a charge-transporting moiety and the glass transition temperature (Tg) of the mixture is above 20 C.

The multivalent charge-transporting moiety, the multivalent luminescent moiety, and combinations thereof of this invention can be hole-transporting, electron-transporting, luminescent, or combinations thereof. Examples of hole-transporting moieties include triarylamines, N-substituted-carbazole, arylalkanes, hydrazones, pyrazolines and others known in the art. Electron-transporting moieties include diphenoquinones, bisimides, oxadiazoles, triazoles, imidazoles, oxazoles, thiazoles, thiadiazoles, triazines, quinolones, quinoxalines, anthrazolines, phenanthrolines, siloles, and others known in the art.

Specific examples of multivalent charge transporting materials for cross coupling reactions include:

51 52
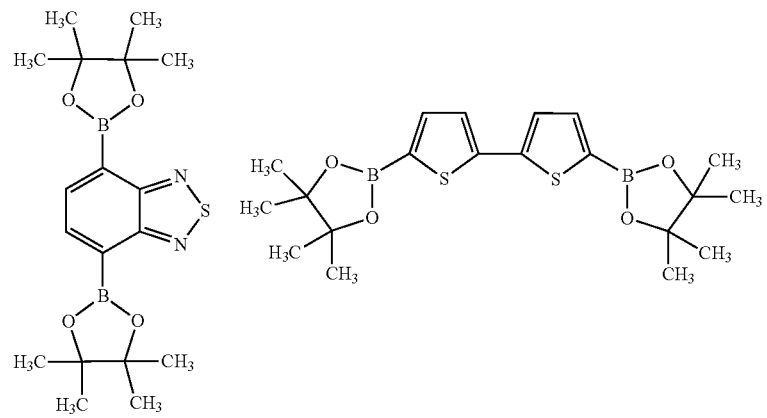
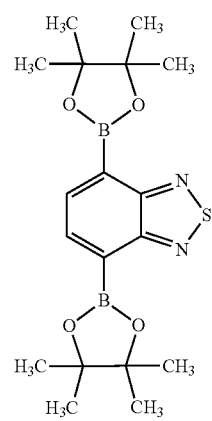
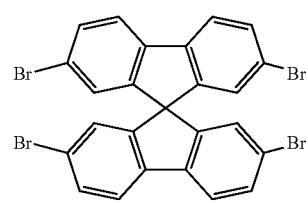
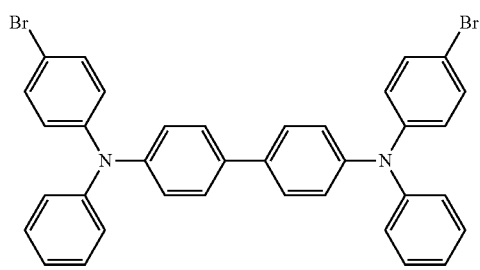
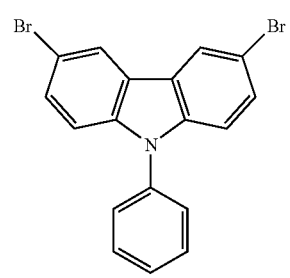
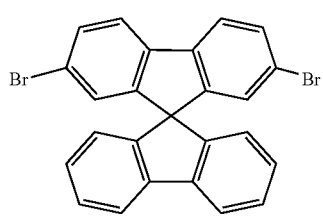
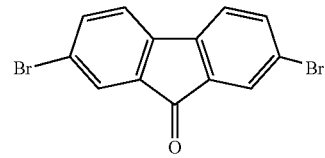
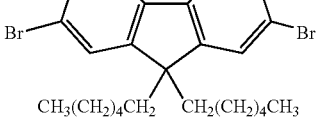
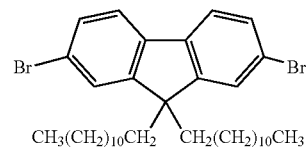
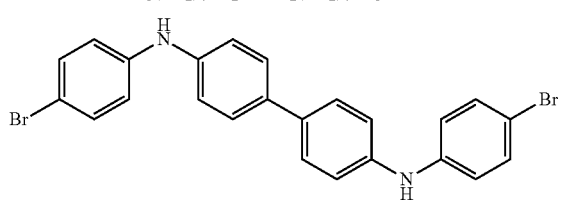
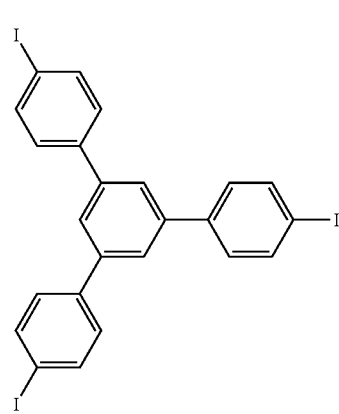
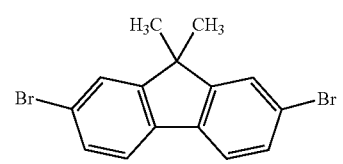

-continued
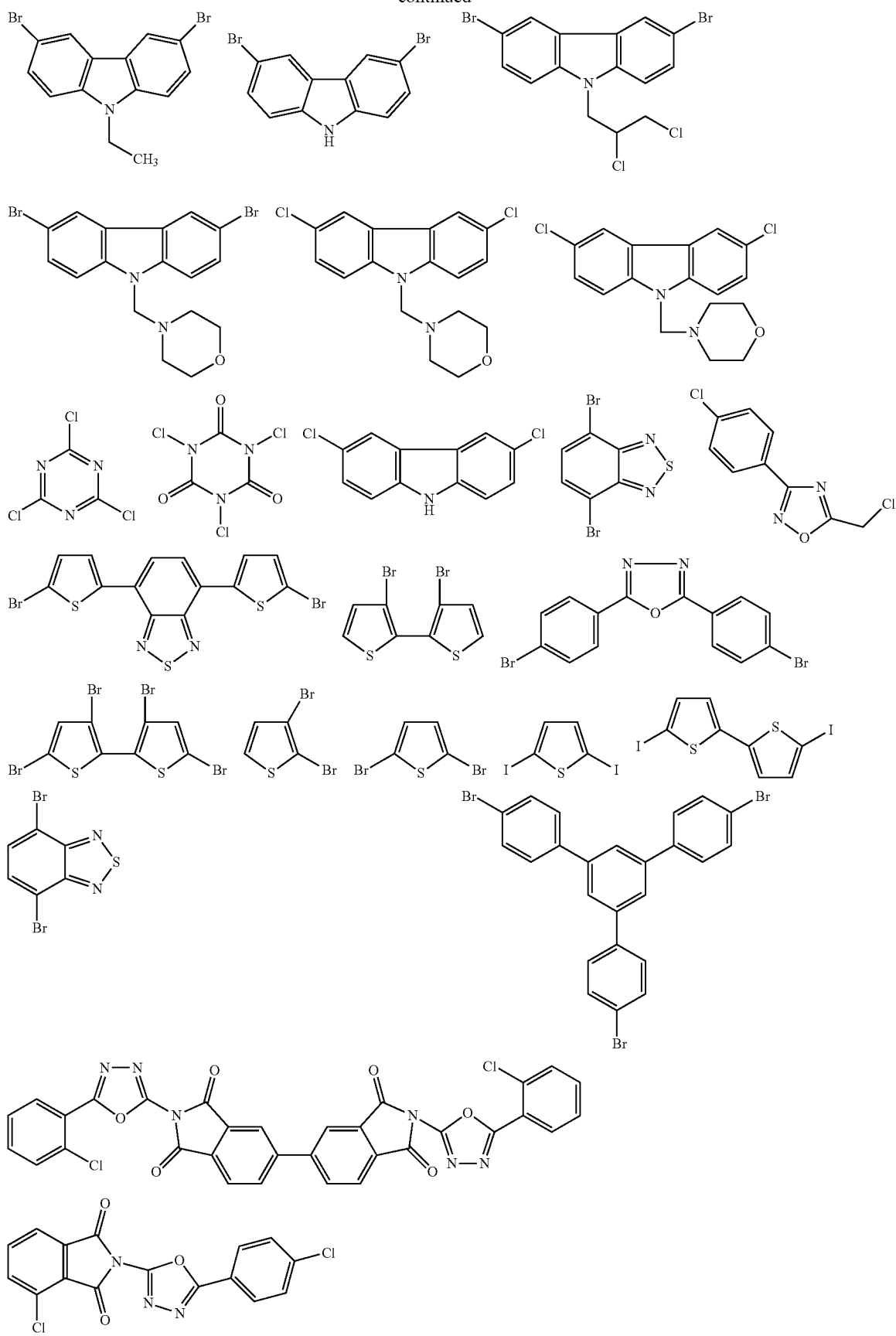

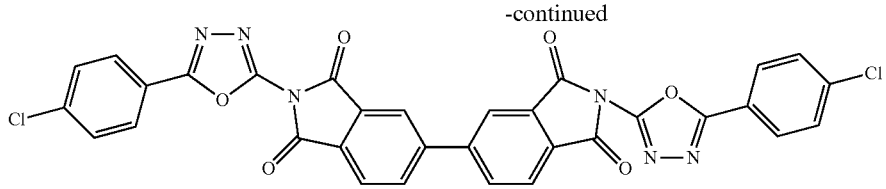
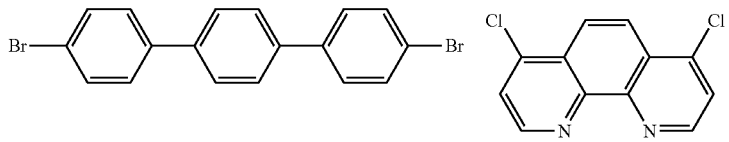
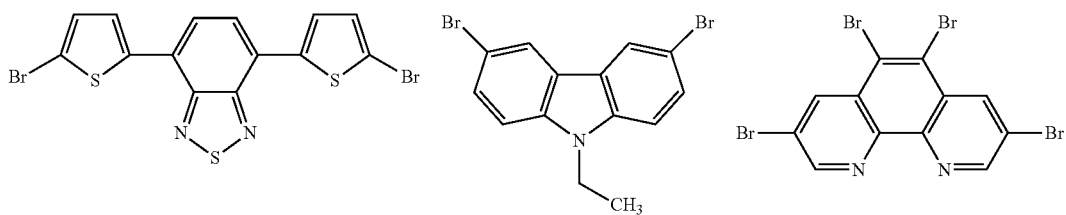
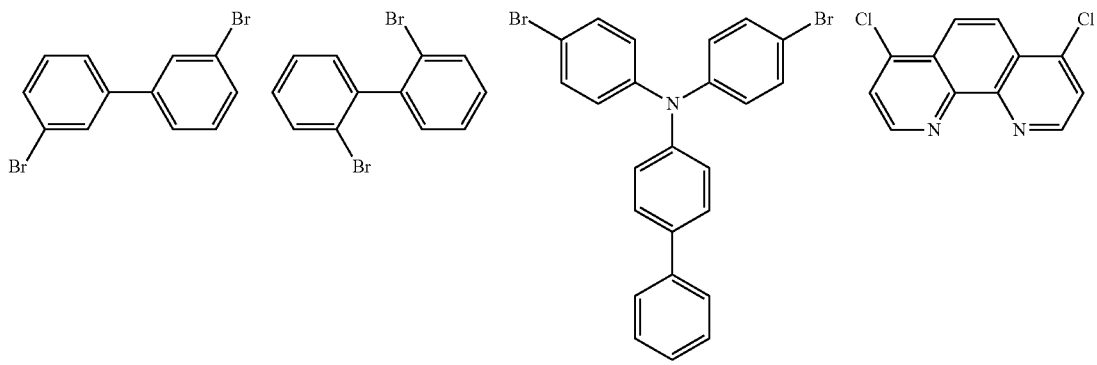
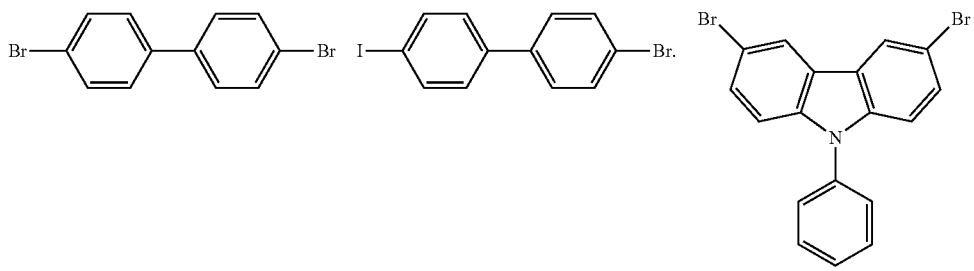
Examples of multivalent fluorescent or phosphorescent starting materials for the coupling reactions of the invention include:
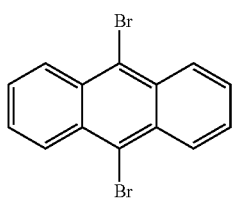
-continued
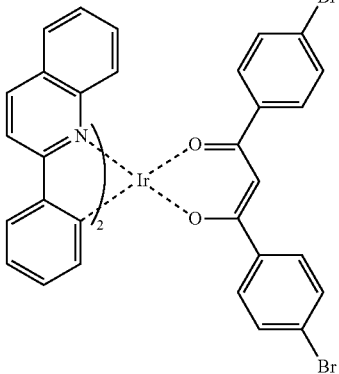

-continued

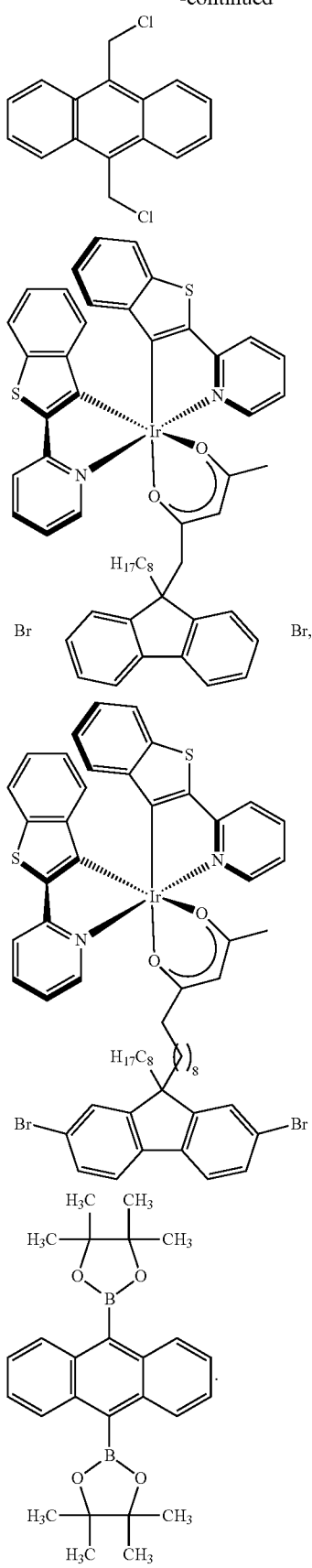

In the structural Formula (I), the expression "$[(Z^1 Y^2)_m R^2 Y^3]_n$," describes nonpolymeric compounds which are oligomers. Oligomers are usually formed when either $Z^1$ or $R^2$ are at least bivalent. The $(Z^1 Y^2)_m$ moiety describes oligomers in which $Z^1$ repeats itself such as when $Z^1$ is derived from

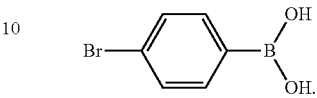

When n is one or more, p in the structural formula is preferably one to avoid significant crosslinking of the compound due to the multivalent nature of $Z^1$. However, some crosslinking can be tolerated in charge transport-mixtures of the invention.

In the second embodiment of the invention each $R^1$ and $R^3$ of Formula (I) is independently a monovalent aliphatic or cycloaliphatic hydrocarbon group having 1 to 20 carbon atoms, an aromatic group or a multicyclic aromatic nucleus where at least one of each $R^1$ and $R^3$ is independently a monovalent charge-transporting moiety, a monovalent luminescent moiety, or a combination thereof;

$R^2$, $Z^1$ and $Z^2$ of Formula (I) each independently represent multivalent aliphatic or cycloaliphatic hydrocarbon groups having 1 to 20 carbon atoms or an aromatic group as described above; and $Y^1$, $Y^2$, $Y^3$ and $Y^4$ each independently represent a triple bond, a double bond, or a single bond link;

The monovalent charge transporting moiety of this invention can be hole-transporting or electron-transporting. Examples of hole-transporting moieties include triarylamines, N-substituted-carbazole, arylalkanes, hydrazones, pyrazolines and others known in the art. Electron-transporting moieties include diphenoquinones, bisimides, and others known in the art. Examples of luminescent moieties of this invention include polycyclic aromatic hydrocarbons (PAHs) such as pyrenes, naphthalenes, anthracenes, perylenes, fluorenes, carbazoles, dibenzothiophenes, metal complexes such as 2,4-Pentanedionato)bis[2-(2-quinolinyl)phenyl]iridium (III), Tris-(8-hydroxyquinoline)aluminum (Alq3), 8-Hydroxyquinoline zinc, Tris[2-phenylpyridinato-$C^2$,N]iridium (III) (Ir(ppy)$_3$), Tris[2-(4,6-difluorophenyl)pyridinato-$C^2$,N]iridium(II) (Ir(Fppy)3), and others known in the art.

Specific examples of monovalent charge-transporting moieties include:

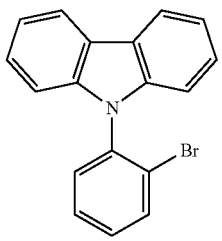

-continued
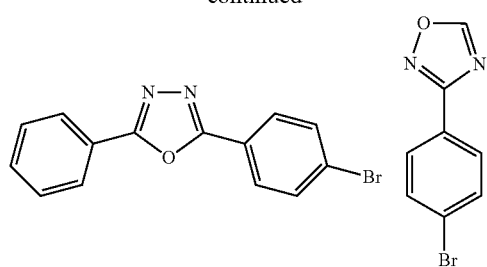
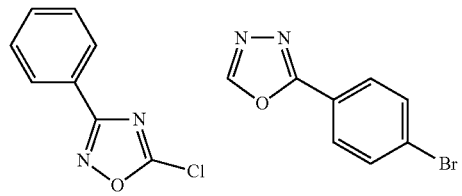
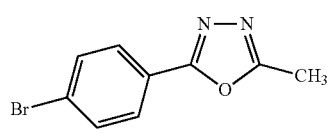
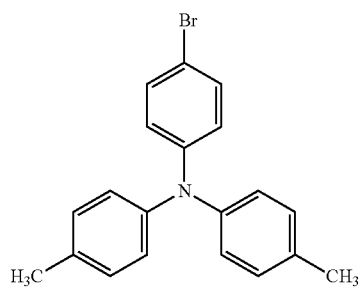
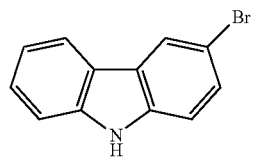
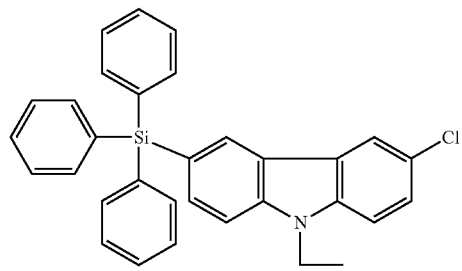
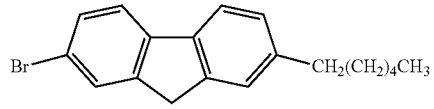
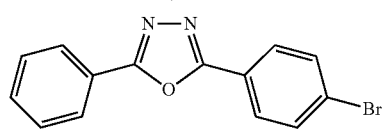
-continued
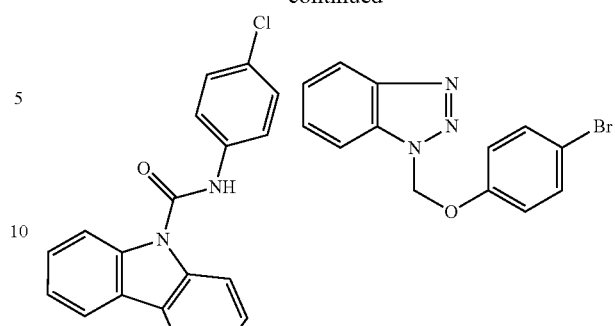
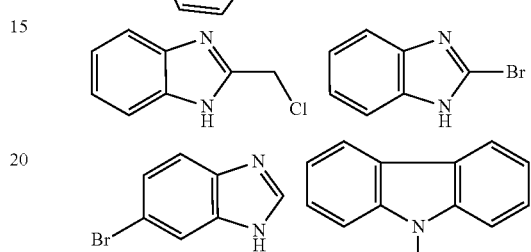
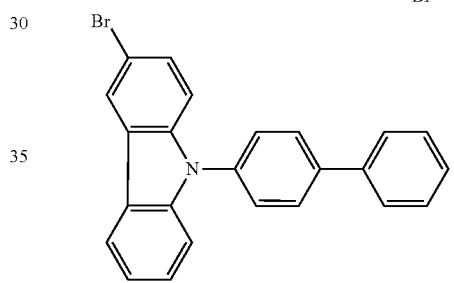
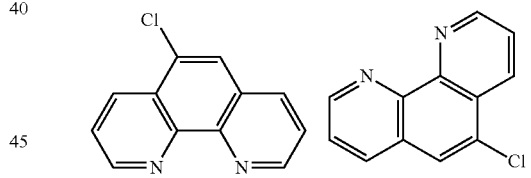
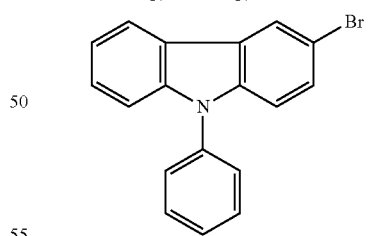
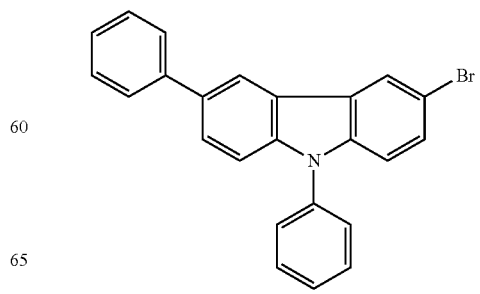

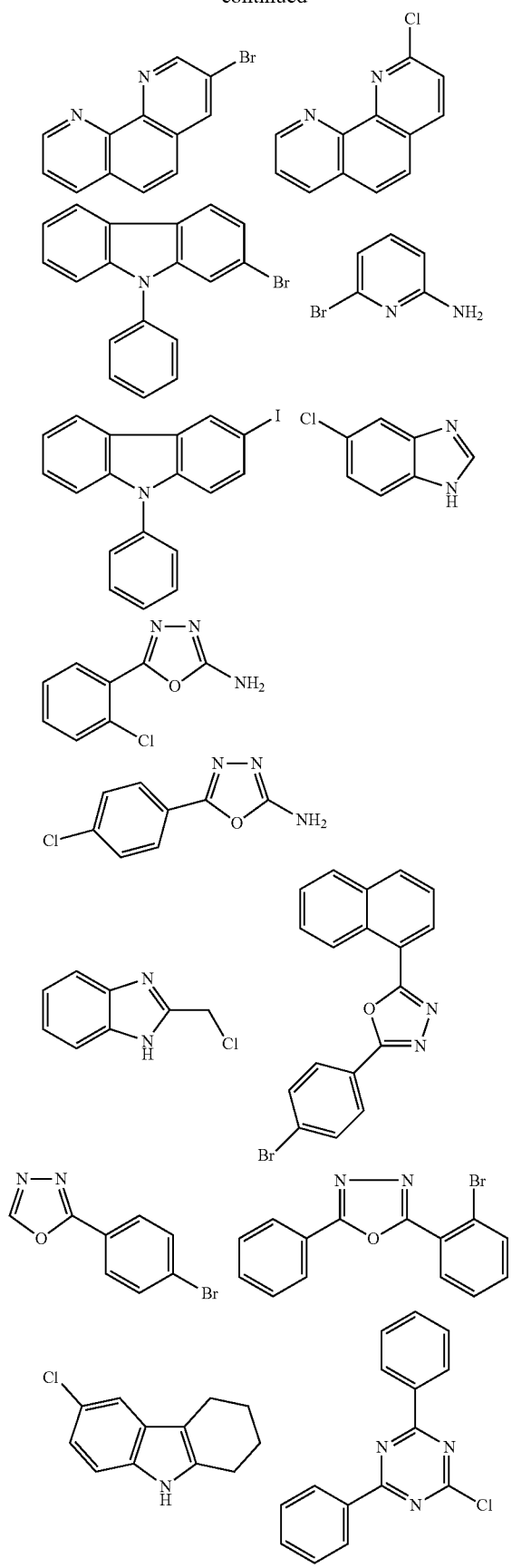
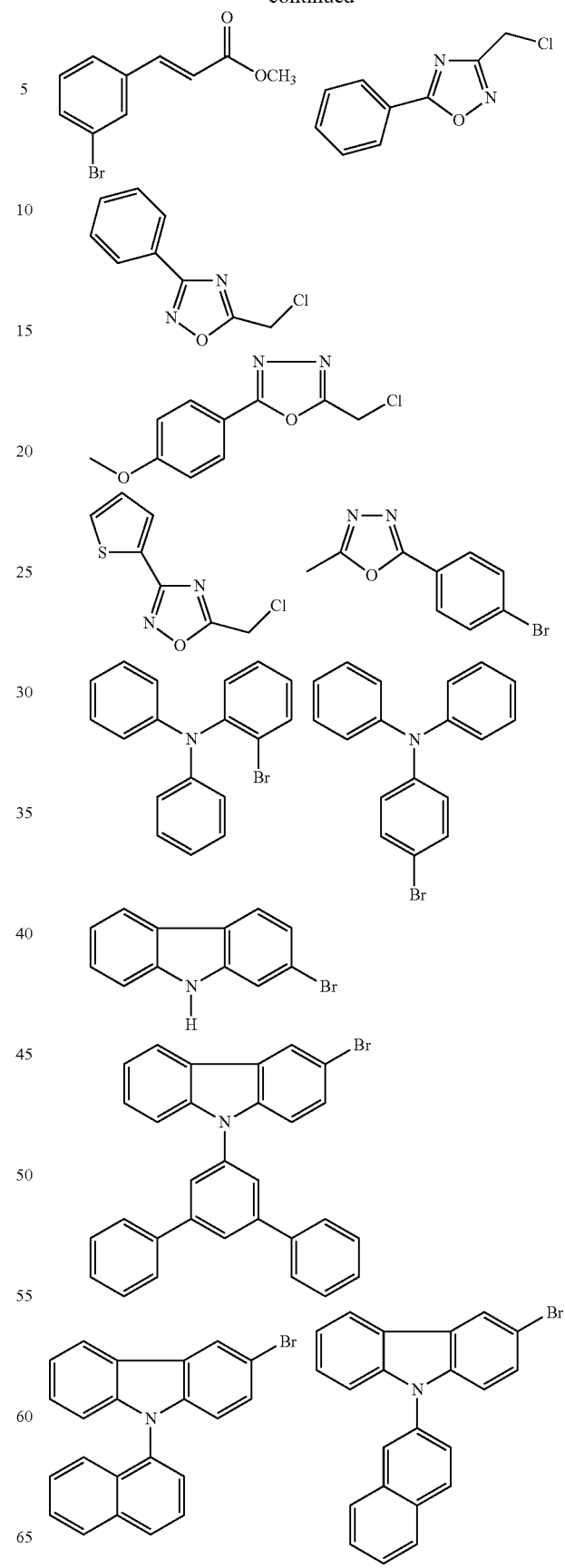

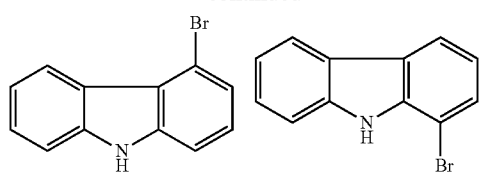
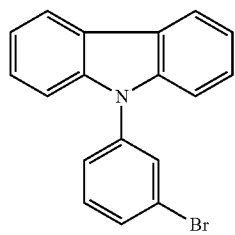
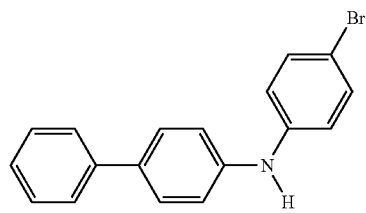
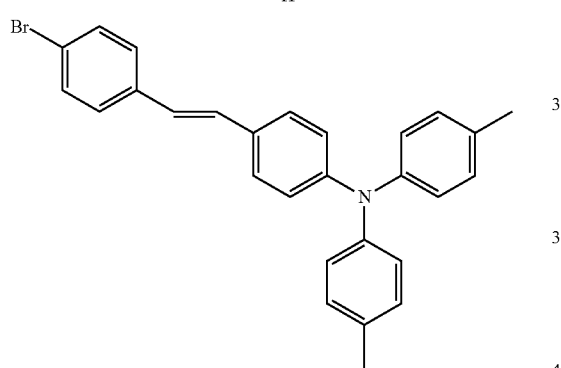
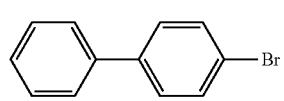
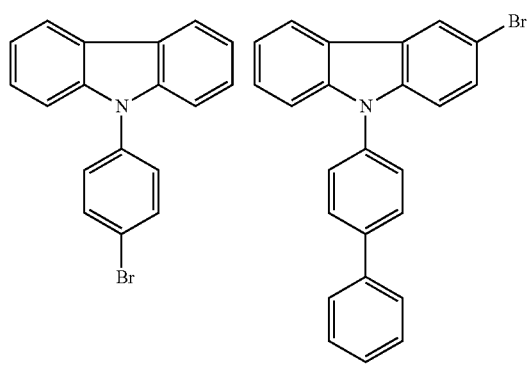
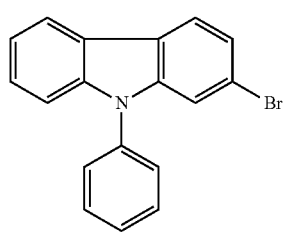
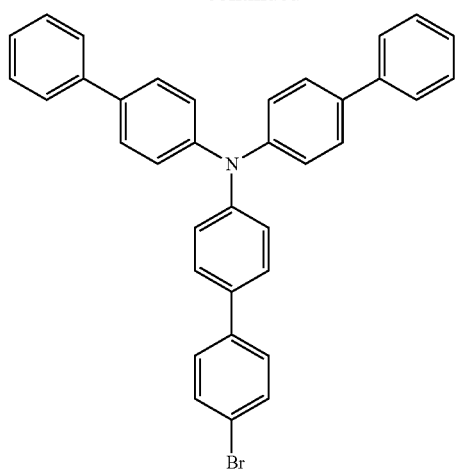
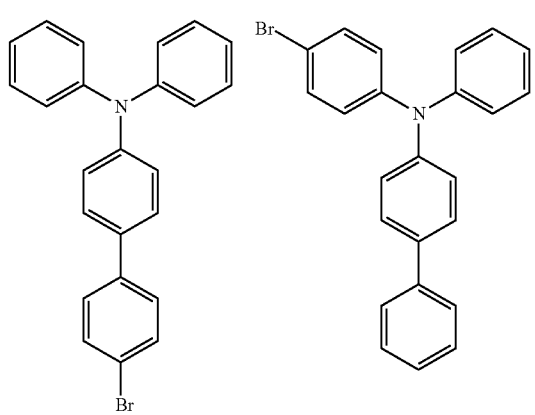
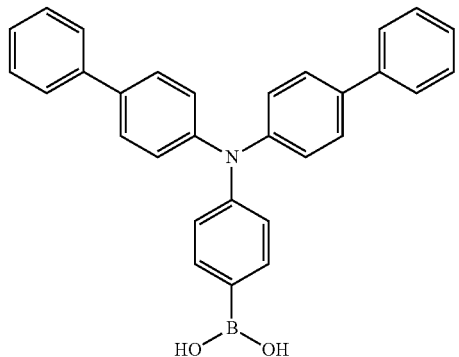
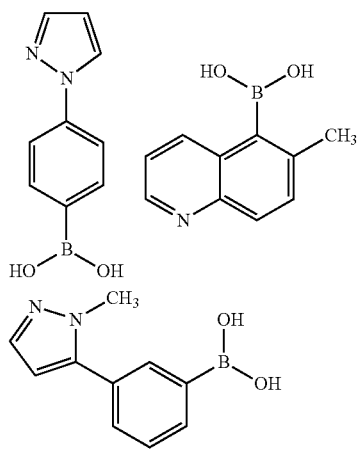

-continued

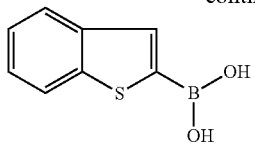

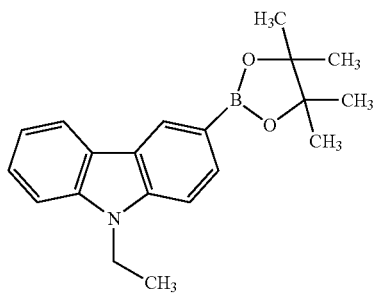

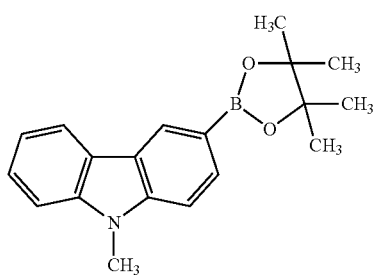

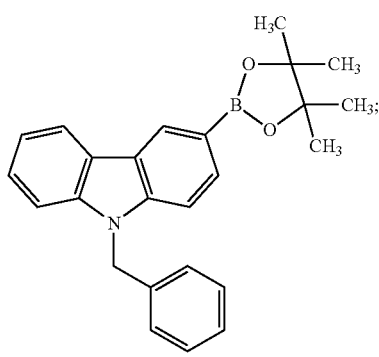

The monovalent luminescent moieties of this invention include polycyclic aromatic hydrocarbons (PAHs) such as pyrenes, naphthalenes, anthracenes, perylenes, fluorenes, carbazoles, dibenzothiophenes, metal complexes such as 2,4-Pentanedionato)bis[2-(2-quinolinyl)phenyl]iridium(III), Tris-(8-hydroxyquinoline)aluminum (Alq3), 8-Hydroxyquinoline zinc, Tris[2-phenylpyridinato-$C^2$,N]iridium(III) (Ir(ppy)$_3$), Tris[2-(4,6-difluorophenyl)pyridinato-$C^2$,N]iridium (1 II) (Ir(Fppy)3), and others known in the art. Monovalent luminescent moieties include any luminescent moiety, fluorescent or phosphorescent, that is monovalently functionalized with one of an hydroxy, carboxy, amino, anhydride, or isocyanate group and any luminescent materials known in the art that can be modified to provide monovalency.

Examples of monovalent luminescent moieties include:

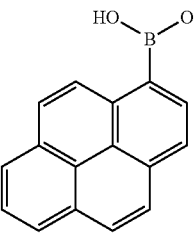
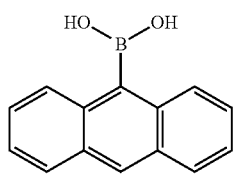

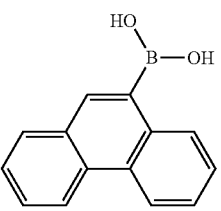

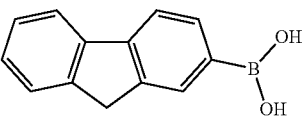

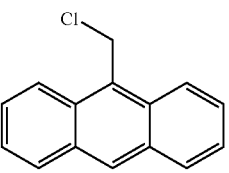

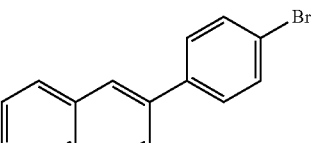

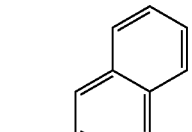

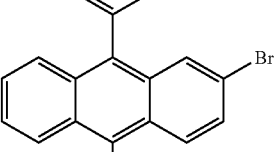

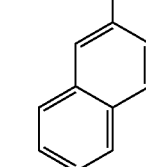
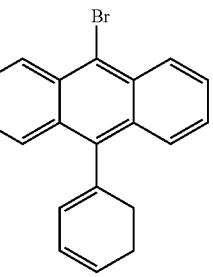

-continued

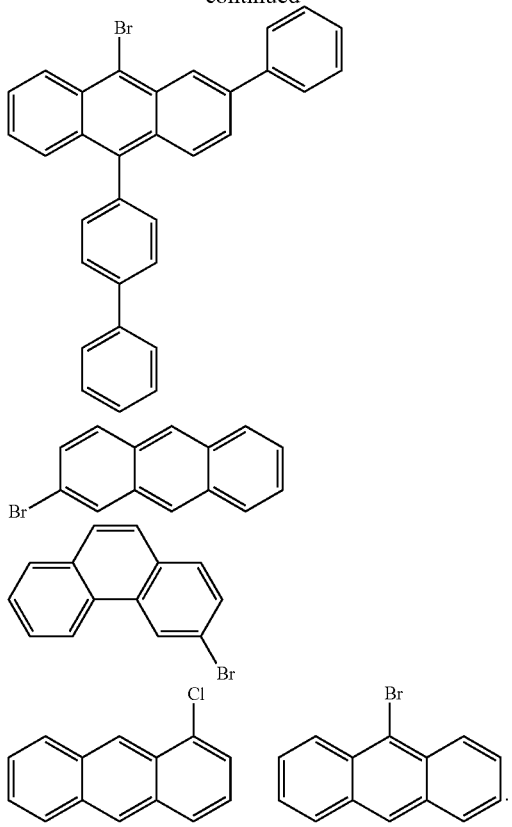

In the third embodiment of the invention each $R^1$ and $R^3$ of Formula (I) is independently a monovalent aliphatic or cycloaliphatic hydrocarbon group having 1 to 20 carbon atoms, an aromatic group or a multicyclic aromatic nucleus where at least one of each $R^1$ and $R^3$ is independently a monovalent charge-transporting moiety, a luminescent moiety, or a combination thereof. The monovalent charge-transporting moiety may be any of the charge-transporting moieties provided in the description of the second embodiment of the invention described above and the monovalent luminescent moiety may be any of the luminescent moieties of the second embodiment of the invention described above.

$R^2$, $Z^1$, and $Z^2$ of Formula (I) each independently represent multivalent aliphatic or cycloaliphatic hydrocarbon groups having 1 to 20 carbon atoms or an aromatic group where at least one of each $R^2$, $Z^1$, and $Z^2$ is independently a charge-transporting moiety, a luminescent moiety, or a combination thereof. The multivalent charge-transporting moiety may be any of the charge-transporting moieties provided in the description of the first embodiment of the invention provided above and the multivalent luminescent moiety may be any of the luminescent moieties of the first embodiment of the invention described above.

$Y^1$, $Y^2$, $Y^3$ and $Y^4$ each independently represent a triple bond, a double bond, or a single bond link.

In the fourth embodiment of the invention each $R^1$ and $R^3$ of Formula (I) is independently a monovalent aliphatic or cycloaliphatic hydrocarbon group having 1 to 20 carbon atoms, an aromatic group or a multicyclic aromatic nucleus where at least one of $R^1$ and $R^3$ is independently a monovalent hole-transporting moiety, a luminescent moiety, or a combination thereof. The monovalent hole-transporting moiety may be any of the hole-transporting moieties provided in the description of the second embodiment of the invention described above and the monovalent luminescent moiety may be any of the luminescent moieties of the second embodiment of the invention described above.

$R^2$, $Z^1$, and $Z^2$ of Formula (I) each independently represent multivalent aliphatic or cycloaliphatic hydrocarbon groups having 1 to 20 carbon atoms or an aromatic group where at least one of each $R^2$, $Z^1$, and $Z^2$ is independently a multivalent electron-transporting moiety, a luminescent moiety, or a combination thereof. The multivalent electron-transporting moiety may be any of the electron-transporting moieties provided in the description of the first embodiment of the invention provided above and the multivalent luminescent moiety may be any of the luminescent moieties of the first embodiment of the invention described above.

$Y^1$, $Y^2$, $Y^3$ and $Y^4$ each independently represent a triple bond, a double bond, or a single bond link.

In the fifth embodiment of the invention each $R^1$ and $R^3$ of Formula (I) is independently a monovalent aliphatic or cycloaliphatic hydrocarbon group having 1 to 20 carbon atoms, an aromatic group or a multicyclic aromatic nucleus where at least one of each $R^1$ and $R^3$ is independently a monovalent electron-transporting moiety, a luminescent moiety, or a combination thereof. The monovalent electron-transporting moiety may be any of the electron-transporting moieties provided in the description of the second embodiment of the invention above and the monovalent luminescent moiety may be any of the luminescent moieties of the second embodiment of the invention described above.

$R^2$, $Z^1$, and $Z^2$ of Formula (I) each independently represent multivalent aliphatic or cycloaliphatic hydrocarbon groups having 1 to 20 carbon atoms or an aromatic group, where at least one of each $R^2$, $Z^1$, and $Z^2$ is independently a multivalent hole-transporting moiety, a luminescent moiety, or a combination thereof. The multivalent hole-transporting moiety may be any of the hole-transporting moieties provided in the description of the first embodiment of the invention provided above and the multivalent luminescent moiety may be any of the luminescent moieties of the first embodiment of the invention described above.

$Y^1$, $Y^2$, $Y^3$ and $Y^4$ each independently represent a triple bond, a double bond, or a single bond link.

In the sixth embodiment of the invention each $R^1$ and $R^3$ of Formula (I) is independently a monovalent aliphatic or cycloaliphatic hydrocarbon group having 1 to 20 carbon atoms, an aromatic group or a multicyclic aromatic nucleus where at least one of each $R^1$ and $R^3$ is independently a monovalent electron-transporting moiety, a luminescent moiety, or a combination thereof; and at least one of each R1 and R3 is independently a monovalent hole-transporting moiety, a luminescent moiety, or a combination thereof. The monovalent electron-transporting moiety may be any of the electron-transporting moieties provided in the description of the second embodiment of the invention provided above, the monovalent hole-transporting moiety may be any of the hole-transporting moieties provided in the description of the second embodiment of the invention provided above, and the monovalent luminescent moiety may be any of the luminescent moieties of the second embodiment of the invention described above.

$R^2$, $Z^1$, and $Z^2$ each independently represent multivalent aliphatic or cycloaliphatic hydrocarbon groups having 1 to 20 carbon atoms or an aromatic group, where at least one of each $R^2$, $Z^1$, and $Z^2$ is independently a multivalent hole-transporting moiety, a luminescent moiety, or a combination thereof. The multivalent hole-transporting moiety may be any of the hole-transporting moieties provided in the description of the first embodiment of the invention provided above and the multivalent luminescent moiety may be any of the luminescent moieties of the first embodiment of the invention described above.

$Y^1$, $Y^2$, $Y^3$ and $Y^4$ each independently represent a triple bond, a double bond, or a single bond link.

In the seventh embodiment of the invention each $R^1$ and $R^3$ of Formula (I) is independently a monovalent aliphatic or cycloaliphatic hydrocarbon group having 1 to 20 carbon atoms, an aromatic group or a multicyclic aromatic nucleus where at least one of each R1 and R3 is independently a monovalent electron-transporting moiety, a luminescent moiety, or a combination thereof; and at least one of each $R^1$ and $R^3$ is independently a monovalent hole-transporting moiety, a luminescent moiety, or a combination thereof. The monovalent electron-transporting moiety may be any of the electron-transporting moieties provided in the description of the second embodiment of the invention provided above, the monovalent hole-transporting moiety may be any of the hole-transporting moieties provided in the description of the second embodiment of the invention provided above, and the monovalent luminescent moiety may be any of the luminescent moieties of the second embodiment of the invention described above.

$R^2$, $Z^1$, and $Z^2$ each independently represent multivalent aliphatic or cycloaliphatic hydrocarbon groups having 1 to 20 carbon atoms or an aromatic group, where at least one of each $R^2$, $Z^1$, and $Z^2$ is independently a multivalent electron-transporting moiety, a luminescent moiety or a combination thereof. The multivalent electron-transporting moiety may be any of the electron-transporting moieties provided in the description of the first embodiment of the invention provided above and the multivalent luminescent moiety may be any of the luminescent moieties of the first embodiment of the invention described above.

$Y^1$, $Y^2$, $Y^3$ and $Y^4$ each independently represent a triple bond, a double bond, or a single bond link.

In the eighth embodiment of the invention each $R^1$ and $R^3$ of Formula (I) is independently a monovalent aliphatic or cycloaliphatic hydrocarbon group having 1 to 20 carbon atoms, an aromatic group or a multicyclic aromatic nucleus where at least one of each $R^1$ and $R^3$ is independently a monovalent hole-transporting moiety, a luminescent moiety, or a combination thereof; and at least one of each R1 and R3 is independently a monovalent electron-transporting moiety, a luminescent moiety, or a combination thereof. The monovalent electron-transporting moiety may be any of the electron-transporting moieties provided in the description of the second embodiment of the invention provided above, the monovalent hole-transporting moiety may be any of the hole-transporting moieties provided in the description of the second embodiment of the invention provided above, and the monovalent luminescent moiety may be any of the luminescent moieties of the second embodiment of the invention described above.

$R^2$, $Z^1$, and $Z^2$ of Formula (I) each independently represent multivalent aliphatic or cycloaliphatic hydrocarbon groups having 1 to 20 carbon atoms or an aromatic group where none of $R^2$, $Z^1$, and $Z^2$ is a charge-transporting moiety, a luminescent moiety, or a combination thereof; and $Y^1$, $Y^2$, $Y^3$ and $Y^4$ each independently represent a triple bond, a double bond, or a single bond link.

In the ninth embodiment of the invention all the components of the mixture are isomeric, that is they have the same molecular weight; thus approximately the same vapor pressure. This ensures thermal deposition of the mixture without fractionation. This is accomplished by using monovalent starting materials that are isomeric. Specific examples of isomeric monovalent starting materials for the coupling reactions of this invention include:

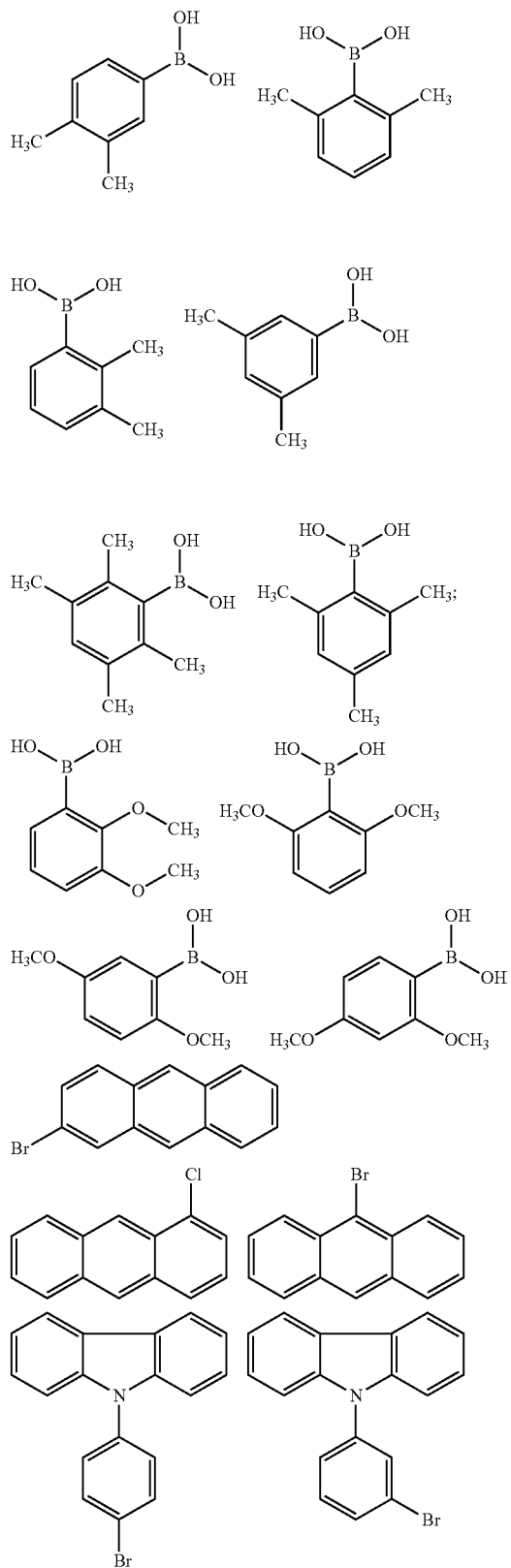

-continued
71
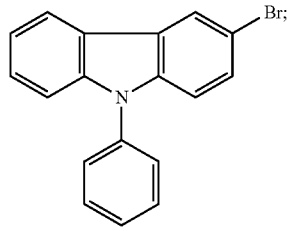
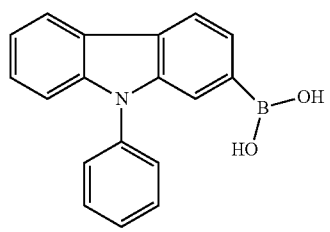
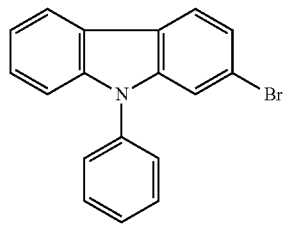
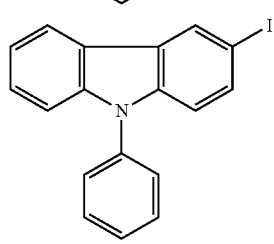
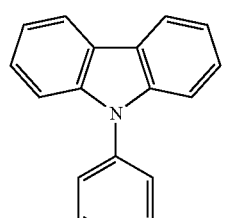
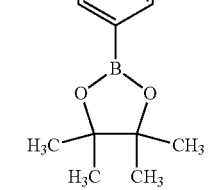
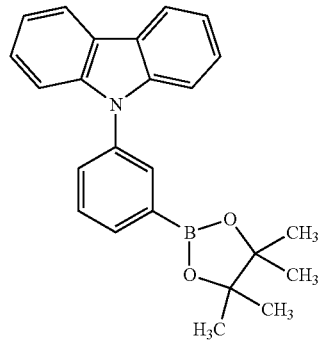
72
-continued
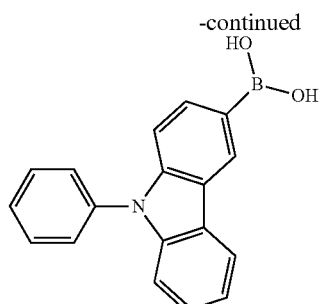
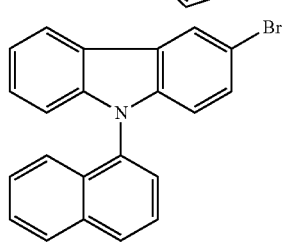
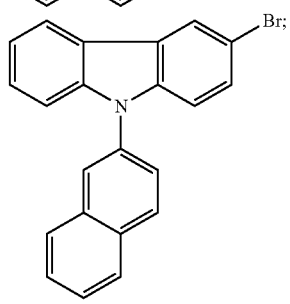
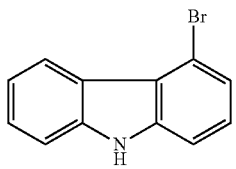
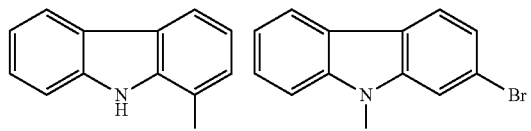
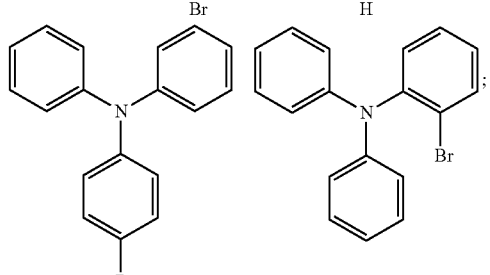
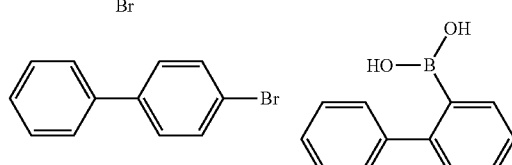
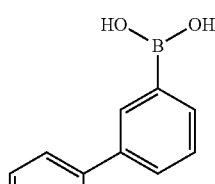
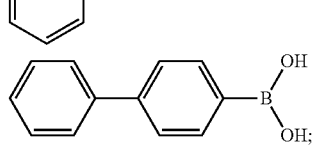

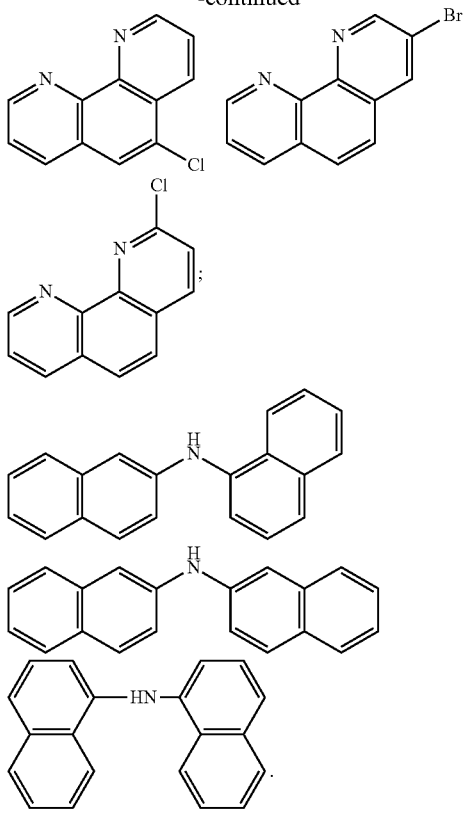

General Procedure

An important object of this invention is to provide a method of providing truly non-crystallizable charge transporting molecular glass mixtures; truly non-crystallizable luminescent molecular glass mixtures; and combinations thereof that can be easily purified by simple and economic processes. Truly amorphous materials by definition cannot be recrystallized. Thus because of that it is very difficult, or perhaps potentially costly to purify charge transport molecular glass mixtures containing high level of impurities and other compositions.

Accordingly, this invention only uses reactions that are quantitative, that is the reaction is near 100 percent complete; with either no byproducts; or with byproducts that can be easily solubilized in water or other solvents and extracted efficiently.

Furthermore the procedure of this invention calls for pre-purification of all starting materials by either recrystallization, sublimation, or distillation or other purification methods to purity level required for poly-condensation reactions. This procedure eliminates the transport of unwanted impurities from any of the starting materials to the produced amorphous charge transport materials.

The following are specific examples of reaction procedures.

Coupling Reaction Via the Heck Reaction

One equivalent of a recrystallized multivalent halogenated aliphatic or cycloaliphatic hydrocarbon groups having 1 to 20 carbon atoms or an aromatic group is dissolved in dry dimethylformamide at 80° C. under a nitrogen atmosphere. Pd(OAc)$_2$ (0.05 equivalent), tri(o-tolyl)phosphine, "TOP" (0.30 equivalent) dissolved and stirred for 1 hour (h). Then two equivalent of the equimolar mixture consisting of three vinyl monovalent aliphatic or cycloaliphatic hydrocarbon group having 1 to 20 carbon atoms, an aromatic group or a multicyclic aromatic nucleus is added, dissolved and heated overnight to 100° C. with stirring. After 24 hours, the reaction mixture is cooled to room temperature and poured into a large amount of methanol. The resulting precipitate is stirred for 1 hour in methanol. The crude molecular glass mixture is filtered off and dissolved in hot chloroform. The solution is filtered through a glass filter to remove residual catalyst particles, and precipitated in methanol. The obtained molecular glass mixture is dried in a vacuum oven at 40° C. for 2 days.

If necessary the mixture is further purified by column chromatography using silica gel and appropriate solvent, or solvent mixture.

The isolated material is characterized, using differential scanning calorimetry (DSC) and thermogravimetric analysis (TGA) for thermal properties, and liquid chromatography, nuclear magnetic resonance (NMR) or both liquid chromatography and NMR for composition. The "Component Equations" of Molaire are used to calculate the expected composition based on the functionality of the multifunctional material and the number of mono vinyl-substituted compounds. (*Organic Monomeric Glasses: A Novel Class of Materials*, M. F. Molaire et al, J of Polymer Science, Part A, Polymer Chemistry, Vol. 27, 2569-2592 (1989))

The following is a listing of specific examples of molecular glass mixtures that can be prepared by the procedure above:

Glass Mixture 1: which is a hole-transporting blue luminescent molecular glass mixture from the reaction of

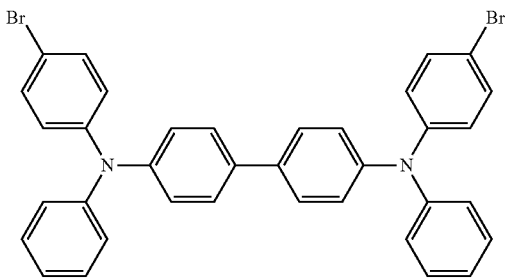 [SMILES: Brc1ccc(N(c2ccccc2)c2ccc(-c3ccc(N(c4ccccc4)c4ccc(Br)cc4)cc3)cc2)cc1]

with the equimolar mixture comprising

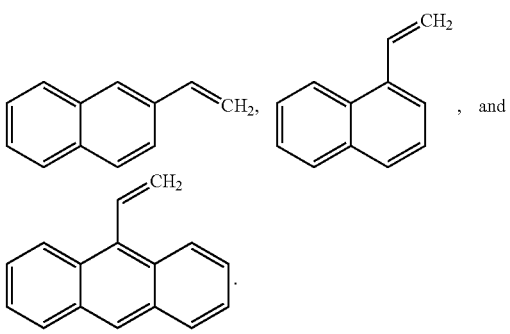

The structures of the six components of the glass mixture are shown below:

Glass Mixture 1
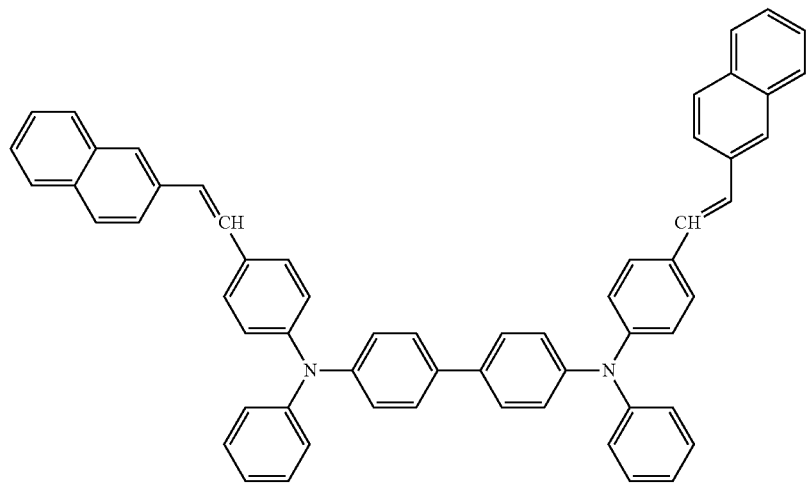
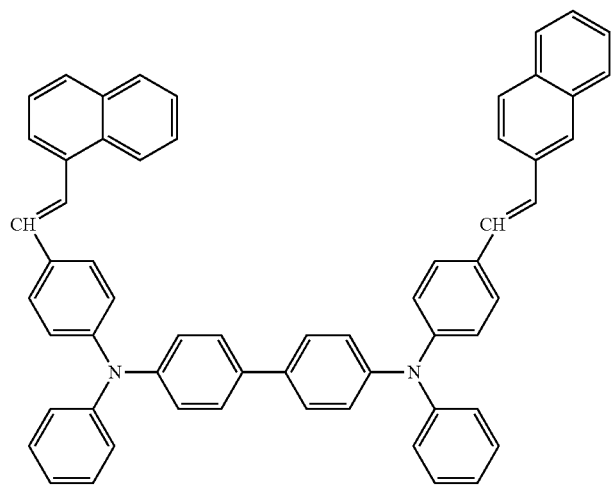
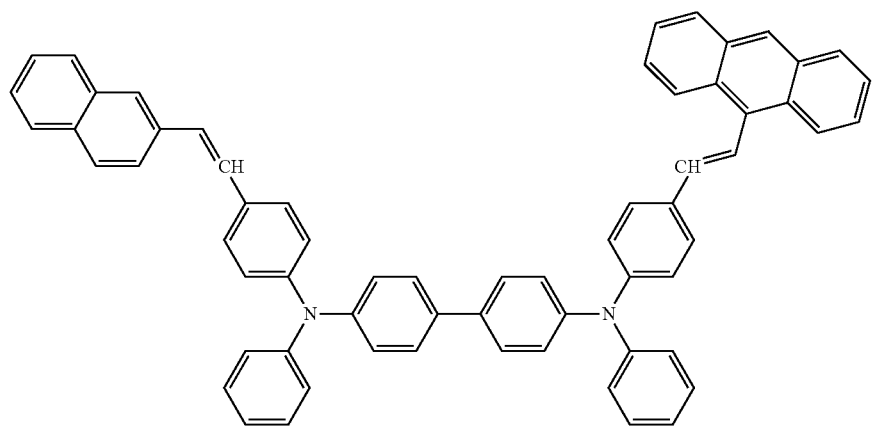

-continued
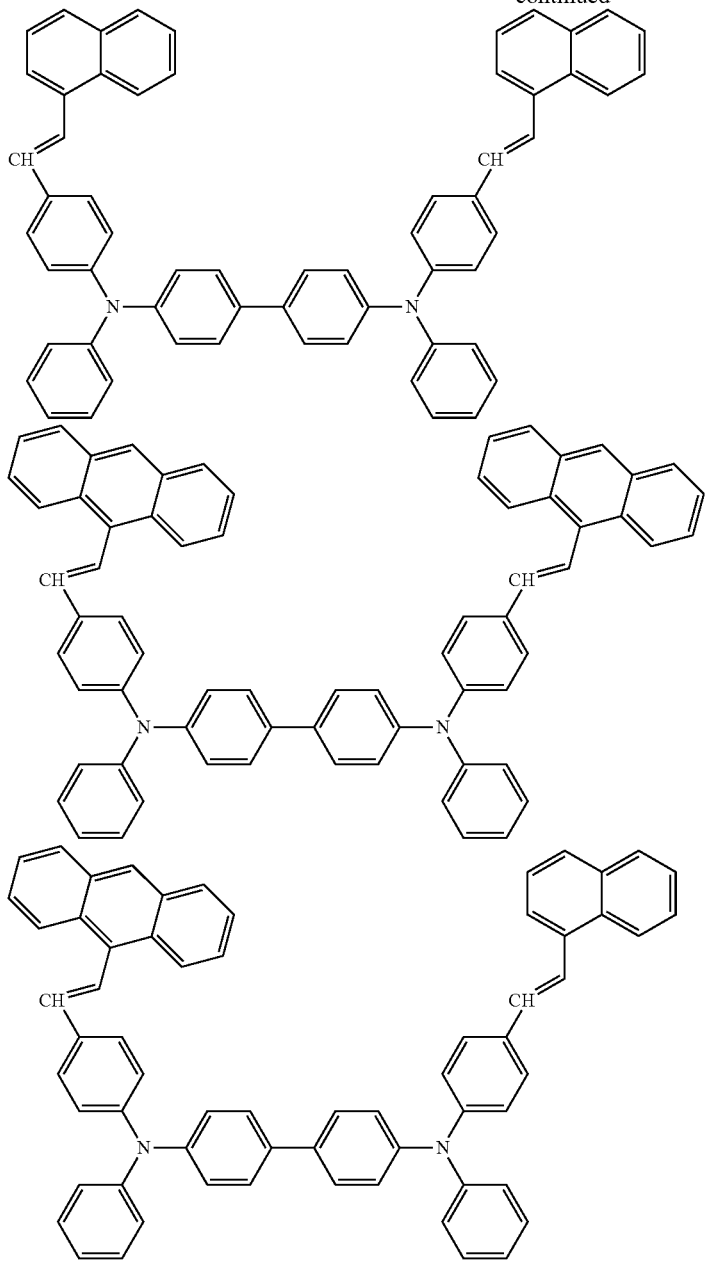
Glass Mixture 2: which is a hole-transporting/blue luminescent molecular glass mixture from the reaction of
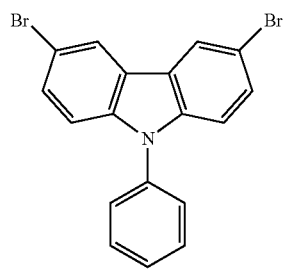 [SMILES: Brc1ccc2c(c1)c1cc(Br)ccc1n2-c1ccccc1]
with the equimolar mixture comprising
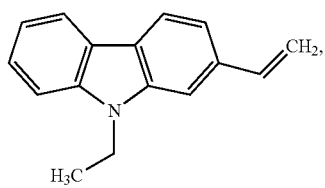

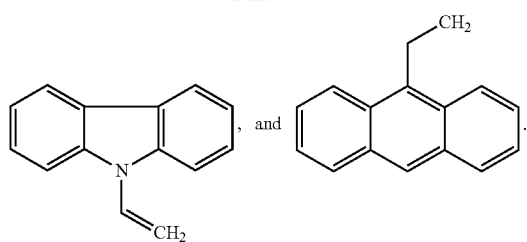, and 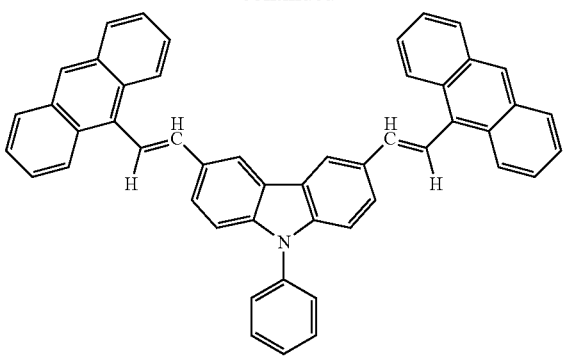
The structures of the six components of the glass mixture are shown below:
Glass Mixture 2
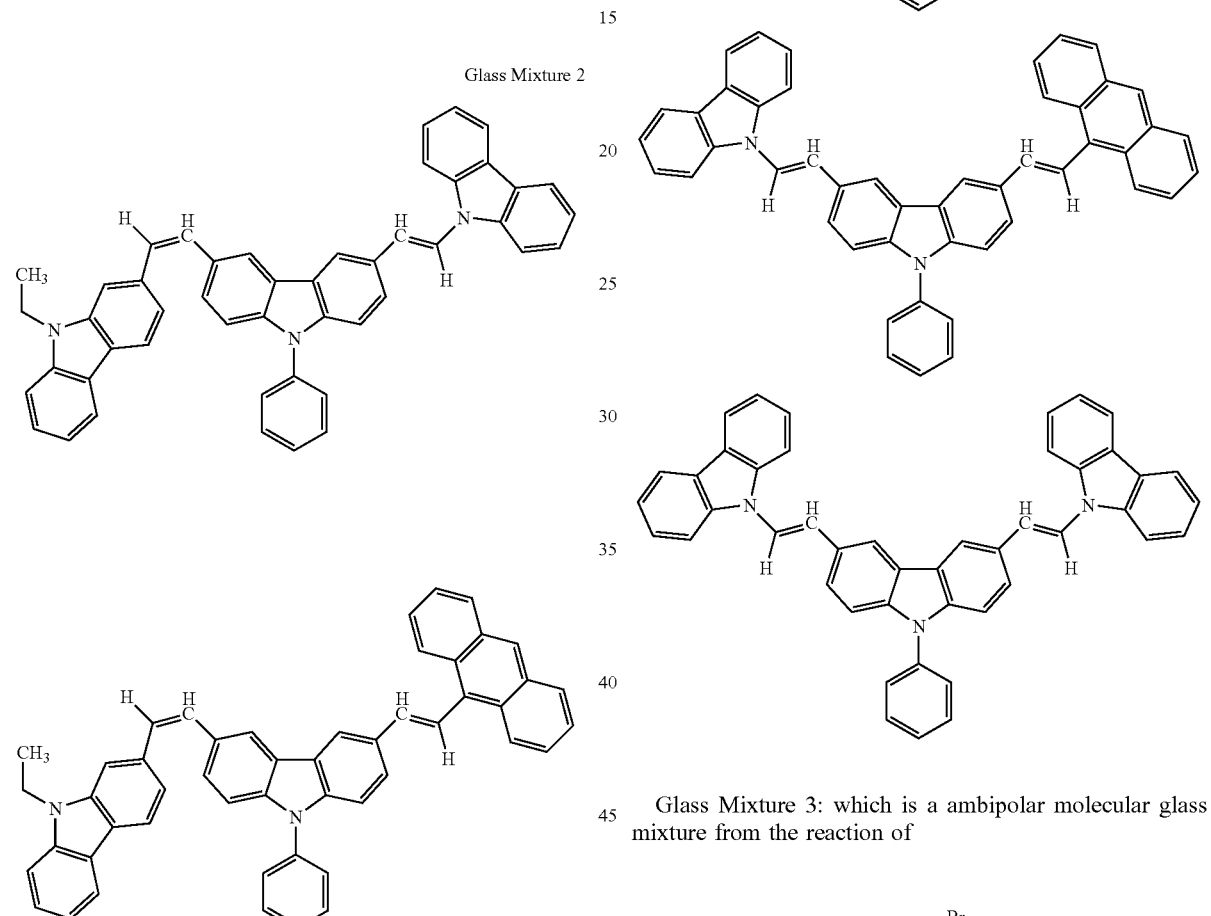
Glass Mixture 3: which is a ambipolar molecular glass mixture from the reaction of
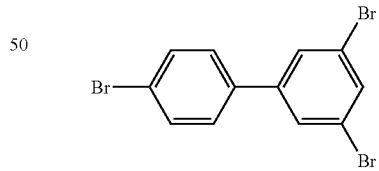
with the equimolar mixture comprising
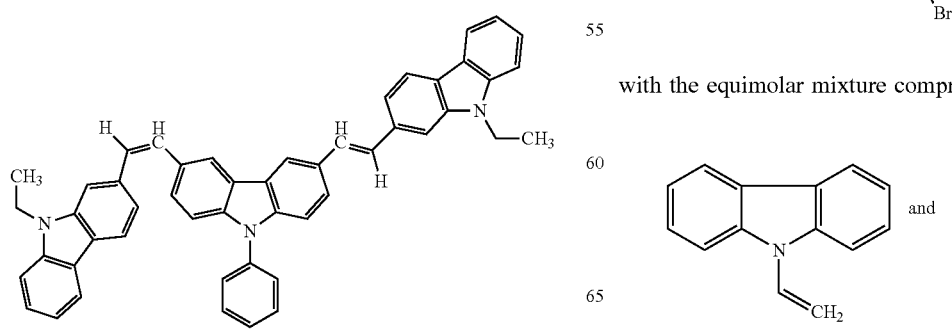 and

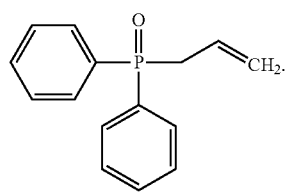
The structures of the six components of the glass mixture are shown below
Glass Mixture 3
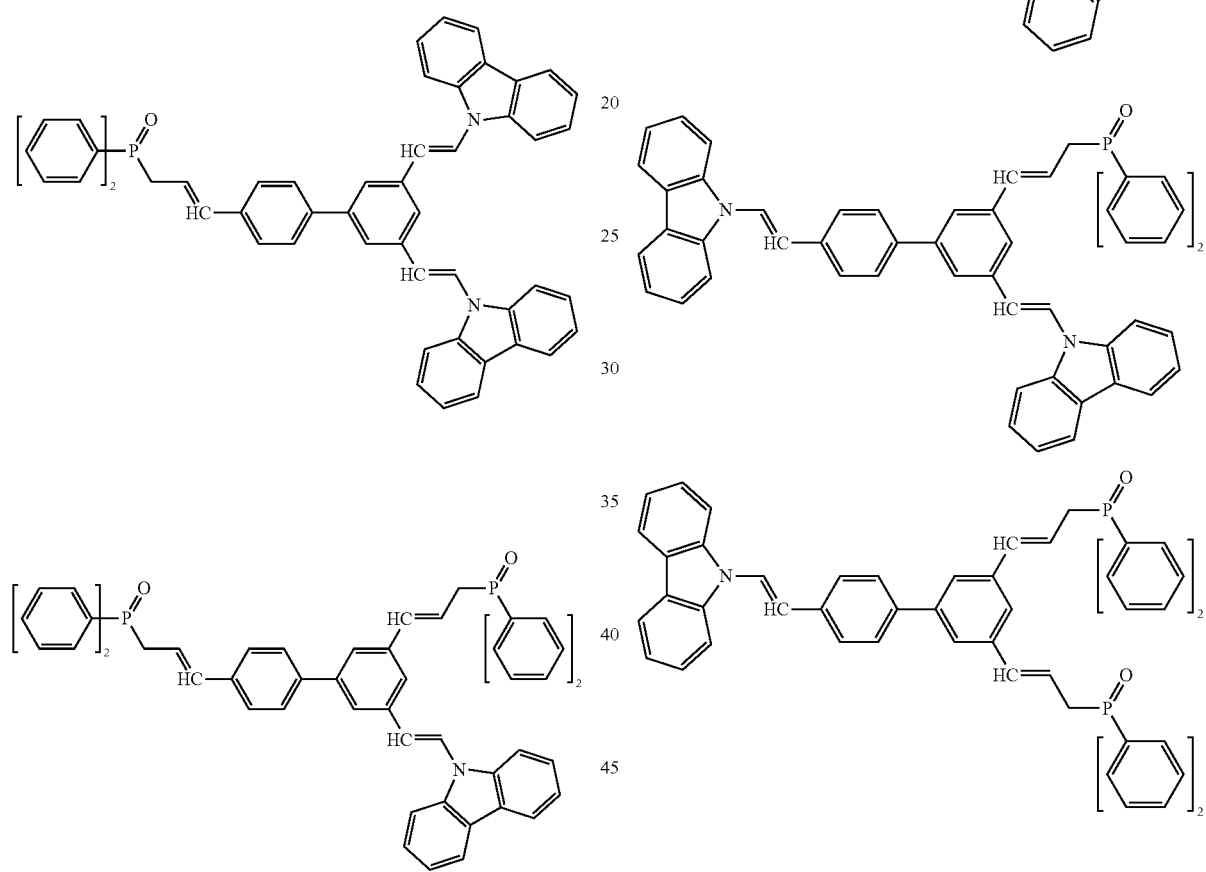
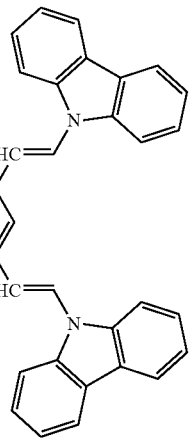
Glass Mixture 4: which is a hole-transporting molecular glass mixture from the reaction of
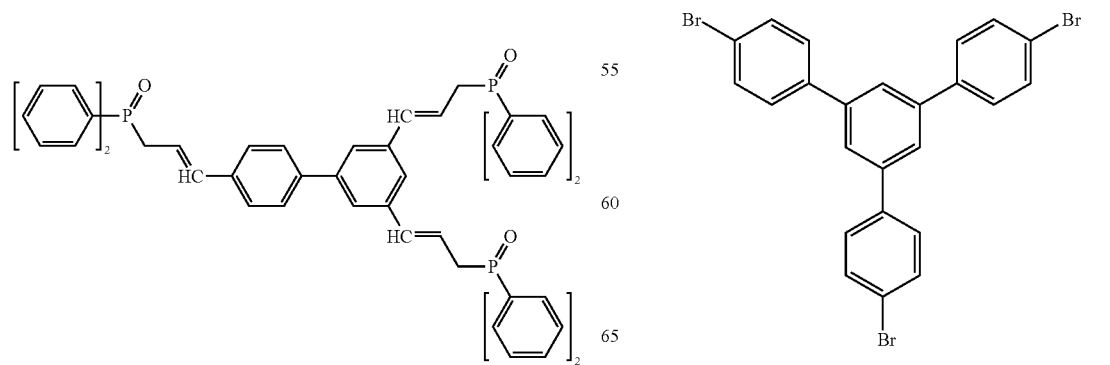

with the equimolar mixture comprising
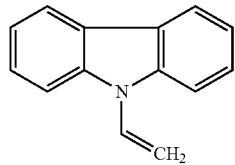 and
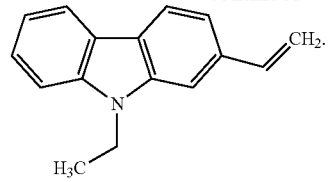
The structures of the four components of the glass mixture are shown below
Glass Mixture 4
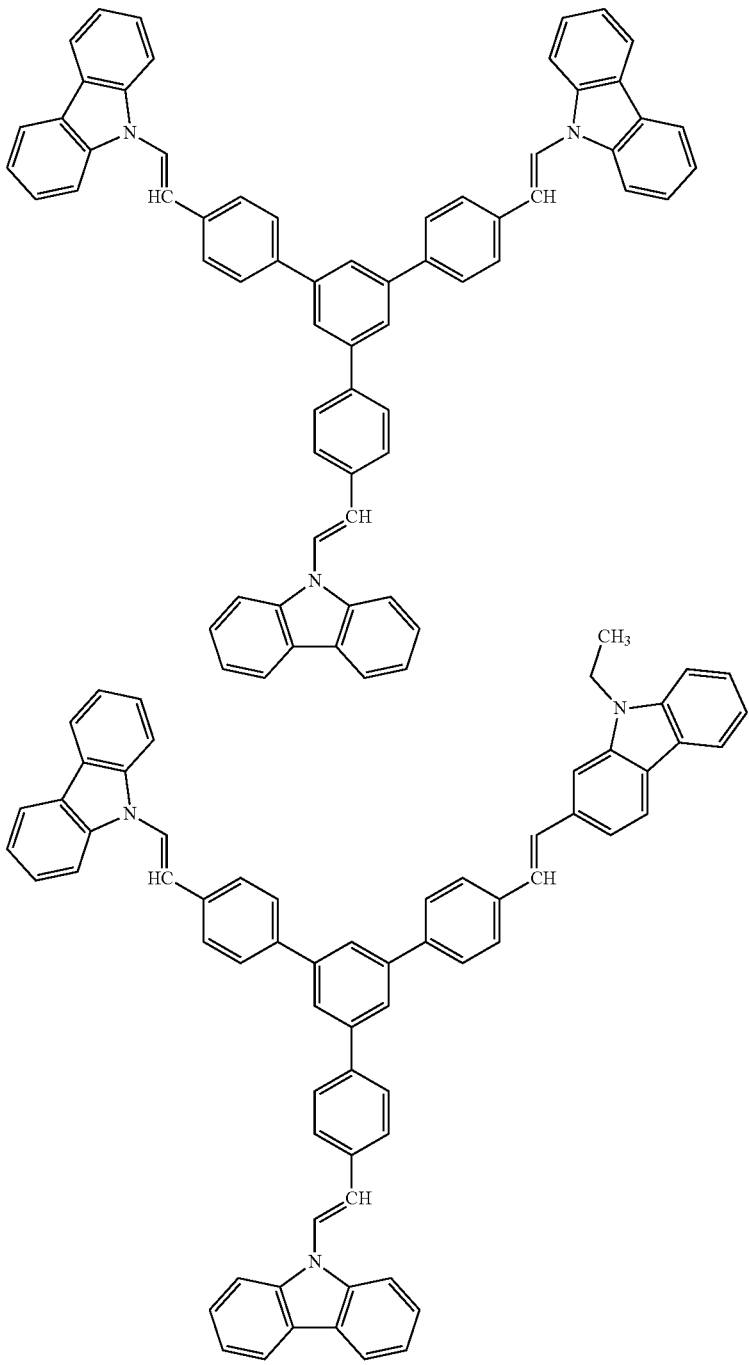

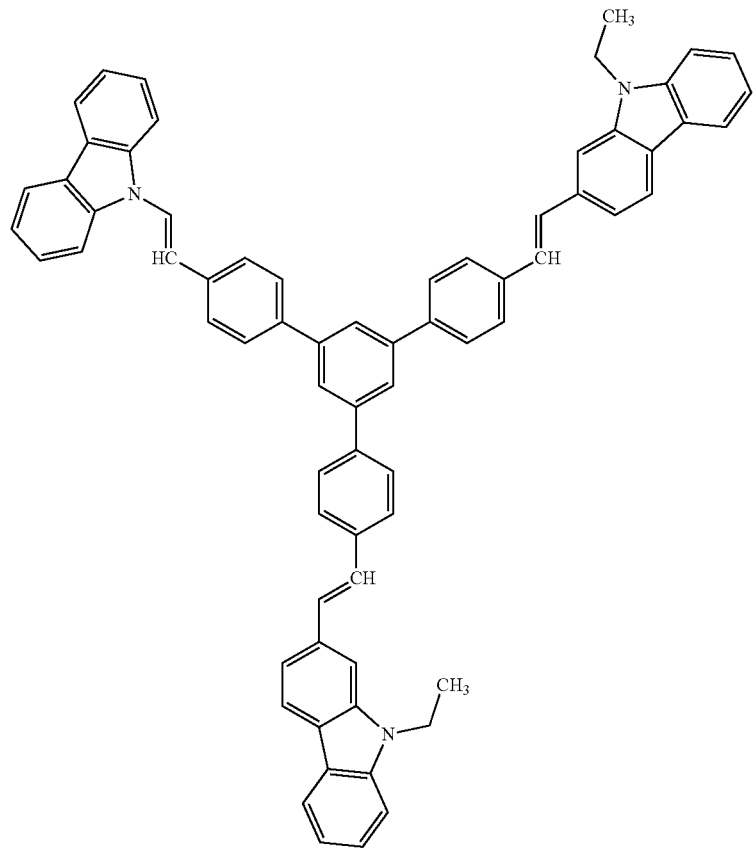
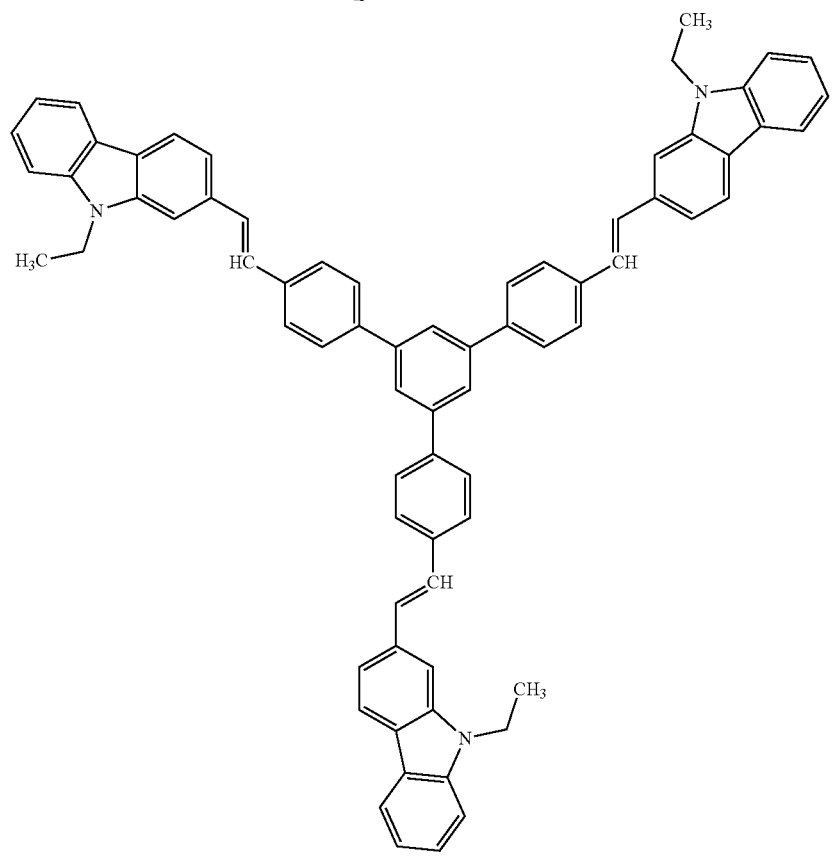

Coupling Reaction Via the Suzuki Reaction

One equivalent of a multivalent aliphatic or cycloaliphatic hydrocarbon group having 1 to 20 carbon atoms or an aromatic group and one equivalent of an equimolar mixture consisting of three or monovalent boronic acid or boronate aliphatic or cycloaliphatic hydrocarbon group having 1 to 20 carbon atoms, an aromatic group or a multicyclic aromatic nucleus are mixed together with 0.25 equivalent of Trioctylmethylammonium chloride in toluene. 2 moles (M) $Na_2CO_2$ aqueous solution is added to the suspension which is degassed with nitrogen for 30 minutes. Tetrakis(triphenylphosphine palladium(0), 0.0042 equivalent is added to the mixture. The reaction is then heated to reflux under nitrogen for one day. The reaction mixture is cooled down to room temperature and poured into a large amount of methanol: water (9:1) mixture. The precipitate is purified by repeated dissolution in tetrahydrofuran (THF) and precipitation into methanol. The molecular glass mixture is obtained as a powder.

The isolated material is characterized, using differential scanning calorimetry (DSC) and thermogravimetric analysis (TGA) for thermal properties, and liquid chromatography, nuclear magnetic resonance (NMR) or a combination of liquid chromatography and NMR for composition. The "Component Equations" of Molaire are used to calculate the expected composition based on the functionality of the multifunctional material and the number of mono vinyl-substituted compounds. (*Organic Monomeric Glasses: A Novel Class of Materials*, M. F. Molaire et al, J of Polymer Science, Part A, Polymer Chemistry, Vol. 27, 2569-2592 (1989))

The following is a listing of specific examples of molecular glass mixtures that can be prepared by the procedure above:

Glass Mixture 5: which is an electron-transporting molecular glass mixture from the reaction of

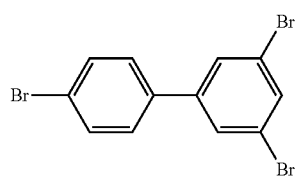 [SMILES: Brc1ccc(-c2cc(Br)cc(Br)c2)cc1]

with the equimolar mixture comprising

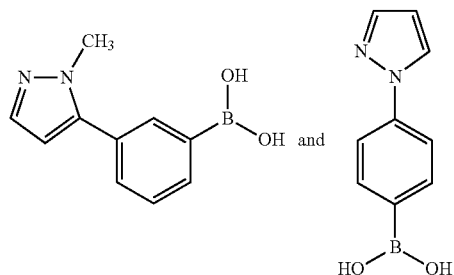

via the Suzuki reaction

The structures of the six components of the glass mixture are shown below

Glass Mixture 5

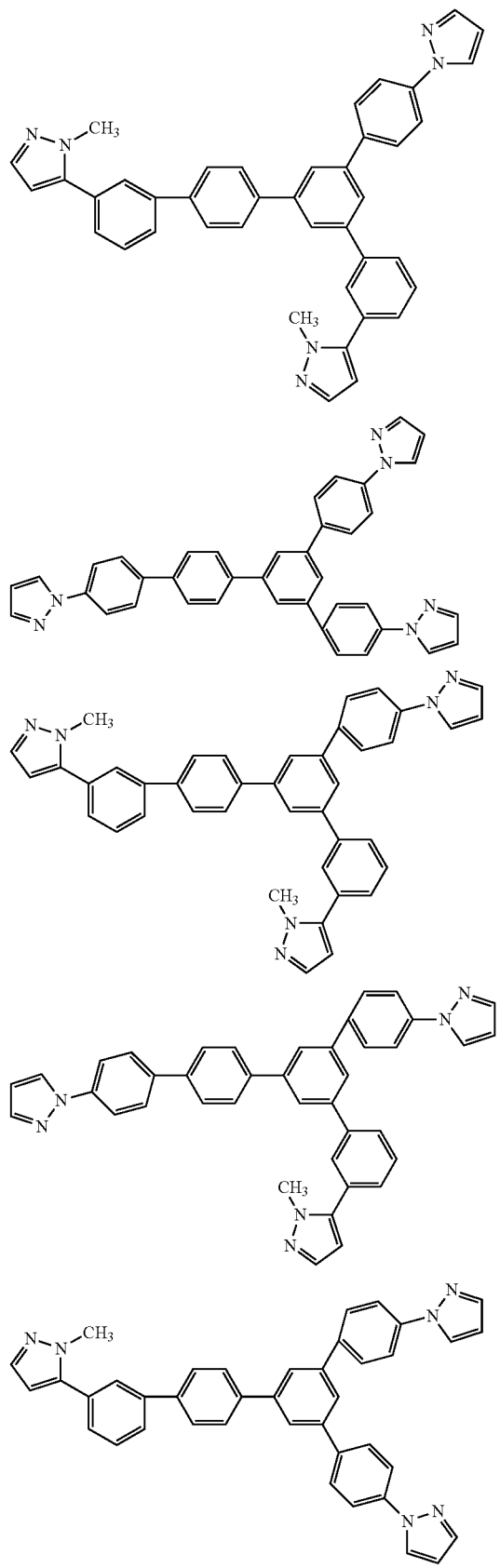

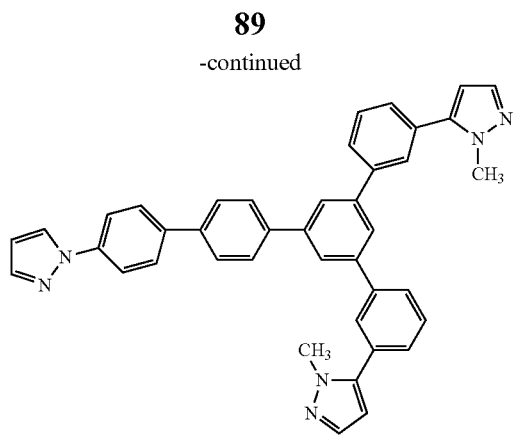
of
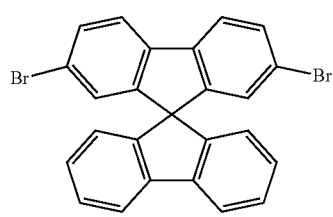 [SMILES: Brc1ccc2c(c1)C1(c3ccccc3-c3ccccc31)c1cc(Br)ccc1-2]
with the equimolar mixture comprising
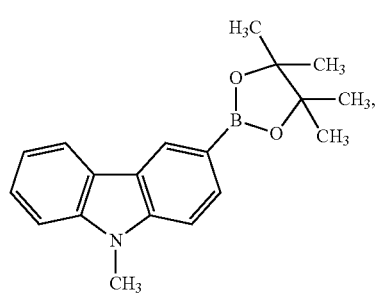
via the Suzuki reaction. The structures of the six components of the glass mixture are shown below:
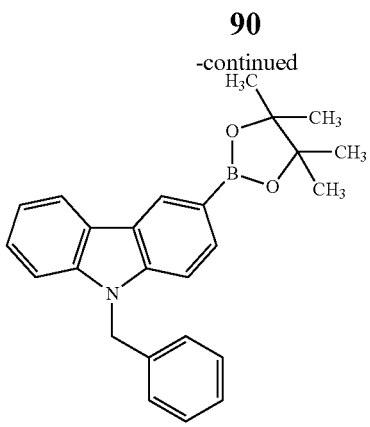
Glass Mixture 6
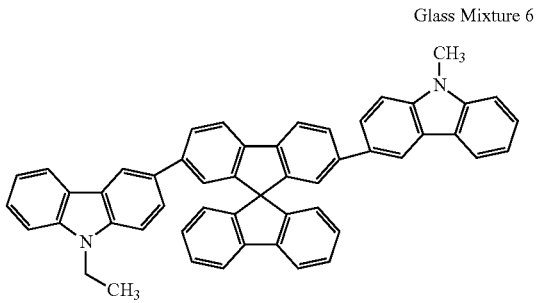
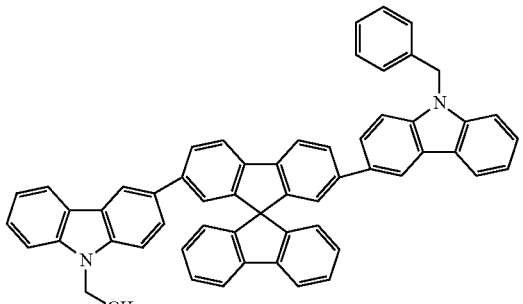
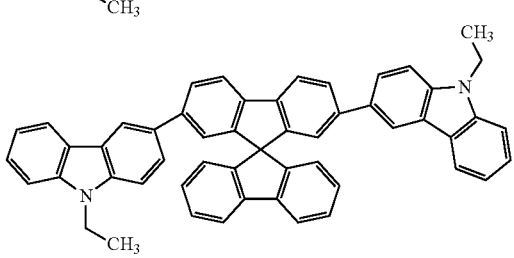
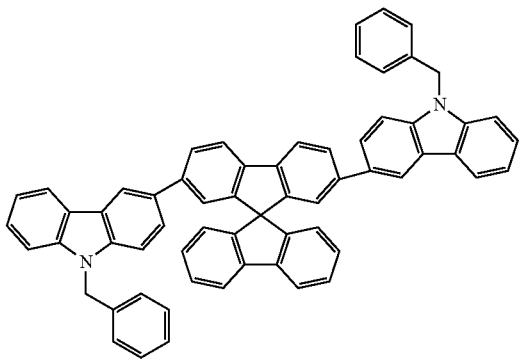

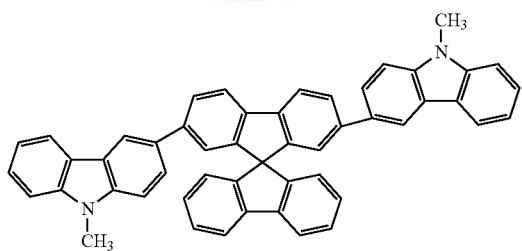
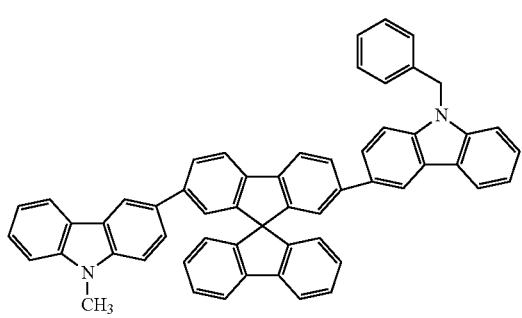
Glass Mixture 7: which is a electron-transporting blue emitting molecular glass mixture from the reaction of
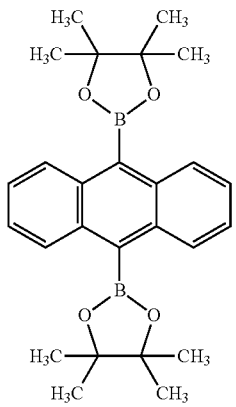 [SMILES: CC1(C)OB(c2c3ccccc3c(B3OC(C)(C)C(C)(C)O3)c3ccccc23)OC1(C)C]
with the equimolar mixture comprising
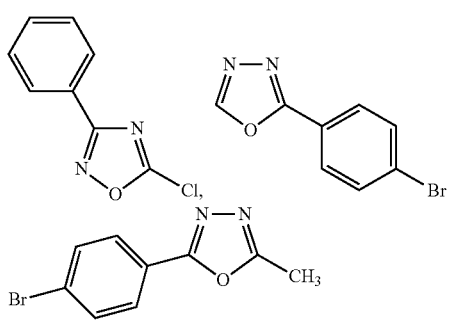
and via the Suzuki reaction. The structures of the six components of the glass mixture are shown below:
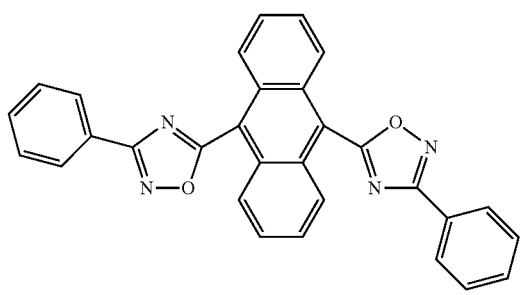
Glass Mixture 7
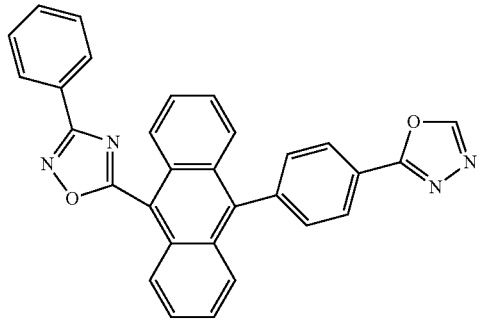
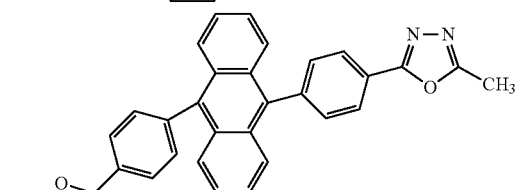
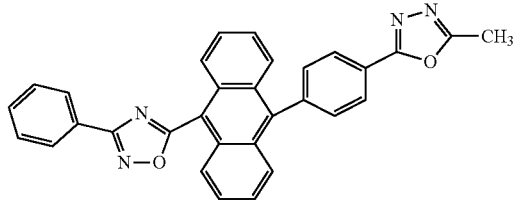
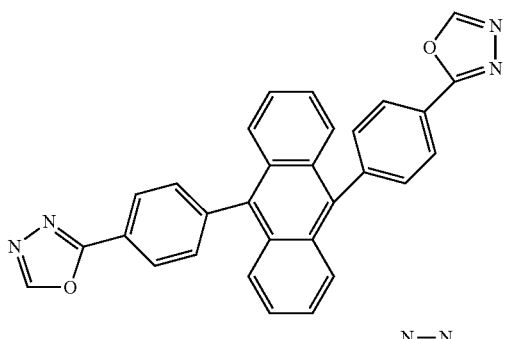
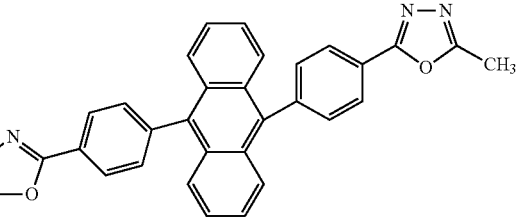
Glass Mixture 8: which is a hole-transporting emitting molecular glass of 100 mole %

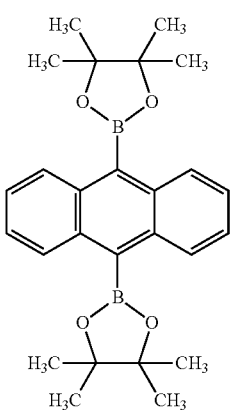 [SMILES: CC1(C)OB(c2c3ccccc3c(B3OC(C)(C)C(C)(C)O3)c3ccccc23)OC1(C)C]
with the mixture comprising: 35 mole % of
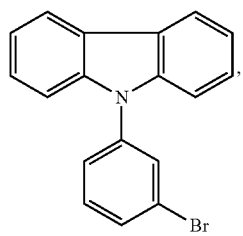 [SMILES: Brc1cccc(-n2c3ccccc3c3ccccc32)c1]
35 mole % of
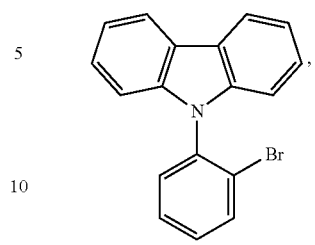
10 mole % of
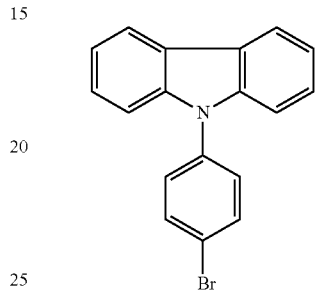
and 20 mole % of the difunctional
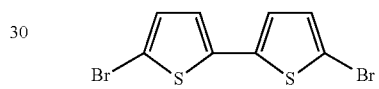
via the Suzuki reaction by controlled oligomerization. The structures of the components of the glass mixture are shown below:
Glass Mixture 8
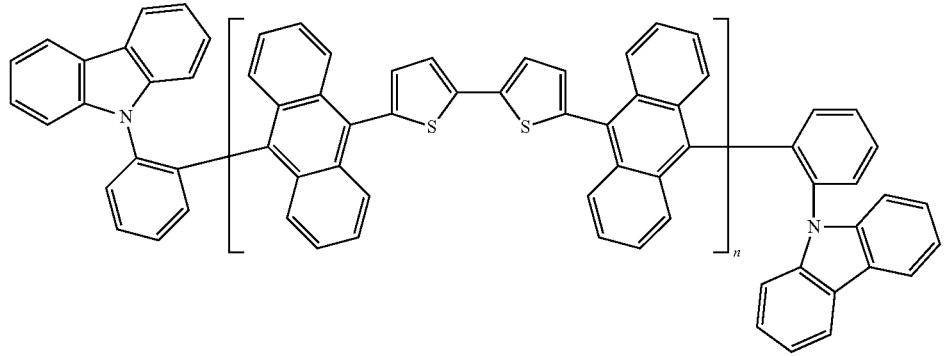
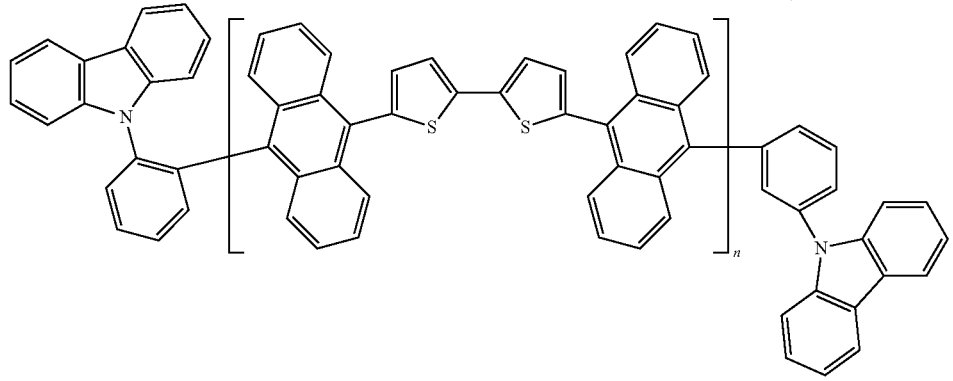

-continued
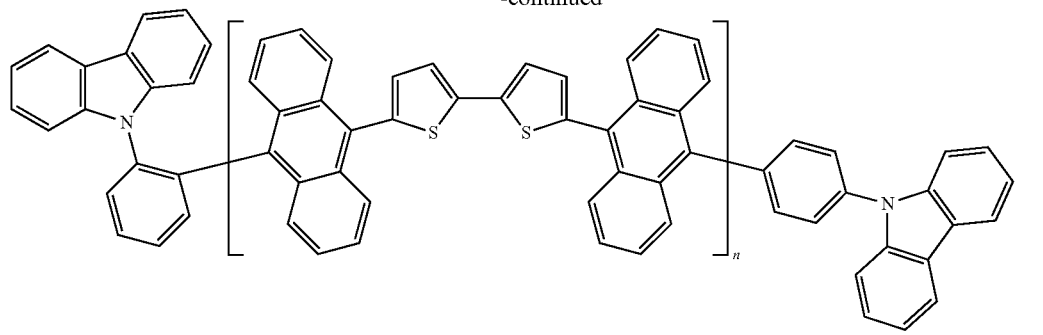
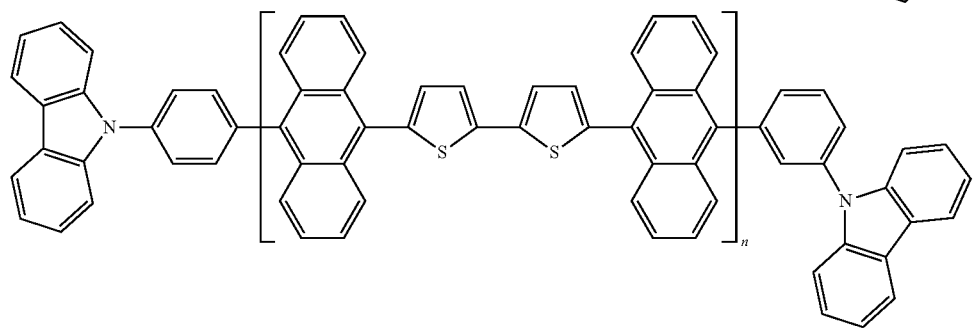
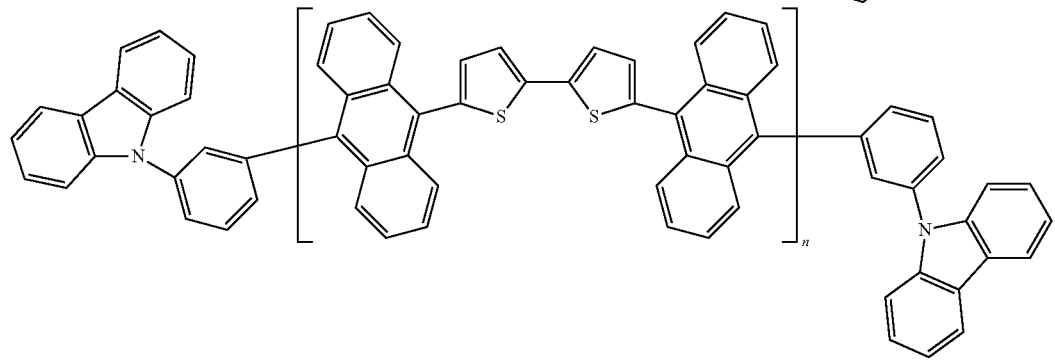
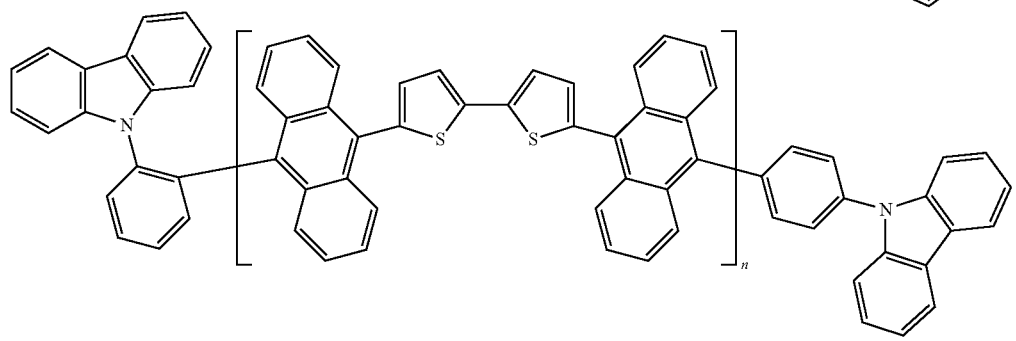
Glass Mixture 9: which is a bipolar-transporting molecular glass of
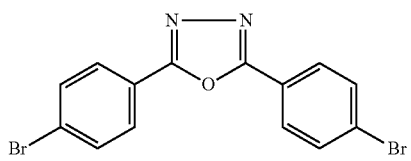 [SMILES: Brc1ccc(-c2nnc(-c3ccc(Br)cc3)o2)cc1]
with the equimolar mixture comprising
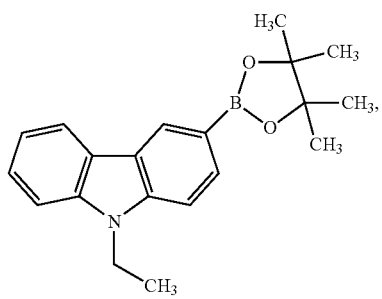

97
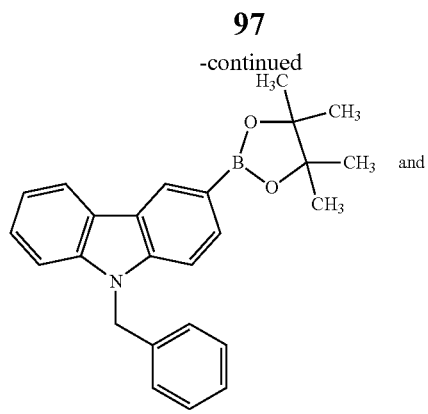
and
98
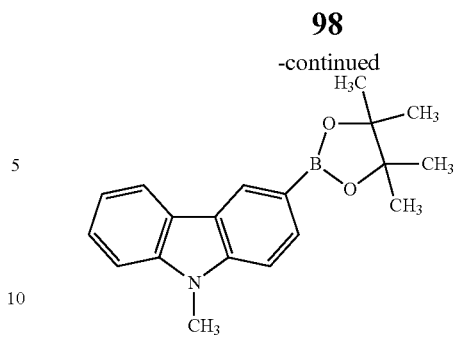
via the Suzuki reaction. The structures of the components of the glass mixture are shown below:
Glass Mixture 9
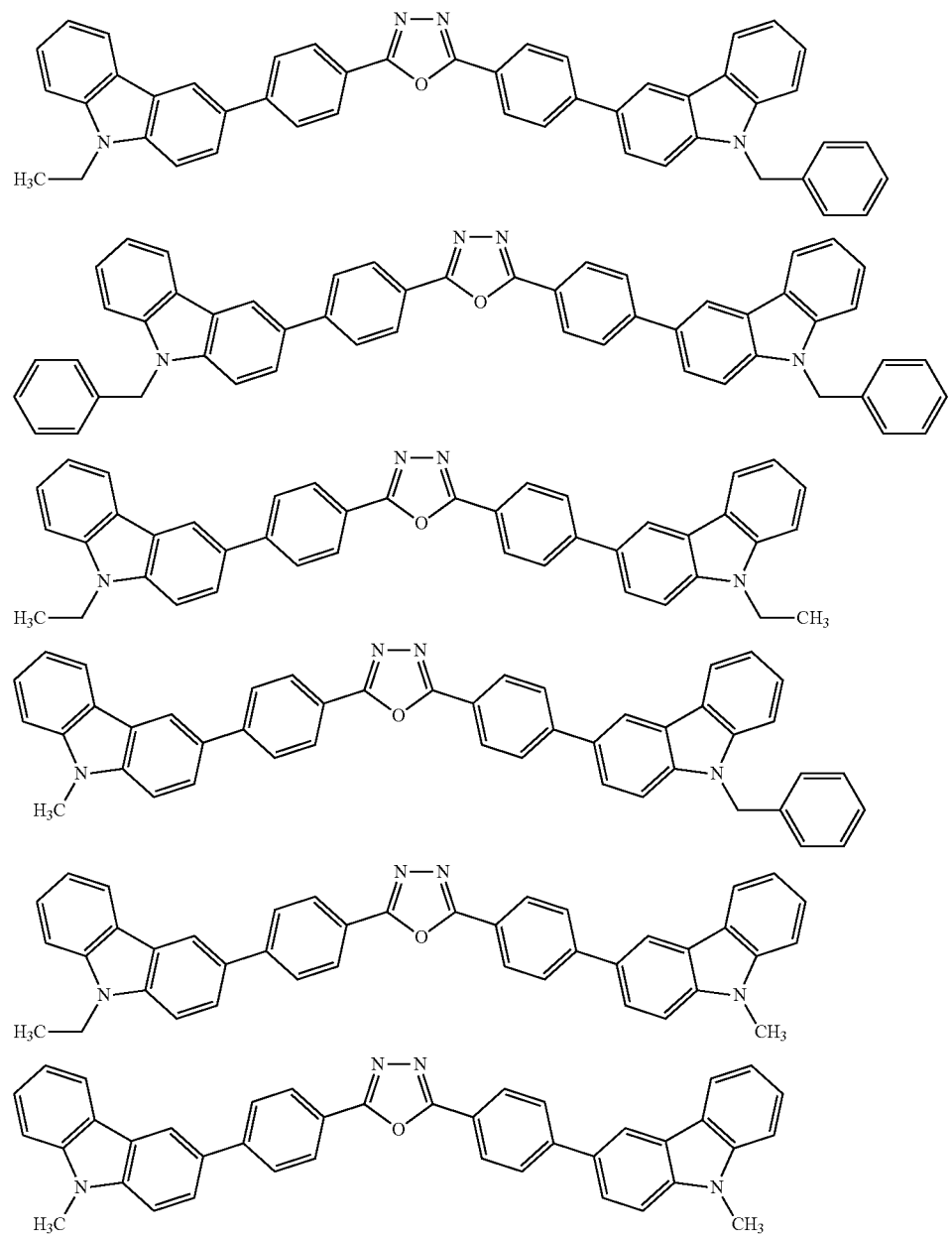

Glass Mixture 10: which is a bipolar-transporting molecular glass of
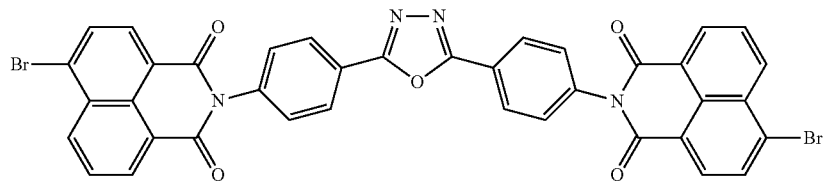 [SMILES: O=C1c2cccc3c(Br)ccc(c23)C(=O)N1c1ccc(-c2nnc(-c3ccc(N4C(=O)c5cccc6c(Br)ccc(c56)C4=O)cc3)o2)cc1]
with the equimolar mixture comprising
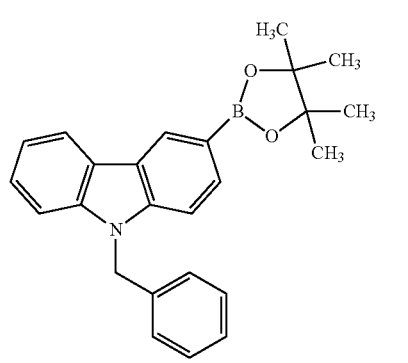 [SMILES: CC1(C)OB(c2ccc3c(c2)c2ccccc2n3Cc2ccccc2)OC1(C)C]
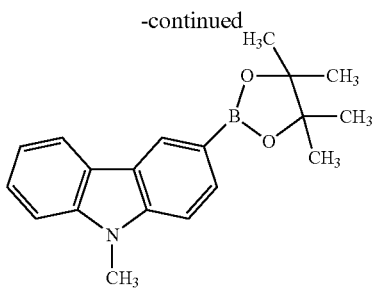
-continued
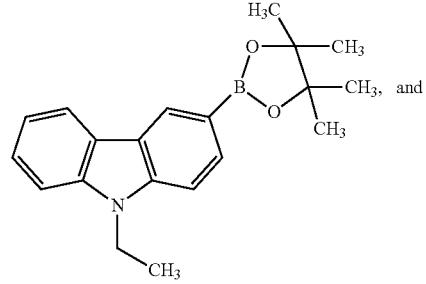
and
via the Suzuki reaction. The structures of the components of the glass mixture are shown below:
Glass Mixture 10
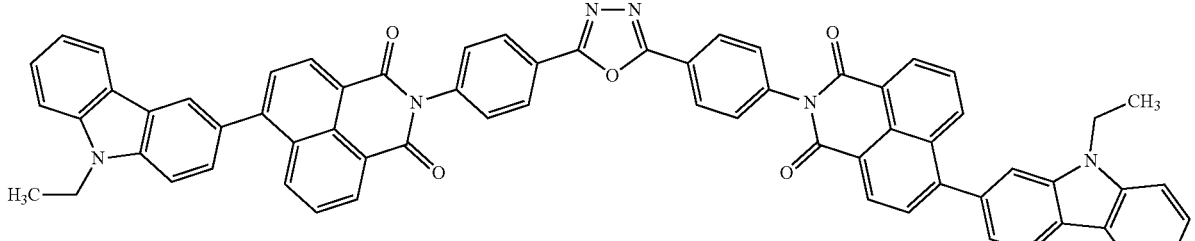
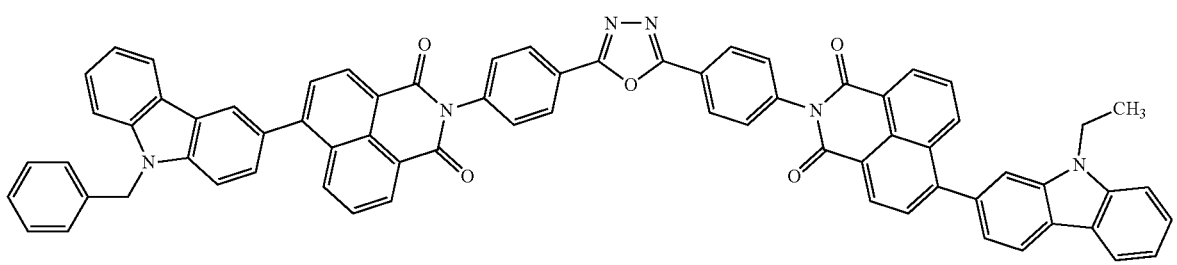

-continued
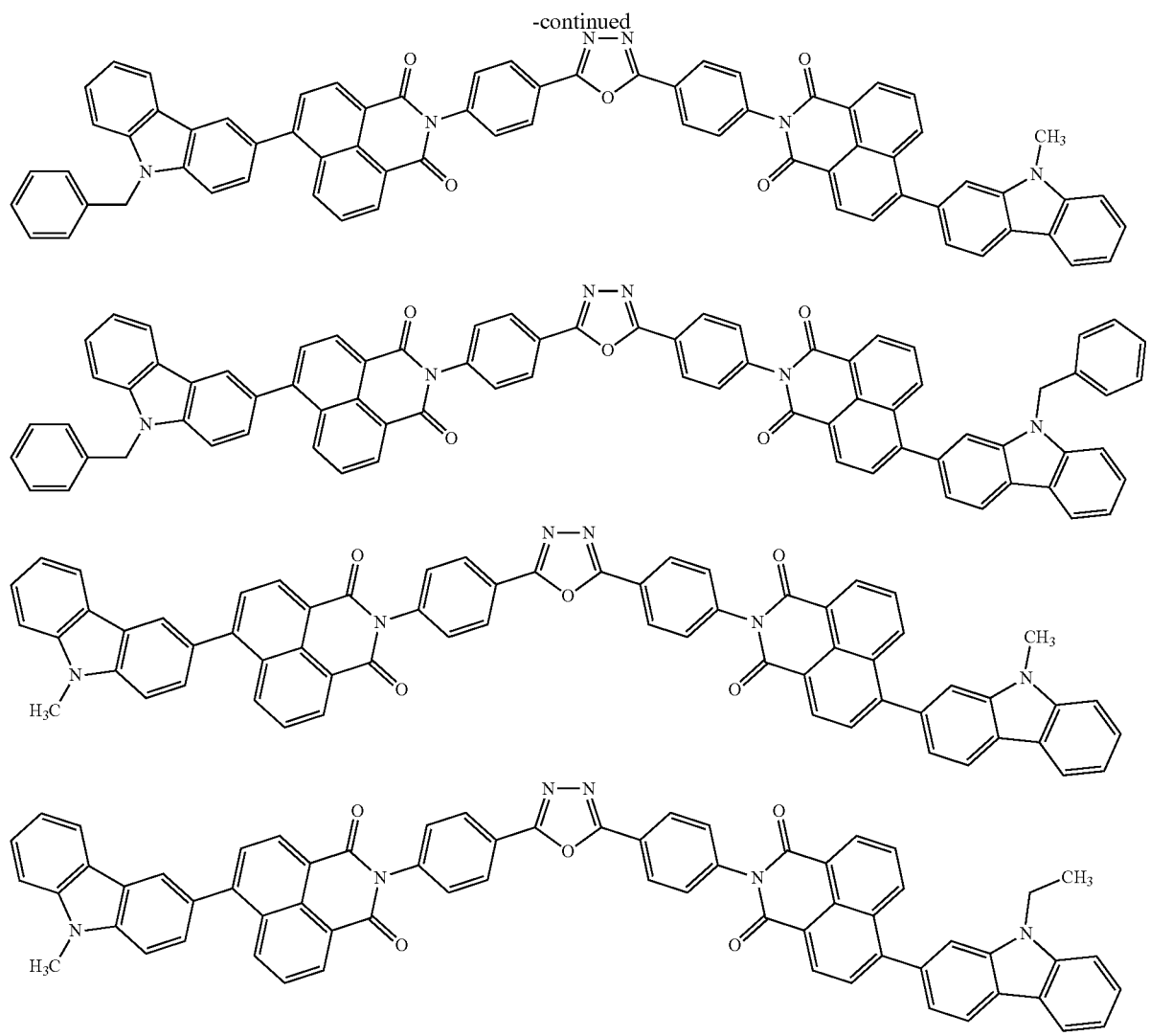
Glass Mixture 11: which is a bipolar-transporting molecular glass of
with the equimolar mixture comprising
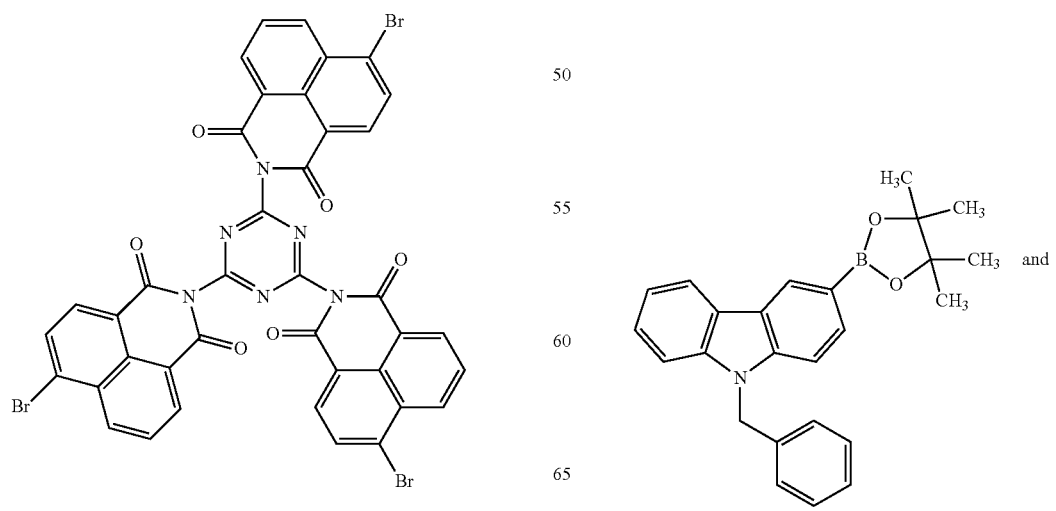

-continued
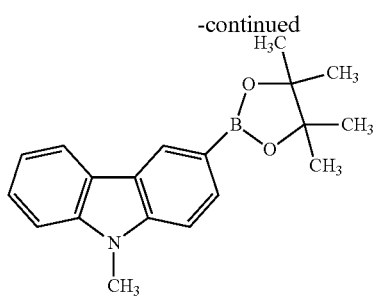
via the Suzuki reaction. The structures of the components of the glass mixture are shown below:
Glass Mixture 11
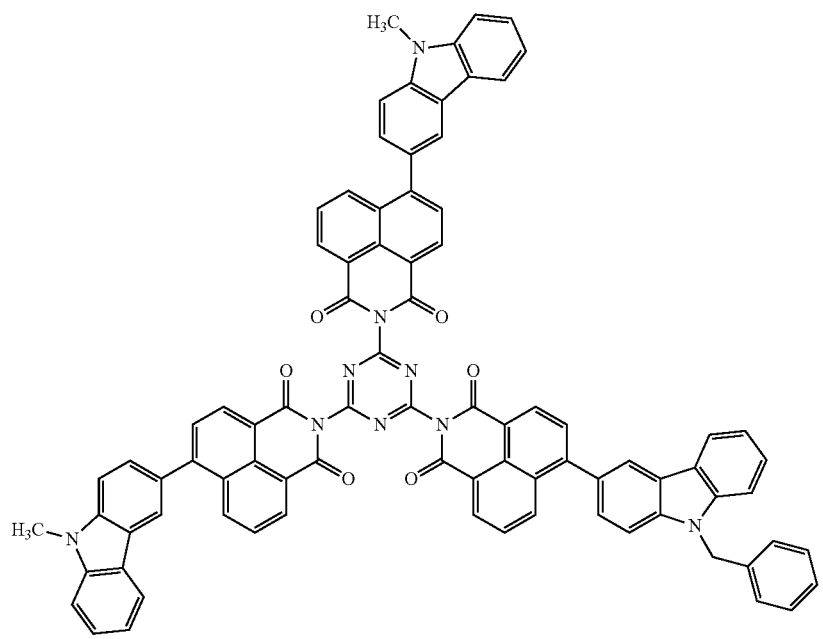
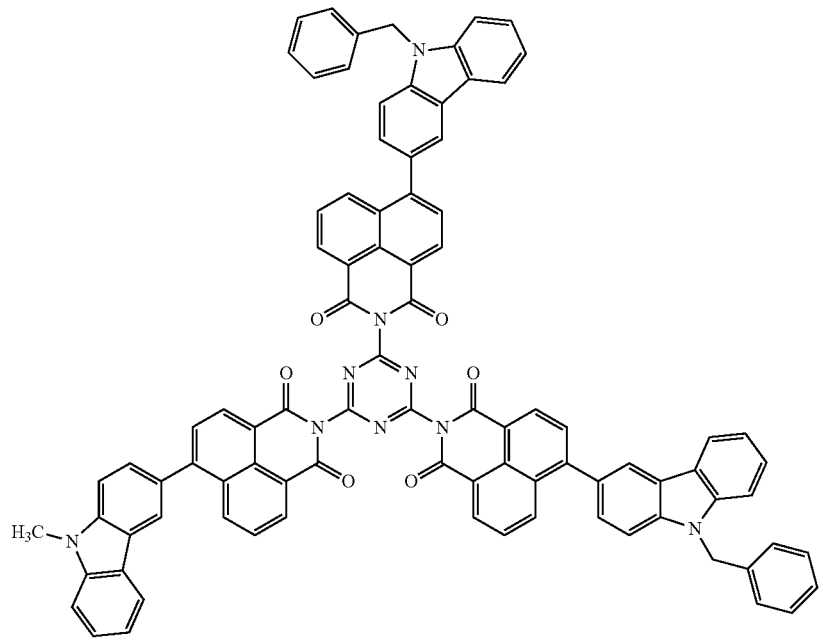

-continued
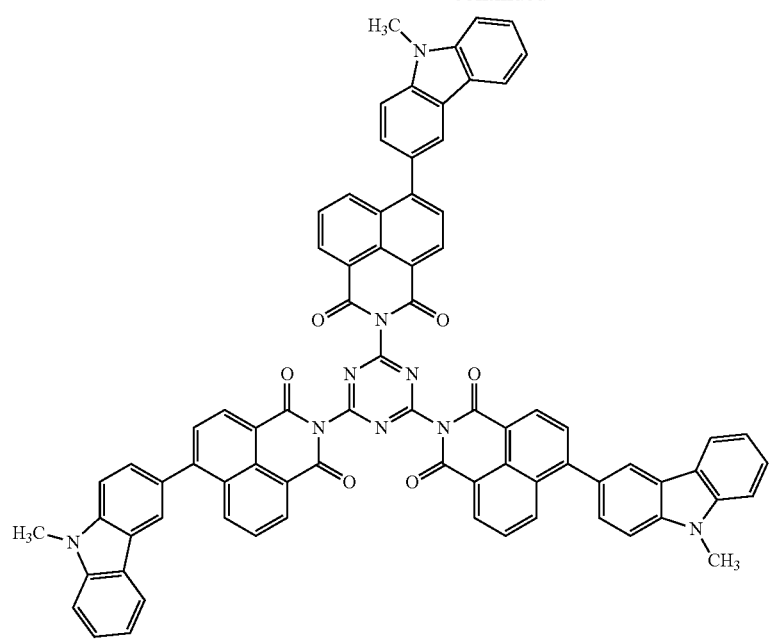
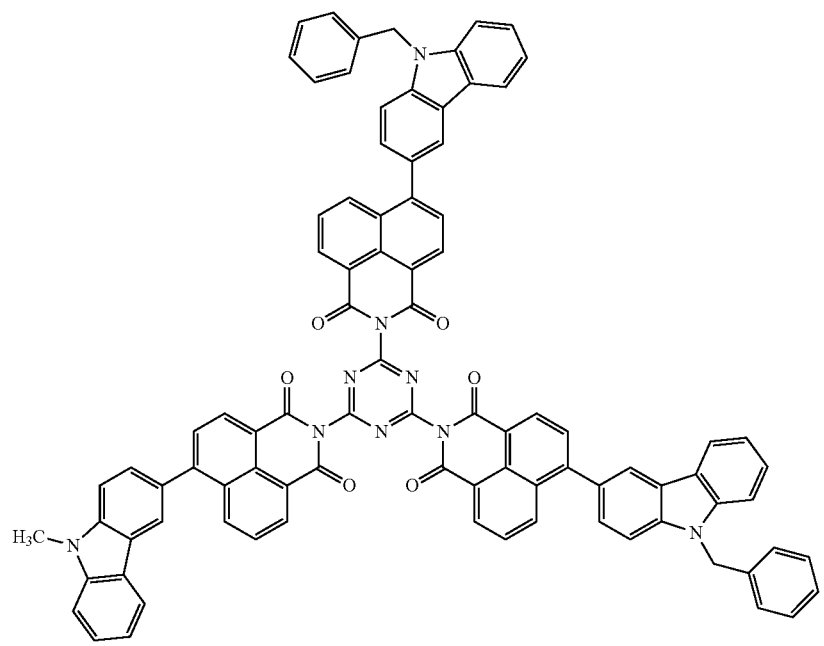

Glass Mixture 12: which is a blue emitting molecular glass made by the Suziki reaction
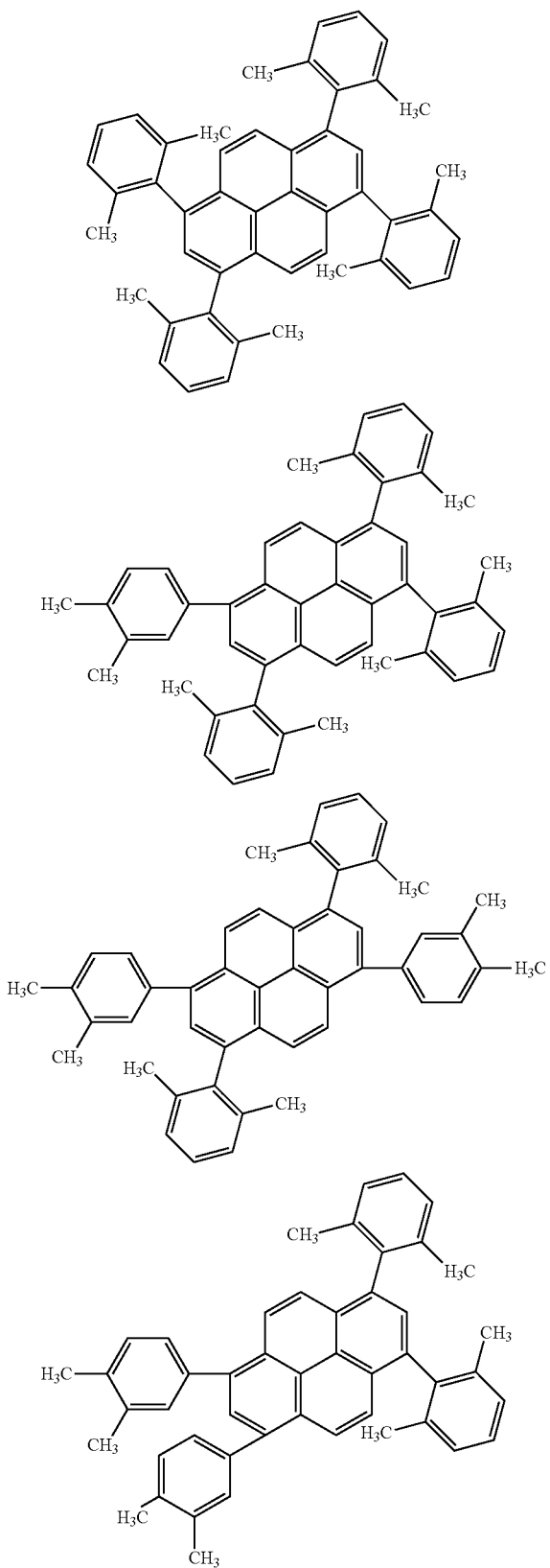
Glass Mixture 12
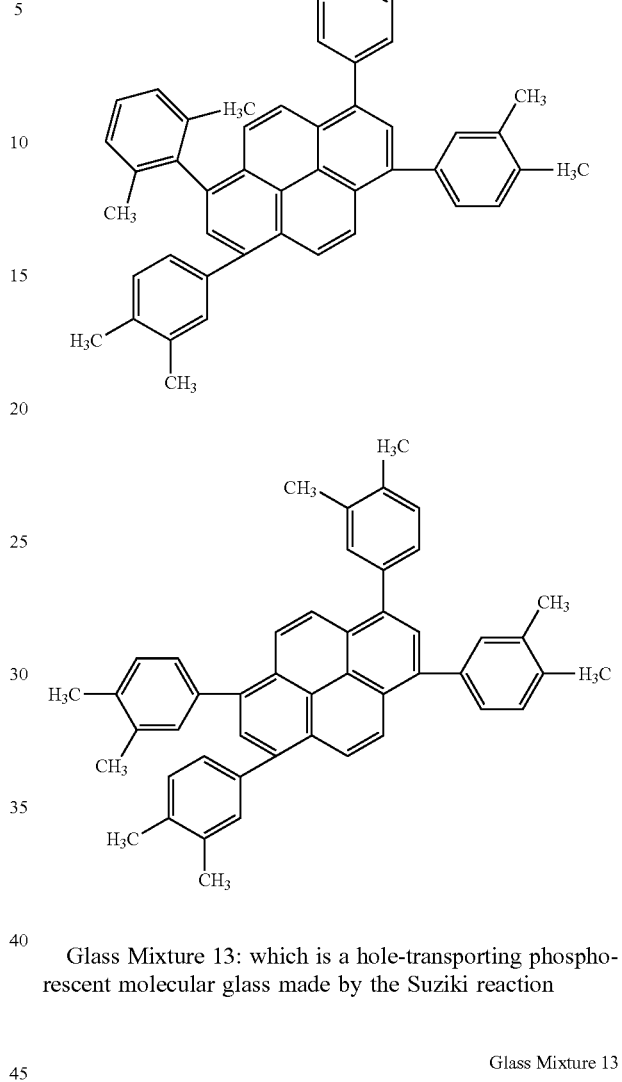
Glass Mixture 13: which is a hole-transporting phosphorescent molecular glass made by the Suziki reaction
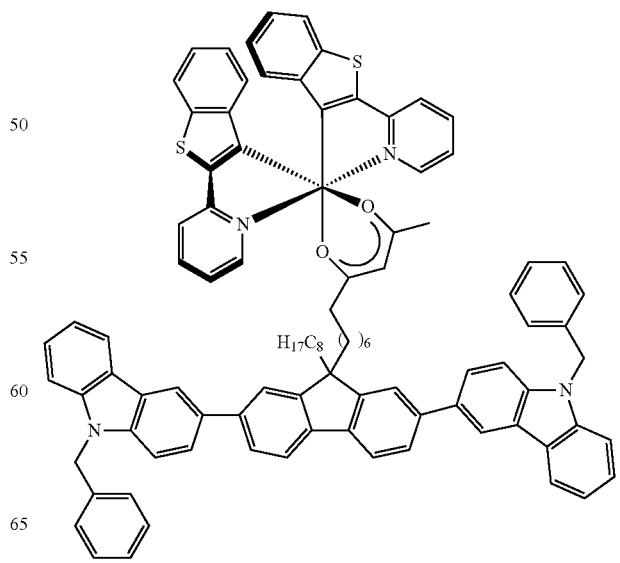
Glass Mixture 13

109
-continued
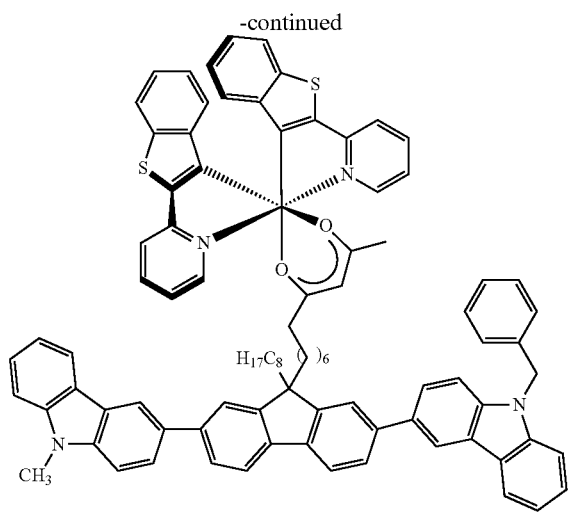
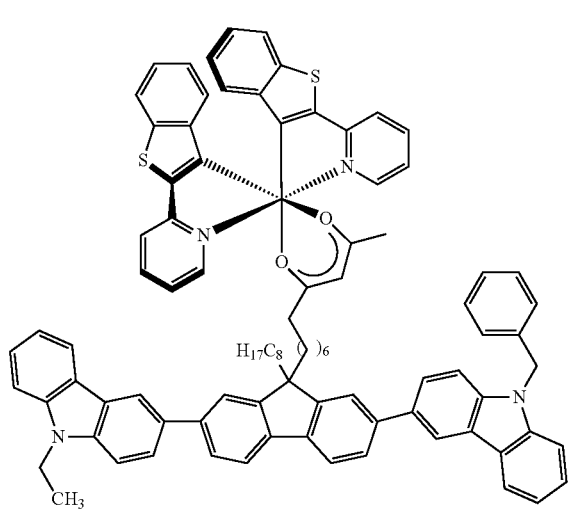
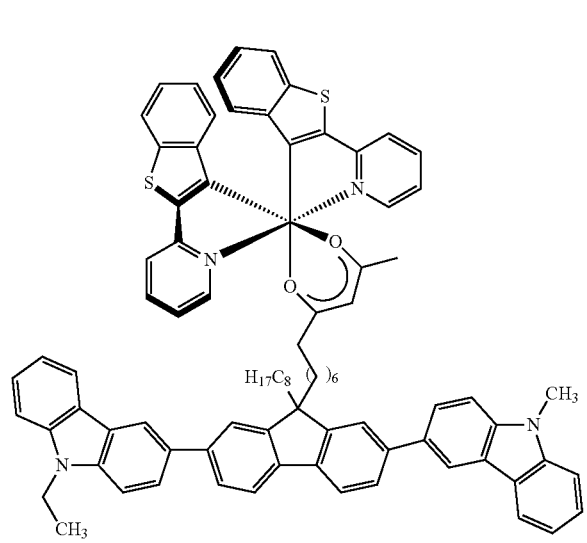
110
-continued
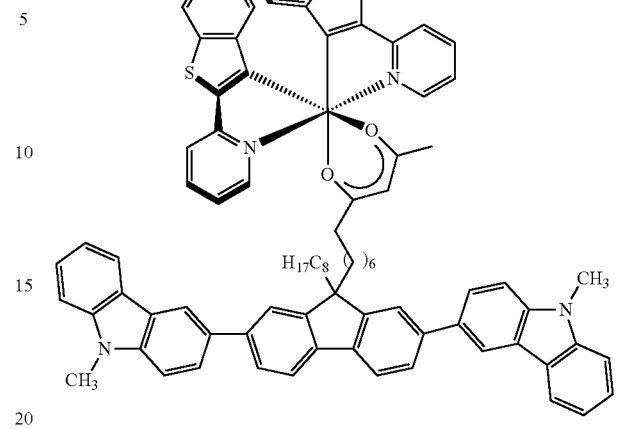
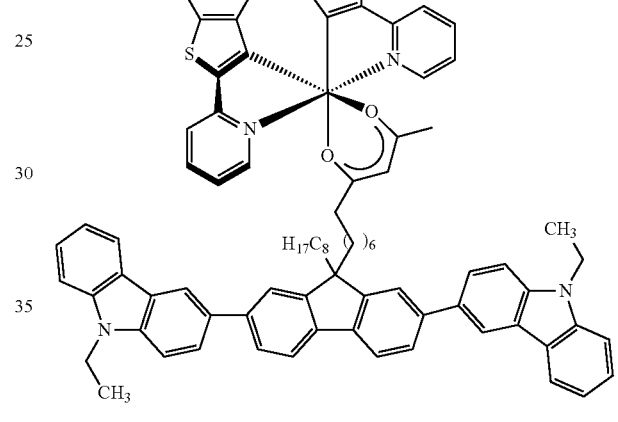
Glass Mixture 14: which is a hole-transporting phosphorescent molecular glass made by the Suziki reaction
Glass Mixture 14
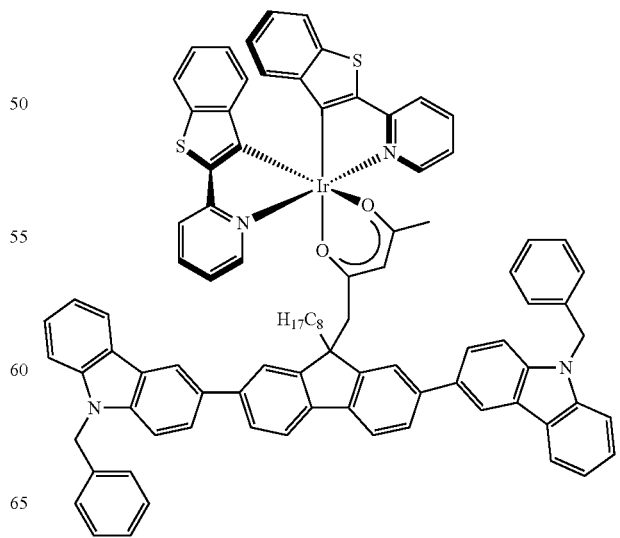

111
-continued
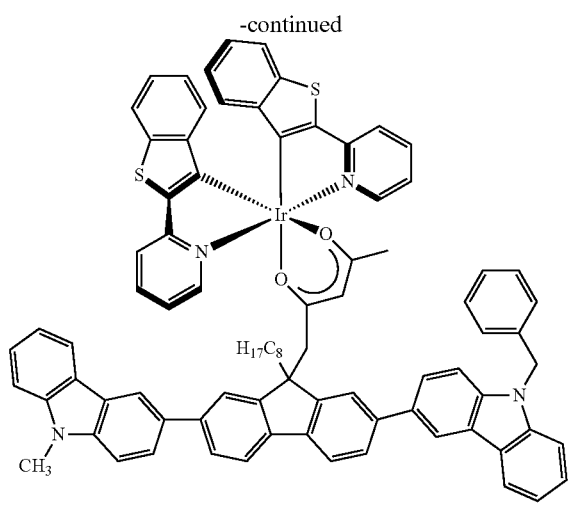
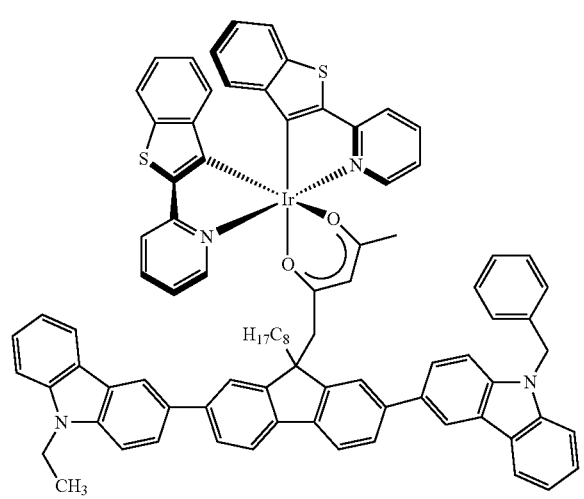
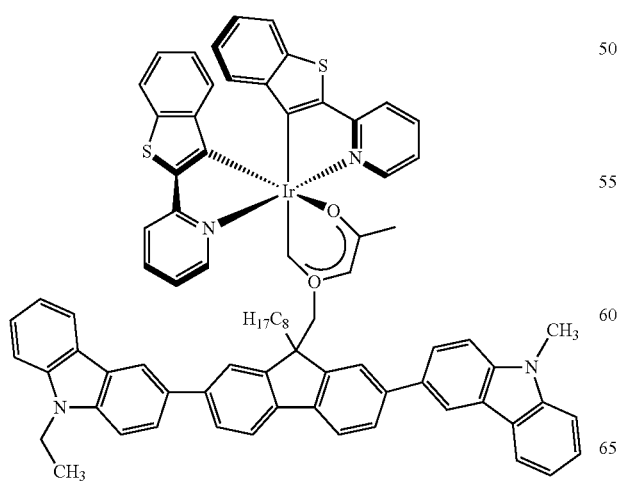
112
-continued
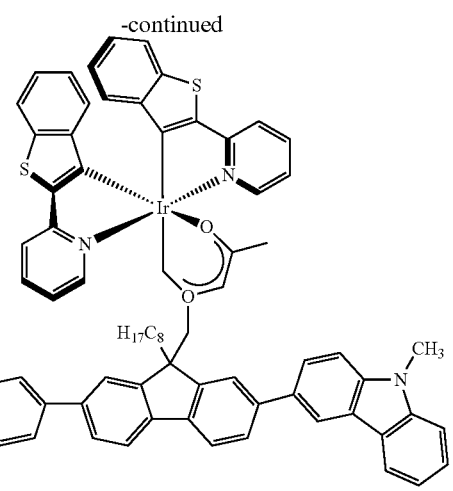
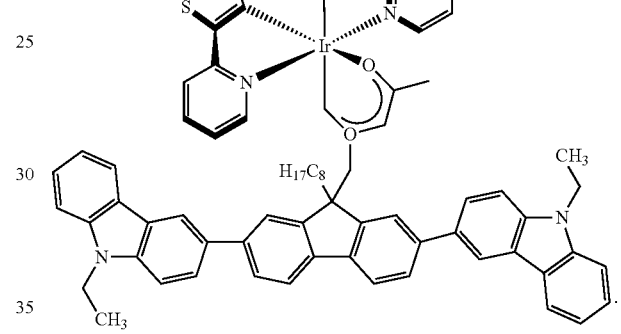
Glass Mixture 15: which is a hole-transporting phosphorescent molecular glass made by the Suziki reaction
Glass Mixture 15
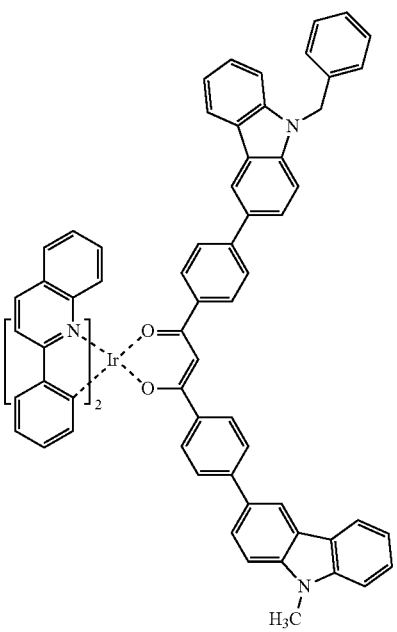

113
-continued
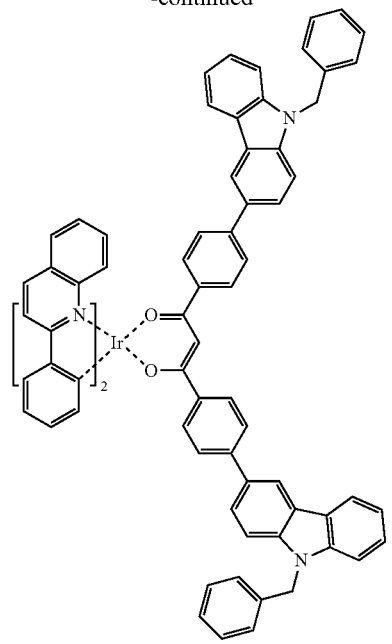
114
-continued
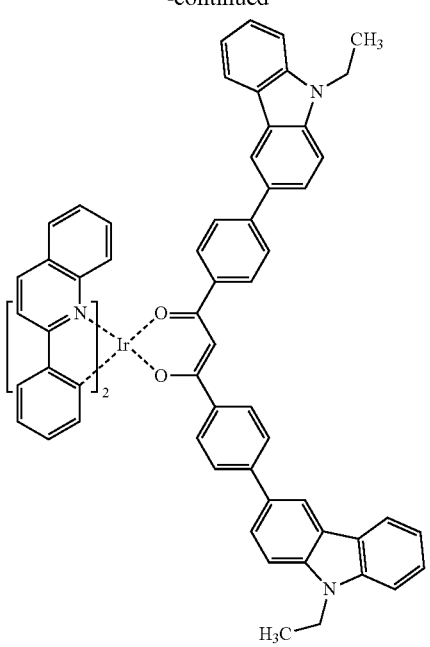
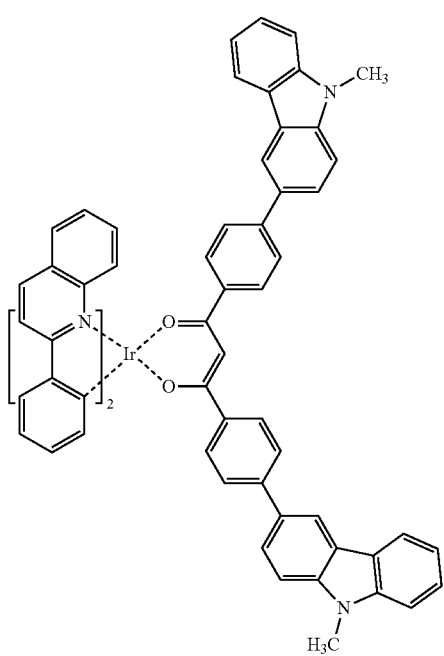
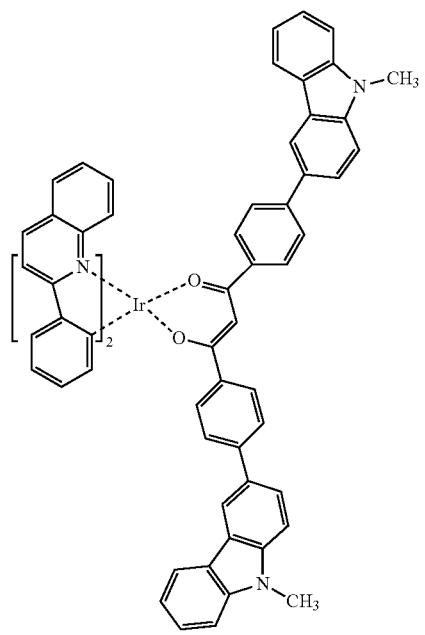

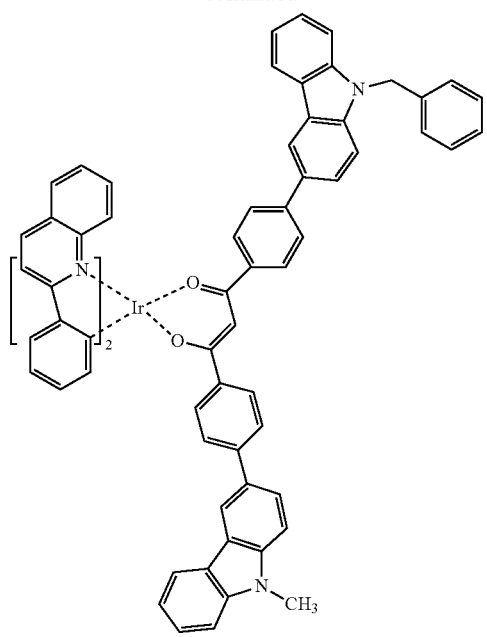
Glass Mixture 17: which is a high triplet hole-transporting molecular glass made by the Suziki reaction
Glass Mixture 17
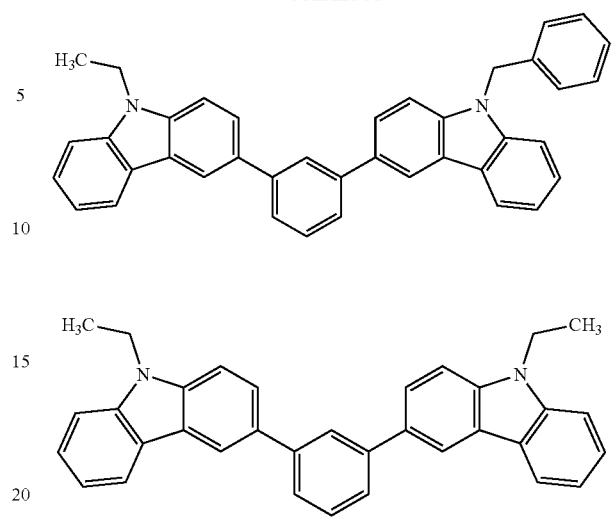
Glass Mixture 18: which is hole-transporting molecular glass made by the Suziki reaction
Glass Mixture 18
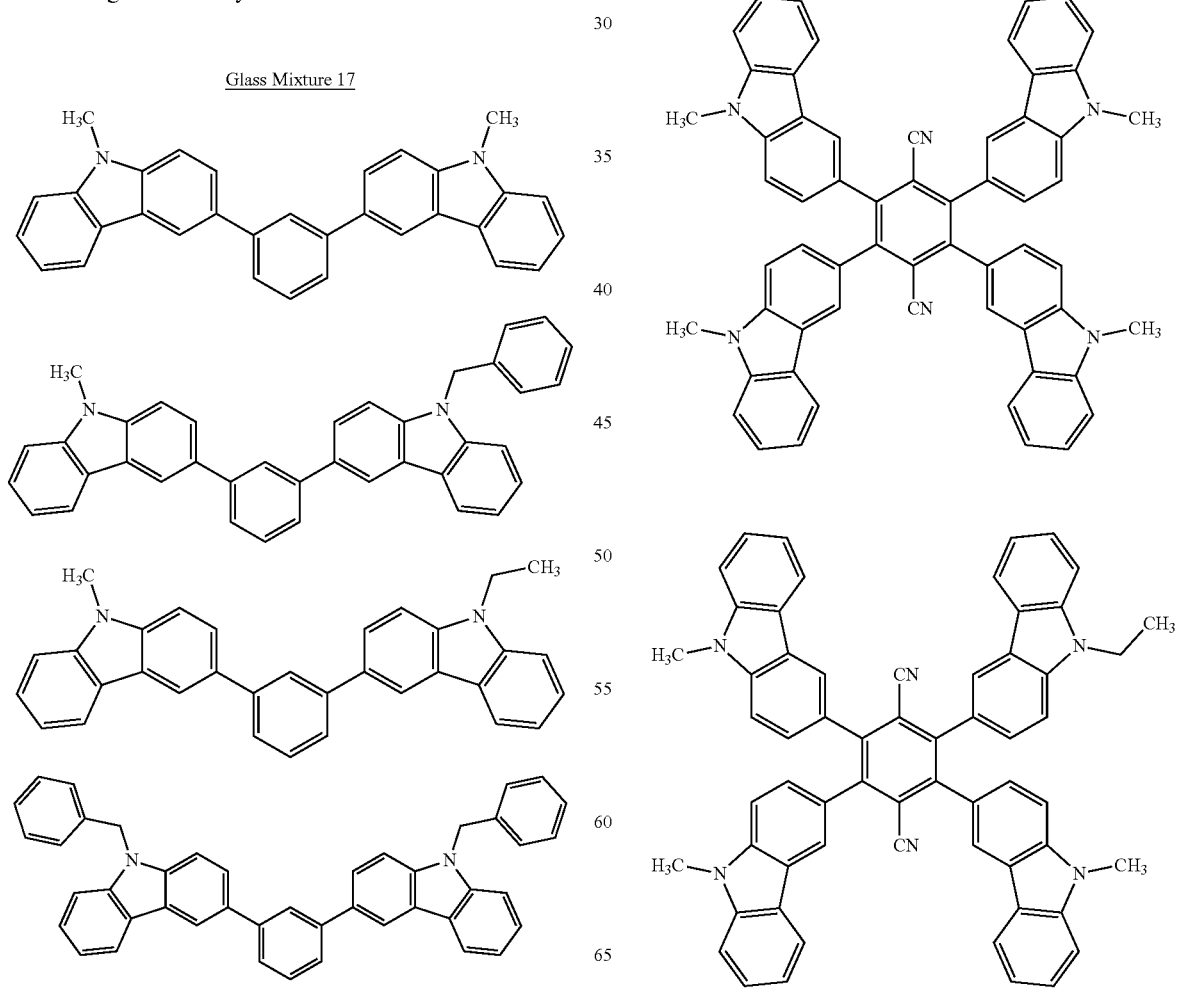

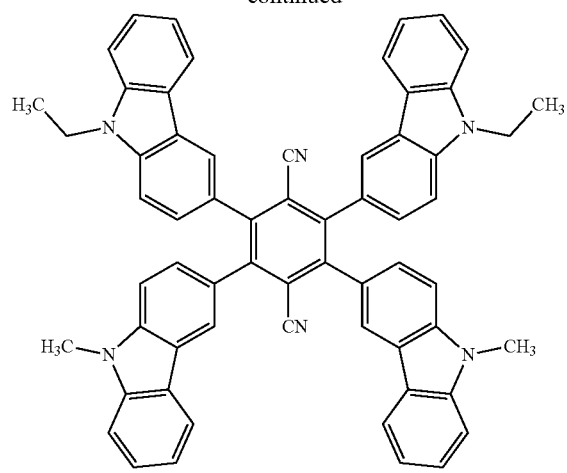
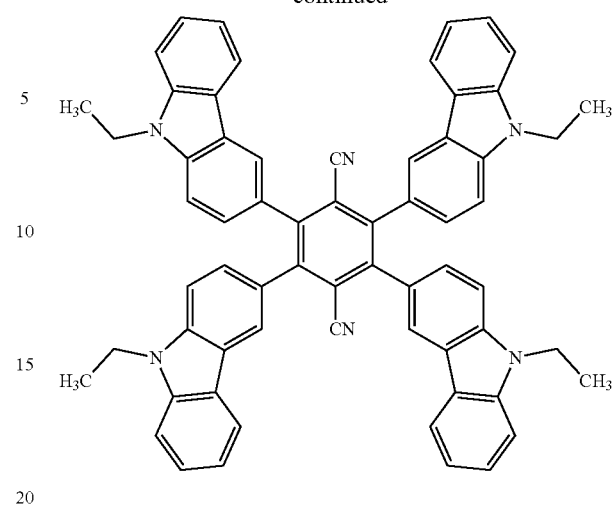
Glass Mixture 19: which is an isomeric blue host electron-transporting molecular glass made by the Suziki reaction
Glass Mixture 19
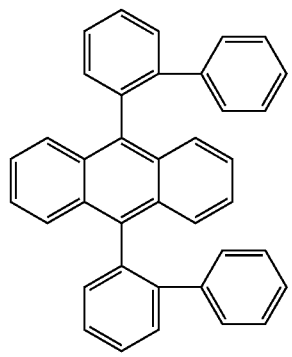
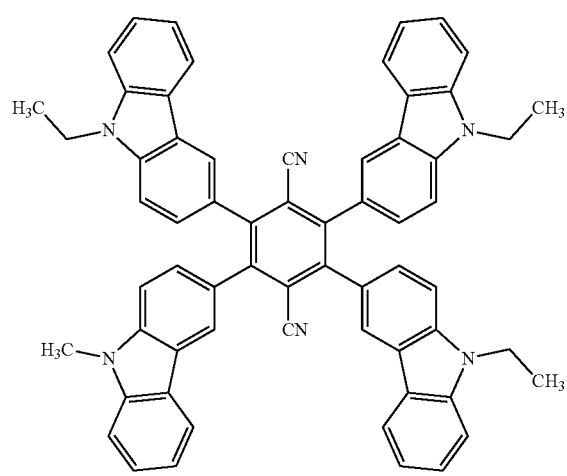
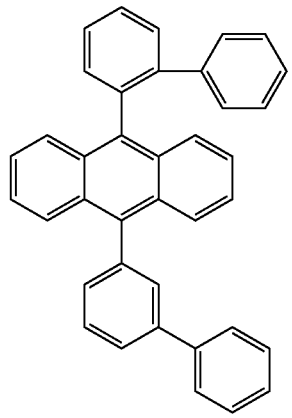

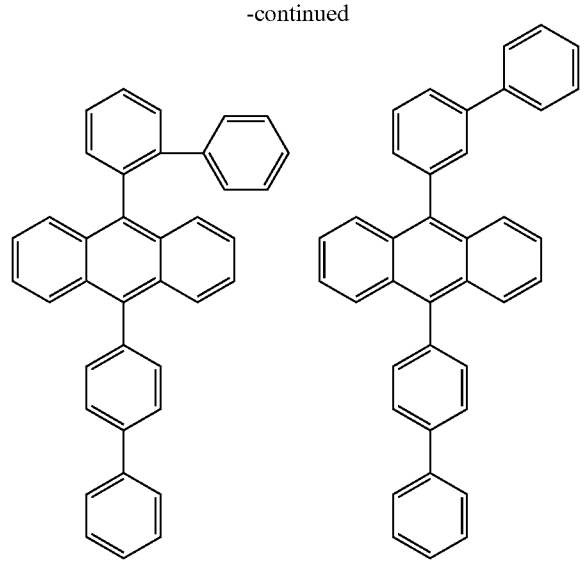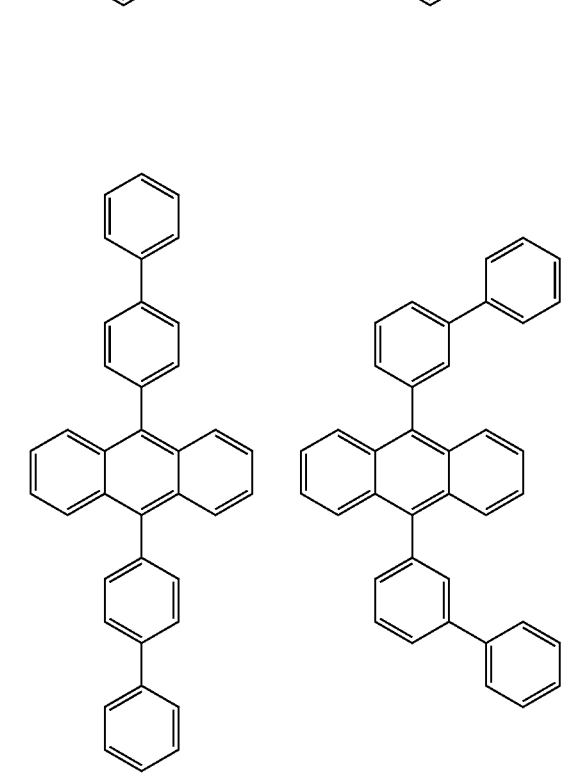
Glass Mixture 20: which is an isomeric electron-transporting molecular glass made by the Suziki reaction
Glass Mixture 20
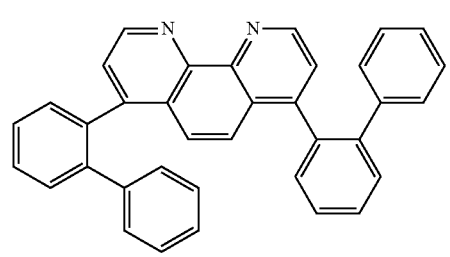
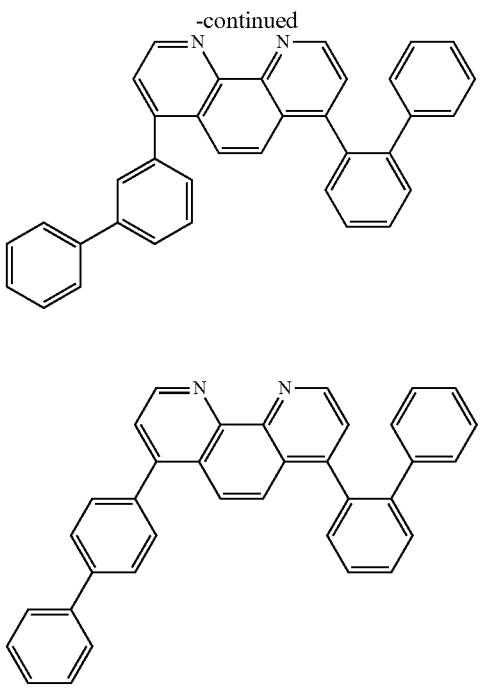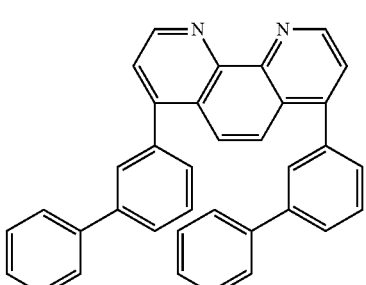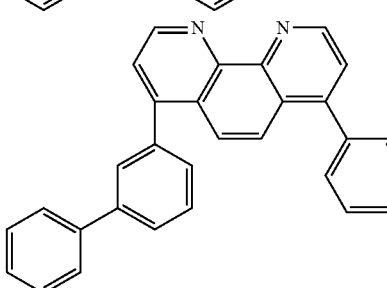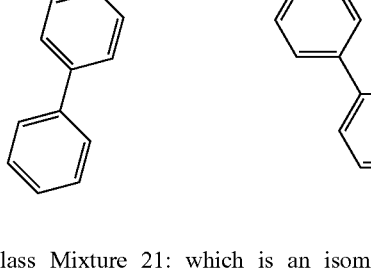
Glass Mixture 21: which is an isomeric high triplet hole-transporting molecular glass made by the Suziki reaction Glass Mixture 21
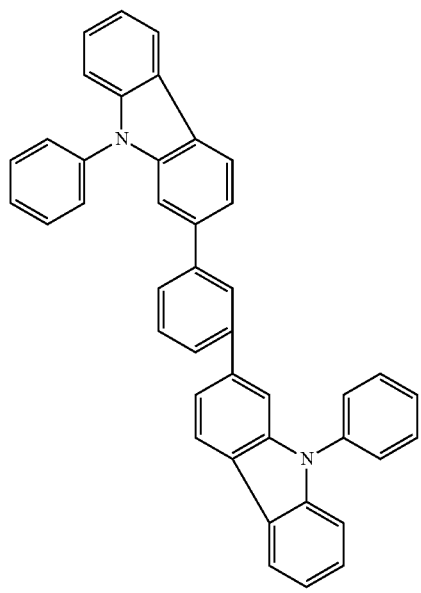
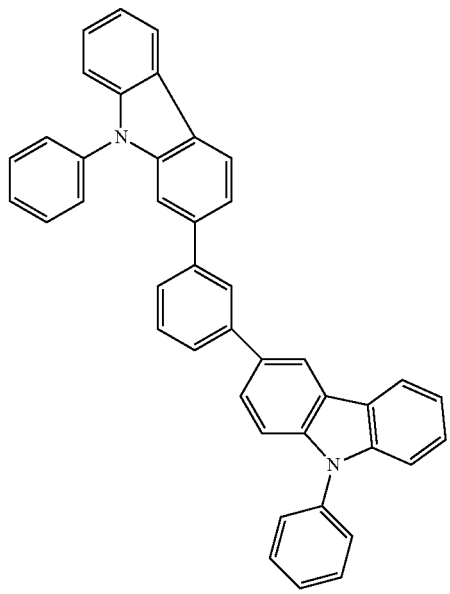
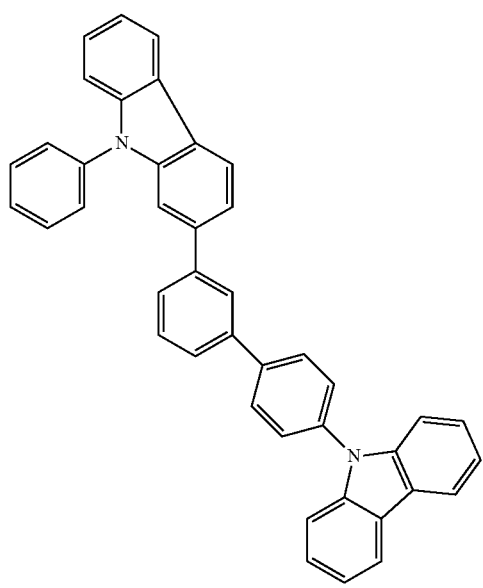
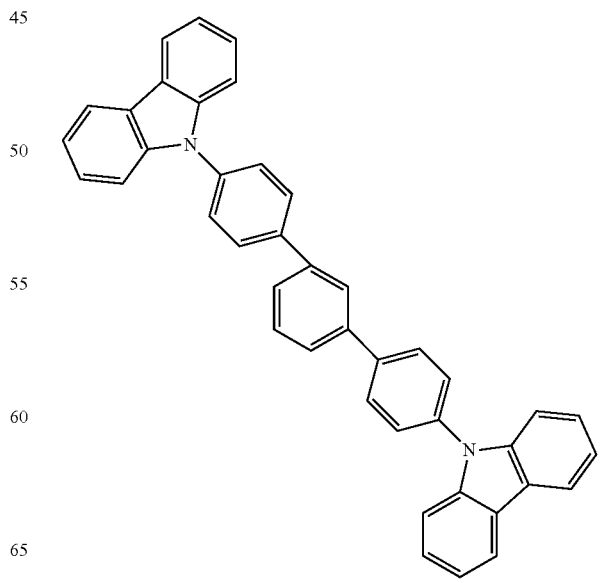

-continued
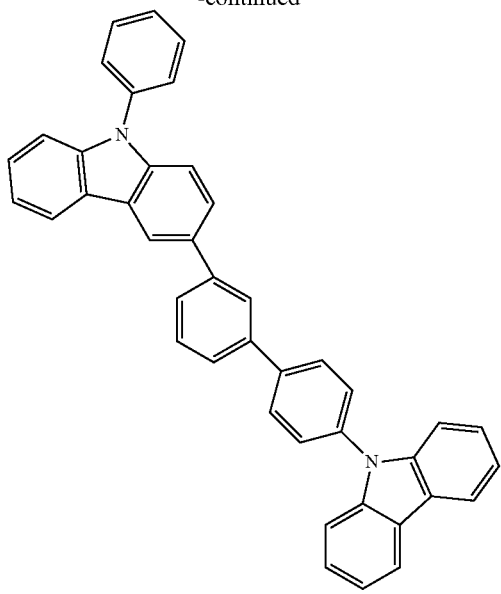
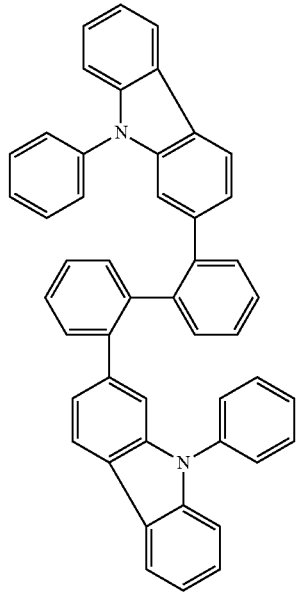
Glass Mixture 22
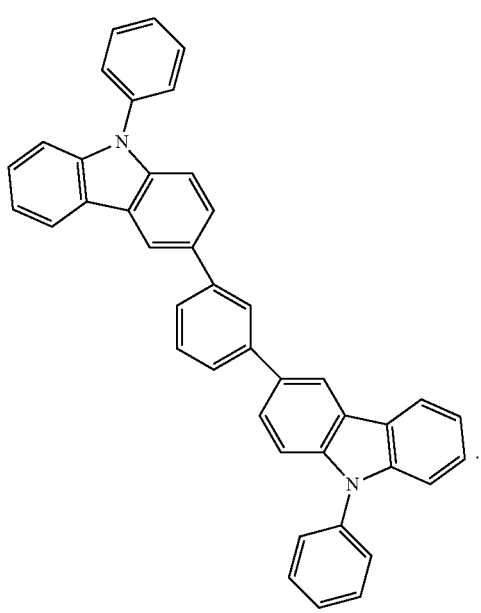
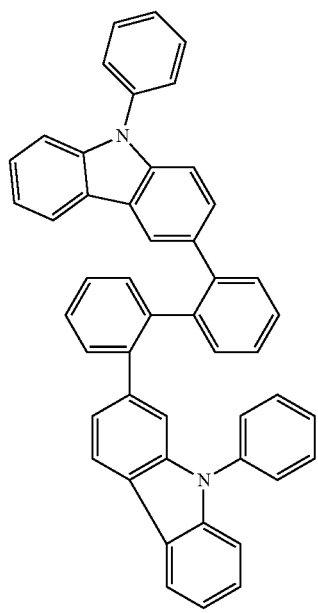
Glass Mixture 22: which is an isomeric high triplet hole-transporting molecular glass made by the Suziki reaction -continued
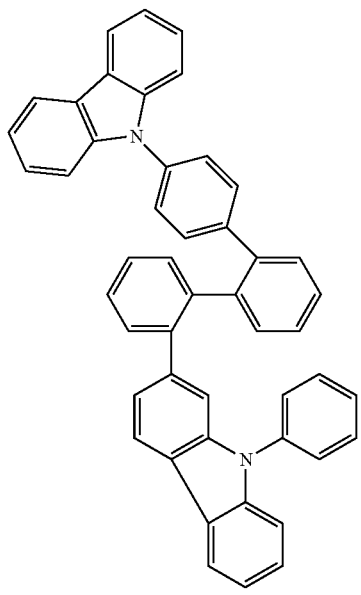
-continued
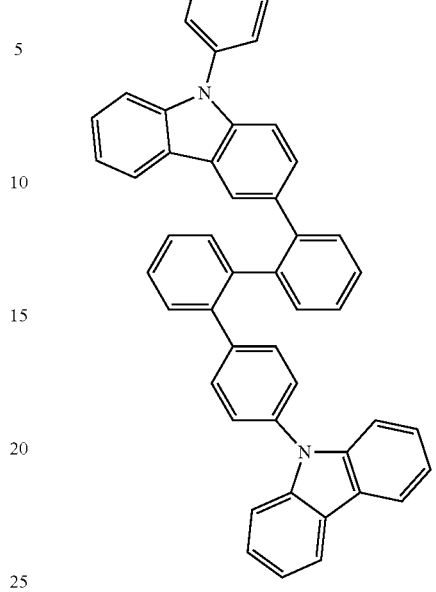
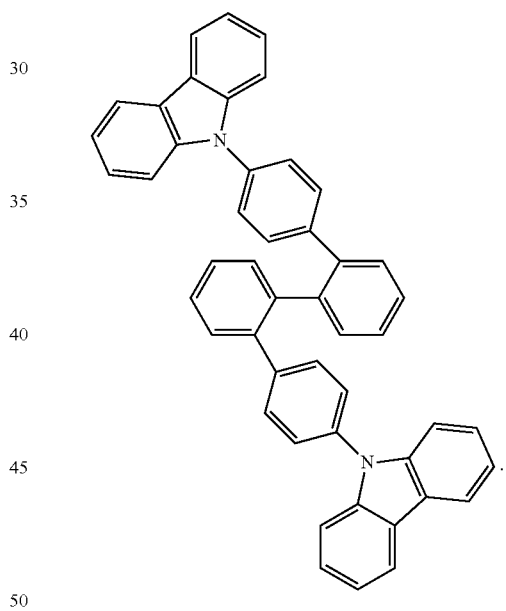
Glass Mixture 23: which is a blue fluorescent molecular glass made by the Suzuki reaction
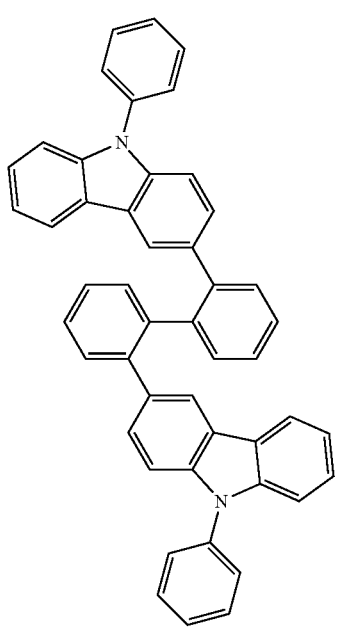
Glass Mixture 23
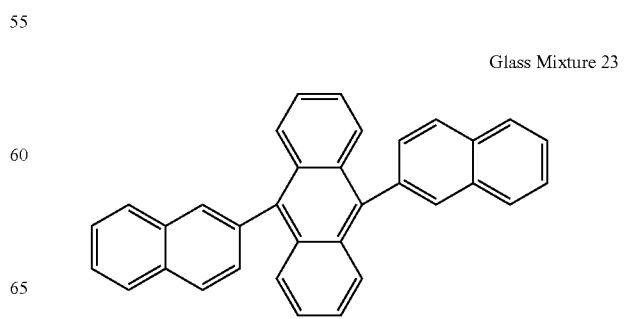

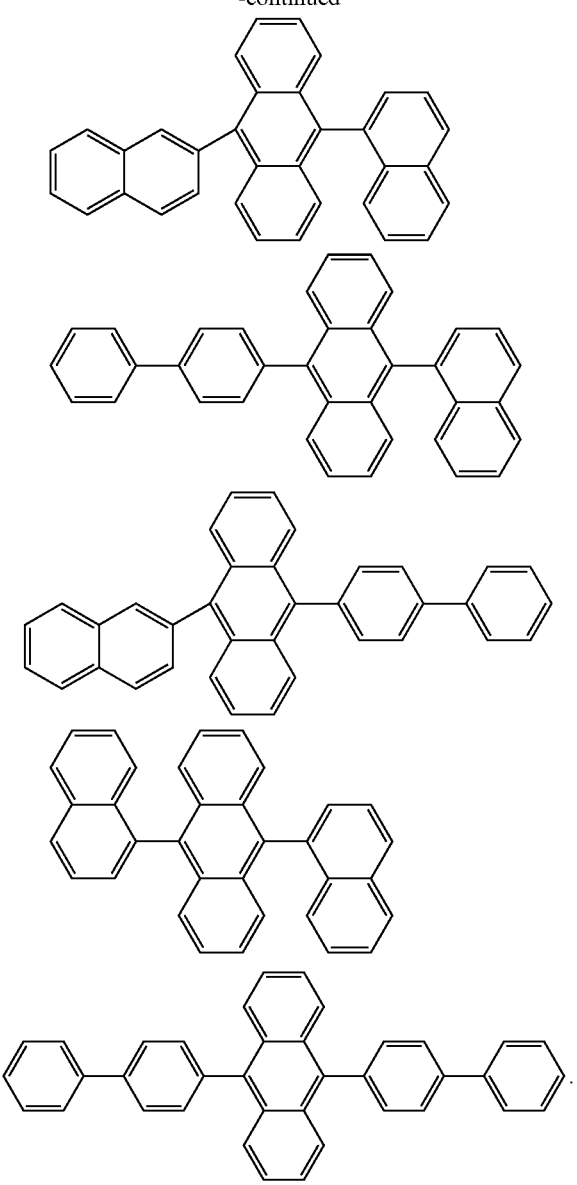
Glass Mixture 24: which is an isomeric high triplet electron-transporting molecular glass made by the Suzuki reaction
Glass Mixture 24
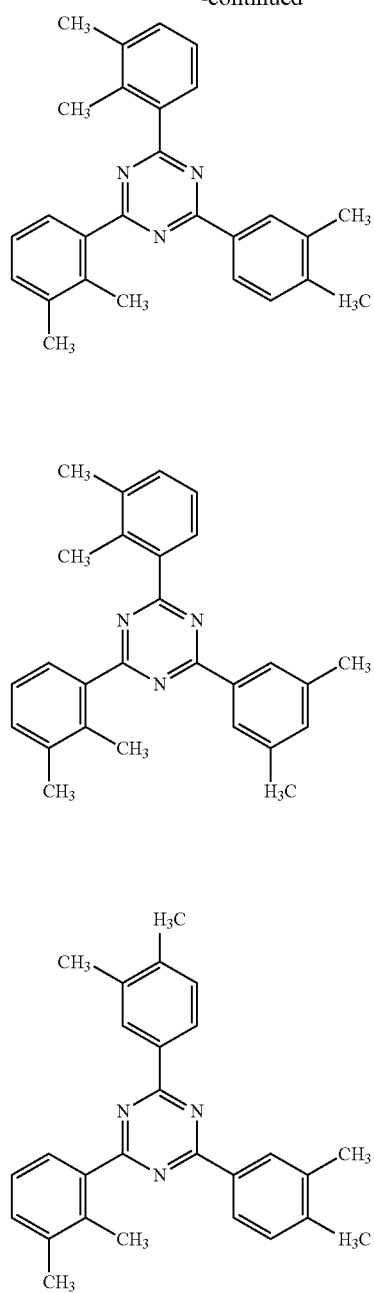

129
-continued
130
-continued
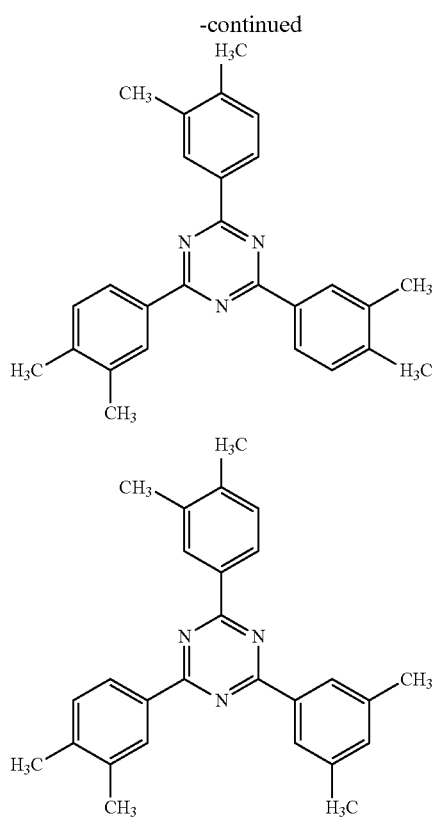
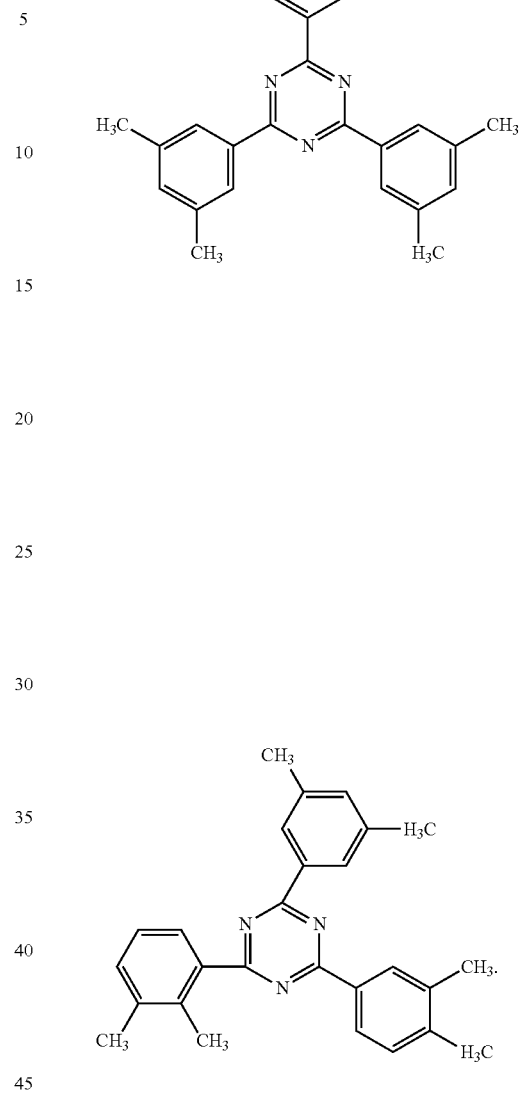
Glass Mixture 25: which is an isomeric bipolarcharge-transporting molecular glass made by the Suzuki reaction
Glass Mixture 25
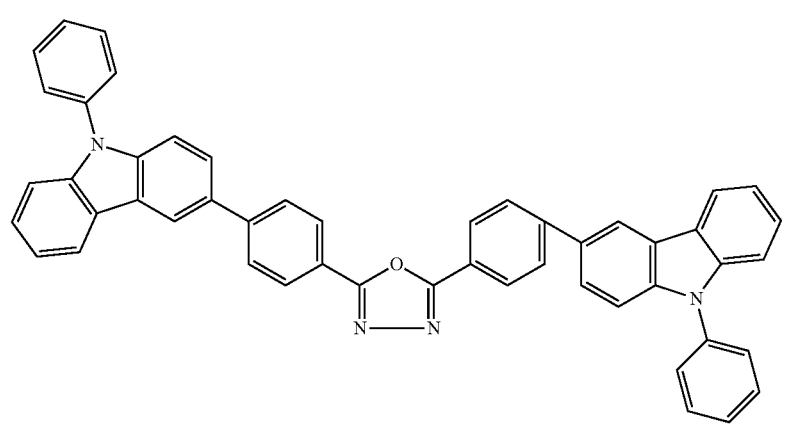

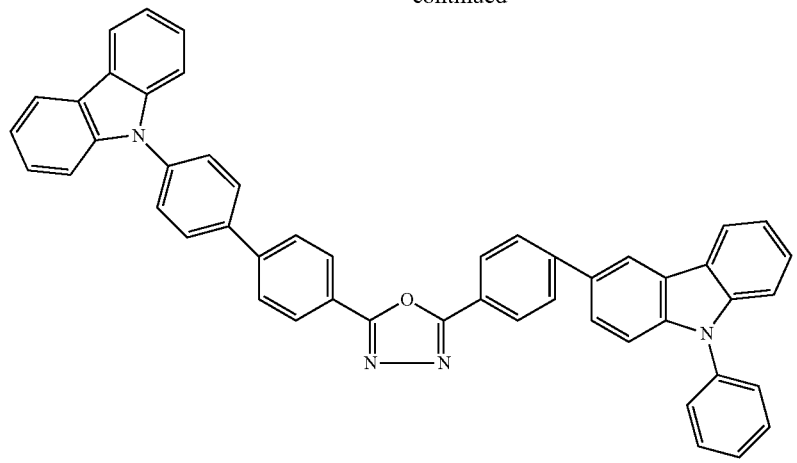
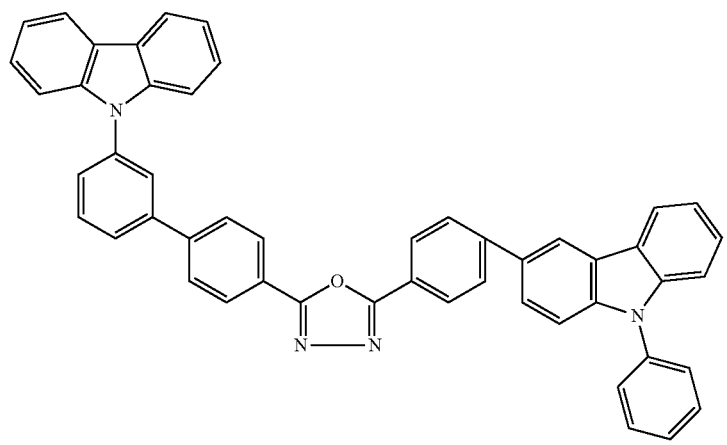
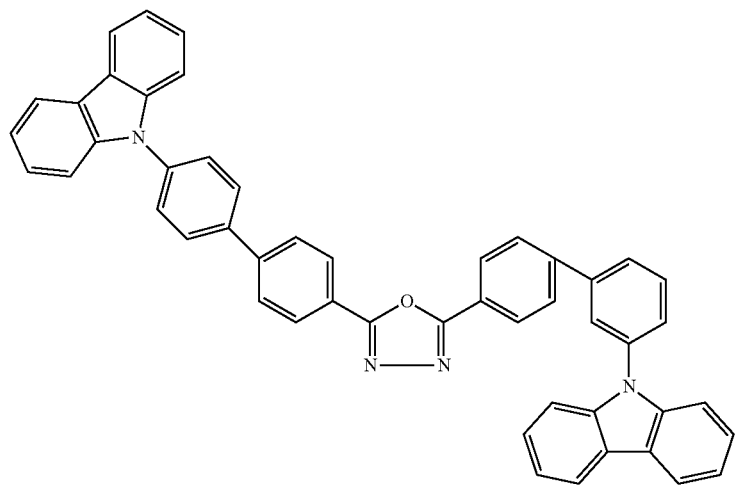

-continued
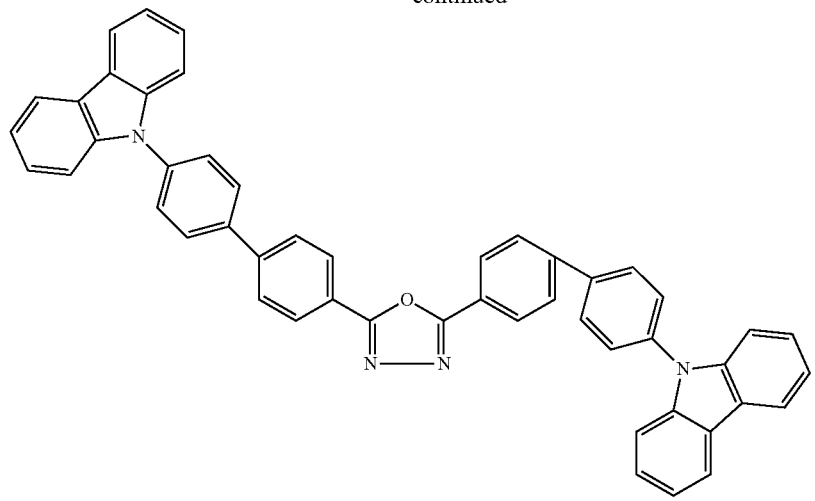
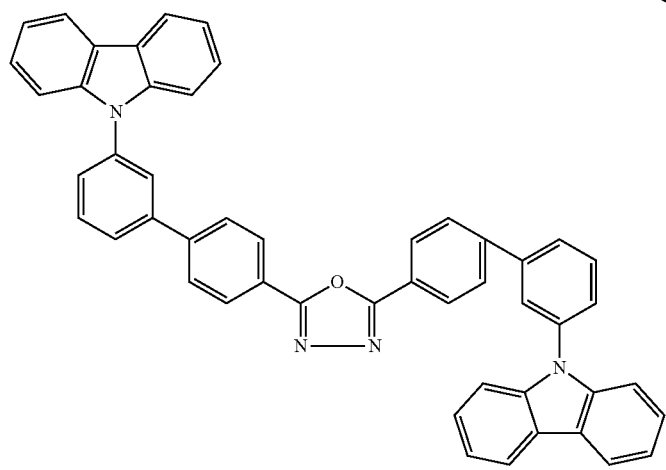
Glass Mixture 26: which is an isomeric bipolar charge-transporting yellow-emitting molecular glass made by the Suzuki reaction
Glass Mixture 26
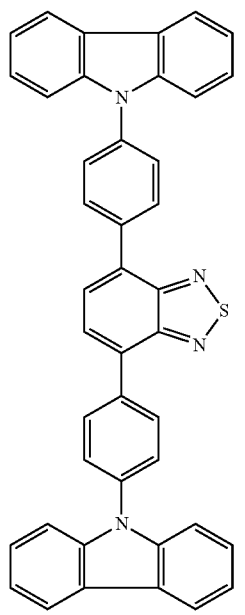
-continued
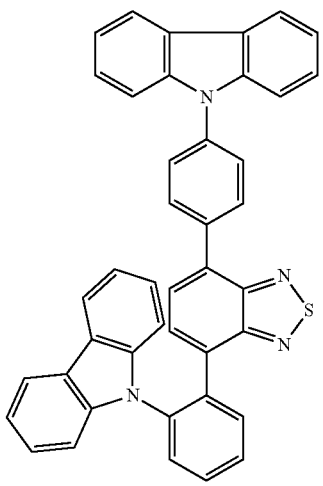

135
-continued
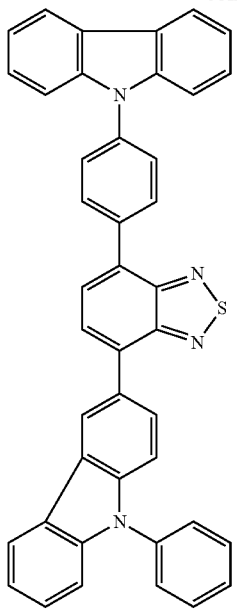
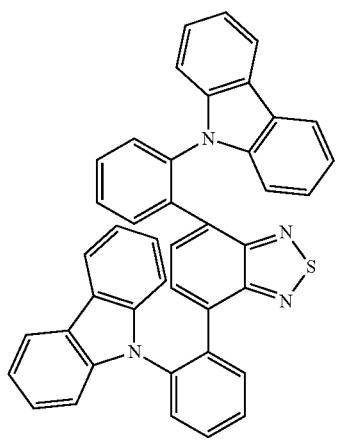
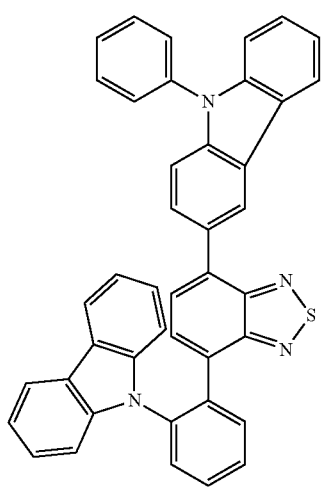
136
-continued
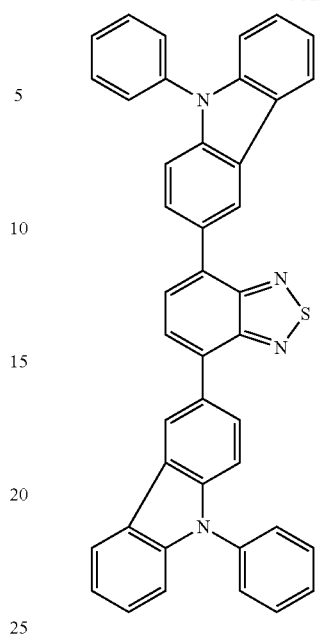
Glass Mixture 27: which is an isomeric hole-transporting molecular glass
Glass Mixture 27
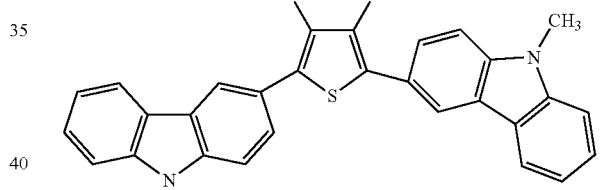
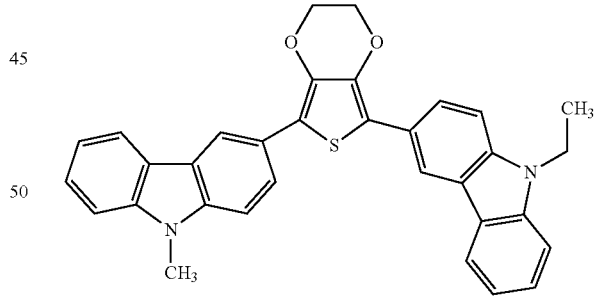
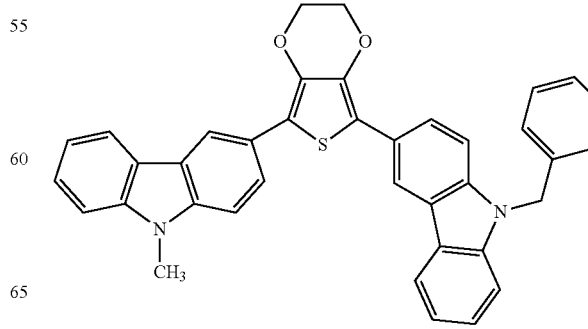

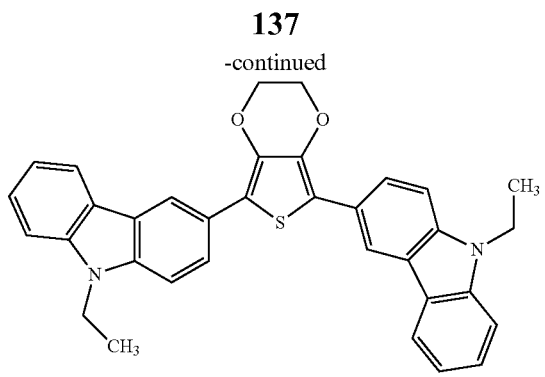

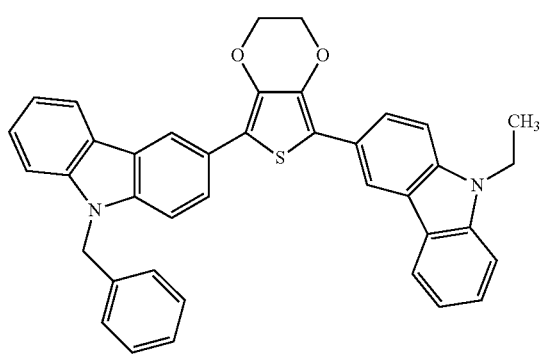

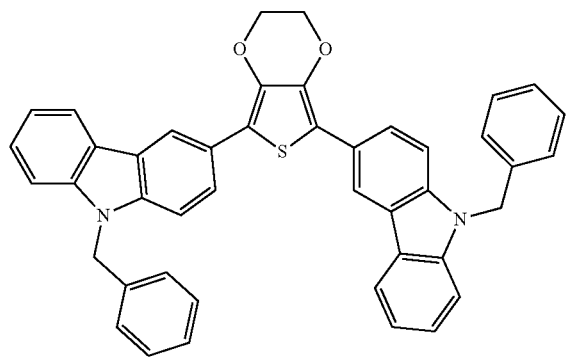 [SMILES: c1ccc(Cn2c3ccccc3c3cc(-c4sc(-c5ccc6c(c5)c5ccccc5n6Cc5ccccc5)c5c4OCCO5)ccc32)cc1]

Glass Mixture 28: which is an isomeric electron-transporting molecular glass

Glass Mixture 28

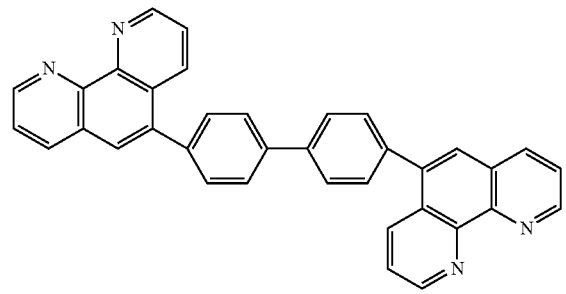

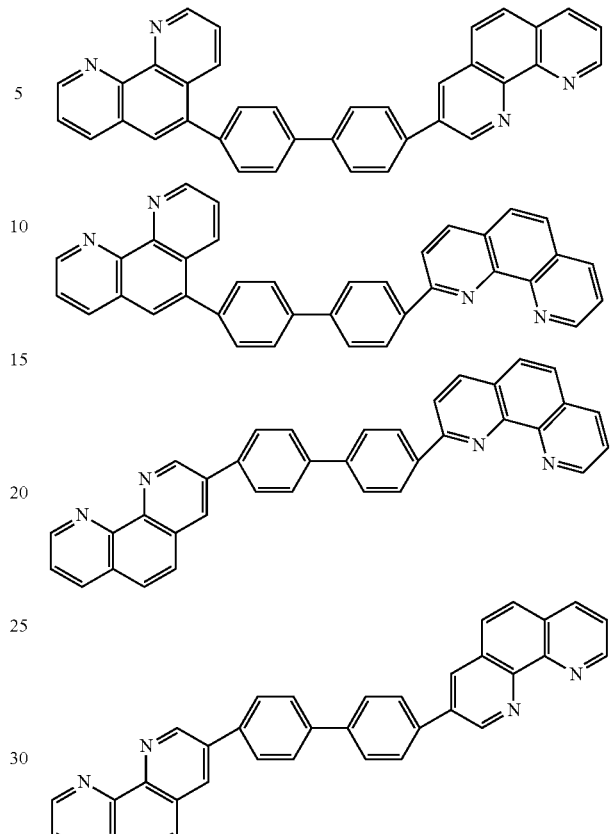

N-Arylation Coupling Reaction

One equivalent of a recrystallized multivalent halogenated aliphatic or cycloaliphatic hydrocarbon groups having 1 to 20 carbon atoms or an aromatic group, 2 eq Cs2CO3, 2 eq LiCl, 20% CuI were dissolved in dry dimethylformamide in a vial Then two equivalent of the equimolar mixture consisting of three iminodiarylamines. The vial was sealed and stirred and heated in an oil bath at 150 C for 48 hours. The reaction mixture was diluted with saturated ammonium chloride. The product was extracted with ethyl acetate. The ethyl acetate layer was dried over anhydrous magnesium sulfate, filtered, and concentrated. The product was purified by silica gel column chromatography using hexane: ethyl acetate solvent.

Examples of molecular glass mixtures that can be made by this reaction procedure are shown below:

Glass Mixture 29: which is an isomeric hole-transporting molecular glass

Glass Mixture 29
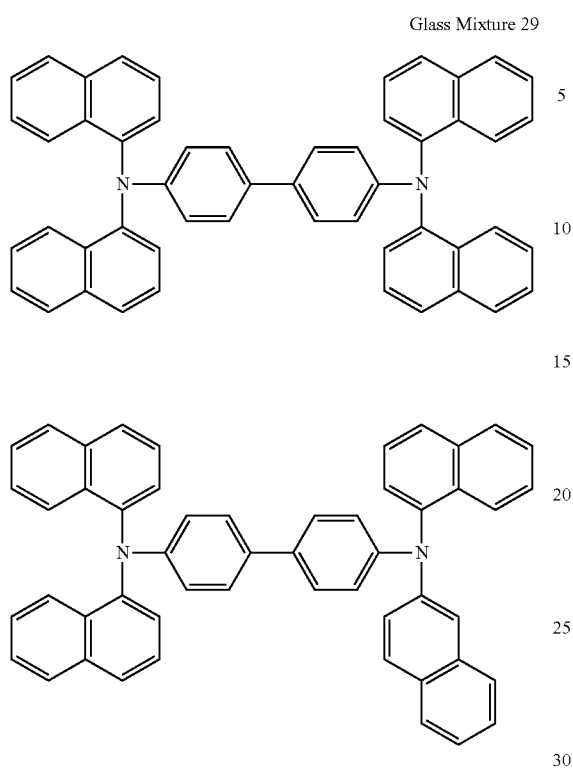
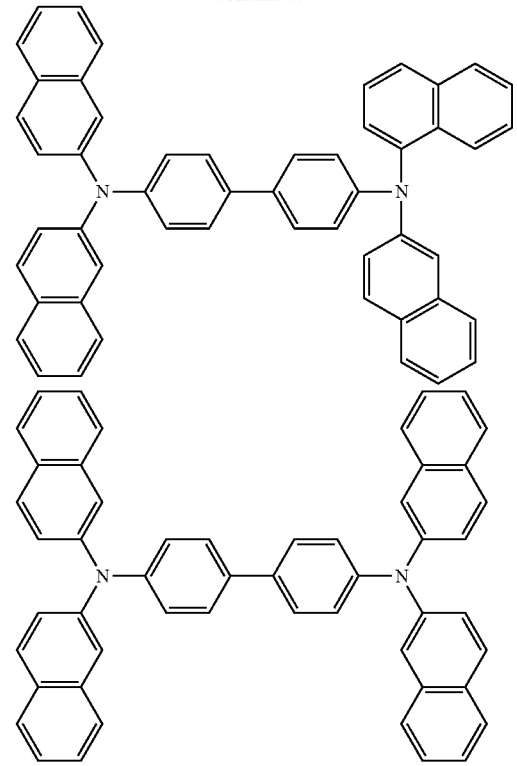
Glass Mixture 30: which is an isomeric hole-transporting molecular glass
Glass Mixture 30
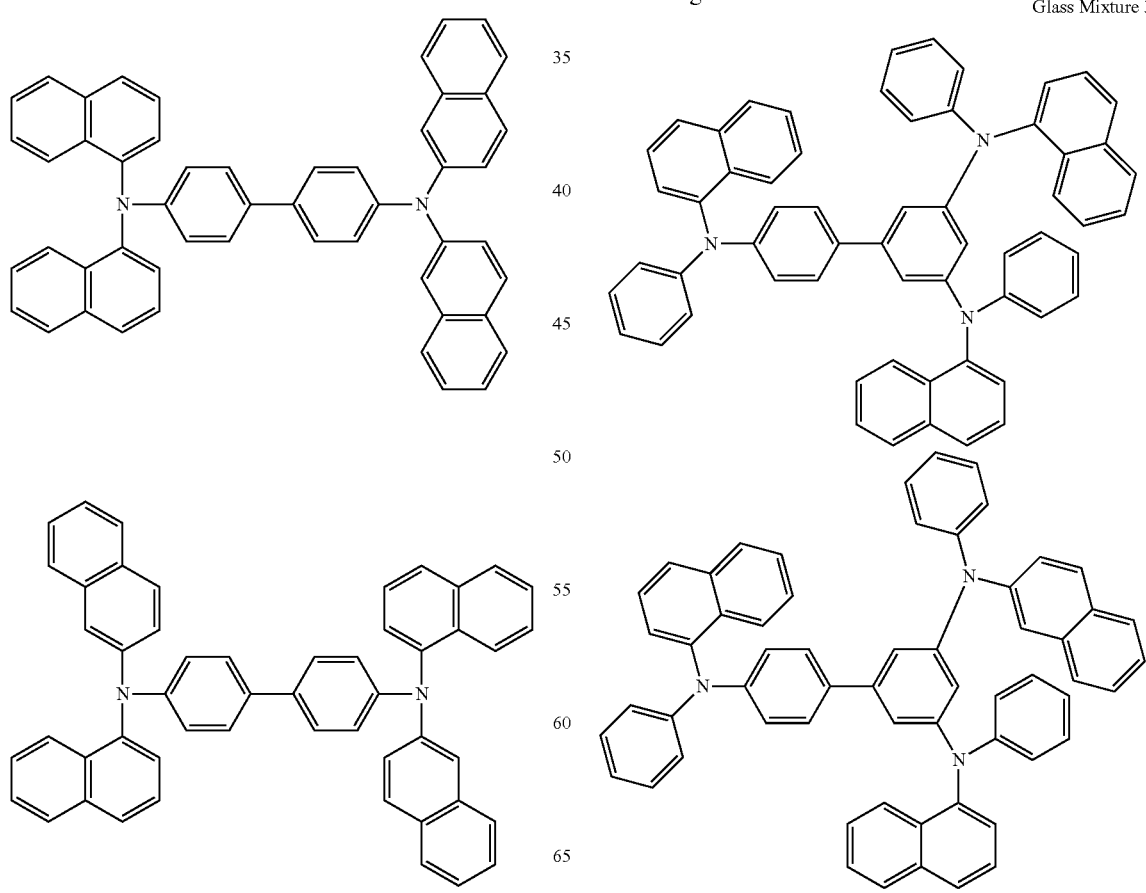

141
-continued
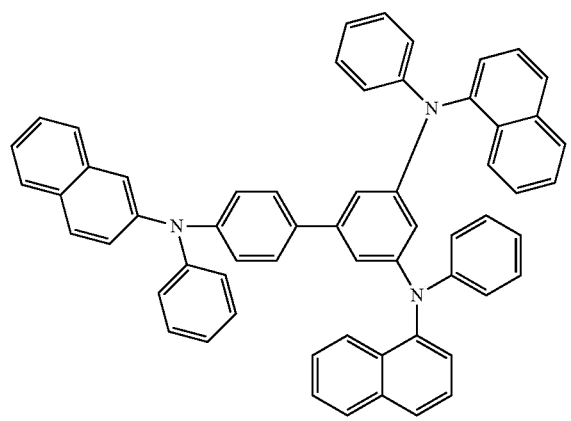
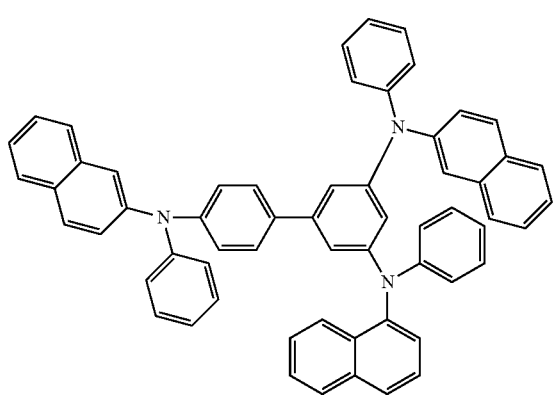
142
-continued
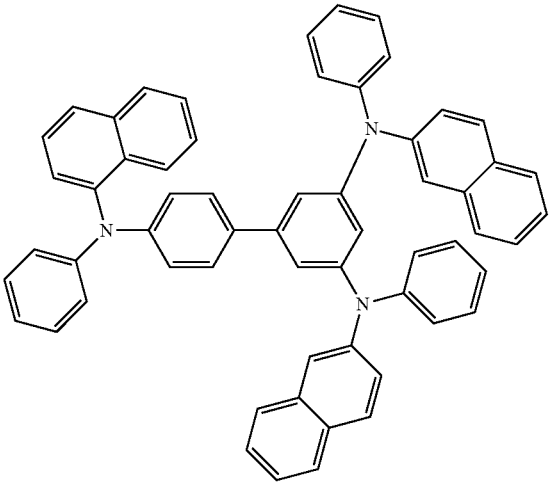
Glass Mixture 31: which is an isomeric bipolar-transporting molecular glass
Glass Mixture 31
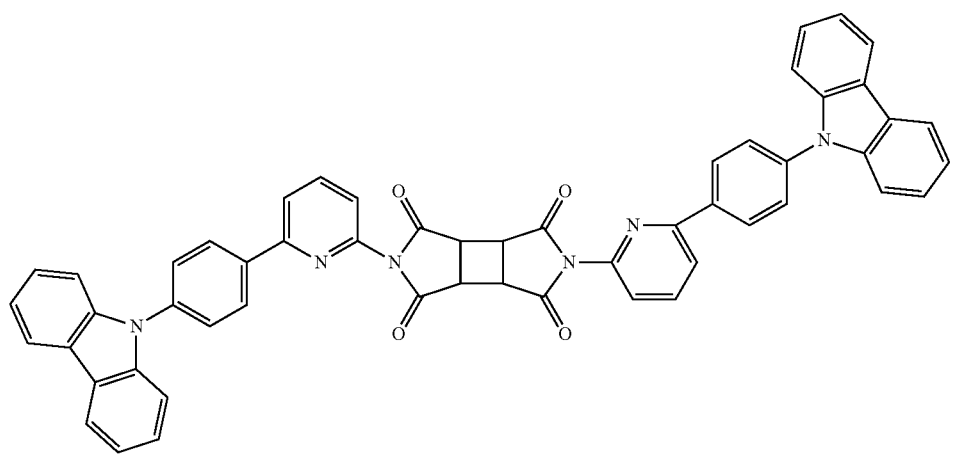

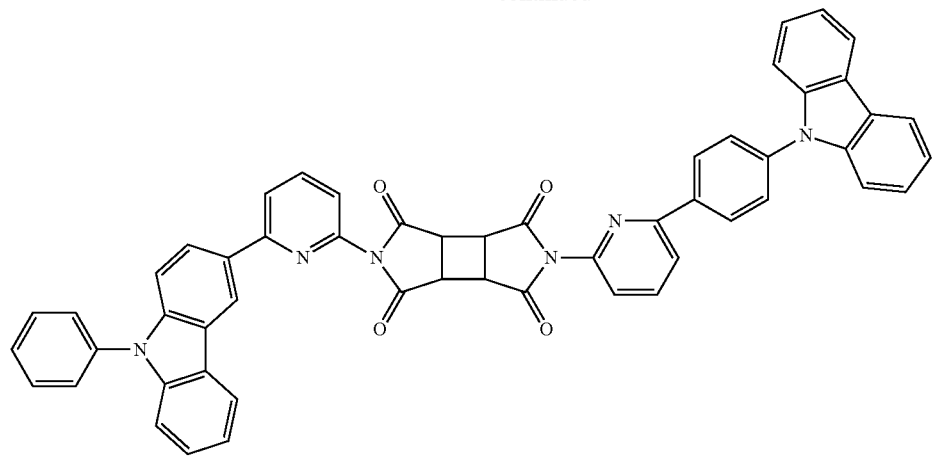
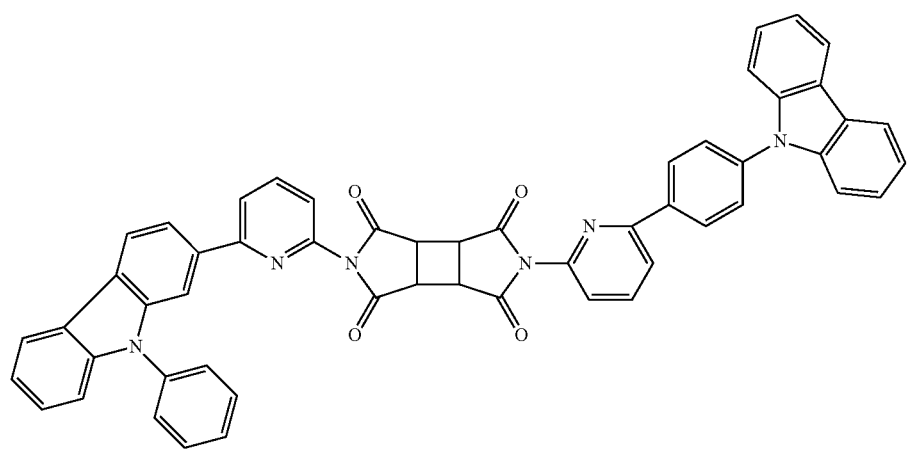
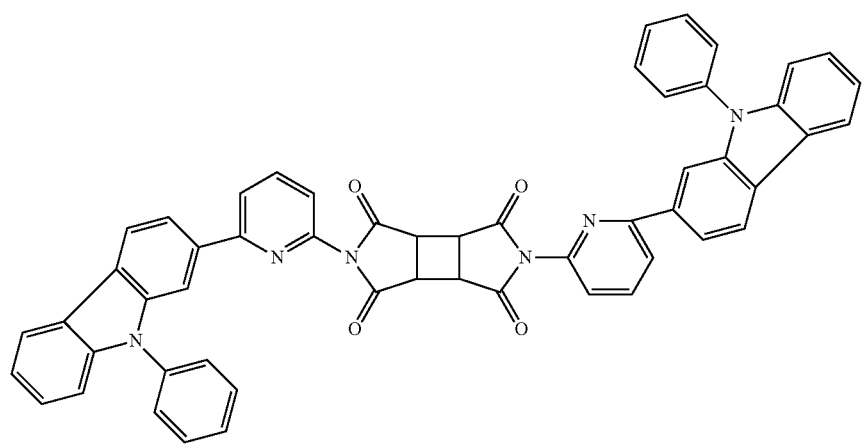

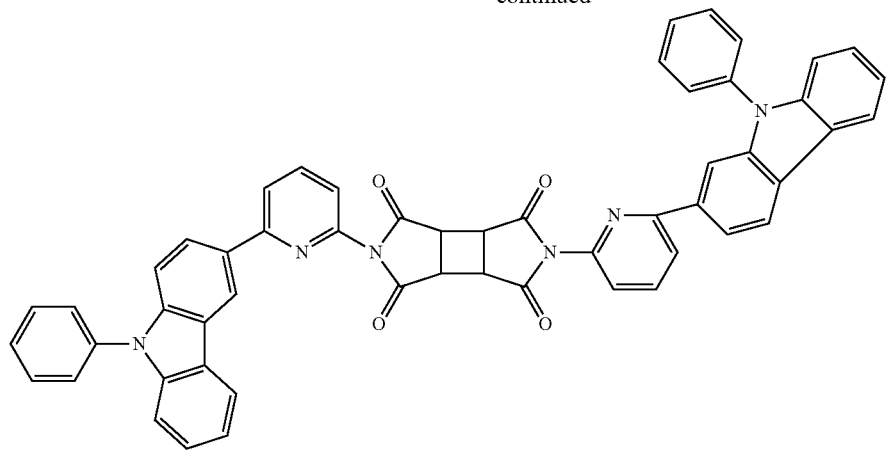
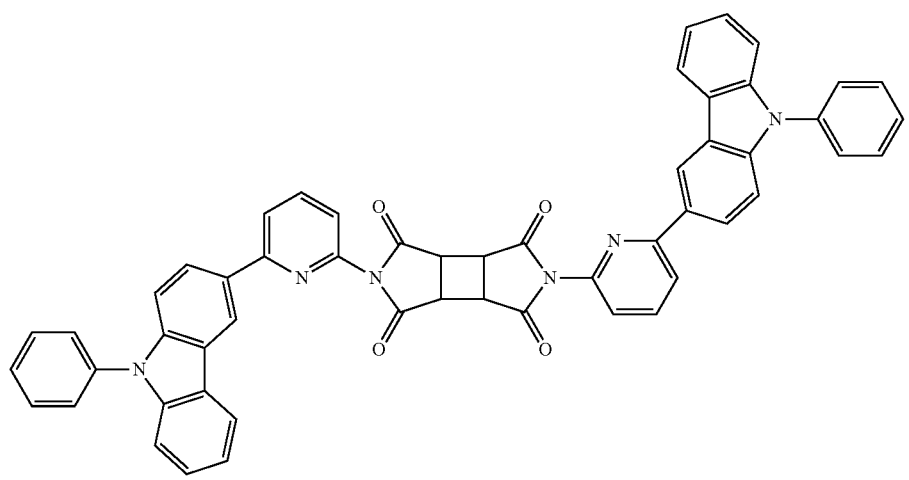
Glass Mixture 32: which is an isomeric hole-transporting luminescent molecular glass
Glass Mixture 32
-continued
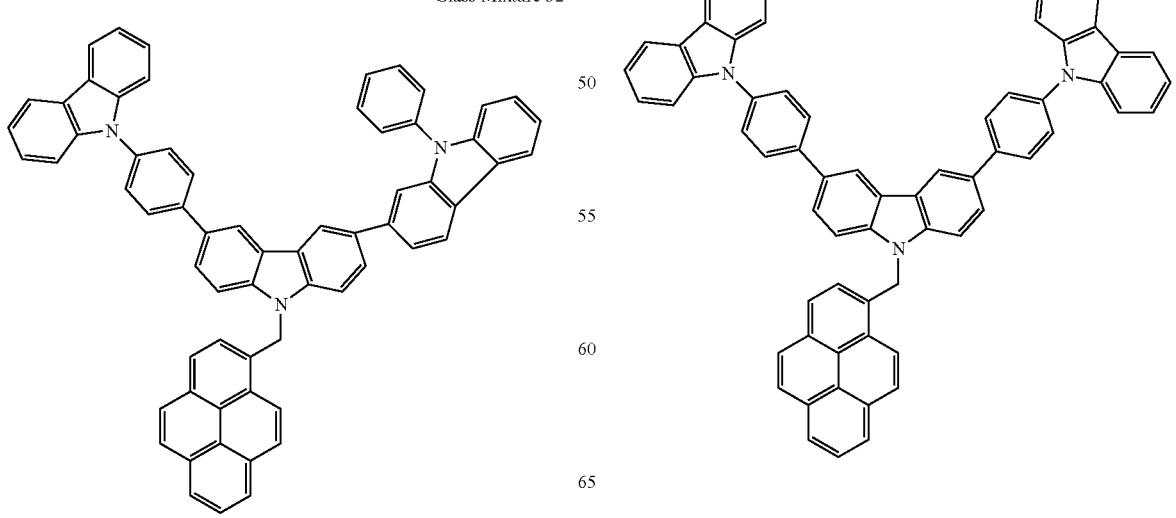

-continued
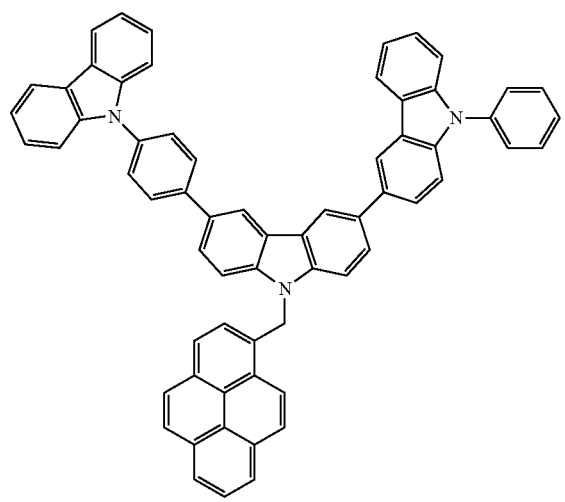
-continued
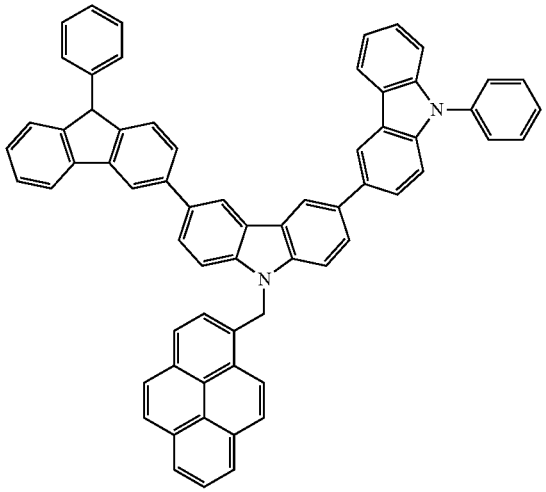
Glass Mixture 33: which is an isomeric hole-transporting luminescent molecular glass
Glass Mixture 33
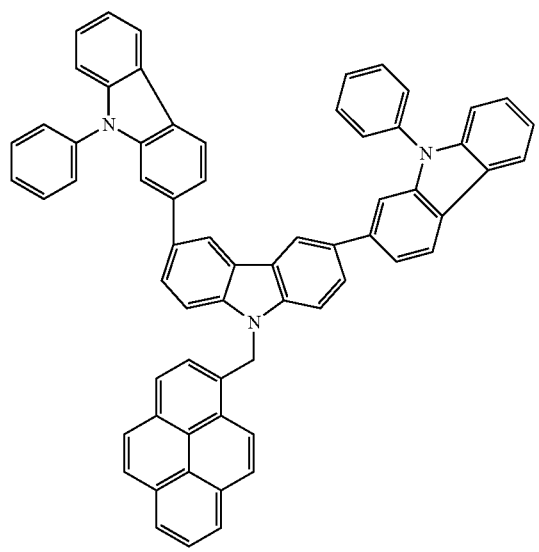
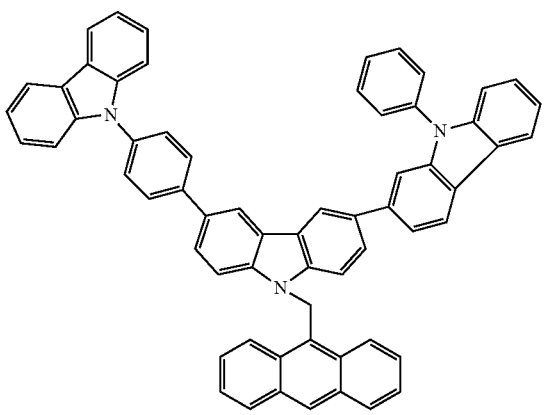
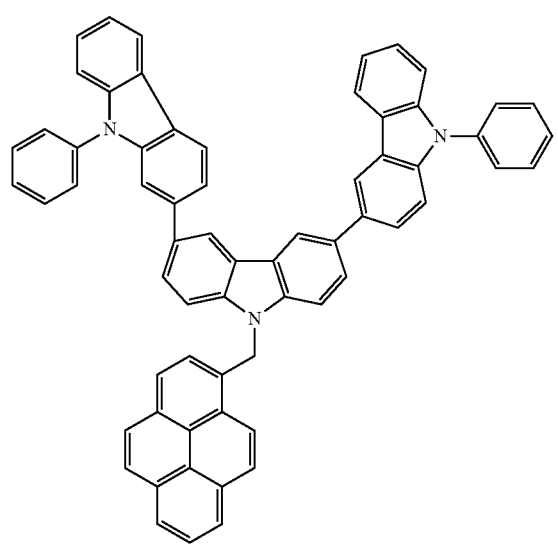
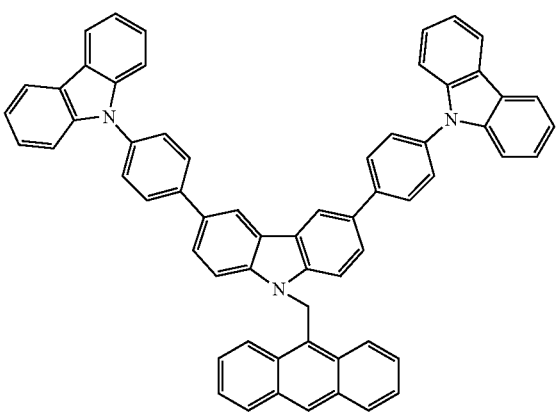

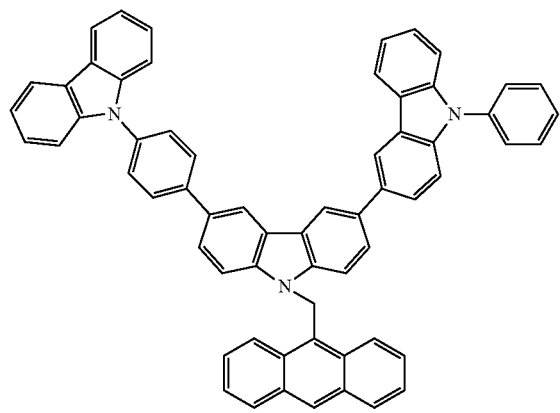
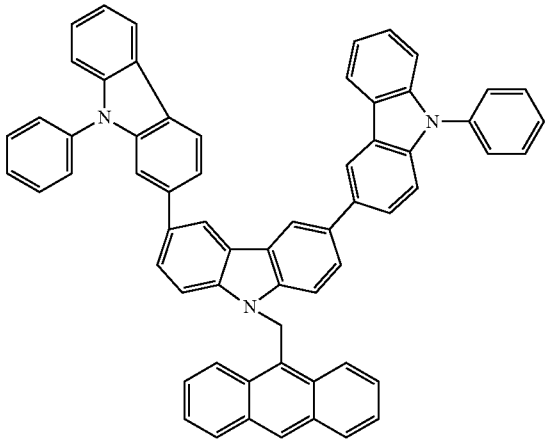
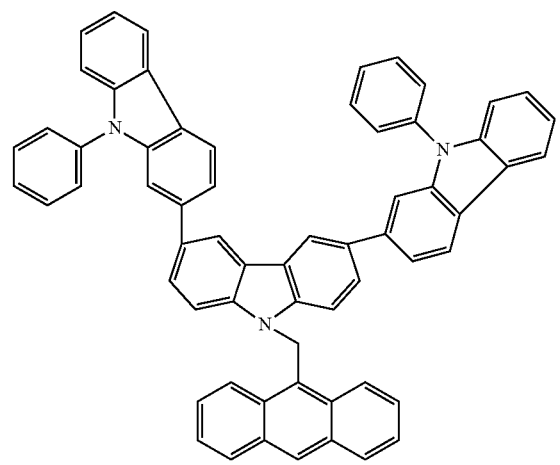
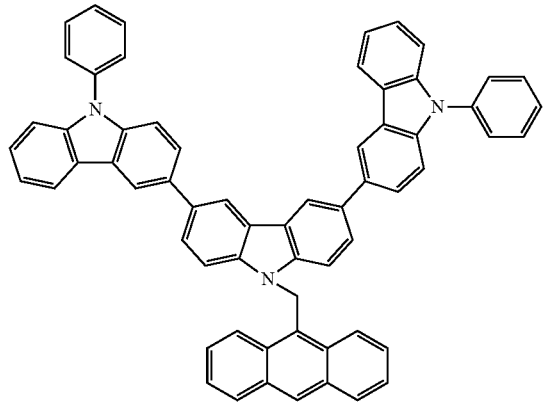
Glass Mixture 34: which is an isomeric hole-transporting luminescent molecular glass
Glass Mixture 34
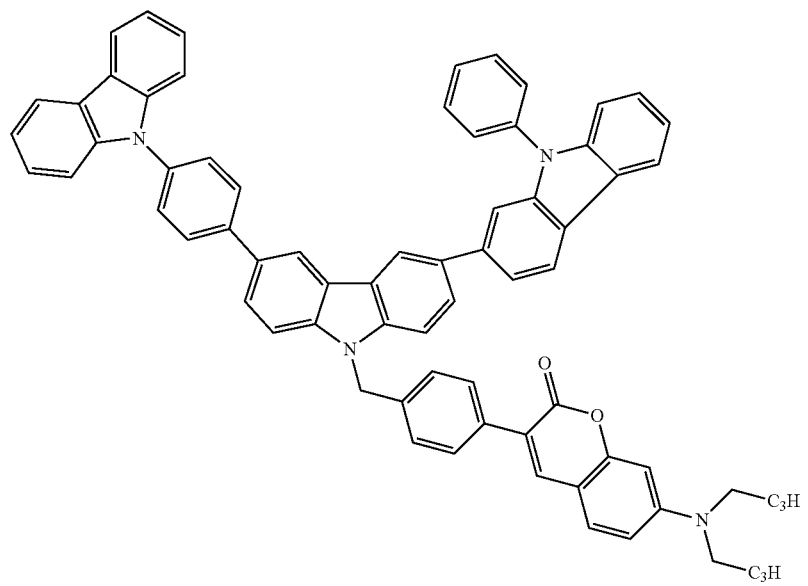

-continued
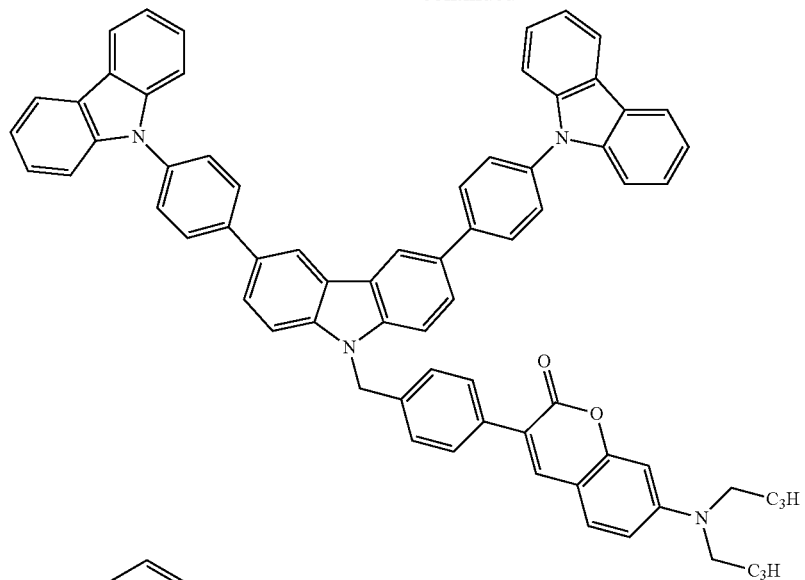
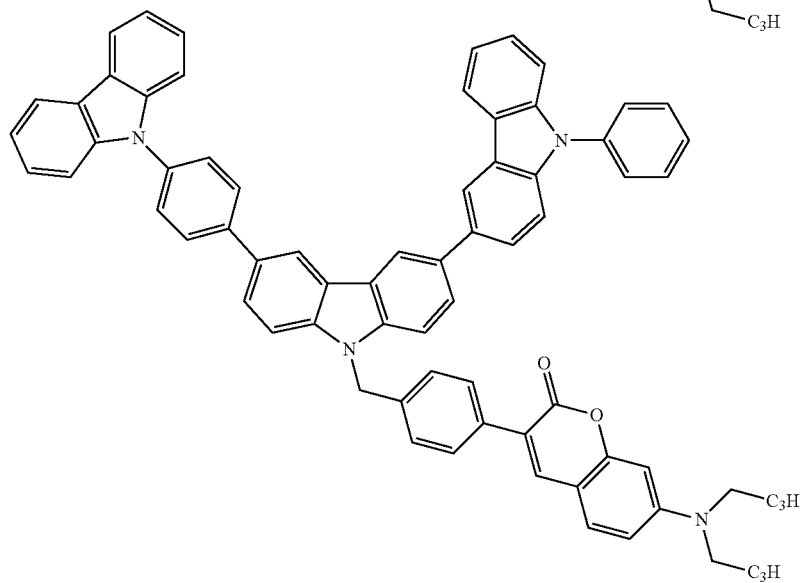
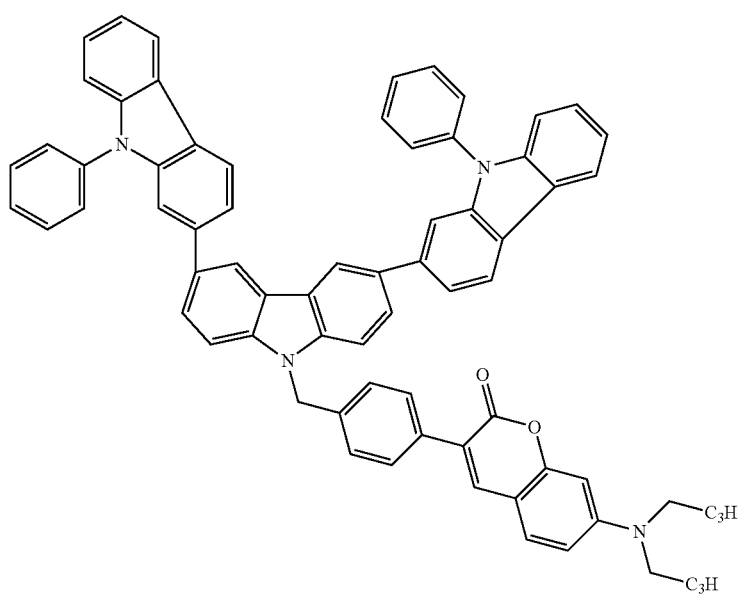

-continued
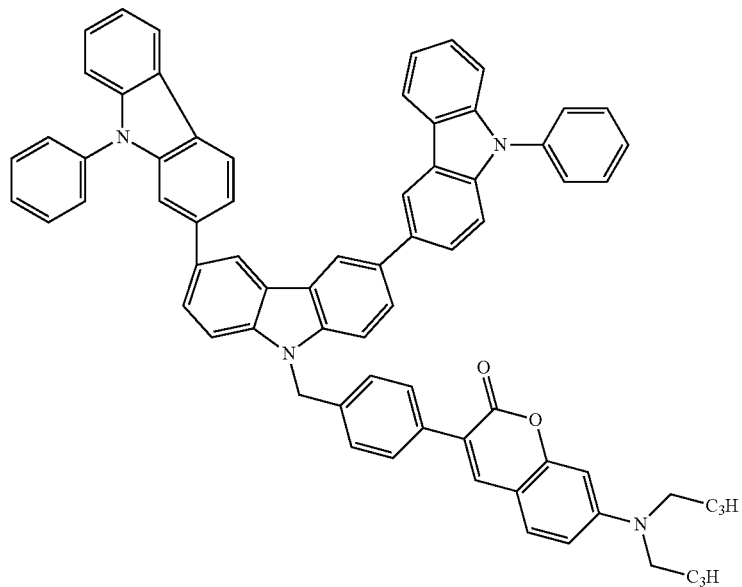
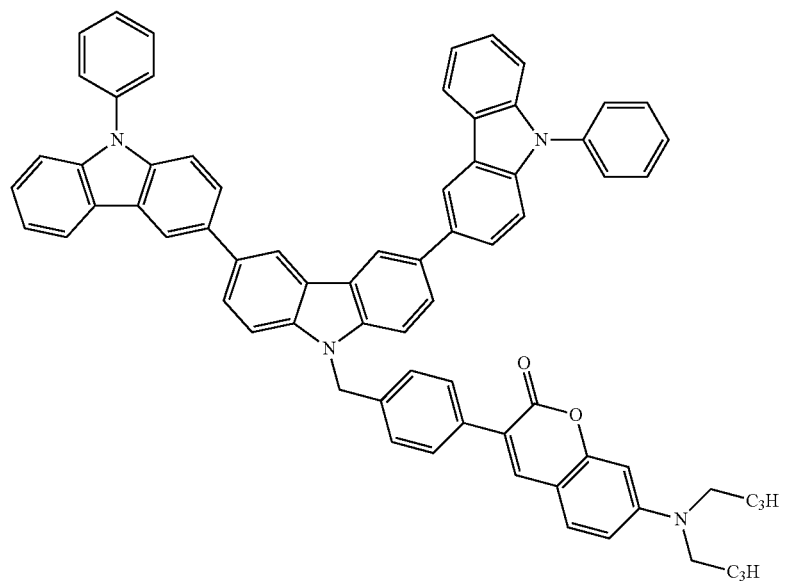

Glass Mixture 35: which is an isomeric hole-transporting luminescent molecular glass
Glass Mixture 35
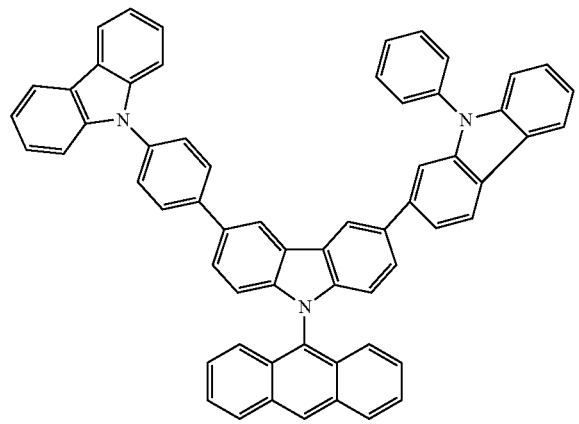
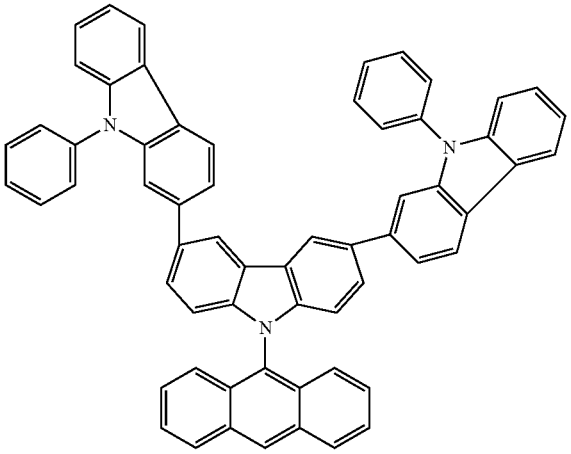
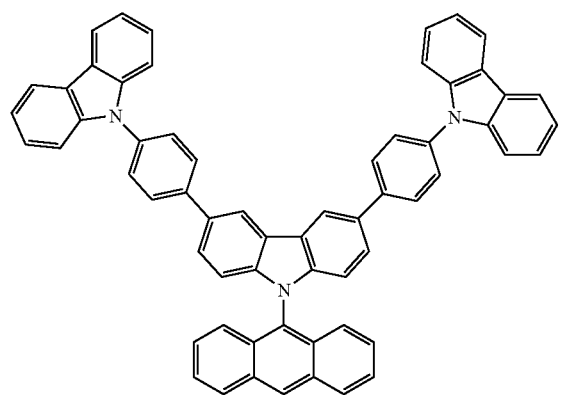
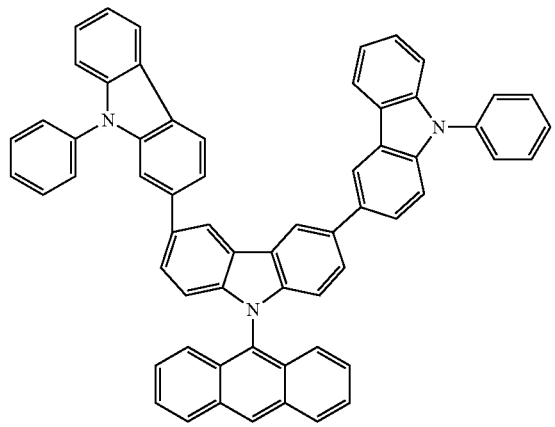
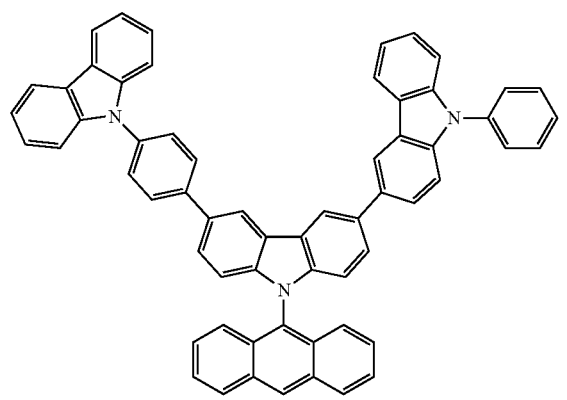
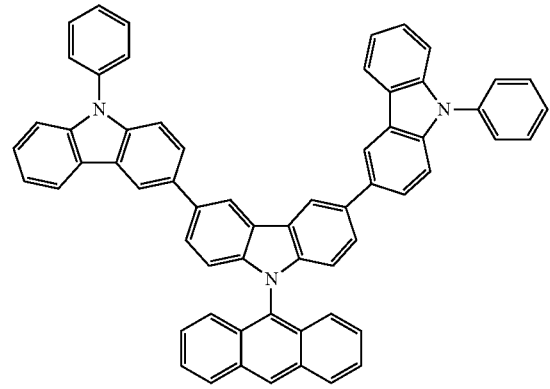
Glass Mixture 36: which is an isomeric electron-transporting luminescent molecular glass Glass Mixture 36
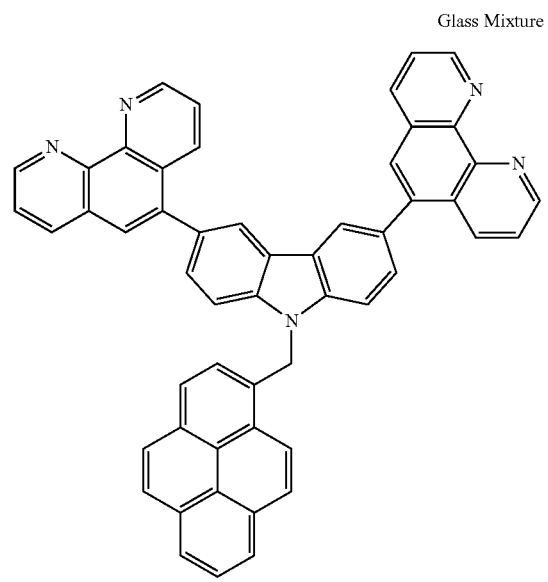
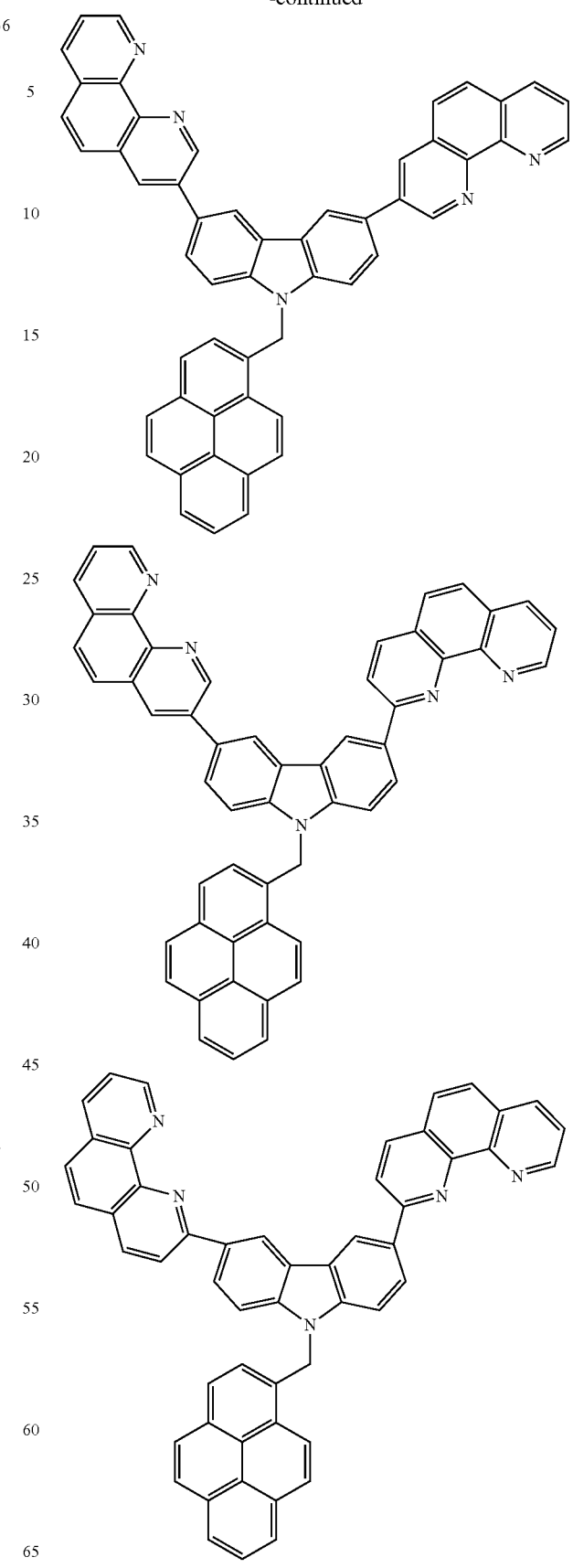

Glass Mixture 37: which is an isomeric electron-transporting molecular glass
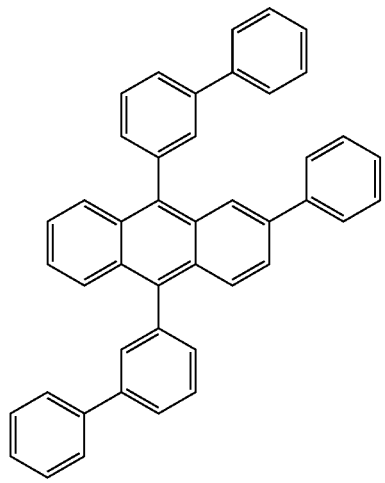
Glass Mixture 37
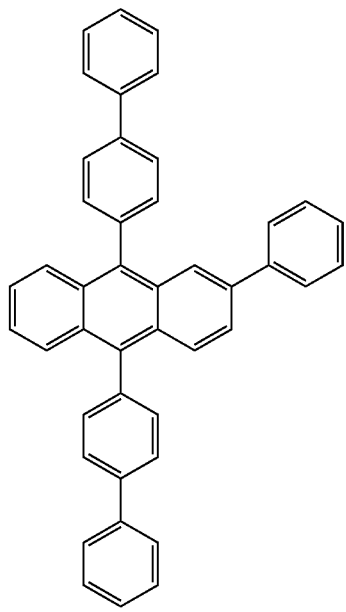
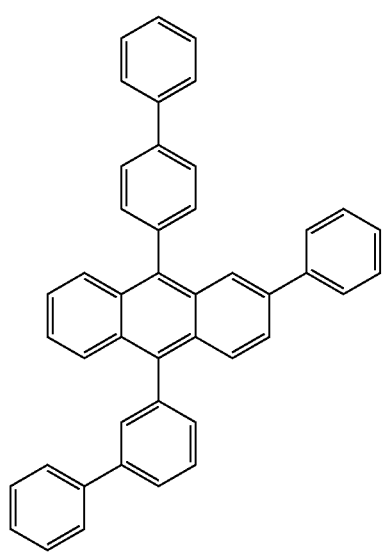
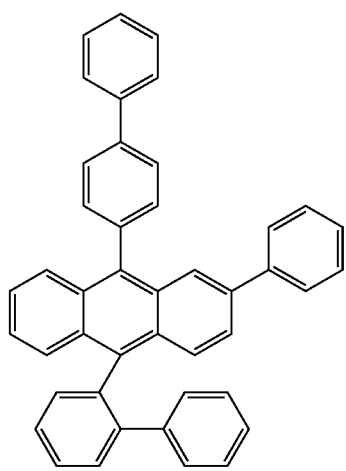
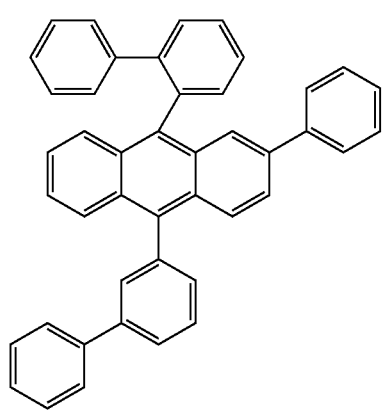
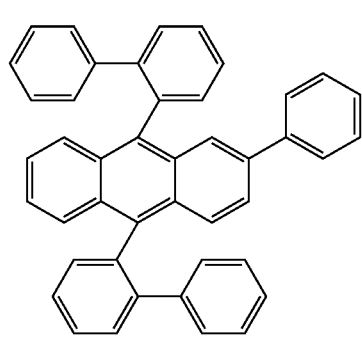
Glass Mixture 38: which is an isomeric bipolar-transporting molecular glass Glass Mixture 38
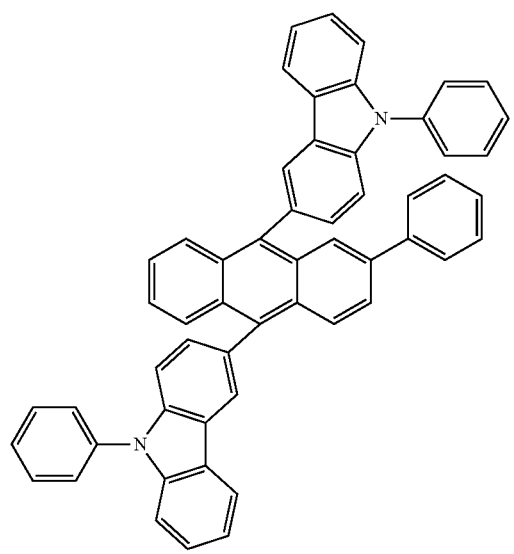
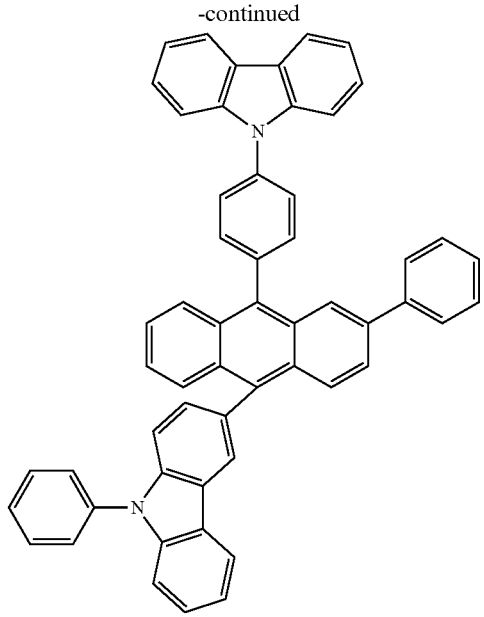
-continued
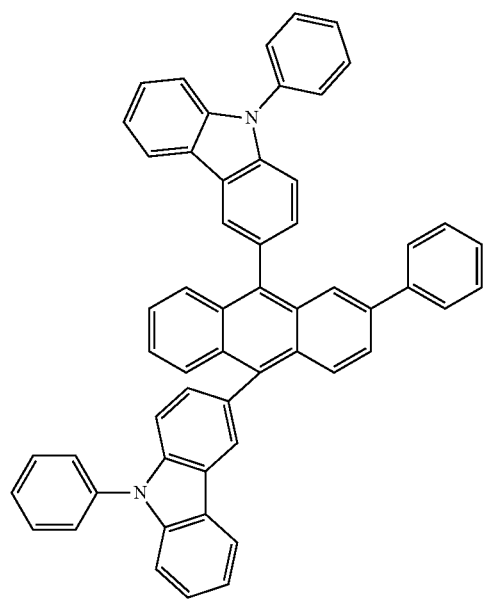
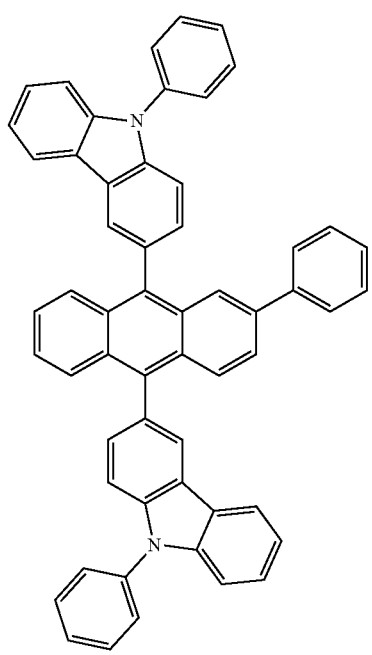

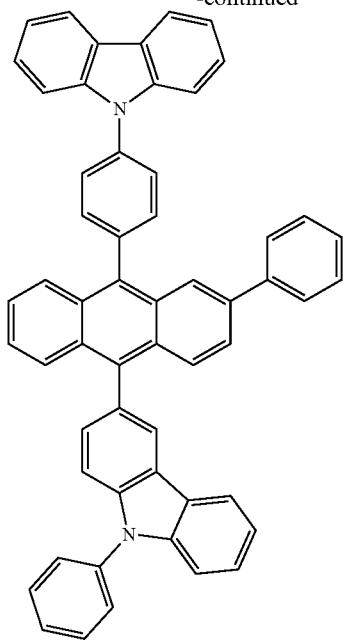
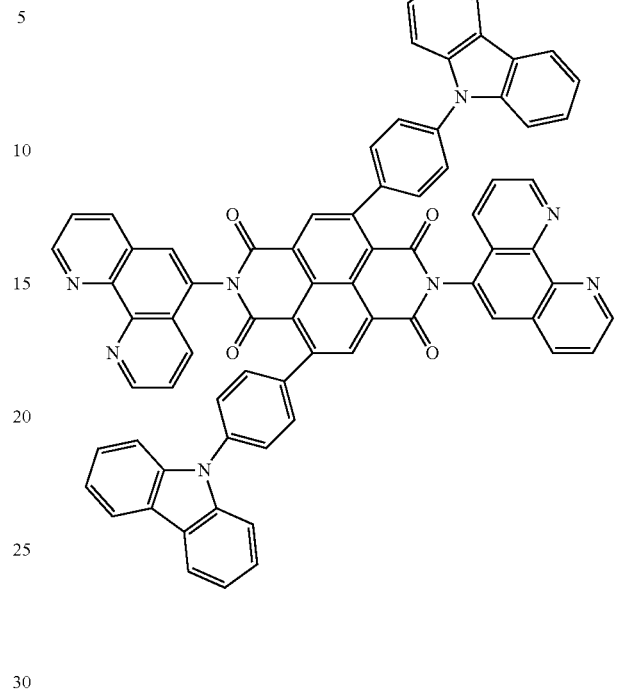
Glass Mixture 39
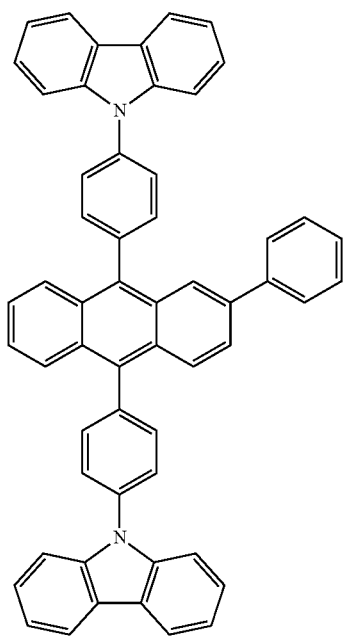 [SMILES: c1ccc(-c2ccc3c(-c4ccc(-n5c6ccccc6c6ccccc65)cc4)c4ccccc4c(-c4ccc(-n5c6ccccc6c6ccccc65)cc4)c3c2)cc1]
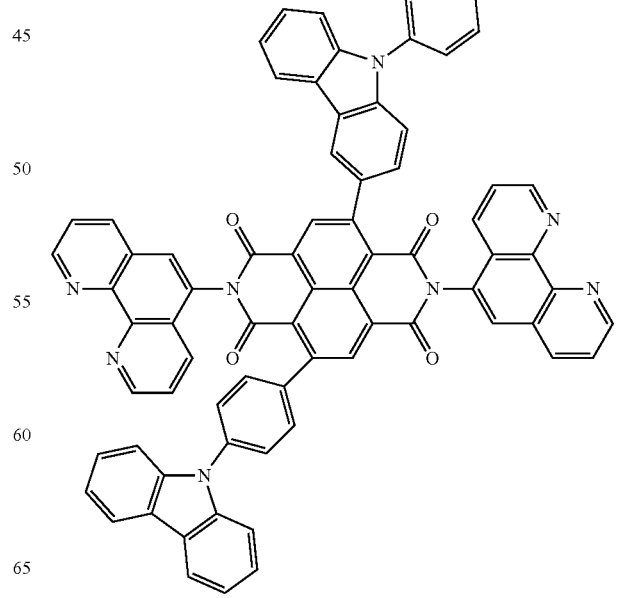
Glass Mixture 39: which is an isomeric bipolar-transporting molecular glass 165
-continued
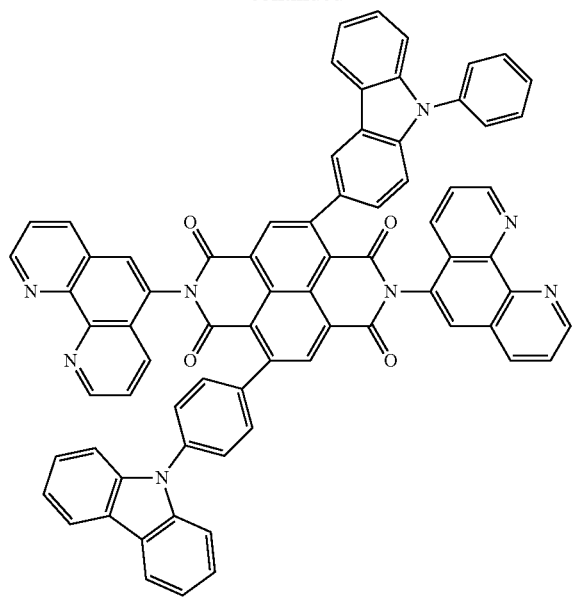
166
-continued
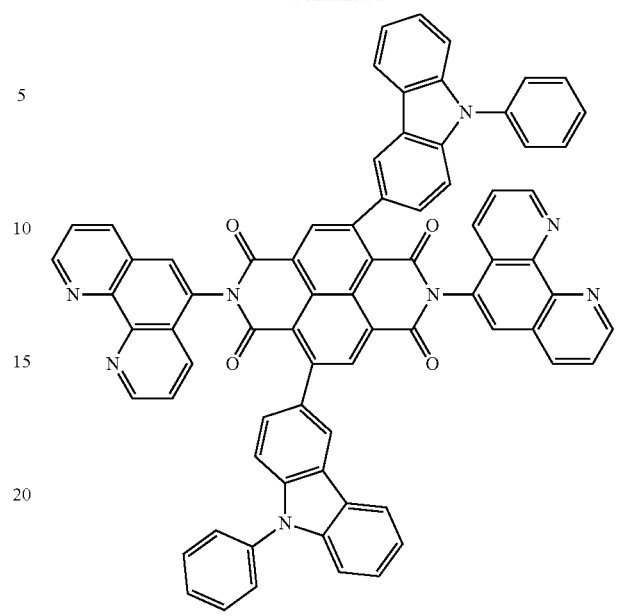
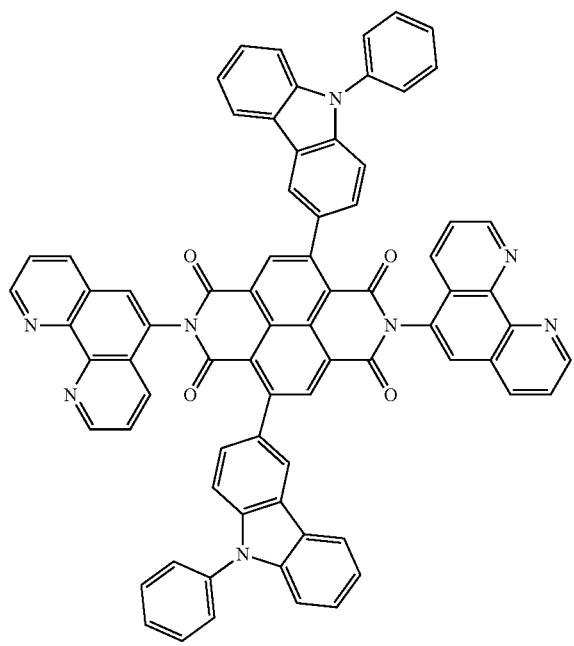
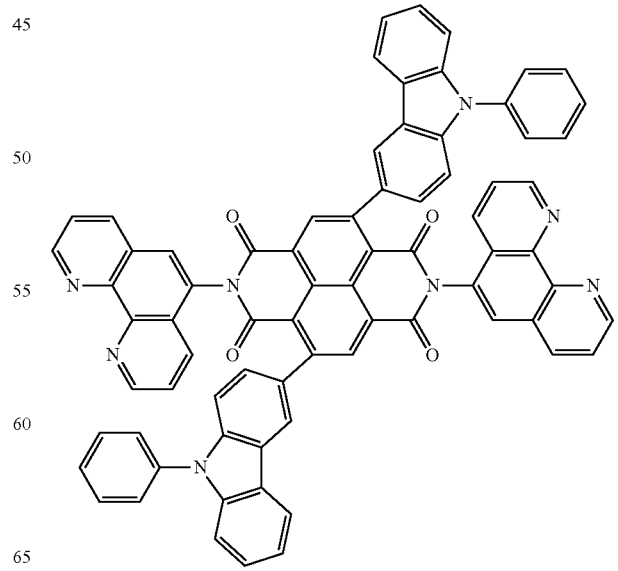

EXAMPLES OF THE INVENTION

Example 1

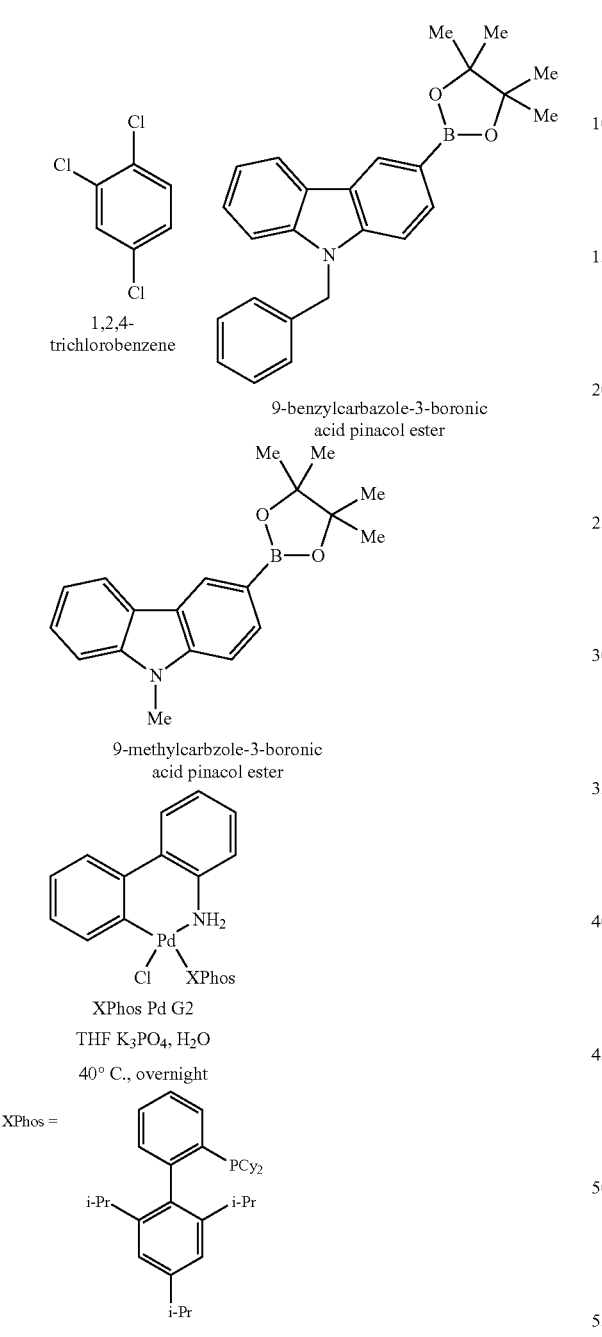

316 milligrams (0.825 mill mole (mmol)) 9-benzylcarbazole-3-boronic acid pinacol ester, 253 mg (0.825 mmol) 9-methylcarbazole-3-boronic acid pinacol ester, and 35 mg XPhos Pd G2 (3 mole %) were added to a Schlenk flask, which was then purged under nitrogen. 63 µL (0.5 mmol) 1,2,4-trichlorobenzene, 3 mL dry THF, and 6 mL degassed 0.5M K3PO4 were sequentially added to the reaction flask under nitrogen. The flask was sealed, heated to 40° C. and stirred overnight. Three extracts of 10 milliliters diethyl ether are collected and filtered twice through silica gel. The solution is evaporated with the rotovap and the resulting oil is dissolved in a small amount of dichloromethane and crashed out of 150 milliliter heptane. The white precipitate is filtered and dried on vacuum. The 8 components of the mixture are shown below

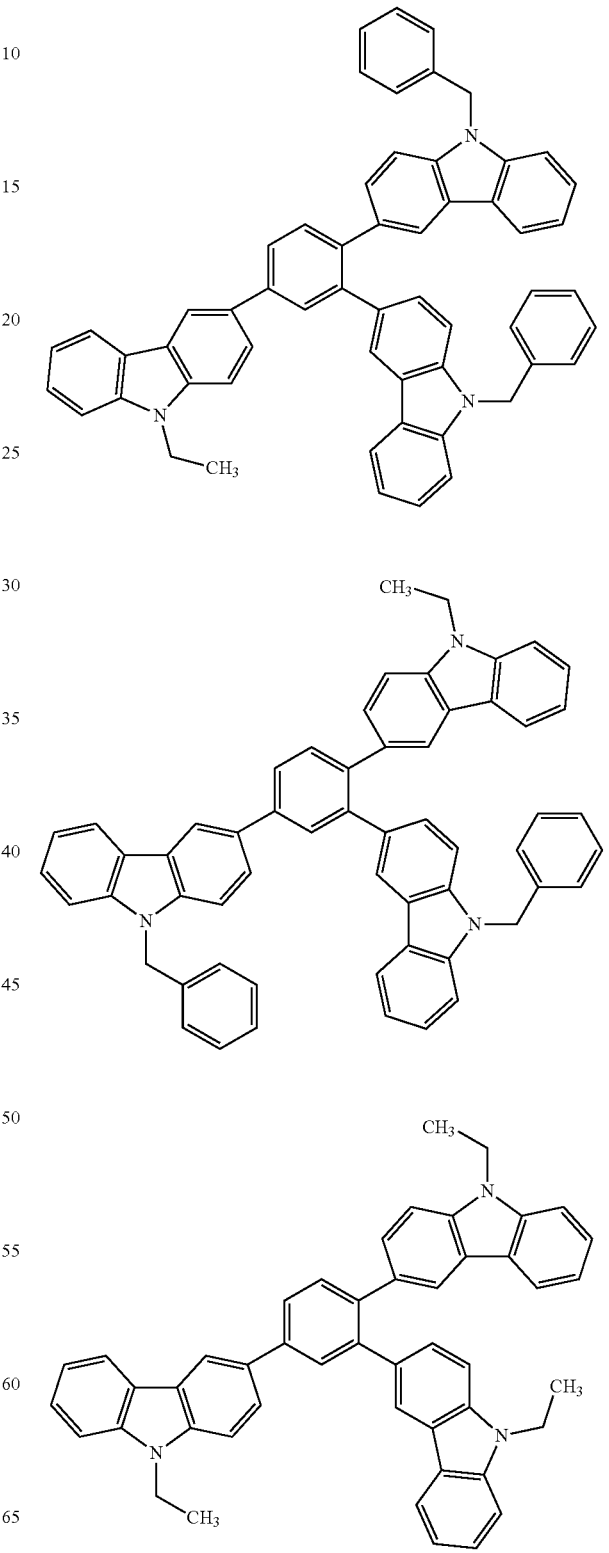

Molecular Glass Mixture Example 1

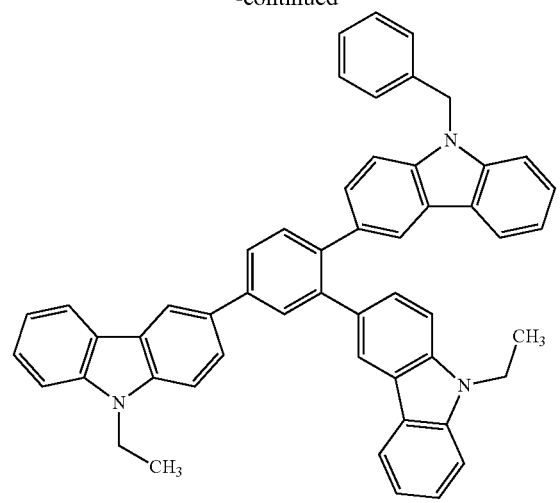
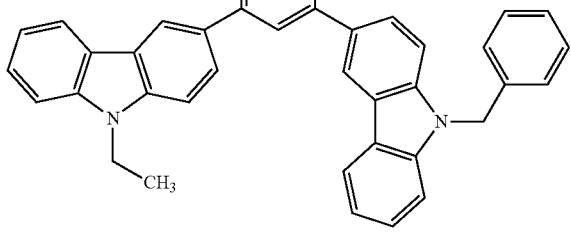
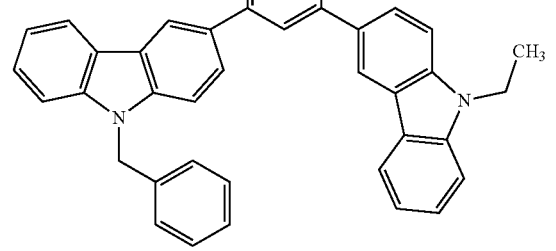
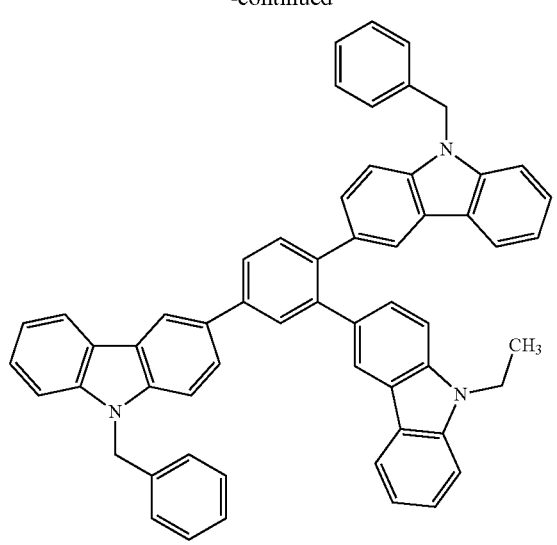
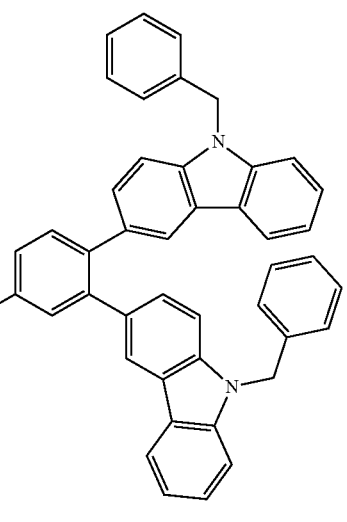
Example 2
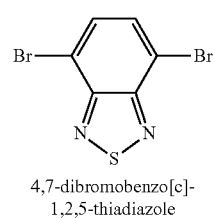
4,7-dibromobenzo[c]-
1,2,5-thiadiazole -continued

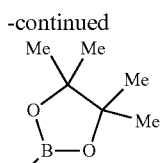

9-methylcarbazole-3-
boronic acid pinacol

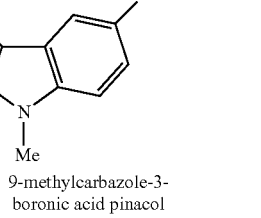

9-ethylcarbazole-3-
boronic acid pinacol

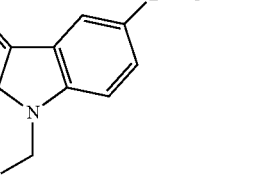

9-benzylcarbazole-3-
boronic acid pinacol

THF
K₃PO₄, H₂O
40° C., overnight

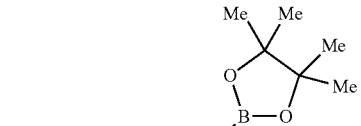

XPhos Pd G2

XPhos =

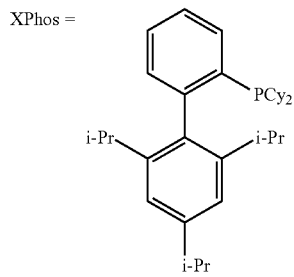

294 mg (1.0 mmol) 4,7-dibromobenzo[c]-1,2,5-thiadiazole, 215 mg (0.7 mmol) 9-methylcarbazole-3-boronic acid pinacol ester, 225 mg (0.7 mmol) 9-ethylcarbazole-3-boronic acid pinacol ester, 268 mg (0.7 mmol) 9-benzylcarbazole-3-boronic acid pinacol ester, and 47 mg XPhos Pd G2 (3 mole %) were added to a Schlenk flask, which was then purged under nitrogen. 3 mL dry THF and 6 mL degassed 0.5M K3PO4 were added to the reaction flask under nitrogen. The flask was sealed, heated to 40° C. and stirred overnight. 3 extracts of 10 mL diethyl ether were collected and filtered twice through silica gel. The solution was evaporated with the rotovap and the resulting oil was dissolved in a small amount of dichloromethane and crashed out of 150 mL heptane. The orange precipitate was filtered and dried on vacuum. The structures of the components are shown below:

Molecular Glass Mixture of Example 2

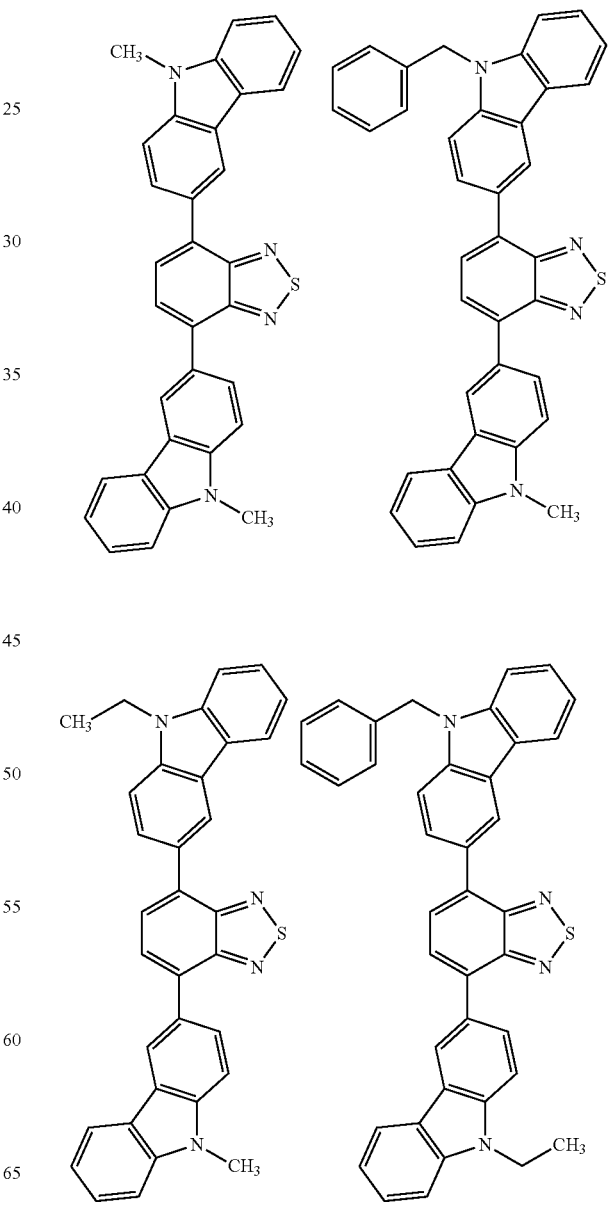

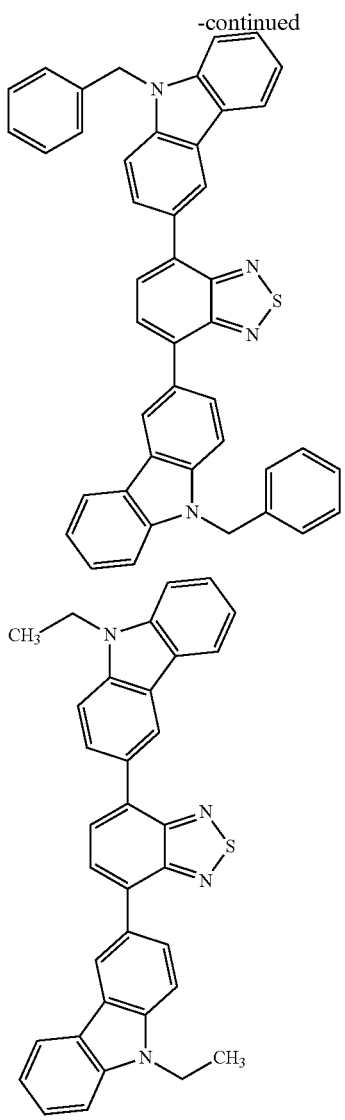

Example 3. High Pressure Performance Liquid Chromatography (HPLC) Assay of Molecular Glass Mixture Example 1

The samples were dissolved in tetrahydrofuran and analyzed by LC/MS on an Agilent 1100 Series high performance liquid chromatograph (HPLC). The samples were chromatographed using reversed-phase gradient conditions. UV detection was performed using a diode array detector set at 254 nm. FIG. 1 show four major peaks for the molecular glass mixture of example 1. The first major peak at retention time 18.49 min. is associated with the lower molecular weight tri (9-ethyl carbazole) component. The peak at retention time 18.9 min is associated with the three isomeric di (9-ethyl carbazole)-9-phenyl carbazole component. The peak at retention time 19.25 min is associated with the three isomeric di (9-benzyl carbazole)-9-ethyl carbazole component. The last peak at retention time 19.52 min. is associated with the tri-(9-benzyl carbazole) component. The four peaks account for 94.37% of peak areas (based on absorption response at 254 nm.

Example 3. High Pressure Performance Liquid Chromatography (HPLC) Assay of Molecular Glass Mixture Example 2

Figure 2:
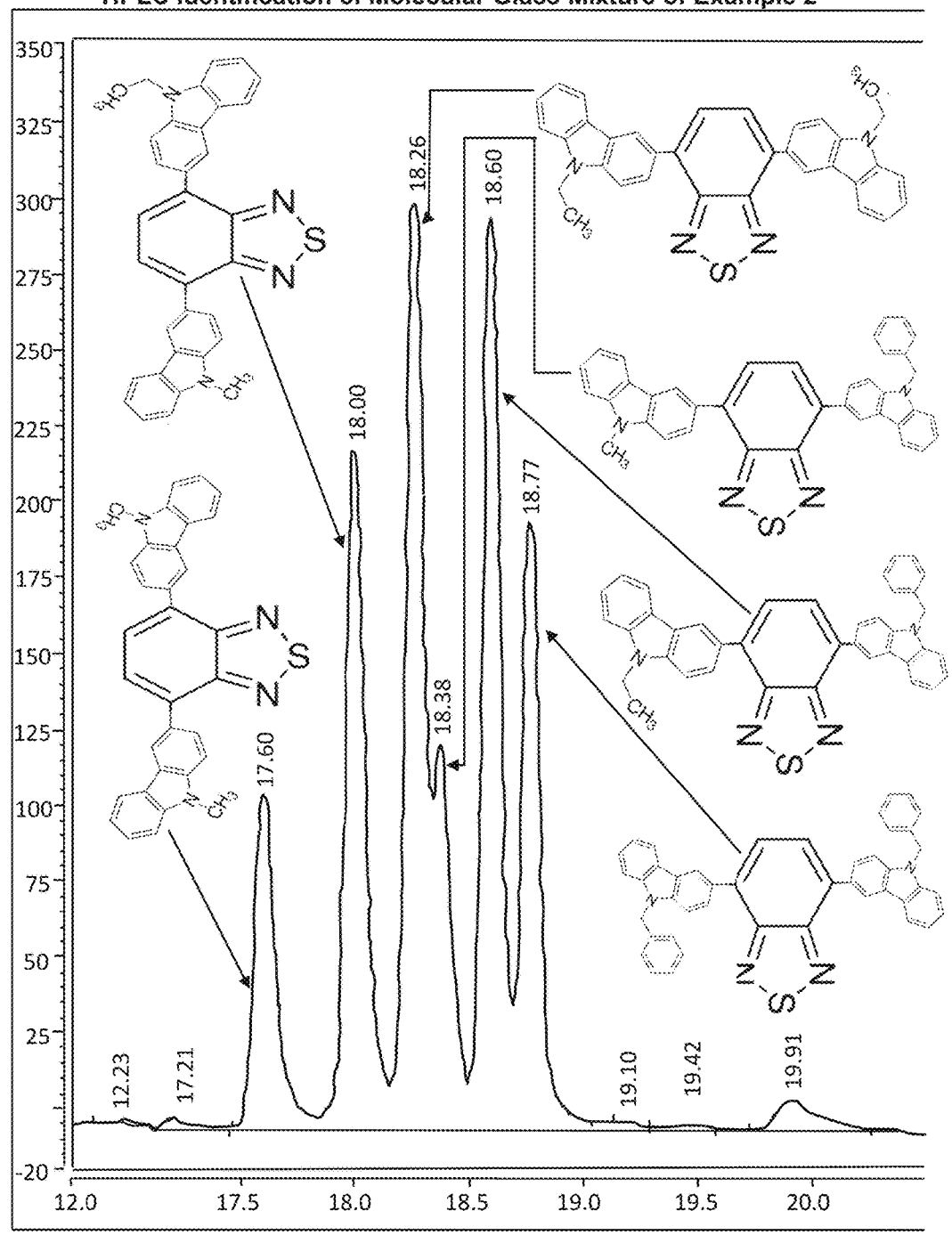

The procedure of Example 3 was used. FIG. 2 shows six major peaks. The first peak at retention time 17.6 min. is associated with the di (9-methyl carbazole) component. The peak at retention time 18.0 min is associated with 9-methylcarbazole, 9-ethyl carbazole component. The peak at 18.26 min. is associated with the di-(9-ethyl carbazole) component. The peak at 18.38 min is associated with the 9-methyl carbazole, 9-benzyl carbazole component. The peak at 18.60 is associated with the 9-ethyl carbazole, 9-benzyl carbazole component. The last major peak at retention time 18.77 min is associated with the di (9-benzyl carbazole) component. The six major peaks account for 96.82% of peak areas (based on absorption response at 254 nm).

Example 4. Solubility Evaluation

Solubility was evaluated in five solvents. Three of the solvents, acetone, isopropanol (IPA), and ethyl acetate are chosen from the preferred solvent list, the other two, tetrahydrofuran (THF), and toluene, from the usable solvent list. The results in Table 2 show the glass mixture of Example 1 soluble in all the solvents except isopropanol. The molecular glass mixture of Example 2 is soluble in all five solvents. As A Comparative Example, N'-Di-(1-naphthyl)-N,N'-diphenyl-(1,1'-biphenyl)-4,4'-diamine (NPB) was used. NPB is not soluble in the three preferred solvents, but is soluble in toluene and THF. This demonstrates that the molecular glass mixtures of this invention are more soluble.

TABLE 2

| | Solubilty Data | | | | |
|---|---|---|---|---|---|
| Materials | Acetone | IPA | Ethyl Acetate | Toluene | THF |
| Example 1 | Yes | NO | Yes | Yes | Yes |
| Example 2 | Yes | Yes | Yes | Yes | Yes |
| TAPC (comparative) | NO | | | Yes | |
| TPD (comparative) | NO | | | | |
| NPD/NPB (comparative) | NO | NO | NO | Yes | Yes |
| PBD (comparative) | NO | | | Yes | |

Example 5. Photophysical Properties

Optical absorption curves in THF solution were obtained for the molecular glass mixture of Example 1 and Example 2. The wavelength of maximum absorption are shown on Table 3. The optical band gap (Eg) was calculated from the threshold of THF solution optical absorption and that of neat films at 3.13 eV/3.3 eV for the molecular glass mixture of Example 1 and 2.3/2.4 eV for the molecular glass mixture of Example 2.

Triplet energy was evaluate from phosphorescence spectrum of the molecular glass mixture of Example 1 in triplet solvent at 77K (liquid $N_2$). A triplet energy of 2.7 eV (+/−0.05) was measured. This si 0.5 eV higher than NPB and 0.20 eV higher than Bphen. Thus triplket energy of the molecular glass mixture of Example 1 is high enough for hosting certain blue phosphorescent emitters.

TABLE 3

Photo-Physical Data

| Materials | in THF $\lambda_{abs}{}^a$/nm | in THF $\lambda_{em}$/nm | in THF $E_g$/ev | Neat Film $E_g$/ev | Triplet Energy $E_T$ eV |
|---|---|---|---|---|---|
| Example 1 | 298 | | 3.13 | 3.3 | 2.70 |
| Example 2 | 453 | | 2.3 | 2.24 | |
| NPD/NPB (comparative | 339 | 450 | 3.1 | 3.4 | 2.29 |
| Bphen (Comparative) | 277 | 386 | 3.4 | 3.4 | 2.50 |
| Alq3 (Comparative) | 259 | 522 | 2.7 | 2.7 | |

Example 6: Charge Transport Mobility

The materials of Example 1 and Example 2 were vacuum deposited to provide samples for time of flight mobility, demonstrating the thermal stability of these glass mixtures.

Time-of-flight measurements show hole transport for the molecular glass mixture of Example 1 (Table 4). The hole mobility for the molecular glass is comparable to that of NPB mixture of Example 1 ($1.3 \times 10^{-4}$ cm$^2$/Vsec). The molecular glass mixture of Example 2 shows bipolar transport. The hole mobility was estimated at $1.8 \times 10^{-4}$ cm$^2$N/sec comparable to NPB. The electron mobility for the molecular glass mixture of Example 2 was estimated at $1.8 \times 10^{-4}$ cm$^2$/Vsec comparable (4,7-Diphenyl-1,10-phenanthroline (Bphen), but one order of magnitude better than example 2 and can be exploited to provide very efficient devices.

TABLE 4

Transport Mobility

| Materials | $\mu_{electron}$ cm$^2$/Vsec | $\mu_{hole}$ cm$^2$/Vsec |
|---|---|---|
| Example 2 | $1.2 \times 10^{-4}$ | $1.8 \times 10^{-4}$ |
| Example 1 | NA | $1.3 \times 10^{-4}$ |
| NPD/NPB (comparative) | NA | $8.8 \times 10^{-4}$ |
| Bphen (comparative) | $3.4 \times 10^{-4}$ | NA |
| Alq3 (comparative) | 2.00E−05 | NA |

Example 7. Thermal Properties Measurements

Differential scanning colorimetry analysis at 10°/min was used to characterize the thermal properties of the glass mixtures of Example 1 and Example 2. A glass transition $T_g$ at 136° C. and 109° C. were measured respectively for the molecular glass mixture of Example 1 and that of Example 2 (Table 6). Even after four heating runs (above $T_g$) no crystallization peaks nor melting peaks were found for the two molecular glass mixture examples of this invention. On the other hand NPB shows both a crystallization and melting peaks, while 1,1-bis((di-4-tolylamino)phenyl)cyclohexane (TAPC) show a melting peak. These results clearly show that the glass mixtures of this invention are truly non-crystallizable as compared to NPB and TAPC.

TABLE 6

Thermal Properties

| Materials | $T_g{}^e$/° C. | $T_{sch}$/° C. | $T_m$/° C. | Td/° C. |
|---|---|---|---|---|
| Example 1 | 136 | none | none | 400 |
| Example 2 | 106 | none | none | 400 |
| NPD (Comparative) | 98.7 | 175 | 281 | |
| TAPC (Comparative) | 78 | | 184.8 | 280 |

Example 8. Compatibility With Coumarin 6

Coumarin 6 is one of a set of fluorescent dyes widely used in OLED (Table 7). It has a very sharp melting point and does not show a glass transition temperature. Typically coumarin 6 is used as a dopant in a host matrix to suppress fluorescent quenching.

However phase separation has been a concern. The molecular glass mixtures of this invention can prevent the phase separation problem given their inherent high entropy of mixing values.

TABLE 7

(a)

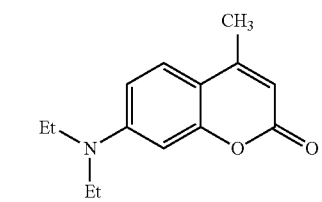 [SMILES: CCN(CC)c1ccc2c(C)cc(=O)oc2c1]

(b)

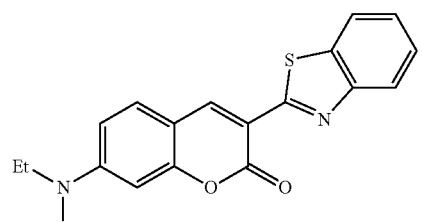

(c)

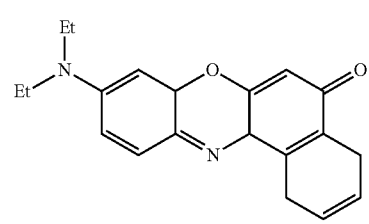 [SMILES: CCN(CC)C1=CC2OC3=CC(=O)C4=C(CC=CC4)C3N=C2C=C1]

(d)

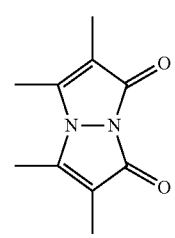

Chemical structure of (a) Coumarin 47, (b) Coumarin 6, (c) Nile red, and (d) bimane To demonstrate this, the compatibility of coumarin 6 with the molecular glass mixture of example 1 and example 2 at three different concentrations: 10 weight percent (wt %) and 20 wt % and 40 wt % was evaluated by differential scanning calorimetry (DSC).

Figure 3:
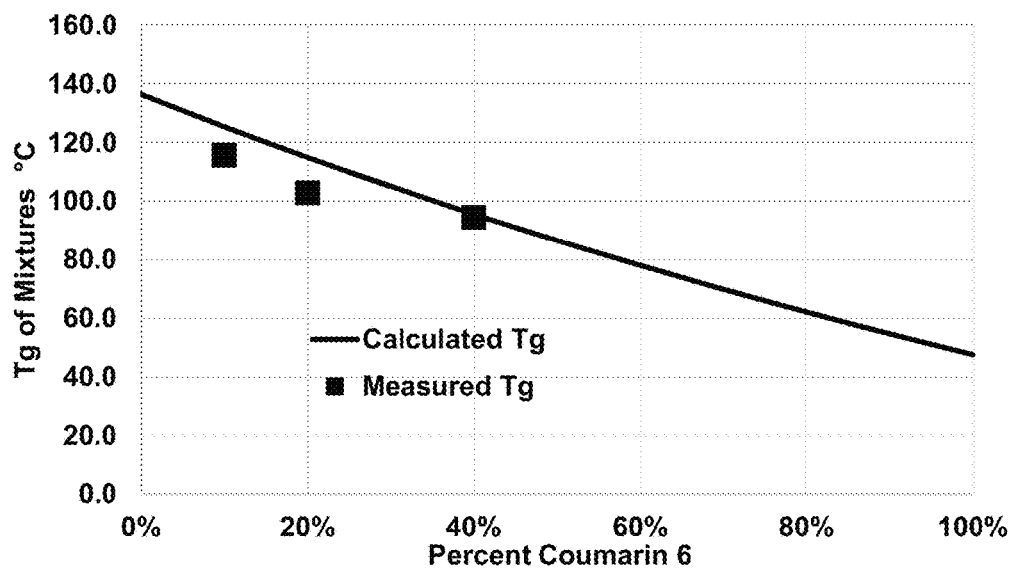
Figure 4:
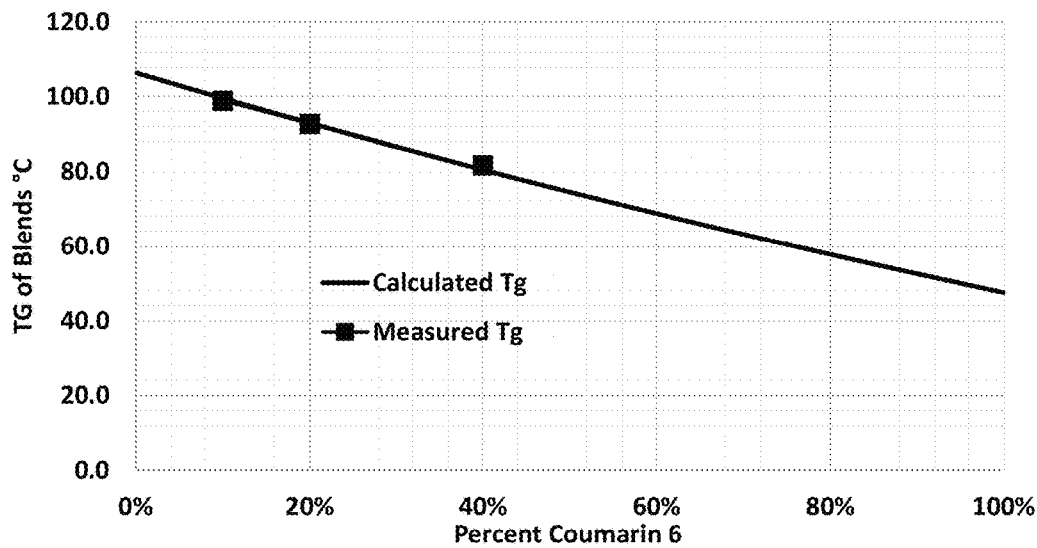

Table 8 shows the results. Coumarin 6 was completely miscible in both the molecular glass mixtures of examples 1 and 2 at all three concentrations. A single glass transition temperature, $T_g$, was measured for each composition respectively with the absence of any crystallization nor melting peaks even though the neat coumarin 6 shows a melting point at four consecutive DSC heat runs. This clearly proves the exceptional ability of the molecular glass mixtures of the present invention to dissolve other materials and keep them from crystallizing at very high concentration. FIG. 3 shows $T_g$ prediction for the mixture of comarin 6 and the molecular glass mixture of example 1 against the results of Table 8. Similar comparison is shown for the molecular glass mixture of Example 2 in FIG. 4.

The concentration of coumarin 6 and of other dyes used as a dopant is 5 to 10 times lower than the concentrations used for the DSC compatibility test. Thus we expect a device utilizing the molecular glass mixture of this invention to be very stable and free of phase separation and contributing to increased lifetime of the device. We also anticipate that the molecular glass mixtures of this invention will prevent dopant aggregation at very high dopant concentration, leading to higher efficiency, high luminance and reduced efficiency roll-off.

Comparative Compatibility Example

The same DSC evaluation was repeated at the 10 wt % level using 4,4'-cyclohexylidene bis [N,N-bis(4-methyl phenyl) benzamine (TAPC),

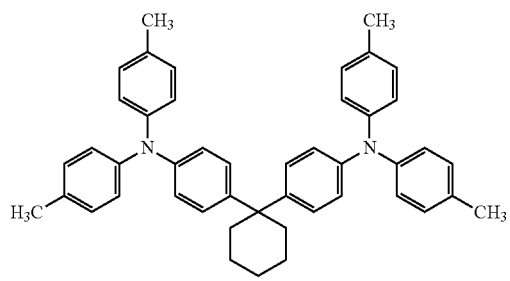

a widely used hole-transporting material in OLED.

Table 8 shows a single glass transition temperature around 71° C., a little lower than the 75° C. of the neat TAPC; However a crystallization peak is seen at 149.7° C., as well as a melting point at 170.4° C. at both the second and third scans. This illustrates the problem with non-equilibrium molecular glasses.

TABLE 8

| | Compatibilty Data | | | |
|---|---|---|---|---|
| | | Coumarin 6 | | |
| Materials | Wt % | $T_g$ ° C. | $T_c$ ° C. | $T_m$ ° C. |
| Example 1 | 10% | 115.7 | NONE | NONE |
| Example 1 | 20% | 102.8 | NONE | NONE |
| Example 1 | 40% | 94.4 | NONE | NONE |

TABLE 8-continued

| | Compatibilty Data | | | |
|---|---|---|---|---|
| | | Coumarin 6 | | |
| Materials | Wt % | $T_g$ ° C. | $T_c$ ° C. | $T_m$ ° C. |
| Example 2 | 10% | 99 | NONE | NONE |
| Example 2 | 20% | 91.8 | NONE | NONE |
| Example 2 | 40% | 81.8 | NONE | NONE |
| TAPC (comparative example) | 10% | 71.3 | 149.7 | 161.7 |

Example 9. OLED Device Made with Molecular Glass Mixture of Example 2 as a Non-Doped Emitter A about 1.1 mm thick glass substrate coated with a transparent indium tin oxide (ITO) conductive layer was cleaned and dried using a commercial glass scrubber tool. The thickness of ITO is about 42 nm and the sheet resistance of the ITO is about 68 OMEGA./square. The ITO surface was subsequently treated with oxidative plasma to condition the surface as an anode. A layer of molybdenium oxide (MoOxO, 5 nm thick, was deposited on the clean ITO surface as the hole injection layer (HIL). The substrate was then transferred into a vacuum deposition chamber for deposition of all other layers on top of the substrate.

The following layers were deposited in the following sequence by evaporation from a heated boat under a vacuum of approximately $10.^{-6}$ Torr: (1) a hole-transport layer, 75 nm thick, including NPB; (2) a luminescent layer, 75 nm thick, including the molecular glass mixture of example 2 as non-doped emitting layer; (3) an LiF layer 1 nm thick (4) a aluminum cathode, approximately 100 nm thick.

Figure 5:
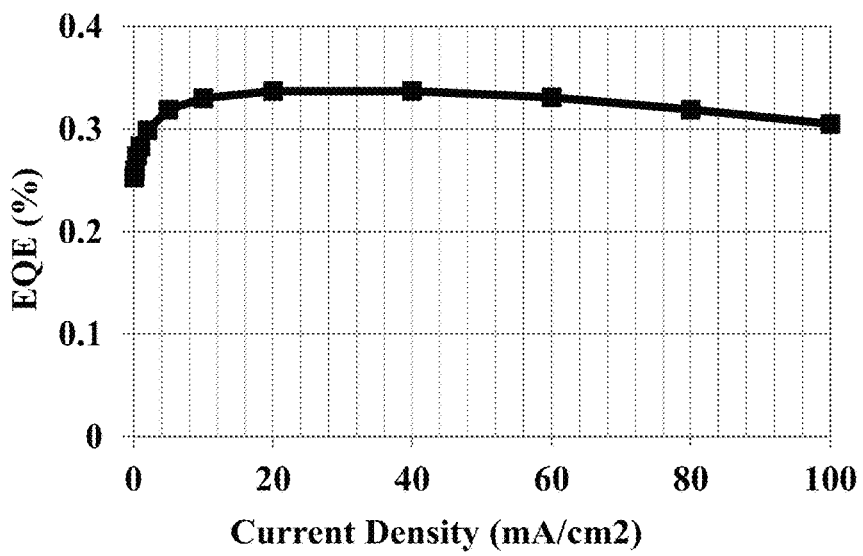
FIG. 5 is a plot of external quantum efficiency vs current density for an OLED device made using the molecular glass mixture of example 2 as emitter layer.
Figure 6:
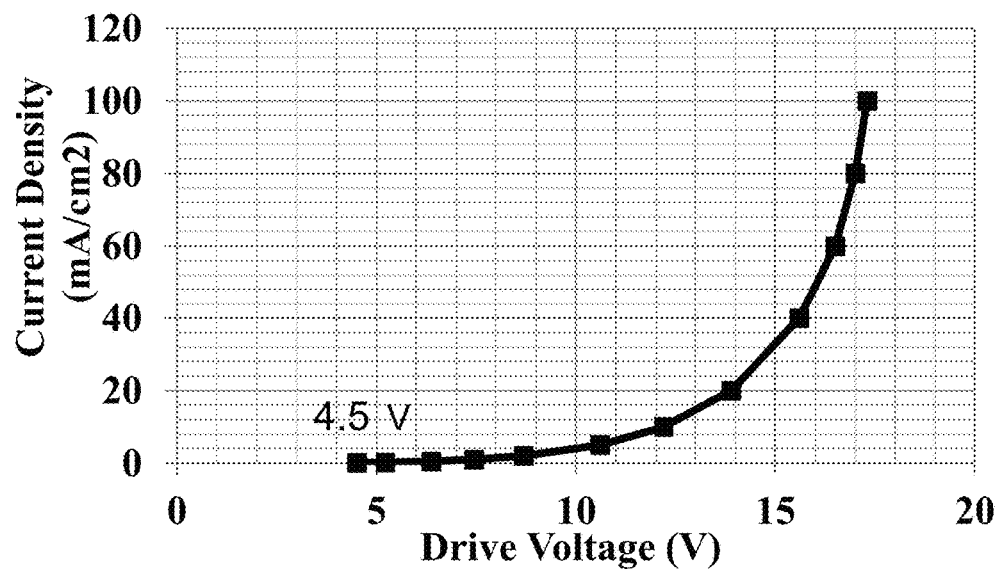
FIG. 6 is a plot of current density vs drive voltage for an OLED device made using the molecular glass mixture of example 2 as emitter layer.
Figure 7:
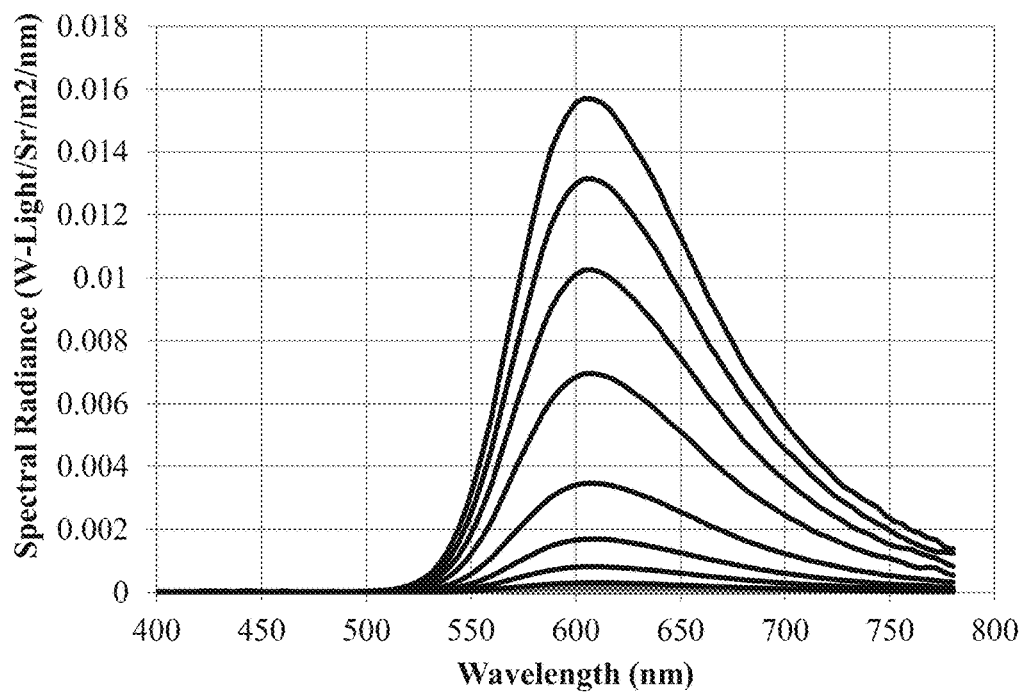
FIG. 7 is a plot of spectral radiance vs wavelength for an OLED device made using the molecular glass mixture of example 2 as emitter layer.
Figure 8A:
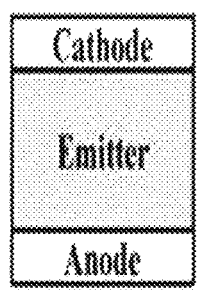
FIGS. 8A, 8B, 8C, 8D depict common OLED architectures with a hole-transporting material (HTM), and an electron-transport material (ETM) of the invention.
Figure 8B:
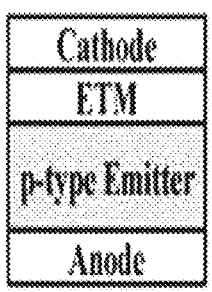
Figure 8C:
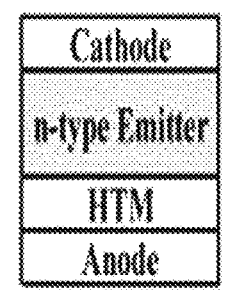
Figure 8D:
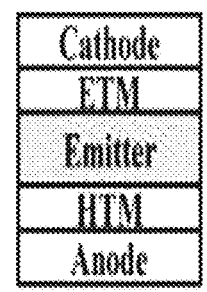

FIG. 5 shows the external quantum efficiency for the device as a function of current density. The maximum efficiency of 0.34% is obtained at 20 Volts. FIG. 6 shows the current density of the OLED device against driving voltage, with a threshold voltage of 4.5 volt. FIG. 7 shows the spectral radiance of the device with a lambda max at 604 nm, providing orange light.

It should be pointed out that the device is hardly optimized. The molecular glass mixture of example 2 is ambipolar, showing balanced electron and hole mobility.

The addition of a hole blocking layer and an electron layer will contribute to confine the exitons in the emitting layer and thus improve on the performance for the device.

Example of Applications

The charge-transporting molecular glass mixtures, the luminescent molecular glass mixtures, and combinations thereof of the invention can be used in organic photoactive electronic devices, such as organic light emitting diodes (OLED) that make up OLED displays. The organic active layer is sandwiched between two electrical contact layers in an OLED display. In an OLED, the organic photoactive layer emits light through the light-transmitting electrical contact layer upon application of a voltage across the electrical contact layers.

It is well known by expert in the art, to use organic luminescent compounds as the active component in light-emitting diodes. Simple organic molecules, conjugated polymers, and organometallic complexes have been used. Devices that use photoactive materials frequently include one or more charge transport layers, which are positioned between a photoactive (e.g., light-emitting) layer and a contact layer (hole-injecting contact layer). A device can contain two or more contact layers. A hole transport layer can be positioned between the photoactive layer and the hole-injecting contact layer. The hole-injecting contact layer may also be called the anode. An electron transport layer can be positioned between the photoactive layer and the electron-injecting contact layer. The electron-injecting contact layer may also be called the cathode. Charge transport materials can also be used as hosts in combination with the photoactive materials.

FIGS. 8A-8D show common OLED architectures, not in scale, with a hole-transport material (HTM) and an electron-transport material (ETM), ("Electron Transport Materials for Organic Light-Emitting Diodes' A. Kulkarni et al, Chem. Mater. 2004,16, 4556-4573).

The luminescent molecular glass mixtures of the invention can be used either as host, dopant or non-doped emitter layers in those structures, depending on the composition, the structure and properties of the luminescent moieties. The charge transport molecular glass mixtures of the invention can also be used in fluorescent as well phosphorescent emitter systems.

It is well understood that these materials have to be optimized for particular device configuration. The hole transport layer materials (HTL) need to have the highest occupied molecular orbital (HOMO) level aligned with the corresponding HOMO level of the host to assure the hole flow into the emissive layer zone with minimal barrier for injection, whereas the HTL lowest occupied molecular orbital (LUMO) has to be sufficiently high to prevent electron leakage from the host into the HTL.

A similar set of rules, but with the opposite sign, exists for the interface of the host with the electron transport layer (ETL): The LUMO levels need to be aligned, and the ETL HOMO sufficiently deep to provide charge confinement. Triplet exciton energies of the materials in both charge transport layers should be significantly higher than the highest triplet level of all the emitters to prevent emissive exciton quenching. The triplet energy constraints also apply to the host materials, but with the requirements less stringent compared to those of hole and electron transport molecules. In addition, the positions of the HOMO of the HTL and LUMO of the ETL will have to match the work functions of both electrodes to minimize charge injection barriers. (E. Polikarpov, A B. Padmaperuna, "Materials Design Concepts for Efficient Blue OLEDs: A Joint Theoretical and Experimental Study", Material Matters, Vol 7, No 1, Aldrich Materials Science).

The materials of this invention provide a facile method to satisfy the set of energy alignment requirements in a given material by combining different molecular moieties that carry the desired electronic properties in one molecular glass mixture. The luminescent molecular glass mixtures of this invention provide many design freedoms to simplify the design of these devices. The true non-crystalline nature of these mixtures, their large entropy of mixing values are expected to contribute significantly to device stability and performance.

These examples of materials and applications are not meant to be exhaustive. Although the invention has been described with reference to specific embodiments, it is not intended to be limited thereto, rather those having ordinary skill in the art will recognize that variations and modifications may be made within the scope of the claims.

What is claimed is:

1. A composition comprising
a molecular glass mixture of non-polymeric compounds exhibiting a single thermal transition free of phase separation wherein said molecular glass mixture is characterized as amorphous, solid at about 20° C., and comprises at least two different compounds each independently corresponding to the structure $(R^1Y^1)_p[(Z^1Y^2)_m R^2 Y^3]_n Z^2 Y^4 R^3$;
wherein m is zero or one, n is zero up to an integer at which said compound starts to become a polymer and p is an integer of from one to eight;
$R^1$ and $R^3$ each independently represents a monovalent aliphatic or cycloaliphatic hydrocarbon group having 1 to 20 carbon atoms or an aromatic group or a multicyclic aromatic nucleus;
$R^2$, $Z^1$ and $Z^2$ each independently represent multivalent aliphatic or cycloaliphatic hydrocarbon groups having 1 to 20 carbon atoms or an aromatic group; and
$Y^1$, $Y^2$, $Y^3$ and $Y^4$ each independently represent a triple bond, a double bond, or a single bond link;
provided that at least one of $R^1$, $Z^1$, $R^2$, $Z^2$ and $R^3$ is a multicyclic aromatic nucleus, and the glass-transition temperature is above 25° C.

2. The composition of claim 1 wherein at least one of $R^2$, $Z^1$ and $Z^2$ is a multivalent charge-transport moiety, a luminescent moiety, or a combination thereof.

3. The composition of claim 1 wherein at least one of $R^1$ and $R^3$ is a monovalent charge-transport moiety, a luminescent moiety or a combination thereof.

4. The composition of claim 3 wherein
at least one of $R^2$, $Z^1$ and $Z^2$ is a multivalent charge-transport moiety, a luminescent moiety or a combination thereof.

5. The composition of claim 4 wherein the monovalent charge transport moiety is a hole-transport moiety and the multivalent charge transport moiety is an electron-transport moiety.

6. The composition of claim 4 wherein the monovalent charge transport moiety is an electron-transport moiety and the multivalent transport moiety is a hole-transport moiety.

7. The composition of claim 4 wherein the monovalent charge transport moiety is a mixture of electron-transport and hole-transport moiety and the multivalent transport moiety is a hole-transport moiety.

8. The composition of claim 4 wherein the monovalent charge transport moiety is a mixture of electron-transport and hole-transport moiety and the multivalent transport moiety is an electron-transport moiety.

9. The composition of claim 1 wherein at least one of $R^1$, $R^2$, $R^3$, $Z^1$, and $Z^2$ is a luminescent moiety.

10. The composition of claim 9 wherein the luminescent moiety is a fluorescent moiety.

11. The composition of claim 9 wherein the luminescent moiety is a phosphorescent moiety.

12. The composition of claim 9 wherein the luminescent moiety is a thermally assisted delayed fluorescence moiety.

13. The composition of claim 1 wherein the molecular glass mixture is solvent-coatable.

14. The composition of claim 1 wherein the molecular glass mixture is vacuum-coatable.

15. The composition of claim 1 wherein all the components of the molecular glass mixture are isomeric.

16. The composition of claim 1 wherein the molecular glass mixture is noncrystallizable.

17. The composition of claim 16 further consisting of mixing a non-equilibrium molecular glass, a crystallizable molecule, or a combination thereof with said noncrystallizable molecular glass mixture in a ratio that yields a new noncrystallizable glass mixture, wherein the non-equilibrium glass, the crystallizable molecule, or a combination thereof is charge transporting, luminescent, or a combination thereof.

18. The composition of claim 1 wherein the molecular glass mixture is soluble in a solvent taken from the group consisting of water, acetone, 1-butanol, ethanol, 2-propanol, ethyl acetate, methanol, isopropyl acetate, acetonitrile, tetrahydrofuran, 2-methyltetrahydrofuran, dimethyl sulfoxide, acetic acid, and xylene.

19. A process of making the composition comprising a molecular glass mixture according to claim 1 wherein all the starting materials are pre-purified by recrystallization, distillation, sublimation, or other purification methods.

20. An organic electronic device comprising multiple layers wherein at least one of the layers contain a hole-transporting, an electron-transporting, a bipolar, or a luminescent composition, or a combination thereof, wherein the hole-transporting, electron-transporting, bipolar, or luminescent composition is a composition comprising a molecular glass mixture according to claim 1.

21. The organic electronic device of claim 20 wherein the organic electronic device is an organic light emitting diode.

22. The organic electronic device of claim 20 wherein the organic electronic device is a photonic device.

23. The organic electronic device of claim 20 wherein the organic electronic device is a solar cell device.

24. The organic electronic device of claim 20 wherein the organic electronic device is a field-effect transistor.

25. The organic electronic device of claim 20 wherein the organic electronic device is flexible.

26. The organic electronic device of claim 20 wherein the organic electronic device is transparent.

27. The composition according to claim 1, wherein the molecular glass mixture comprises:

-continued

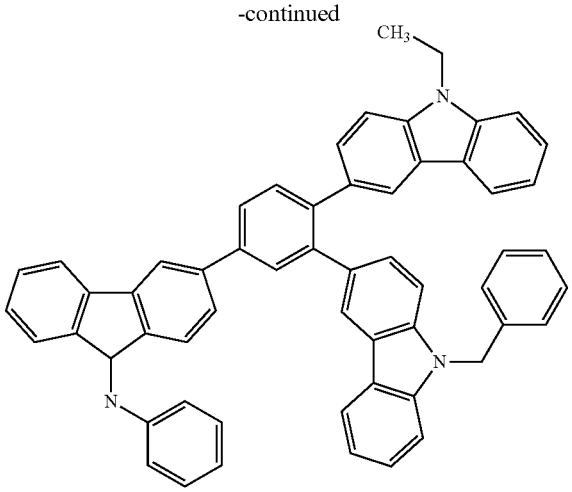

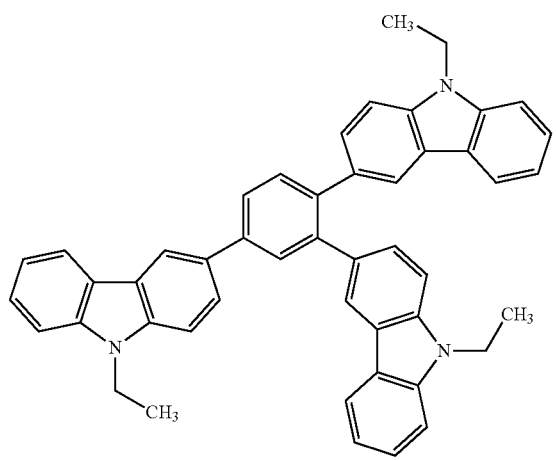

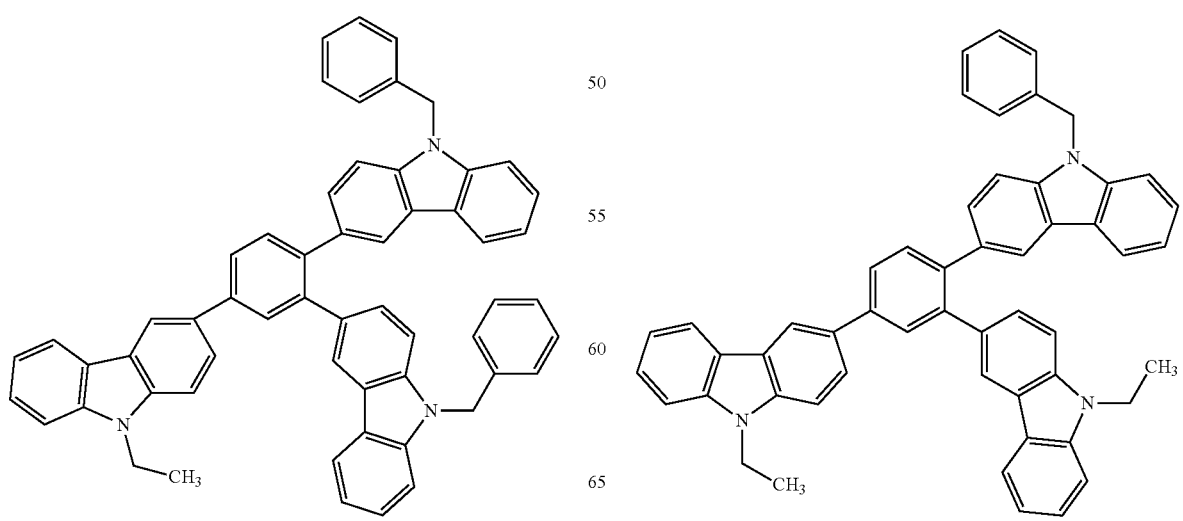

-continued
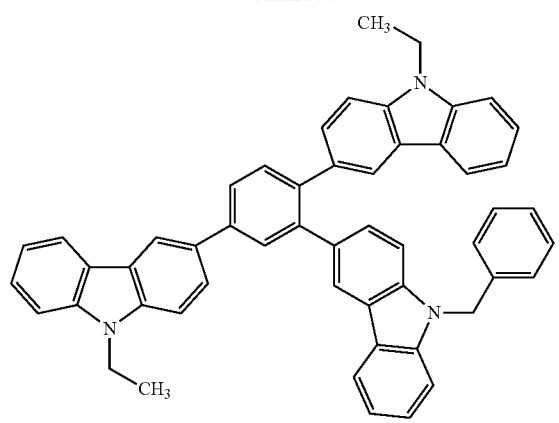
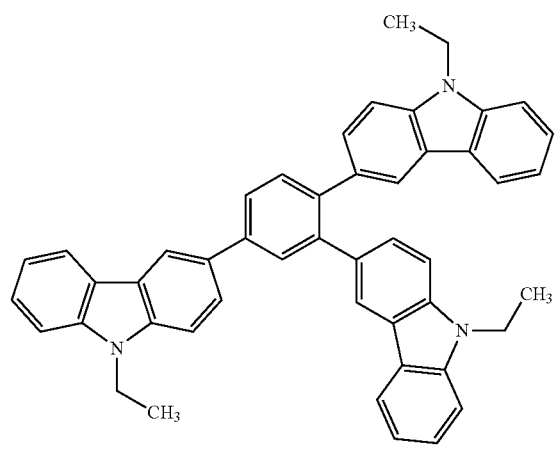
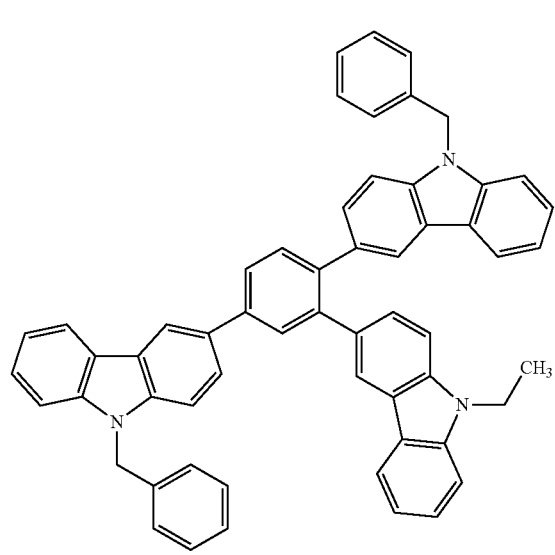
-continued
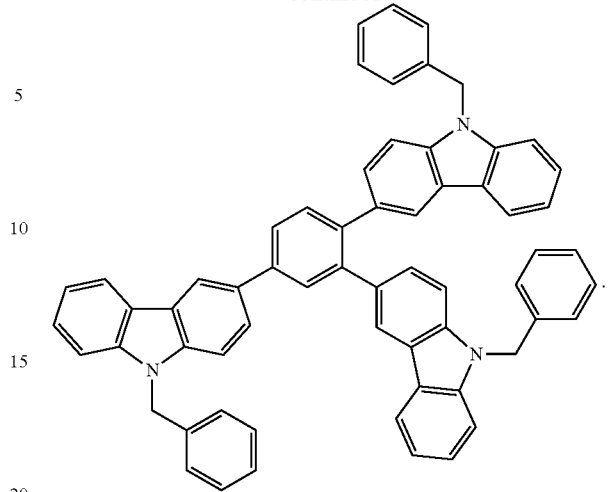
28. The composition according to claim 1, wherein the molecular glass mixture comprises:
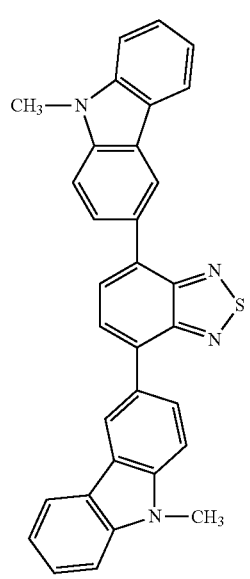
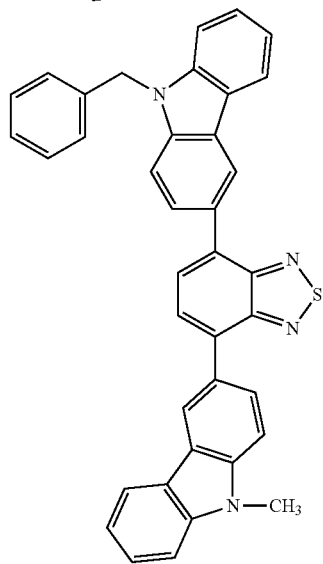

185
-continued
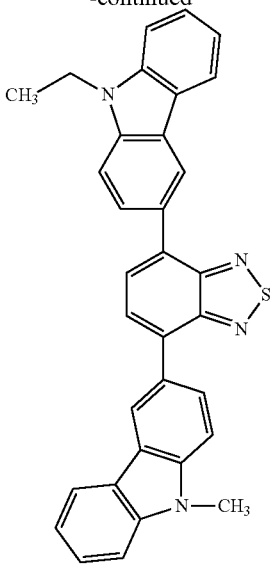
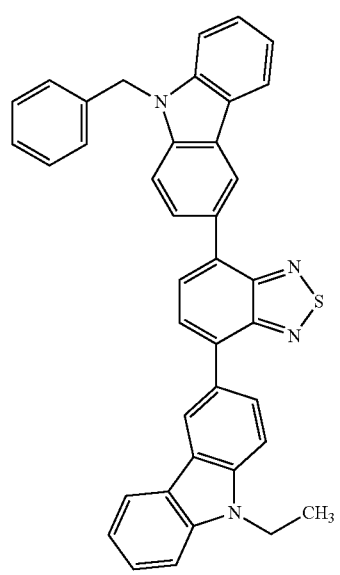
186
-continued
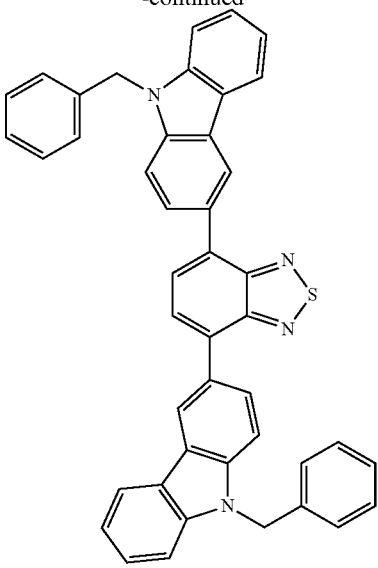
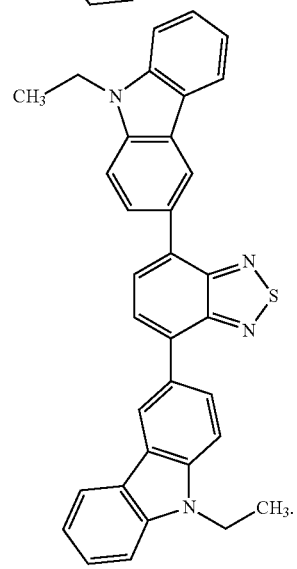
29. The composition according to claim 1, wherein the glass mixture comprises a glass mixture selected from Glass Mixture 1 to Glass Mixture 39.
* * * * *